(12) United States Patent
Murakami et al.

(10) Patent No.: US 9,014,326 B2
(45) Date of Patent: Apr. 21, 2015

(54) FLIP-FLOP, SHIFT REGISTER, DISPLAY DRIVE CIRCUIT, DISPLAY APPARATUS, AND DISPLAY PANEL

(75) Inventors: Yuhichiroh Murakami, Osaka (JP); Shige Furuta, Osaka (JP); Yasushi Sasaki, Osaka (JP); Makoto Yokoyama, Osaka (JP); Takahiro Yamaguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 464 days.

(21) Appl. No.: 13/378,214

(22) PCT Filed: Mar. 26, 2010

(86) PCT No.: PCT/JP2010/002196
§ 371 (c)(1),
(2), (4) Date: Dec. 14, 2011

(87) PCT Pub. No.: WO2010/146756
PCT Pub. Date: Dec. 23, 2010

(65) Prior Publication Data
US 2012/0092323 A1    Apr. 19, 2012

(30) Foreign Application Priority Data
Jun. 17, 2009    (JP) ................................ 2009-144746

(51) Int. Cl.
*H03K 3/356* (2006.01)
*G11C 19/00* (2006.01)
(Continued)

(52) U.S. Cl.
CPC ............ *G09G 3/3677* (2013.01); *G09G 3/3688* (2013.01); *G11C 19/28* (2013.01); *H03K 3/356104* (2013.01); *G09G 3/3655* (2013.01);
(Continued)

(58) Field of Classification Search
None
See application file for complete search history.

(56) References Cited

U.S. PATENT DOCUMENTS 4,806,786 A * 2/1989 Valentine ...................... 327/203
5,471,149 A    11/1995 Usuki
(Continued)

FOREIGN PATENT DOCUMENTS

| CN | 100362593 | 1/2008 |
| CN | 101361109 | 2/2009 |

(Continued)

OTHER PUBLICATIONS

English translation of ISR and Written opinion of the ISA.
(Continued)

*Primary Examiner* — Lincoln Donovan
*Assistant Examiner* — Khareem E Almo
(74) *Attorney, Agent, or Firm* — Harness, Dickey & Pierce

(57) ABSTRACT

A flip-flop includes: a first, second, third, and fourth transistors; input terminals; and first and second output terminals, the first and second transistors constituting a first CMOS circuit such that gate terminals are connected and drain terminals are connected, the third and fourth transistors constituting a second CMOS circuit such that gate terminals are connected and drain terminals are connected, the first output terminal connected to a gate side of the first CMOS circuit and a drain side of the second CMOS circuit, the second output terminal connected to a gate side of the second CMOS circuit and a drain side of the first CMOS circuit, at least one input transistor included in the group of the first through fourth transistors, a source terminal of the input transistor being connected to one of the input terminals. This can provide a further compact flip-flop.

39 Claims, 74 Drawing Sheets

(51) Int. Cl.
  *G09G 3/36* (2006.01)
  *G11C 19/28* (2006.01)
(52) U.S. Cl.
  CPC ............... *G09G 2300/0876* (2013.01); *G09G 2310/0286* (2013.01)

(56) References Cited

U.S. PATENT DOCUMENTS

| | | | |
|---|---|---|---|
| 6,198,324 B1 * | 3/2001 | Schober | 327/202 |
| 6,724,361 B1 | 4/2004 | Washio et al. | |
| 7,852,119 B1 * | 12/2010 | Kojima | 326/81 |
| 8,030,965 B2 * | 10/2011 | Kojima | 326/81 |
| 2004/0150610 A1 | 8/2004 | Zebedee et al. | |
| 2004/0196232 A1 | 10/2004 | Kim et al. | |
| 2004/0257120 A1 | 12/2004 | Wang et al. | |
| 2005/0098894 A1 | 5/2005 | Ohtani et al. | |
| 2009/0009449 A1 | 1/2009 | Uchida et al. | |
| 2009/0121998 A1 | 5/2009 | Ohkawa et al. | |
| 2012/0081346 A1 * | 4/2012 | Furuta et al. | 345/209 |
| 2012/0092323 A1 * | 4/2012 | Murakami et al. | 345/211 |
| 2012/0105395 A1 * | 5/2012 | Hachida et al. | 345/204 |
| 2014/0098016 A1 * | 4/2014 | Furuta et al. | 345/100 |

FOREIGN PATENT DOCUMENTS

| | | |
|---|---|---|
| GB | 2361121 A | 10/2001 |
| JP | 61060008 A | 3/1986 |
| JP | 02266609 A | 10/1990 |
| JP | 2001135093 A | 5/2001 |
| JP | 2005-228459 | 8/2005 |
| WO | WO 2005/098865 | 10/2005 |

OTHER PUBLICATIONS

Extended European Search Report dated Nov. 13, 2013.

* cited by examiner

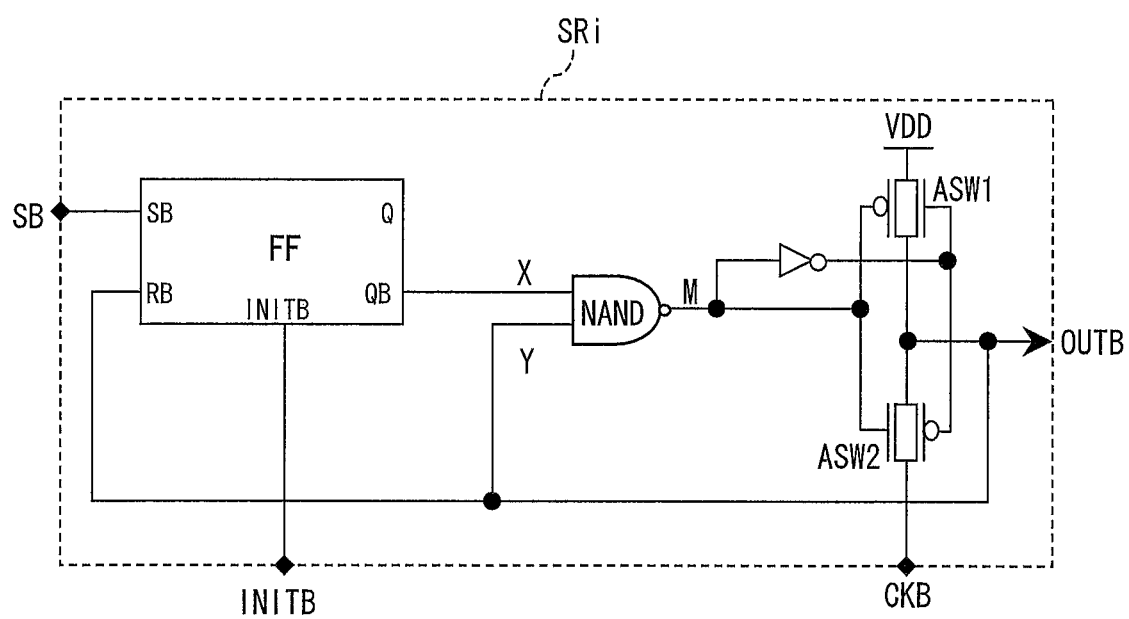
F I G. 3 3

F I G. 4 3
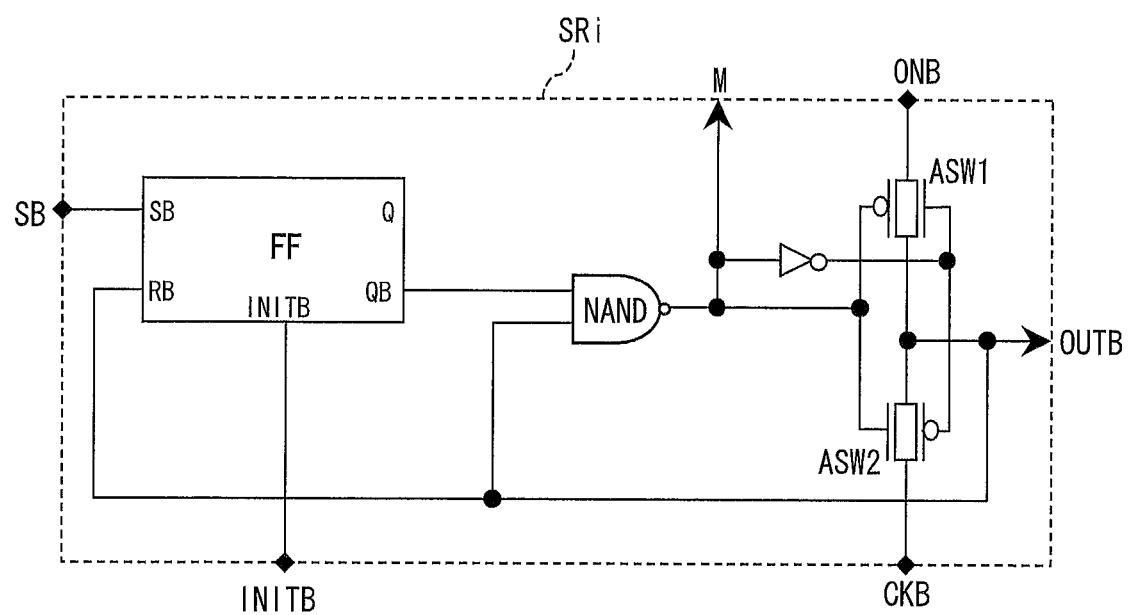

F I G. 5 2
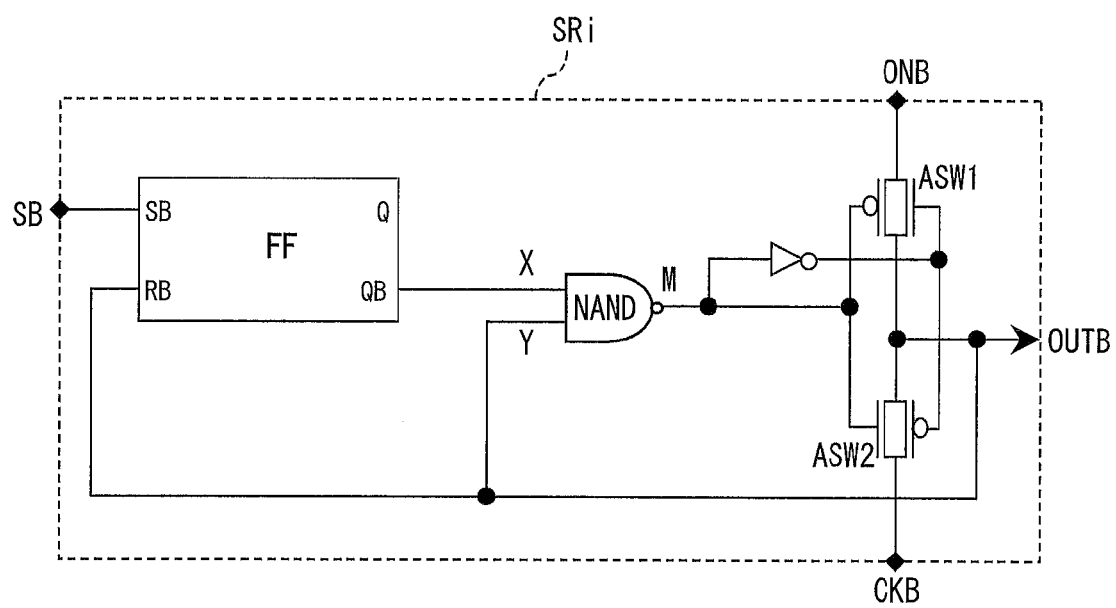

F I G. 5 4
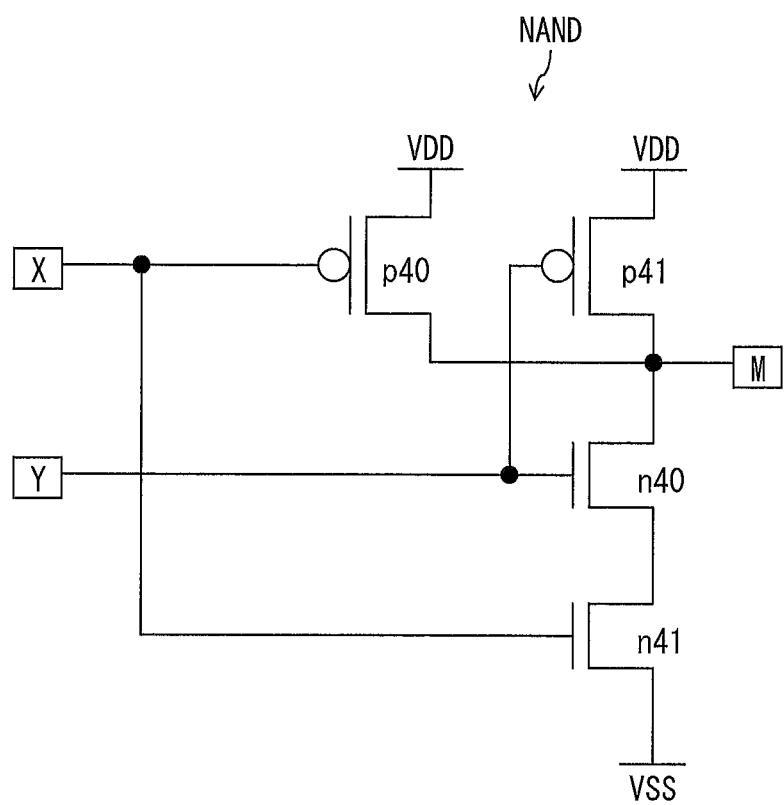

F I G. 5 5
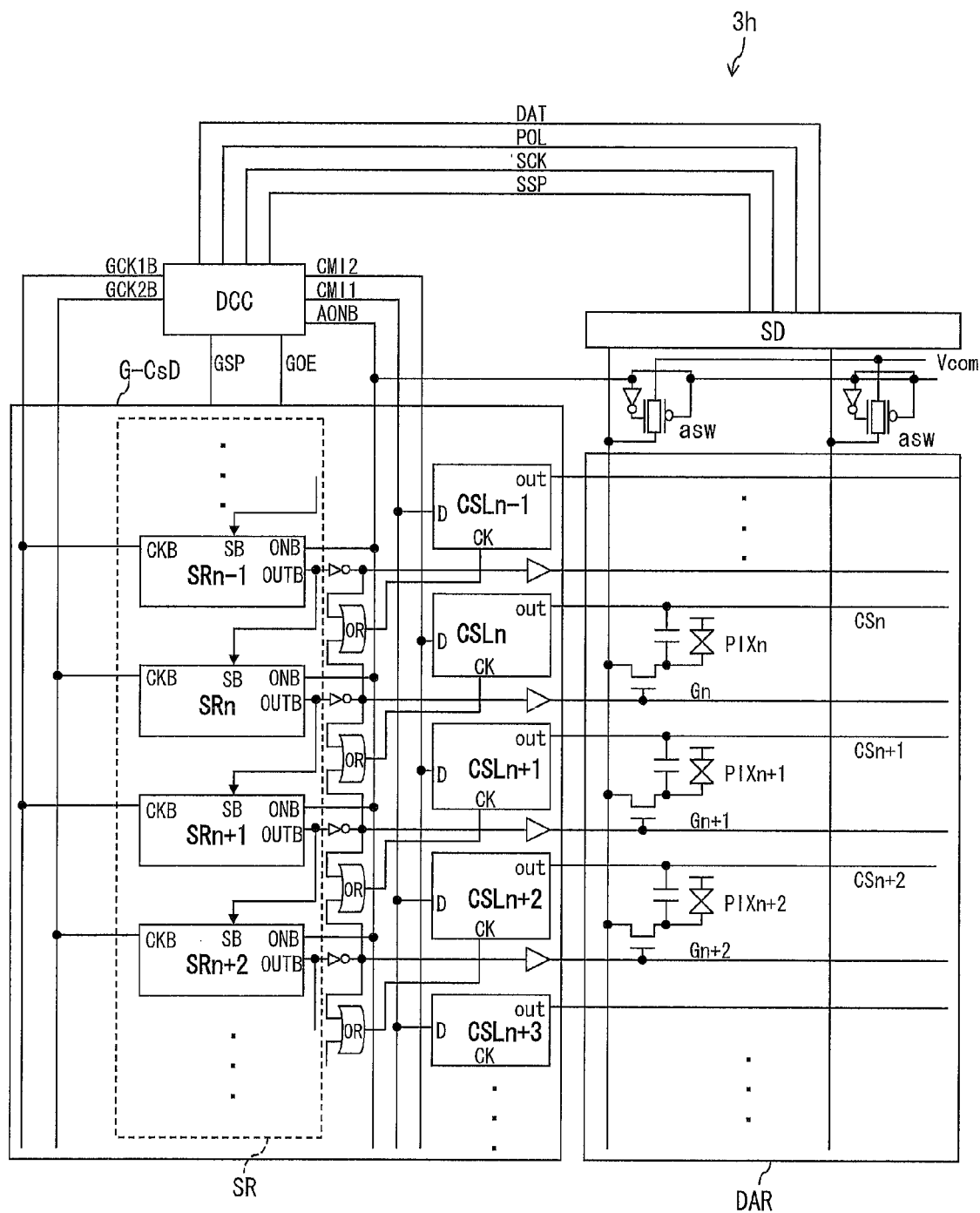

F I G. 6 1
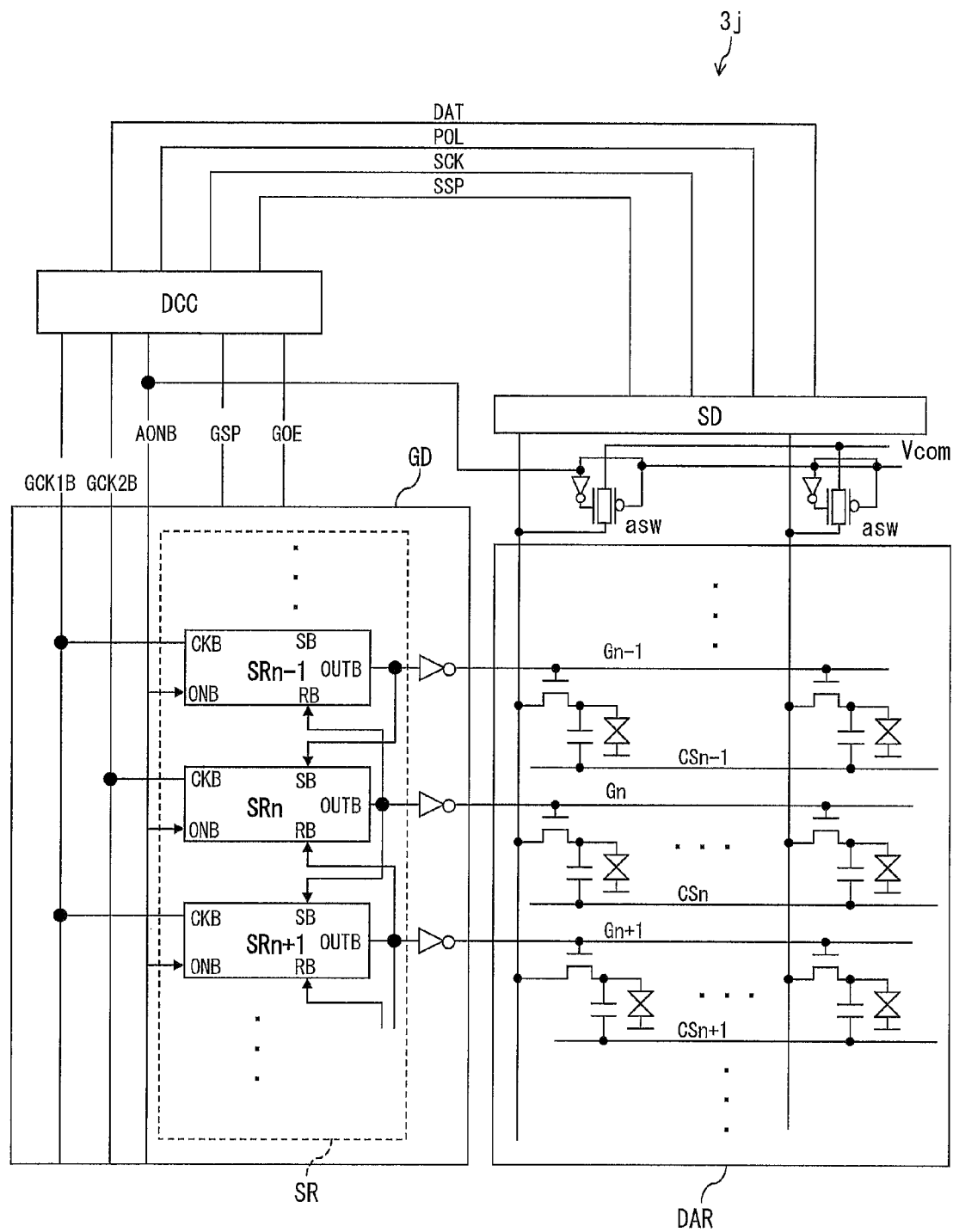

F I G. 6 2
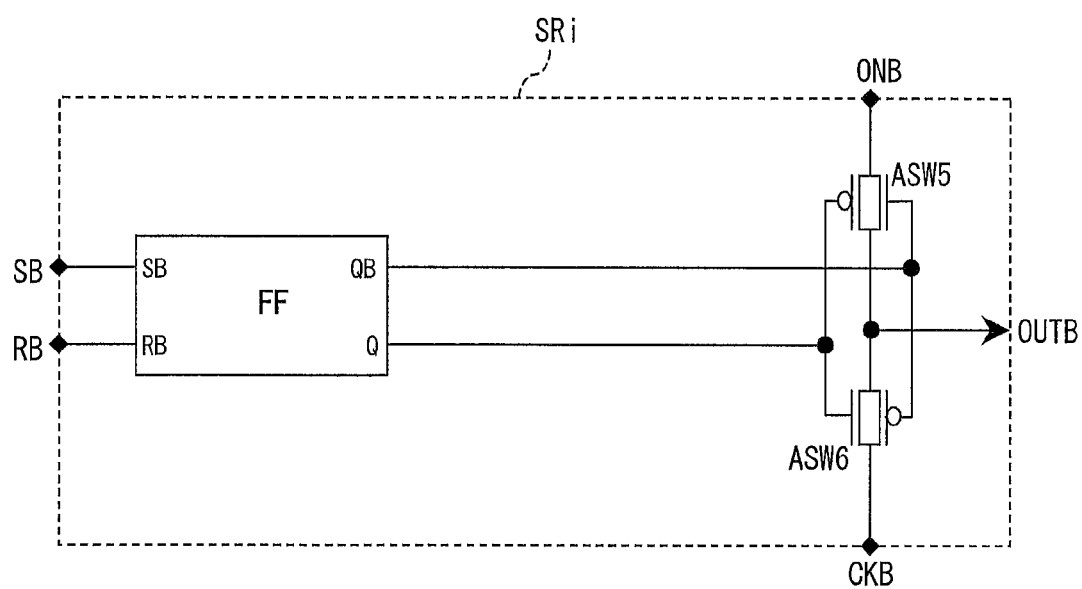

F I G. 6 5
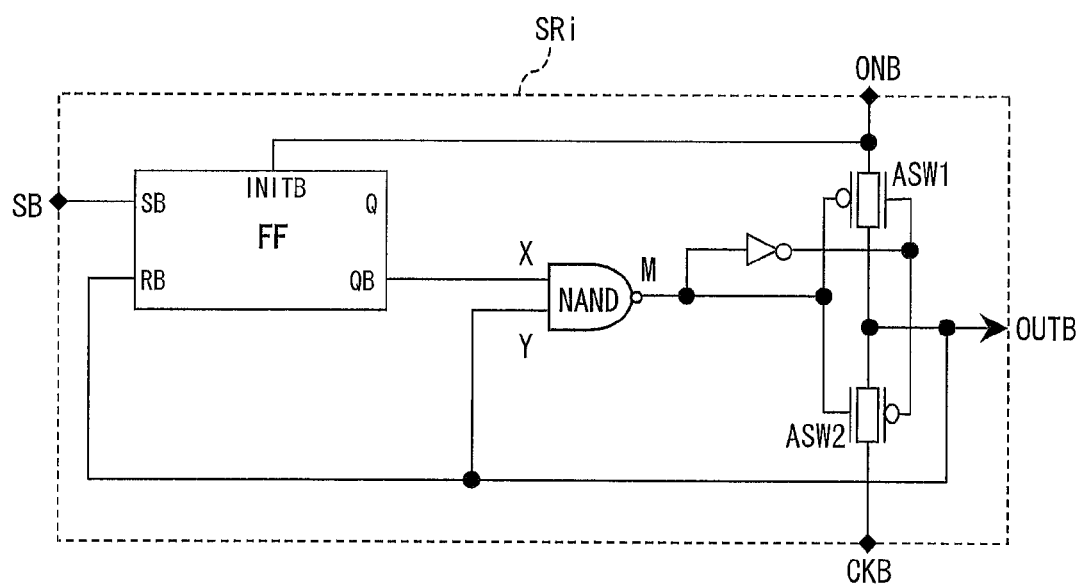

F I G. 6 6
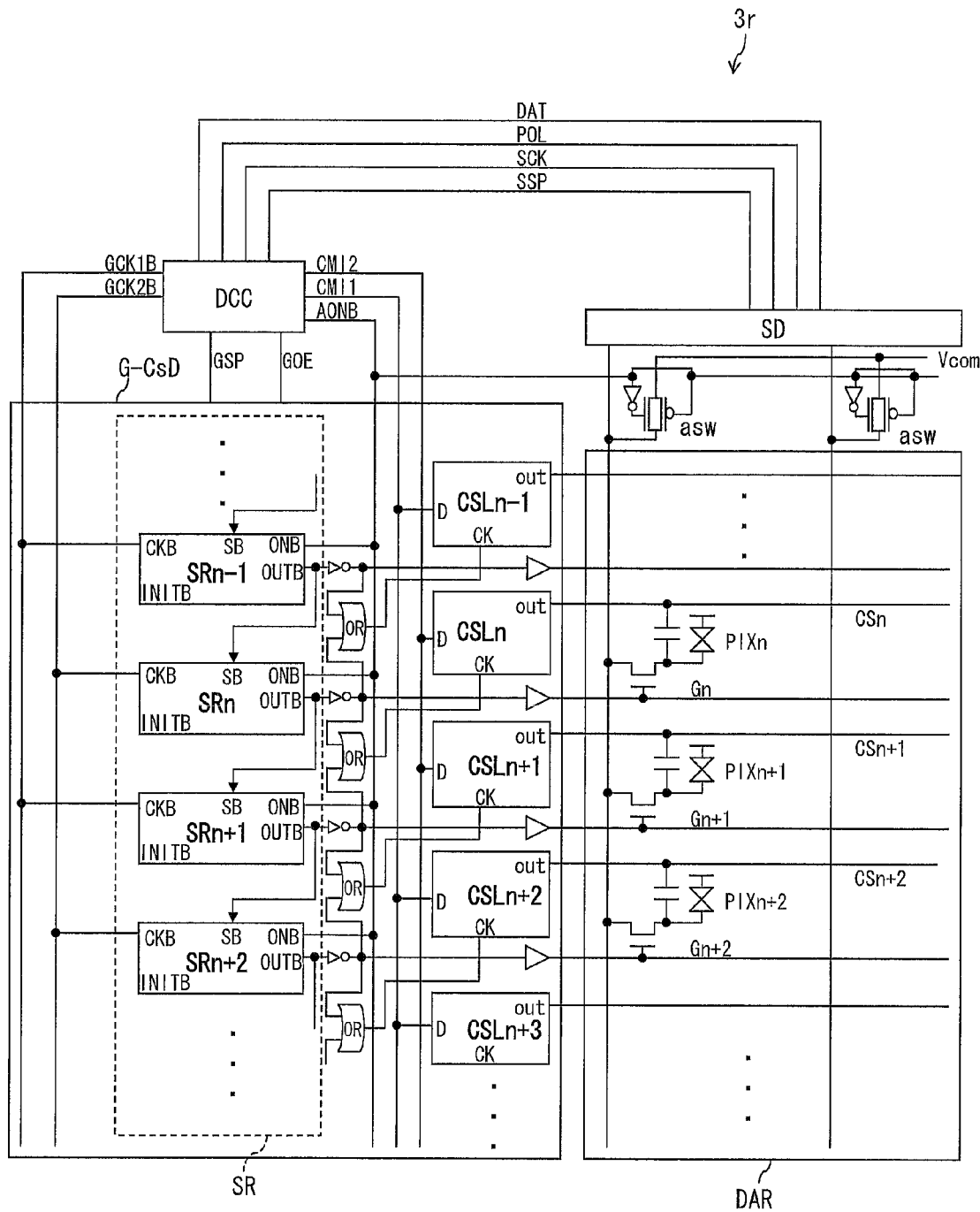

F I G. 6 8
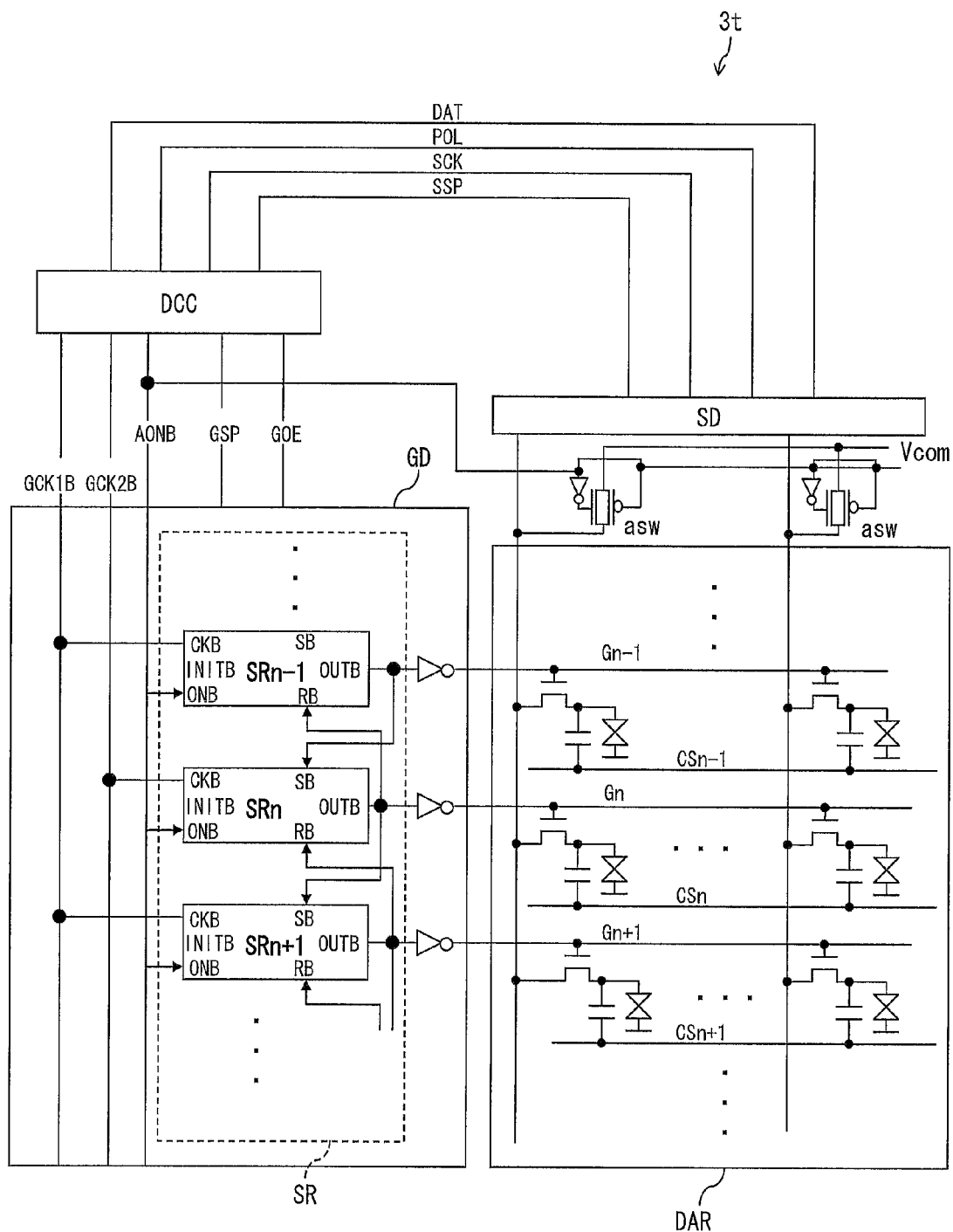

FLIP-FLOP, SHIFT REGISTER, DISPLAY DRIVE CIRCUIT, DISPLAY APPARATUS, AND DISPLAY PANEL

TECHNICAL FIELD

The present invention relates to a flip-flop and various display drivers.

BACKGROUND ART (a) of FIG. 75 illustrates an arrangement of a conventional flip-flop which is used in a gate driver for a liquid crystal display device, or the like. A conventional flip-flop (FF) 900 illustrated in (a) of FIG. 75 includes five P channel transistors (p100, p101, p102, p103, p104), five N channel transistors (n100, n101, n102, n103, n104), an SB (set-bar) terminal, an R (reset) terminal, a Q (output) terminal, a QB (inversion output) terminal, and an INITB (initial-bar) terminal. Hereinafter, a signal supplied to the SB terminal is referred to as "SB (set-bar) signal", a signal supplied to the R terminal is referred to as "R (reset) signal", a signal supplied to the INITB terminal is referred to as "INITB (initial-bar) signal", a signal outputted from the Q terminal is referred to as "Q (output) signal", and a signal outputted from the QB terminal is referred to as "QB (inversion output) signal". Further, an electric potential of a VDD (high potential power source) is referred to as "Vdd", and an electric potential of a VSS (low potential power source) is referred to as "Vss".

Here, the FF900 has an arrangement in which (i) a source of the p100 is connected to the VDD (high potential power source), (ii) a drain of the p100, a drain of the n100, a drain of the p102, a drain of the n102, a gate of the p104, a gate of the n104, and the Q terminal are connected to each other, (iii) a source of the n100 and a drain of the n101 are connected to each other, and (iv) a source of the n101 is connected to the VSS (low potential power source). Further, in the FF900, (i) a source of the p101 is connected to the VDD, (ii) a drain of the p101 and a source of the p102 are connected to each other, (iii) a source of the n102 and a drain of the n103 are connected to each other, (iv) a source of the n103 is connected to the VSS, (v) a source of the p104 is connected to the VDD, (vi) a drain of the p104 and a drain of the n104 are connected to each other, and (vii) a source of the n104 is connected to the VSS. Furthermore, in the FF 900, (i) a gate of the p101, a gate of the n100, and the R terminal are connected to each other, (ii) a gate of the p100, a gate of the n101, a gate of the n103, and the SB terminal are connected to each other, (iii) a source of the p103 is connected to the VDD, (iv) a gate of the p103 is connected to the INITB terminal, and (v) a gate of the p102, a gate of the n102, a drain of the p103, and the QB terminal are connected to each other. The FF900 has an arrangement in which (i) the p100 constitutes a set circuit SC, (ii) the n100 constitutes a reset circuit RC, (iii) the n101 constitutes a priority determining circuit PDC, (iv) the p103 constitutes an initialization circuit IC, (v) the p101 and the n103 constitute latch releasing circuits LRC, respectively, and (vi) the p102, the n102, the p104, and the n104 constitute a latch circuit LC.

(b) of FIG. 75 is a timing chart showing an operation of the FF900, and (c) of FIG. 75 is a truth table of the FF900.

In a case where the SB signal is active (=low) and the R signal is inactive (=high) (a time period t1 shown in (b) of FIG. 75), the FF900 operates as described below. When the SB signal is turned to be active (=low), the p100 (set circuit SC) is turned on. This causes the Q terminal to be electrically connected to the VDD (high potential power source) via the p100. The Q signal is therefore turned to be active (=high). The SB terminal is electrically connected to the gate of the n103. Since the n103 (latch releasing circuit LRC) is in an off state during a time period in which the SB signal is low, the Q terminal is not short-circuited with the VSS (low potential power source). Accordingly, it is possible to maintain the Q signal to be active (=high) stably. The Q terminal is connected to the gate of the p104 and the gate of the n104. For this reason, during a time period in which the Q signal is high, the p104 is in the off state and the n104 is in an on state. Accordingly, the QB terminal is connected to the VSS (low potential power source) via the n104 electrically, so that the QB signal is turned to be active (=low). The QB terminal is connected to the gate of the p102 and the gate of the n102. For this reason, during a time period in which the QB signal is low, the p102 is in the on state and the n102 is in the off state. Further, during a time period in which the R signal is low, the p101 (latch releasing circuit LRC) is in the on state. Accordingly, the Q terminal is electrically connected to the VDD (high potential power source) via the p101 and p102. As described above, during the time period t1, the Q signal is active (=high), while the QB signal is active (=low)(see A shown in (c) of FIG. 75).

In a case where the SB signal is inactive (=high) and the R signal is inactive (=low) (a time period t2 shown in (b) of FIG. 75), the FF900 operates as described below. When the R signal is turned to be low and the SB signal is turned to be high, the n103 is turned on. In this case, both the p101 and the n103 (latch releasing circuits LRC) are in the on state, so that the latch circuit is constituted by (i) an inverter constituted by the p102 and the n102 and (ii) another inverter constituted by the p104 and the n104 (the latch circuit LC is turned on). Here, since both the p100 (set circuit SC) which supplies VDD to the Q terminal and the n100 (reset circuit RC) which supplies Vss to the Q terminal are in the off state, no electric potential is supplied to the latch circuit LC. In such a latch state, a state in which the SB signal has not been changed is retained, that is, the state of the time period t1 (the Q signal is high, while the QB signal is low) is retained during the time period t2 (see C shown in (c) of FIG. 75).

In a case where the SB signal is inactive (=high) and the R signal is active (=high) (a time period t3 shown in (b) of FIG. 75), the FF900 operates as described below. When the R signal is turned to be active (=high), the n100 (reset circuit RC) is turned on. Since the SB signal is high, the n101 (priority determining circuit PDC) is in the on state. Since both the n100 and the n101 are in the on state, the Q terminal is connected to the VSS electrically. The p101 (latch determining circuit) is in the off state during a time period in which the R signal is high, so that the Q terminal and the VDD would not be short-circuited with each other. Accordingly, it is possible to maintain the Q signal to be inactive (=low) stably. Further, since the n104 is in the off state and the p104 is in the on state during a time period in which the Q signal is low, the QB terminal is connected to the VDD electrically. As a result, the QB signal is turned to be high. Furthermore, during a time period in which the QB signal is high and the SB signal is high, (i) both the n102 and the n103 (latch releasing circuit LRC) are in the on state and (ii) the p102 is in the off state. Accordingly, the Q terminal is connected to the VSS via the n102 and the n103 electrically. As described above, during the time period t3, the Q signal is inactive (=low) and the QB signal is inactive (=high) (see D shown in (c) of FIG. 75).

In a case where the SB signal is inactive (=high) and the R signal is inactive (=low) (a time period t4 shown in (b) of FIG. 75), the FF900 operates as described below. When the SB signal is turned to be high and the R signal is turned to be low, both the p101 and the n103 (latch releasing circuits LRC) are turned on. This turns on the latch circuit LC. Accordingly, the state in which the R signal has not been changed is retained, that is, the state of the time period t3 (the Q signal is low, while the QB signal is high) is retained during the time period t4.

The initial bar signal (initialization signal), i.e., the INITB signal, is inactive (=high) in a normal state, so that the p103 (initialization circuit IC) is in the off state in the normal state. For initialization of the flip-flop, it is possible to determine an output (Q signal) of the flip-flop forcibly by turning the INITB signal to be active. In the FF900, when the INITB signal is turned to be active (=low), the p103 is turned on. This causes the QB terminal and the VDD to be electrically connected to each other, so that the QB signal is turned to be high. The n102 is in the on state during a time period in which the QB signal is high. Further, the n103 is in the on state during a time period in which the SB signal is inactive (high). Accordingly, the Q terminal is connected to the VSS via the n102 and the n103 electrically, so that the Q signal is turned to be inactive (=low).

Note that the n101 (priority determining circuit) determines which one of the SB signal and the R signal has priority, in a case where both the SB signal and the R signal are turned to be active simultaneously. In the FF900, in the case where the SB signal is turned to be active (=low) and the R signal is turned to be active (=high), both the p100 and the n100 are turned on. In this case, the n101 (priority determining circuit) is turned off so that the reset circuit RC and the VSS are disconnected from each other electrically, and the Q terminal is connected to the VDD via the p100 electrically. In other words, the SB signal has priority.

CITATION LIST

Patent Literature

Patent Literature 1
Japanese Patent Application Publication, Tokukai, No. 2001-135093 A (Publication Date: May 18, 2001)

SUMMARY OF INVENTION

Technical Problem

In the conventional flip-flop described above, a large area is required for the circuit. This has been an obstacle to a reduction in size of a device (such as a shift register and various display drivers) including the conventional flip-flop.

An object of the present invention is to provide a compact flip-flop or various compact display drivers.

Solution to Problem

A flip-flop of the present invention includes: a first transistor which is a P channel transistor; a second transistor which is an N channel transistor; a third transistor which is a P channel transistor; a fourth transistor which is an N channel transistor; a plurality of input terminals; a first output terminal; a second output terminal; and an input transistor, the first transistor and the second transistor constituting a first CMOS circuit such that their gate terminals are connected to each other and their drain terminals are connected to each other, the third transistor and the fourth transistor constituting a second CMOS circuit such that their gate terminals are connected to each other and their drain terminals are connected to each other, the first output terminal being connected to a gate side of the first CMOS circuit and a drain side of the second CMOS circuit, the second output terminal being connected to a gate side of the second CMOS circuit and a drain side of the first CMOS circuit, the input transistor being such that its gate terminal is connected to one of the plurality of input terminals and its source terminal is connected to another one of the plurality of input terminals. Note that a drain terminal of the input transistor is connected to the first output terminal directly or indirectly (via a relay transistor).

In the present specification, one (on an output side) of two conductive electrodes of a transistor (a P channel transistor or an N channel transistor) is referred to as "drain terminal". With the arrangement described above, in a case where both signals supplied to the different input terminals are turned to be active simultaneously, one of the signals supplied to the different input terminals can be outputted while the one of the signals has priority without provision of a priority determining circuit, which has been required in a conventional flip-flop. This makes it possible to provide a further compact flip-flop.

Advantageous Effects of Invention

As described above, with the arrangement, it becomes possible to provide a compact flip-flop, a compact shift register, or a compact display drive circuit.

BRIEF DESCRIPTION OF DRAWINGS

FIG. 33 is a circuit diagram illustrating each of a plurality of stages of a shift register of the display device illustrated in FIG. 32.

FIG. 43 is a circuit diagram illustrating each of a plurality of stages of a shift register of the display device illustrated in FIG. 42.

FIG. 52 is a circuit diagram illustrating each of a plurality of stages of a shift register of the display device illustrated in FIG. 51.

FIG. 54 is a circuit diagram illustrating a NAND circuit in the shift register of the display device illustrated in FIG. 51.

FIG. 55 is a view schematically illustrating another arrangement of the display device of the present invention.

FIG. 61 is a view schematically illustrating another arrangement of the display device of the present invention.

FIG. 62 is a circuit diagram illustrating each of a plurality of stages of a shift register of the display device illustrated in FIG. 61.

FIG. 65 is a circuit diagram illustrating each of a plurality of stages of a shift register of the display device illustrated in FIG. 64.

FIG. 66 is a view schematically illustrating another arrangement of the display device of the present invention.

FIG. 68 is a view schematically illustrating another arrangement of the display device of the present invention.

DESCRIPTION OF EMBODIMENTS

Figure 74:
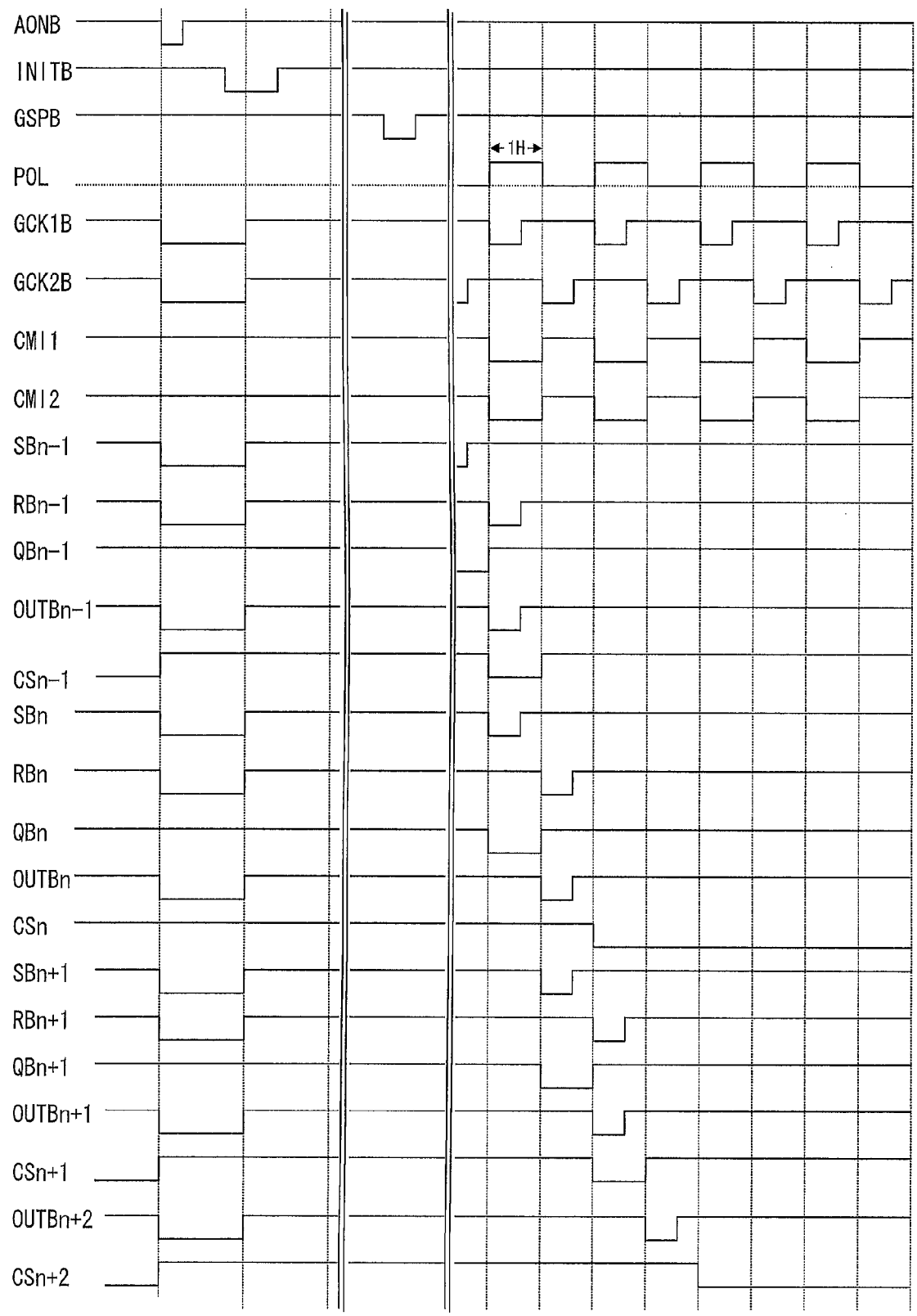
FIG. 74 is a timing chart showing another modified example of either FIG. 40 or FIG. 44.
Figure 75:
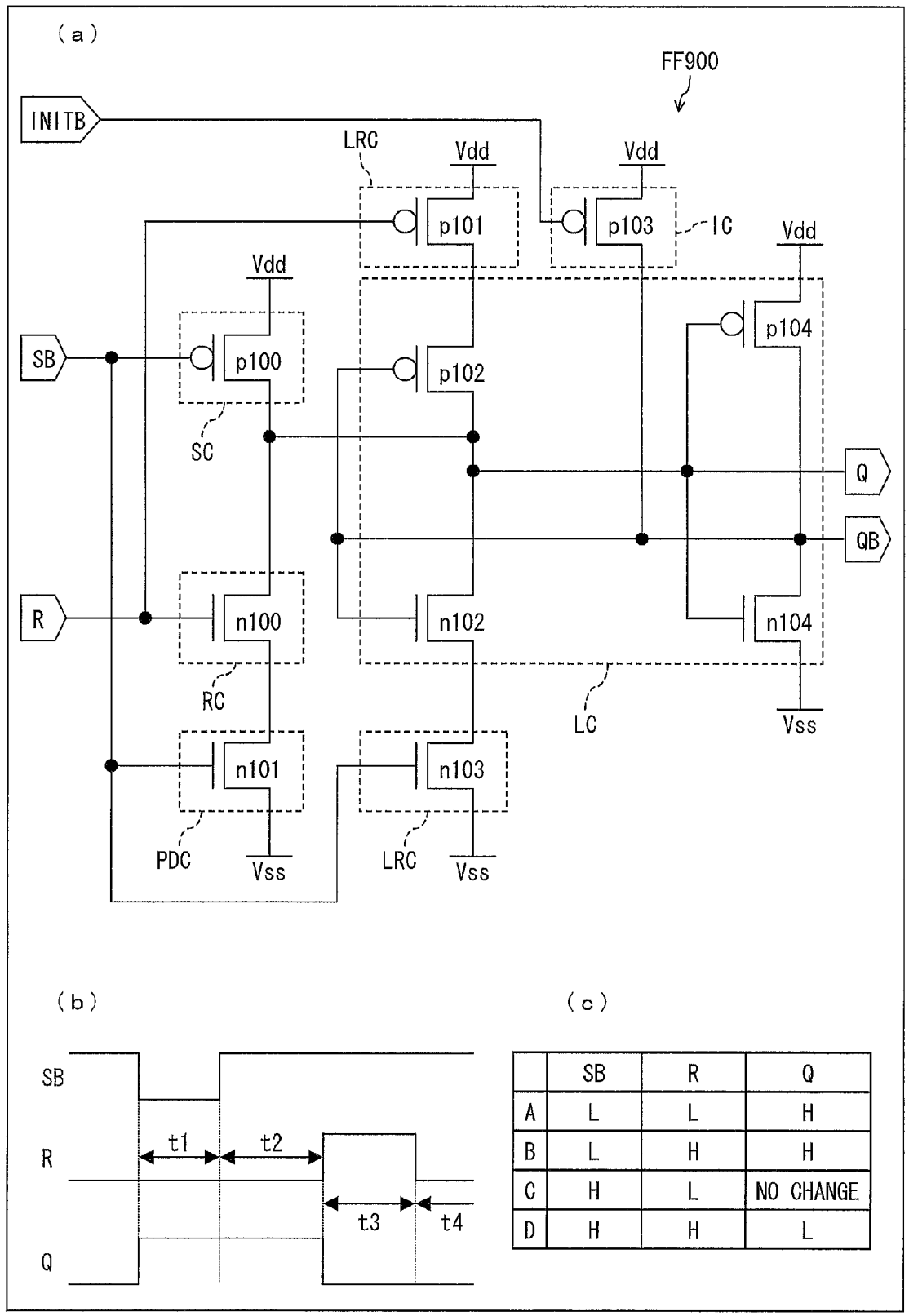
FIG. 75 is a circuit diagram illustrating an arrangement of a conventional flip-flop.

Embodiments of the present invention are described below with reference to FIGS. 1 through 74. In the following descriptions, a set-reset flip-flop (hereinafter, referred to as "FF", as appropriate) receives (i) a set signal (S signal or SB signal) via a set terminal (S terminal or SB terminal), (ii) a reset signal (R signal or RB signal) via a reset terminal (R terminal or RB terminal), and (iii) an initialization signal (INIT signal or INITB signal) via an initialization terminal (INIT terminal or INITB terminal). Further, the set-reset flip-flop outputs (i) a Q signal via an output terminal (Q terminal) and (ii) a QB signal via an inversion output terminal (QB terminal). Note that an electric potential of a high potential power source (VDD) is Vdd (hereinafter, referred to as "high", as appropriate), and an electric potential of a low potential power source (VSS) is Vss (hereinafter, referred to as "low", as appropriate). The S signal (set signal), the R signal (reset signal), the INIT signal (initialization signal), and the Q signal (output signal) are high when these are active. The SB signal (set-bar signal), the RB signal (reset-bar signal), the INITB signal (initialization bar signal), and the QB signal (inversion output signal) are low when these are active.

[Flip-Flop in Accordance with Embodiment 1]

Figure 1:
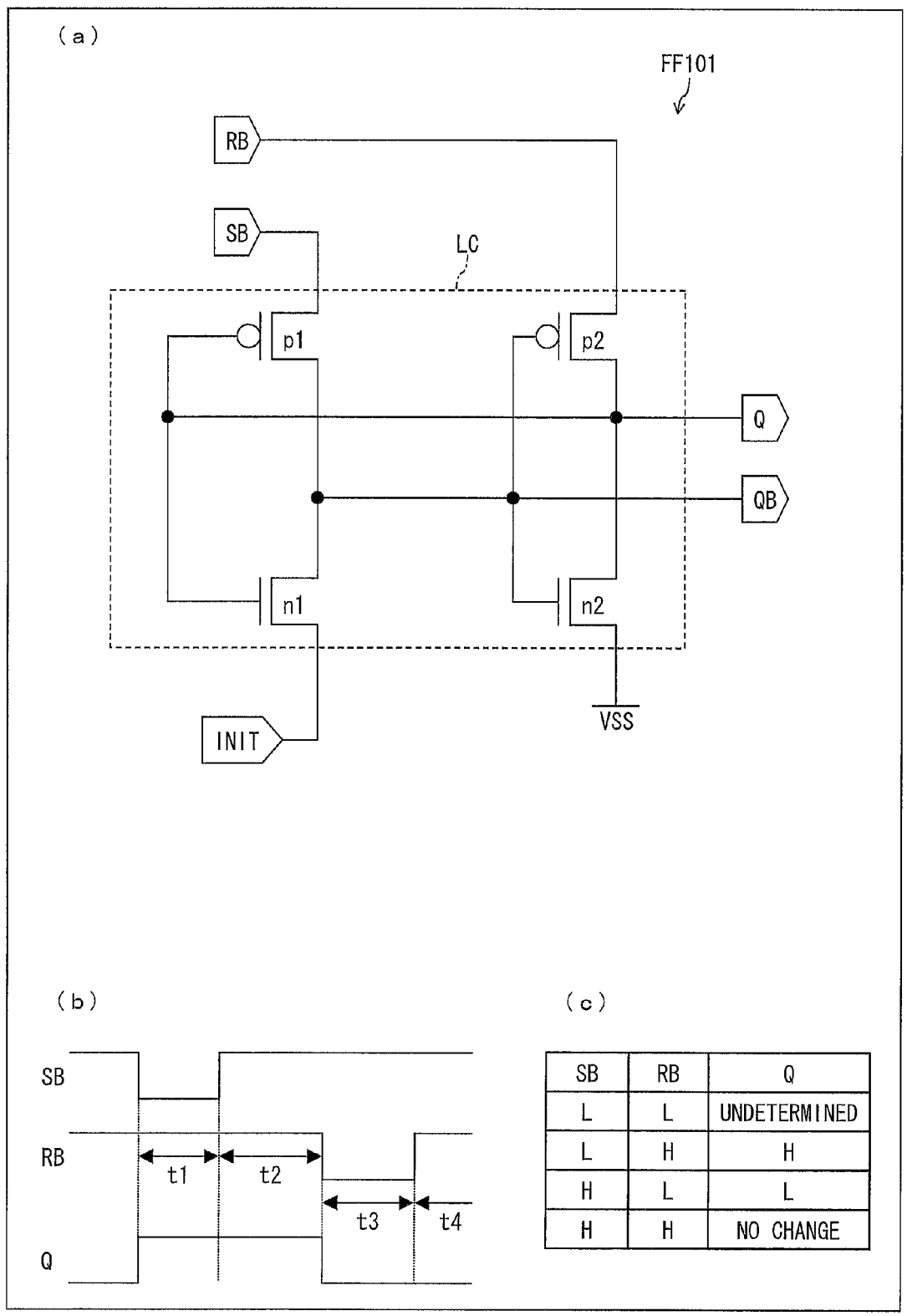
FIG. 1 is an explanatory view illustrating a flip-flop in accordance with Embodiment 1 of the present invention: (a) of FIG. 1 is a circuit diagram, (b) of FIG. 1 is a timing chart, and (c) of FIG. 1 is a truth table.

(a) of FIG. 1 is a circuit diagram illustrating an arrangement of a flip-flop in accordance with Embodiment 1 of the present invention. An FF 101 illustrated in (a) of FIG. 1 includes (i) a P channel transistor p1 and an N channel transistor n1, which constitute a CMOS circuit, (ii) a P channel transistor p2 and an N channel transistor n2, which constitute another CMOS circuit, (iii) an SB terminal, (iv) an RB terminal, (v) a Q terminal, (vi) a QB terminal, and (vii) an INIT terminal. The FF 101 has an arrangement in which (i) a gate of the p1, a gate of the n1, a drain of the p2, a drain of the n2, and the Q terminal are connected to each other, (ii) a drain of the p1, a drain of the n1, a gate of the p2, a gate of the n2, and the QB terminal are connected to each other, (iii) a source of the p1 is connected to the SB terminal, (iv) a source of the p2 is connected to the RB terminal, (v) a source of the n1 is connected to the INIT terminal, and (vi) a source of the n2 is connected to the VSS (low potential power source). Here, the p1, the n1, the p2, and the n2 constitute a latch circuit LC.

(b) of FIG. 1 is a timing chart showing an operation of the FF 101 (in a case where the INIT signal is inactive), and (c) of FIG. 1 is a truth table of the FF 101 (in the case where the INIT signal is inactive).

The following description deals with an operation of the FF 101 in a case where the SB signal is active (=low) and the RB signal is inactive (=high) (a time period t1). In a case where the Q signal is low and the QB signal is high, the p1 is in an on state. Under the circumstances, when the SB signal is turned to be active (=low), an electric potential at the QB terminal is reduced to Vss+Vth (threshold voltage). In a case where the electric potential at the QB terminal is reduced to be substantially equal to Vss, the p2 is turned on and the n2 is turned off (in a case where a threshold of the n2 is not less than the Vth, the n2 is completely turned off). Here, since the RB signal is inactive (=high=Vdd), the Q signal is turned to be high. The Q terminal is connected to the gate of the p1 and the gate of the n1. Accordingly, when the Q terminal is turned to be high, the p1 is turned off, and the n1 is turned on. During a time period other than a time period of initialization, the INIT signal is low (Vss). Accordingly, when the n1 is turned on, the QB signal is also turned to be low (Vss). In a case where the QB signal is low, the p2 is in the on state, and the n2 is in the off state. In this case, the Q terminal is disconnected from the VSS electrically, and outputs the RB signal (=high=Vdd). As described above, the QB signal starts being shifted to Vss+Vth instantaneously, but the Q signal is fed back by the latch circuit LC. As a result, the QB signal is maintained to be low (Vss) stably. Note that, when the SB signal is shifted from a high state to a low state, the drain of the p1 is not connected electrically to any transistor that is in the on state. Accordingly, no latch releasing circuit is necessary.

The following description deals with an operation of the FF 101 in a case where the SB signal is inactive (=high) and the RB signal is inactive (=high) (time period t2). The INIT signal is low (Vss) during the time period other than the time period of the initialization. Therefore, in the case where the SB signal and the RB signal are high, the latch circuit LC is turned on. Accordingly, a state in which the SB signal has not been changed is retained. That is, the state of the t1 (the Q signal is high and the QB signal is low) is retained during the t2.

The following description deals with an operation of the FF 101 in a case where the SB signal is inactive (=high) and the RB signal is active (=low) (time period t3). In a case where the Q signal is high and the QB signal is low, the p2 is in the on state. Under the circumstances, in a case where the RB signal is turned to be active (=low), an electric potential at the Q terminal is reduced to Vss+Vth (threshold voltage). When the electric potential at the Q terminal is reduced to be substantially equal to Vss, the p1 is turned on and the n1 is turned off (in a case where a threshold of the n1 is not less than Vth, the n1 is completely turned off). Here, the SB signal is inactive (=high=Vdd), so that the QB signal is turned to be high. The QB terminal is connected to the gate of the p2 and the gate of the n2. Accordingly, when the QB signal is turned to be high, the p2 is turned off and the n2 is turned on. When the n2 is turned on, the Q terminal is connected to the VSS electrically and therefore the Q signal is turned to be low (Vss). In the case where the Q terminal is low, the p1 is in the on state and the n1 is in the off state. Accordingly, the QB terminal is disconnected from the INIT terminal electrically, and outputs the SB signal (high=Vdd). As described above, the Q signal starts being shifted toward Vss+Vth instantaneously, but the QB signal is fed back by the latch circuit LC and therefore the Q signal is maintained to be low (Vss) stably. Note that the drain of the p2 is not connected electrically to any transistor that is in the on state, when the RB signal is shifted from the high state to the low state. Accordingly, no latch releasing circuit is necessary.

The following description deals with an operation of the FF 101 in a case where the SB signal is inactive (=high) and the RB signal is inactive (=high) (time period t4). The INIT signal is low (Vss) during the time period other than the time period of the initialization. Therefore, in the case where the SB signal is high and the RB signal is high, the latch circuit LC is turned on. Accordingly, a state in which the RB signal has not been changed is retained, that is, the state of the t3 (the Q signal is low and the QB signal is high) is retained during the t4.

The following description deals with an operation of the FF 101 in a case where the INIT signal is active (=high) (initialization). In the case where the Q signal is low and the QB signal is high, the n1 is in the off state. Under the circumstances, in a case where the INIT signal is turned to be high, there is no influence on the output of the flip-flop (the Q signal is low and the QB signal is high). In the case where the Q signal is high and the QB signal is low, the n1 is in the on state. Under the circumstances, in the case where the INIT signal is turned to be high, the electric potential at the QB terminal is increased to Vdd−Vth (threshold voltage). When the electric potential at the QB terminal is increased to be substantially equal to Vdd, the n2 is turned on and the p2 is turned off (in a case where a threshold of the p2 is not less than Vth, the p2 is completely turned off). In this case, the Q terminal is connected to the VSS electrically, so that the Q signal is turned to be low (=Vss). The Q terminal is connected to the gate of the p1 and the gate of the n1. Accordingly, when the Q signal is turned to be low, the n1 is turned off and the p1 is turned on. Here, the SB signal is inactive (=high=Vdd), so that the QB signal is turned to be high. In the case where the QB signal is high, the n2 is in the on state and the p2 is in the off state. Accordingly, the Q terminal is disconnected from the RB terminal electrically, and outputs low (Vss). As described above, the QB signal starts being shifted toward Vdd−Vth instantaneously, but the Q signal is fed back by the latch circuit LC. Accordingly the QB signal is maintained to be high (Vdd) stably. With the method described above, it is possible to carry out the initialization without provision of an initialization circuit.

In a case where both the SB signal and the RB signal are active (=low), the p1, the p2, the n1, and the n2 are turned off (floating state) when both the Q terminal and the QB terminal become equal to Vss+Vth. In this case, the outputs (the Q signal, the QB signal) are in an undetermined state.

As described above, the FF 101 has the arrangement in which (i) the p1, the n1, the p2, and the n2 (two CMOS circuits) constitute a latch circuit, (ii) the source of the p1 is connected to the SB terminal, (iii) the source of the p2 is connected to the RB terminal, and (iv) the source of the n1 is connected to the INIT terminal. With the arrangement, it is possible to carry out a setting operation, a latching operation, a resetting operation, and an initializing operation without a set circuit, a reset circuit, a latch releasing circuit, and an initialization circuit each of which has been required in a conventional flip-flop (see FIG. 70).

Figure 21:
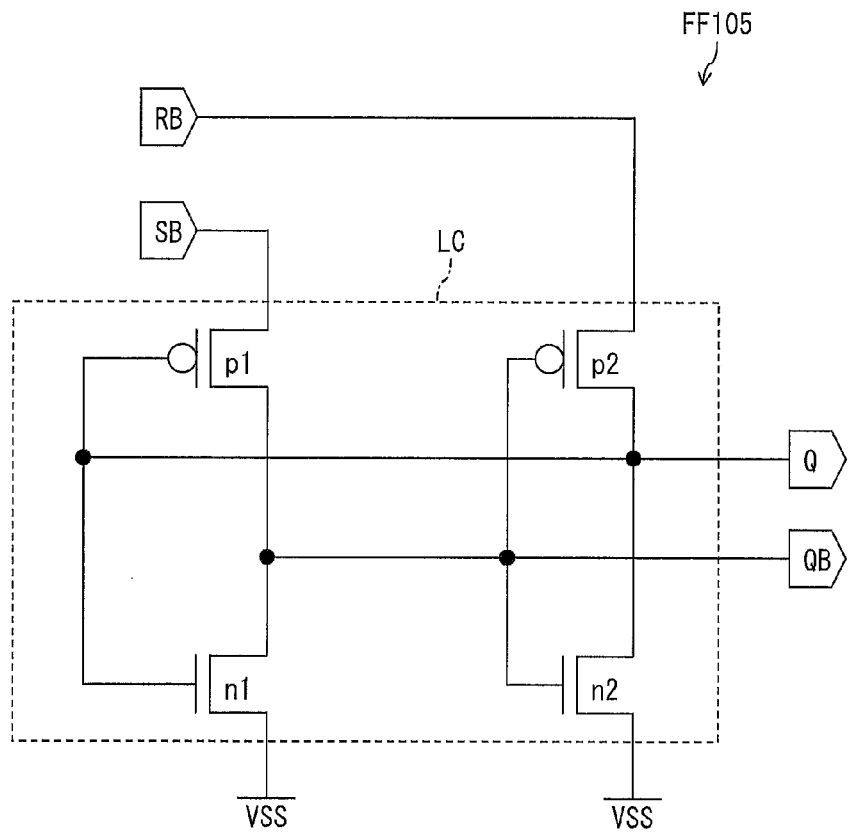
FIG. 21 is an explanatory view illustrating another flip-flop in accordance with Embodiment 1 of the present invention: (a) of FIG. 21 is a circuit diagram, and (b) of FIG. 21 is a truth table.

It is possible to modify the arrangement illustrated in (a) of FIG. 1 such that the source of the n1 is connected to the VSS, as in an FF 105 illustrated in (a) of FIG. 21. (b) of FIG. 21 shows a truth table of the FF 105.

Figure 2:
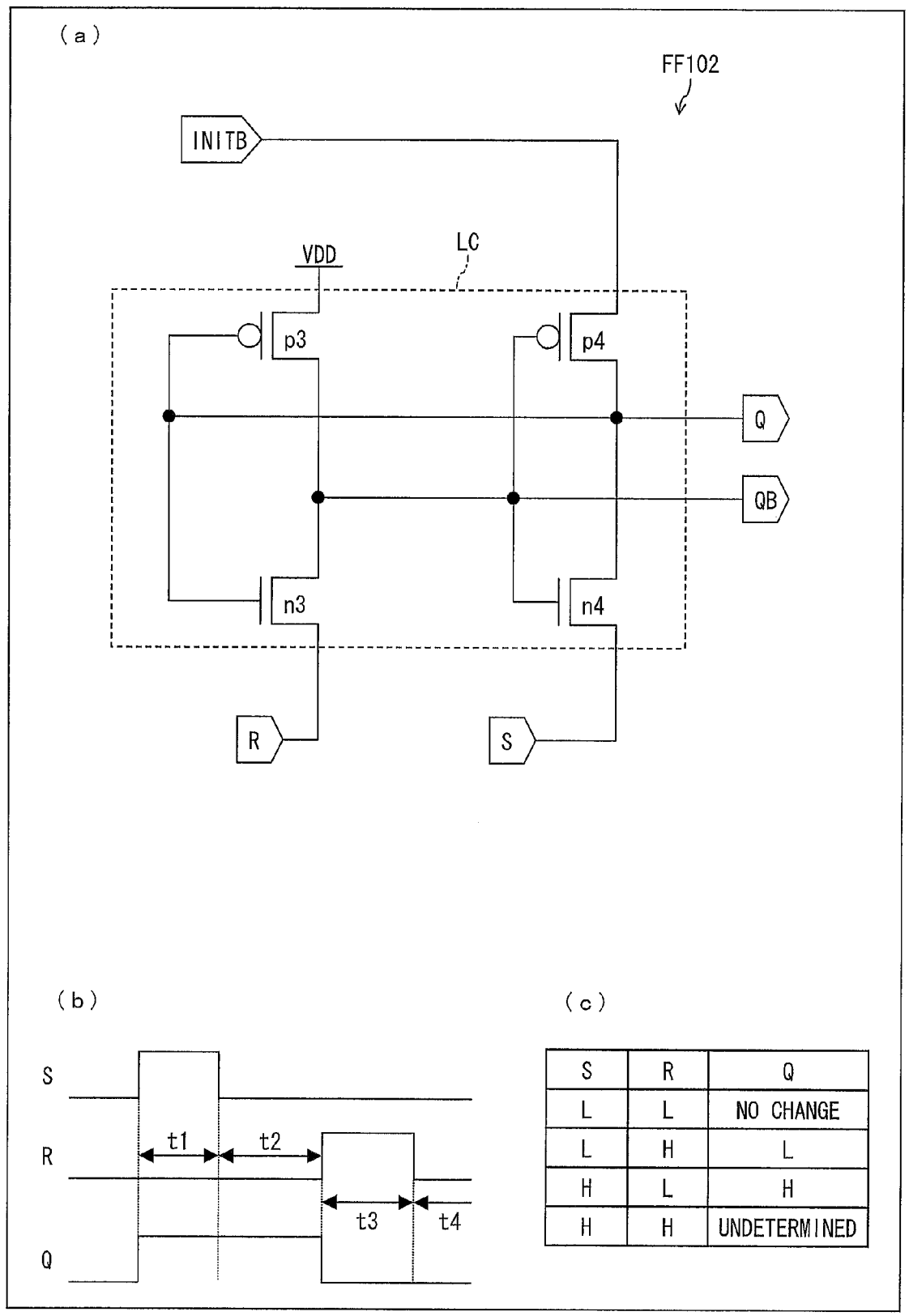
FIG. 2 is an explanatory view illustrating another flip-flop in accordance with Embodiment 1 of the present invention: (a) of FIG. 2 is a circuit diagram, (b) of FIG. 2 is a timing chart, and (c) of FIG. 2 is a truth table.

(a) of FIG. 2 is a circuit diagram illustrating an arrangement, of an FF 102, which is a modified example of (a) of FIG. 1. The FF 102 illustrated in (a) of FIG. 2 includes (i) a P channel transistor p3 and an N channel transistor p4 which constitute a CMOS circuit, (ii) a P channel transistor p4 and an N channel transistor n4 which constitute another CMOS circuit, (iii) an S terminal, (iv) an R terminal, (v) a Q terminal, (vi) a QB terminal, and (vii) an INITB terminal. The FF 102 has an arrangement in which (i) a gate of the p3, a gate of the n3, a drain of the p4, a drain of the n4, and the Q terminal are connected to each other, (ii) a drain of the p3, a drain of the n3, a gate of the p4, a gate of the n4, and the QB terminal are connected to each other, (iii) a source of the n4 is connected to the S terminal, (iv) a source of the n3 is connected to the R terminal, (v) a source of the p4 is connected to the INITB terminal, and (vi) a source of the p3 is connected to a VDD (high potential power source). Here, the p3, the n3, the p4, and the n4 constitute a latch circuit LC.

(b) of FIG. 2 is a timing chart showing an operation of the FF 102 (in a case where an INITB signal is inactive), and (c) of FIG. 2 is a truth table of the FF 102 (in the case where the INITB signal is inactive). A Q signal of the FF 102 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is in an undetermined state during a time period in which the S signal is high (active) and the R signal is high (active) (see (b) and (c) of FIG. 2).

Figure 19:
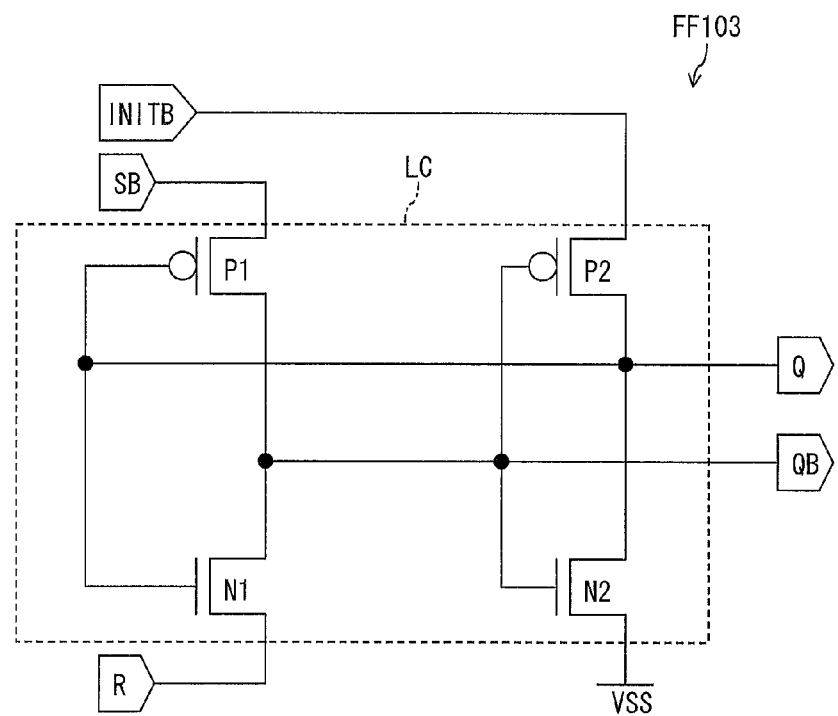
FIG. 19 is an explanatory view illustrating another flip-flop in accordance with Embodiment 1 of the present invention: (a) of FIG. 19 is a circuit diagram, and (b) of FIG. 19 is a truth table.

(a) of FIG. 19 is a circuit diagram illustrating another arrangement of the flip-flop in accordance with Embodiment 1 of the present invention. An FF 103 illustrated in (a) of FIG. 19 includes (i) a P channel transistor P1 and an N channel transistor N1 which constitute a CMOS circuit, (ii) a P channel transistor P2 and an N channel transistor N2 which constitute another CMOS circuit, (iii) an SB terminal, (iv) an R terminal, (v) an INITB terminal, (vi) a Q terminal, and (vii) a QB terminal. The FF 103 has an arrangement in which (i) a gate of the P1, a gate of the N1, a drain of the P2, a drain of the N2, and the Q terminal are connected to each other, (ii) a drain of the P1, a drain of the N1, a gate of the P2, and a gate of the N2 are connected to each other, (iii) a source of the P1 is connected to the SB terminal, (iv) a source of the N1 is connected to the R terminal, (v) a source of the P2 is connected to the INITB terminal, and (vi) a source of the N2 is connected to a VSS. Here, the P1, the N1, the P2, and the N2 constitute a latch circuit LC.

(b) of FIG. 19 is a truth table of the FF 103 (in a case where an INITB signal is inactive). A Q signal of the FF 103 is such that (i) it is in low (inactive) during a time period in which an SB signal is high (inactive) and an R signal is high (active), (ii) it is in a retention state during a time period in which the SB signal is high (inactive) and the R signal is low (inactive), (iii) it is in an undetermined state during a time period in which the SB signal is low (active) and the R signal is high (active), and (iv) it is high (active) during a time period in which the SB signal is low (active) and the R signal is low (inactive) (see (b) of FIG. 19).

Figure 20:
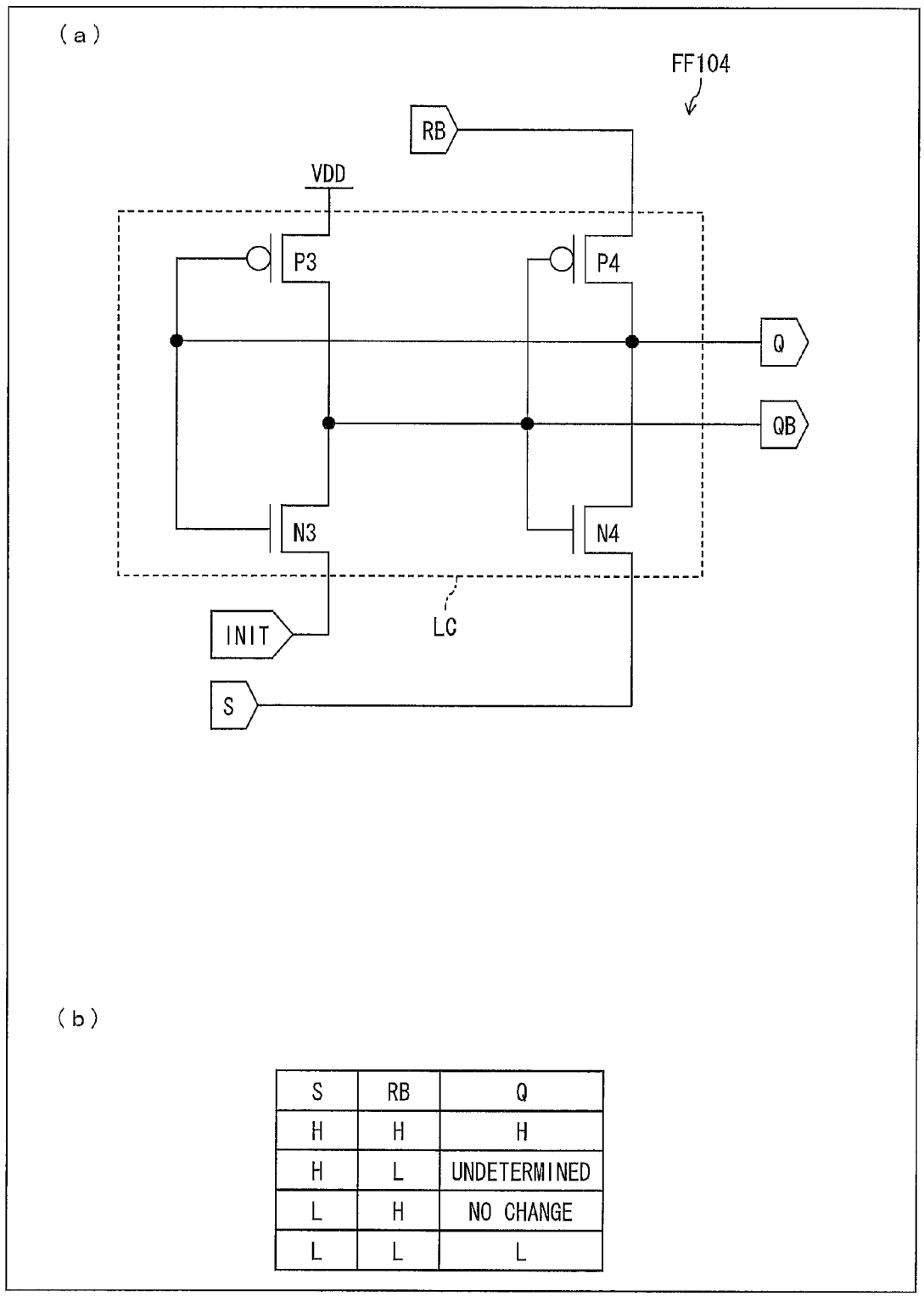
FIG. 20 is an explanatory view illustrating another flip-flop in accordance with Embodiment 1 of the present invention: (a) of FIG. 20 is a circuit diagram, and (b) of FIG. 20 is a truth table.

(a) of FIG. 20 is a circuit diagram illustrating an arrangement of a FF 104 which is a modified example of (a) of FIG. 19. The FF 104 illustrated in (a) of FIG. 20 includes (i) a P channel transistor P3 and an N channel transistor N3 which constitute a CMOS circuit, (ii) a P channel transistor P4 and an N channel transistor N4 which constitute another CMOS circuit, (iii) an S terminal, (iv) an RB terminal, (v) an INIT terminal, (vi) a Q terminal, and (vii) a QB terminal. The FF 104 has an arrangement in which (i) a gate of the P3, a gate of the N3, a drain of the P4, a drain of the N4, and the Q terminal are connected to each other, (ii) a drain of the P3, a drain of the N3, a gate of the P4, and a gate of the N4 are connected to each other, (iii) a source of the N4 is connected to the S terminal, (iv) a source of the P4 is connected to the RB terminal, (v) a source of the N3 is connected to the INIT terminal, and (vi) a source of the P3 is connected to a VDD. Here, the P3, the N3, the P4, and the N4 constitute a latch circuit LC.

(b) of FIG. 20 is a truth table of the FF 104 (in a case where an INITB signal is inactive). A Q signal of the FF 104 is such that (i) it is high (active) during a time period in which an S signal is high (active) and an RB signal is high (inactive), (ii) it is in an undetermined state during a time period in which the S signal is high (active) and the RB signal is low (active), (iii) it is in a retention state during a time period in which the S signal is low (inactive) and the RB signal is high (inactive), and (iv) it is low (inactive) during a time period in which the S signal is low (inactive) and the RB signal is low (active) (see (b) of FIG. 20).

[Flip-Flop in Accordance with Embodiment 2]

Figure 3:
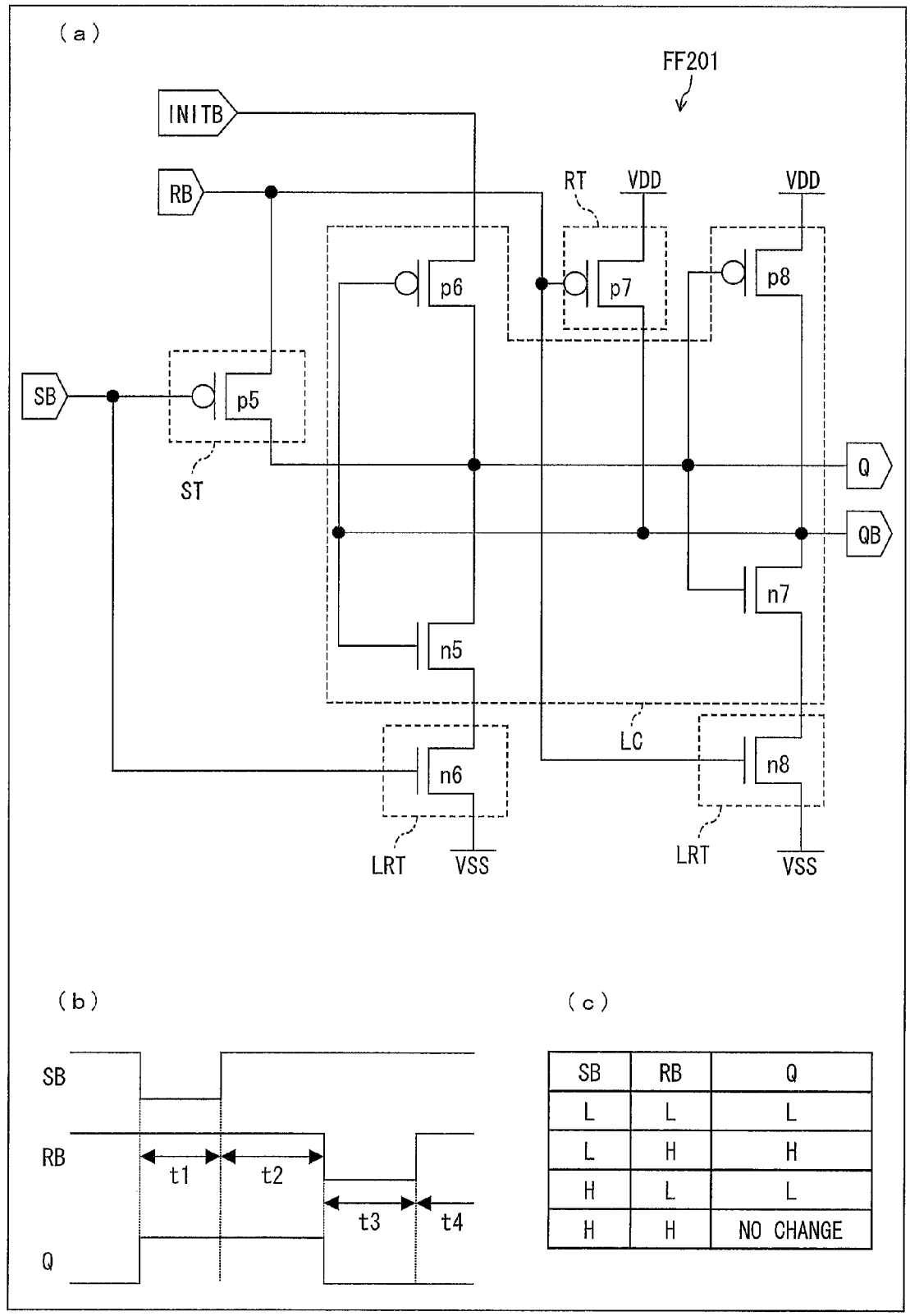
FIG. 3 is an explanatory view illustrating a flip-flop in accordance with Embodiment 2 of the present invention: (a) of FIG. 3 is a circuit diagram, (b) of FIG. 3 is a timing chart, and (c) of FIG. 3 is a truth table.

(a) of FIG. 3 is a circuit diagram illustrating an arrangement of a flip-flop in accordance with Embodiment 2 of the present invention. An FF 201 illustrated in (a) of FIG. 3 includes (i) a P channel transistor p6 and an N channel transistor n5 which constitute a CMOS circuit, (ii) a P channel transistor p8 and an N channel transistor n7 which constitute another CMOS circuit, (iii) P channel transistors p5 and p7, (iv) N channel transistors n6 and n8, (v) an SB terminal, (vi) an RB terminal, (vii) an INITB terminal, (viii) a Q terminal, and (ix) a QB terminal. The FF 201 has an arrangement in which (i) a gate of the p6, a gate of the n5, a drain of the p7, a drain of the p8, a drain of the n7, and the QB terminal are connected to each other, (ii) a drain of the p6, a drain of the n5, a drain of the p5, a gate of the p8, a gate of the n7, and the Q terminal are connected to each other, (iii) a source of the n5 and a drain of the n6 are connected to each other, (iv) a source of the n7 and a drain of the n8 are connected to each other, (v) a gate of the p5 and a gate of the n6 are connected to the SB terminal, (vi) a source of the p5, a gate of the p7, and a gate of the n8 are connected to the RB terminal, (vii) a source of the p6 is connected to the INITB terminal, (viii) a source of the p7 and a source of the p8 are connected to a VDD, and (ix) a source of the n6 and a source of the n8 are connected to a VSS. Here, the p6, the n5, the p8, and the n7 constitute a latch circuit LC. The p5 serves as a set transistor ST. The p7 serves as a reset transistor RT. The n6 serves as a latch releasing transistor (releasing transistor) LRT. The n8 serves as a latch releasing transistor (releasing transistor) LRT.

(b) of FIG. 3 is a timing chart showing an operation of an FF 201 (in a case where an INITB signal is inactive), and (c) of FIG. 3 is a truth table of the FF 201 (in the case where the INITB signal is inactive). A Q signal of the FF 201 is such that (i) it is low (inactive) during a time period in which an SB signal is low (active) and an RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) and (c) of FIG. 3).

For example, during a time period t1 shown in (b) of FIG. 3, the Q terminal receives Vdd from the RB terminal. This turns on the n7. Accordingly, the QB terminal receives Vss (low). Meanwhile, during a time period t2, the SB signal is turned to be high. This turns off the p5, and turns on the n6. Accordingly, the state of the t1 is maintained during the t2. During a time period t3, the RB signal is turned to be low. This turns on the p7. Accordingly, the QB terminal receives Vdd (high). Further, the n5 is turned on, so that the Q terminal receives Vss. In a case where both the SB signal and the RB signal are turned to be low (active), (i) the p7 is turned on and the QB terminal receives Vdd (high) and (ii) the Q terminal receives Vss+Vth (a threshold voltage of the p5) via the P5.

Moreover, in a case where both the SB signal and the RB signal are turned to be inactive in a time period in which the INITB signal is active, both a Q signal and a QB signal of the FF 201 are turned to be inactive.

For example, in a case where, in a time period in which the INITB signal is low (active), both the SB signal and the RB signal are changed from a state A in which both the SB signal and the RB signal are low (active) to a state X in which both the SB signal and the RB signal are high (inactive), outputs of the respective Q terminal and QB terminal are the same as those in the state A. This is because, (i) in the state A, the p7 is in the on state and the p6 is in the off state so that the QB terminal receives Vdd (high) and the Q terminal receives Vss, and (ii) the p6 is maintained to be in the off state in the state X. Further, in a case where, in a time period in which the INITB signal is low (active), the SB signal and the RB signal are changed from a state B in which the SB signal is high (inactive) and the RB signal is low (active) to the state X in which both the SB signal and the RB signal are high (inactive), the outputs of the respective Q terminal and QB terminal are the same as those in state B. This is because, (i), in the state B, the p7 and the p5 are in the on state so that the QB terminal receives Vdd (high) and the Q terminal receives Vss (low), and (ii) the p6 is maintained to be in the off state in the state X. Furthermore, in a case where, in the time period in which the INITB signal is low (active), the SB signal and the RB signal are changed from a state C in which the SB signal is low (active) and the RB signal is high (inactive) to the state X in which both the SB signal and the RB signal are high (inactive), the Q terminal receives Vss (low) and the QB terminal receives Vdd (high). That is, the outputs of the respective Q terminal and QB terminal are in an undetermined state in the state C. In a case where the p6 is turned on immediately before the SB signal and the RB signal are changed from the state C to the state X, the Q terminal is turned to be Vss+Vth (a threshold value of the p6) instantaneously. This turns on the p8, so that the QB terminal receives Vdd (high). In this case, the n5 to which the QB terminal is connected is turned on, so that the Q terminal receives Vss (low). Further, in a case where the p6 is turned off immediately before the SB signal and the RB signal are changed from the state C to the state X, that is, in a case where the p6 constituting the latch circuit LC is in the off state and the transistor n5 constituting the inverter is in the on state, the Q terminal receives Vss (low). This turns on the p8, the gate of which is connected to the Q terminal. Accordingly, the QB terminal receives Vdd (high). As described above, the Q terminal receives Vss (low) and the QB terminal receives Vdd (high) in the state X, regardless of what undetermined state the state C is.

As described above, the FF 201 has an arrangement in which (i) the p6, the n5, the p8, and the n7 (two CMOS circuits) constitute a latch circuit, (ii) the RB terminal is connected to (a) the gate of the p7 which serves as a reset transistor RT and (b) the source of the p5 which serves as a set transistor ST, and (iii) the source of the p6 is connected to the INITB terminal. With the arrangement, it is possible to carry out a setting operation, a latching operation, a resetting operation, priority determination (when both the SB signal and the RB signal are turned to be active simultaneously), and initialization, without provision of a priority determining circuit and an initializing circuit each of which has been required in a conventional flip-flop (see FIG. 70). As described above, in the FF 201, when the SB signal and the RB signal are turned to be active simultaneously, the RB signal (reset) has priority so that the output of the QB is turned to be inactive.

Figure 22:
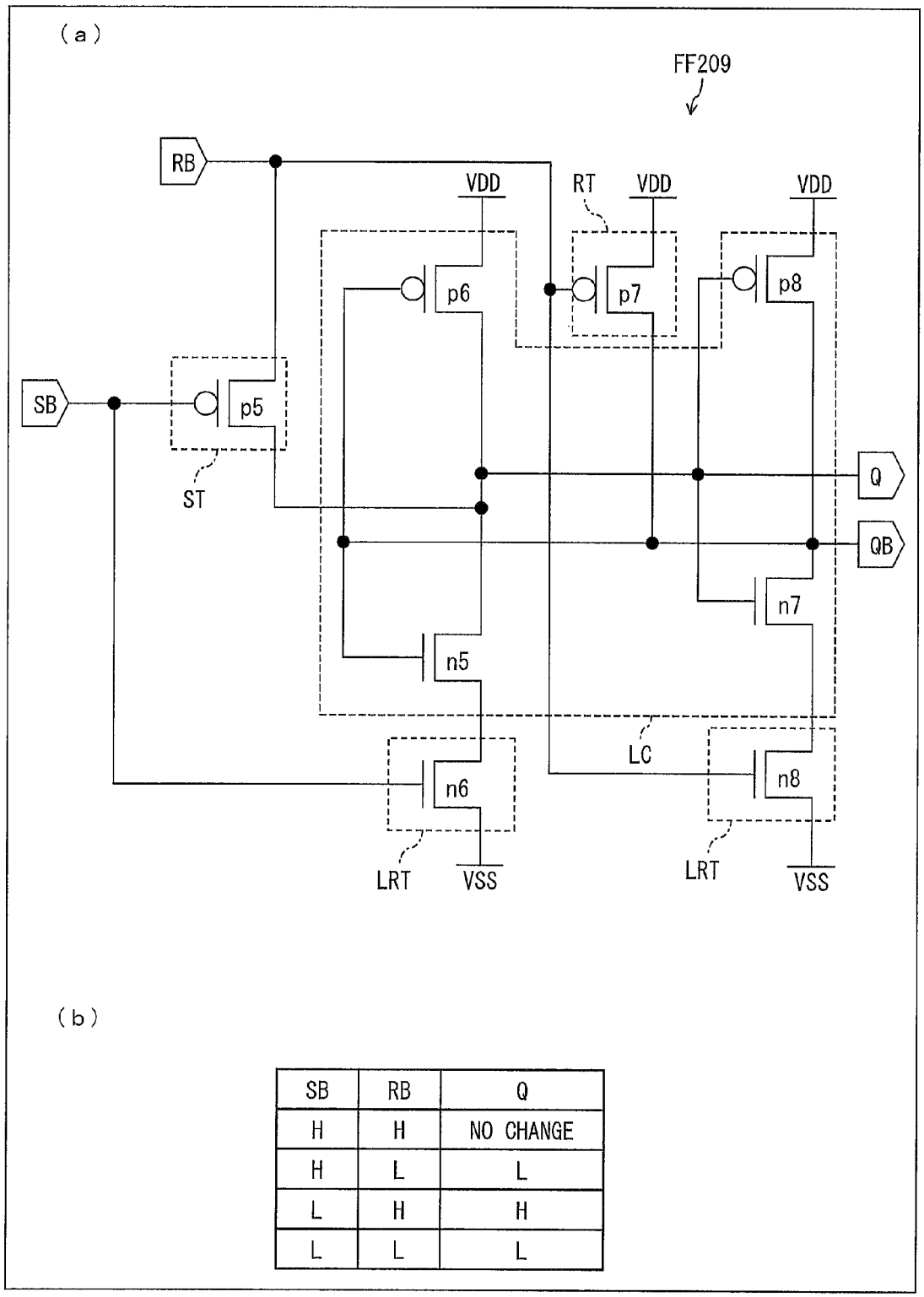
FIG. 22 is an explanatory view illustrating another flip-flop in accordance with Embodiment 2 of the present invention: (a) of FIG. 22 is a circuit diagram, and (b) of FIG. 22 is a truth table.

Note that, the FF 201 illustrated in (a) of FIG. 3 can be modified such that the source of the p6 is connected to the VDD, as in an FF 209 illustrated in (a) of FIG. 22. (b) of FIG. 22 is a truth table of the FF 209.

Figure 4:
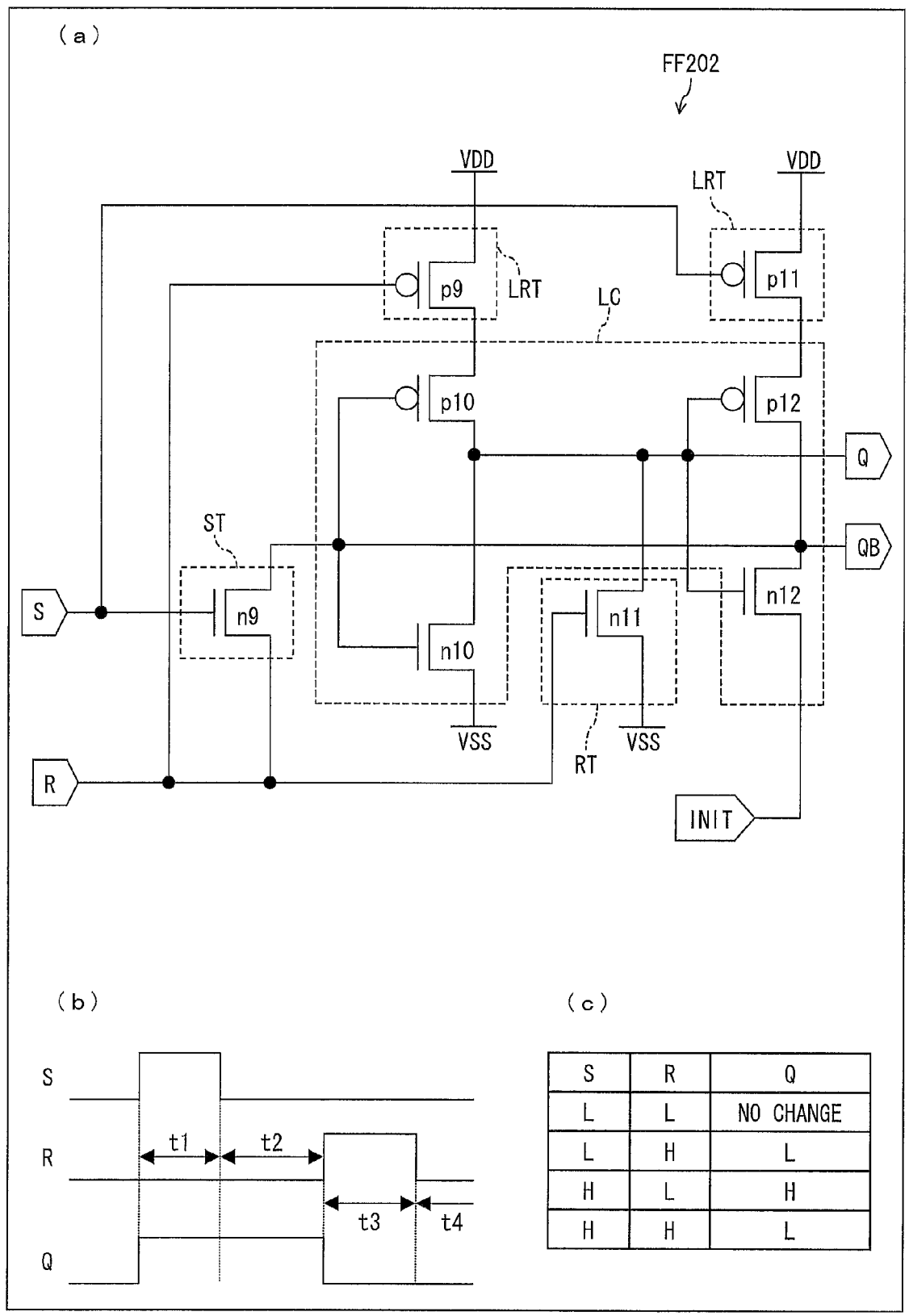
FIG. 4 is an explanatory view illustrating another flip-flop in accordance with Embodiment 2 of the present invention: (a) of FIG. 4 is a circuit diagram, (b) of FIG. 4 is a timing chart, and (c) of FIG. 4 is a truth table.

(a) of FIG. 4 is a circuit diagram illustrating an arrangement of an FF 202 which is a modified example of (a) of FIG. 3. The FF 202 illustrated in (a) of FIG. 4 includes (i) a P channel transistor p10 and an N channel transistor n10 which constitute a CMOS circuit, (ii) a P channel transistor p12 and an N channel transistor n12 which constitute another CMOS circuit, (iii) P channel transistors p9 and p11, (iv) N channel transistors n9 and n12, (v) an S terminal, (vi) an R terminal, (vii) an INIT terminal, (viii) a Q terminal, and (ix) a QB terminal. The FF 202 has an arrangement in which (i) a gate of the p10, a gate of the n10, a drain of the p12, a drain of the n12, a drain of the n9, and the QB terminal are connected to each other, (ii) a drain of the p10, a drain of the n10, a drain of the n10, a gate of the p12, a gate of the n12, a drain of the n11, and the Q terminal are connected to each other, (iii) a source of the p10 and a drain of the n9 are connected to each other, (iv) a source of the p12 and a drain of the p11 are connected to each other, (v) a gate of the n9 and a gate of the n11 are connected to the S terminal, (vi) a source of the n9, a gate of the p9, and a gate of the n11 are connected to the R terminal, (vii) a source of the n12 is connected to the INIT terminal, (viii) a source of the p9 and a source of the p11 are connected to a VDD, and (ix) a source of the n10 and a source of the n11 are connected to a VSS. Here, the p10, the n10, the p12, and the n12 constitute a latch circuit LC. The n9 serves as a set transistor ST. The n11 serves as a reset transistor RT. The p9 serves as a latch releasing transistor LRT, and the p11 also serves as the latch releasing transistor LRT.

(b) of FIG. 4 is a timing chart showing an operation of the FF 202 (in a case where an INIT signal is inactive), and (c) of FIG. 4 is a truth table of the FF 202 (in the case where the INIT signal is inactive). A Q signal of the FF 202 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is low (inactive) during a time period in which the S signal is high (active) and the R signal is high (active) (see (b) and (c) of FIG. 4).

Further, in a case where both the S signal and the R signal are turned to be inactive in a time period in which the INIT signal is active, both a Q signal and a QB signal of the FF 202 are turned to be inactive.

Figure 7:
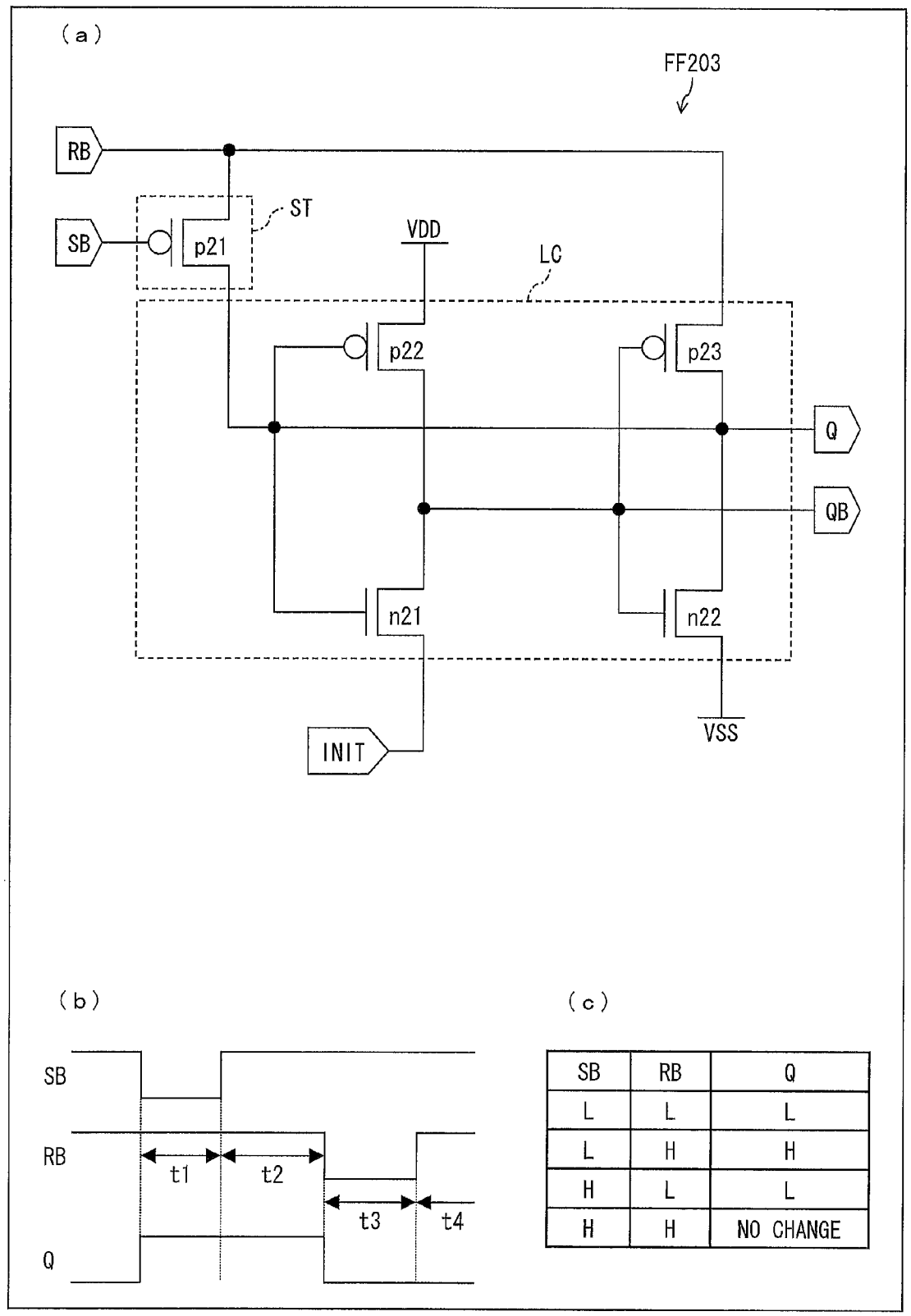
FIG. 7 is an explanatory view illustrating another flip-flop in accordance with Embodiment 2 of the present invention: (a) of FIG. 7 is a circuit diagram, (b) of FIG. 7 is a timing chart, and (c) of FIG. 7 is a truth table.

(a) of FIG. 7 is a circuit diagram illustrating another arrangement of the flip-flop in accordance with Embodiment 2 of the present invention. An FF 203 illustrated in (a) of FIG. 7 includes (i) a P channel transistor p22 and an N channel transistor n21 which constitute a CMOS circuit, (ii) a P channel transistor p23 and an N channel transistor n22 which constitute another CMOS circuit, (iii) a P channel transistor p21, (iv) an SB terminal, (v) an RB terminal, (vi) an INIT terminal, (vii) a Q terminal, and (viii) a QB terminal. The FF 203 has an arrangement in which (i) a gate of the p22, a gate of the n21, a drain of the p23, a drain of the n22, a drain of the p21, and the Q terminal are connected to each other, (ii) a drain of the p22, a drain of the n21, a gate of the p23, a gate of the n22, and the QB terminal are connected to each other, (iii) a gate of the p21 is connected to the SB terminal, (iv) a source of the p21 and a source of the p23 are connected to the RB terminal, (v) a source of the n21 is connected to the INIT terminal, and (vi) a source of the n22 is connected to a VSS. Here, the p22, the n21, the p23, and the n22 constitute a latch circuit LC, and the p21 serves as a set transistor ST.

(b) of FIG. 7 is a timing chart showing an operation of the FF 203 (in a case where an INIT signal is inactive), and (c) of FIG. 7 is a truth table of the FF 203 (in the case where the INIT signal is inactive). A Q signal of the FF 203 is such that (i) it is low (inactive) during a time period in which an SB signal is low (active) and an RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) and (c) of FIG. 7).

For example, during a time period t1 shown in (b) of FIG. 7, the Q terminal receives Vdd (high) from the RB terminal. Accordingly, the n21 is turned on, so that the QB terminal receives Vss (low). Then, during a time period t2, the SB signal is turned to be high, so that the p21 is turned off. Accordingly, the state of the t1 is maintained. During a time period t3, the RB signal is turned to be low. Accordingly, the Q terminal temporarily receives Vss+Vth (a threshold voltage of the p23) via the p23. This turns on the p22, so that the QB terminal receives Vdd (high). Further, since the QB terminal receives Vdd, the n22 is turned on. Accordingly, the Q terminal receives Vss. Note that in a case where both the SB signal and the RB signal are turned to be low (active), the Q terminal temporarily receives Vss+Vth via the p21. This turns on the p22, so that the QB terminal receives Vdd (high). Further, since the QB terminal receives Vdd, the n22 is turned on. Accordingly, the Q terminal receives Vss.

As described above, the FF 203 has an arrangement in which (i) the p22, the n21, the p23, and the n22 (two CMOS circuits) constitute a latch circuit, (ii) the RB terminal is connected to (a) the source of the p21 which serves as a set transistor ST and (b) the source of the p23, and (iii) the source of the n21 is connected to the INIT terminal. With the arrangement, it is possible to carry out a setting operation, a latching operation, a resetting operation, priority determination (when the SB signal and the RB signal are turned to be active simultaneously), and initialization, without provision of a reset circuit, a latch releasing circuit, a priority determining circuit, and an initialization circuit, each of which has been required in a conventional flip-flop (see FIG. 70). As described above, when the SB signal and the RB signal of the FF 203 are turned to be active simultaneously, the RB signal (reset) has priority so that the outputs of the respective Q terminal and QB terminal are turned to be inactive.

Figure 8:
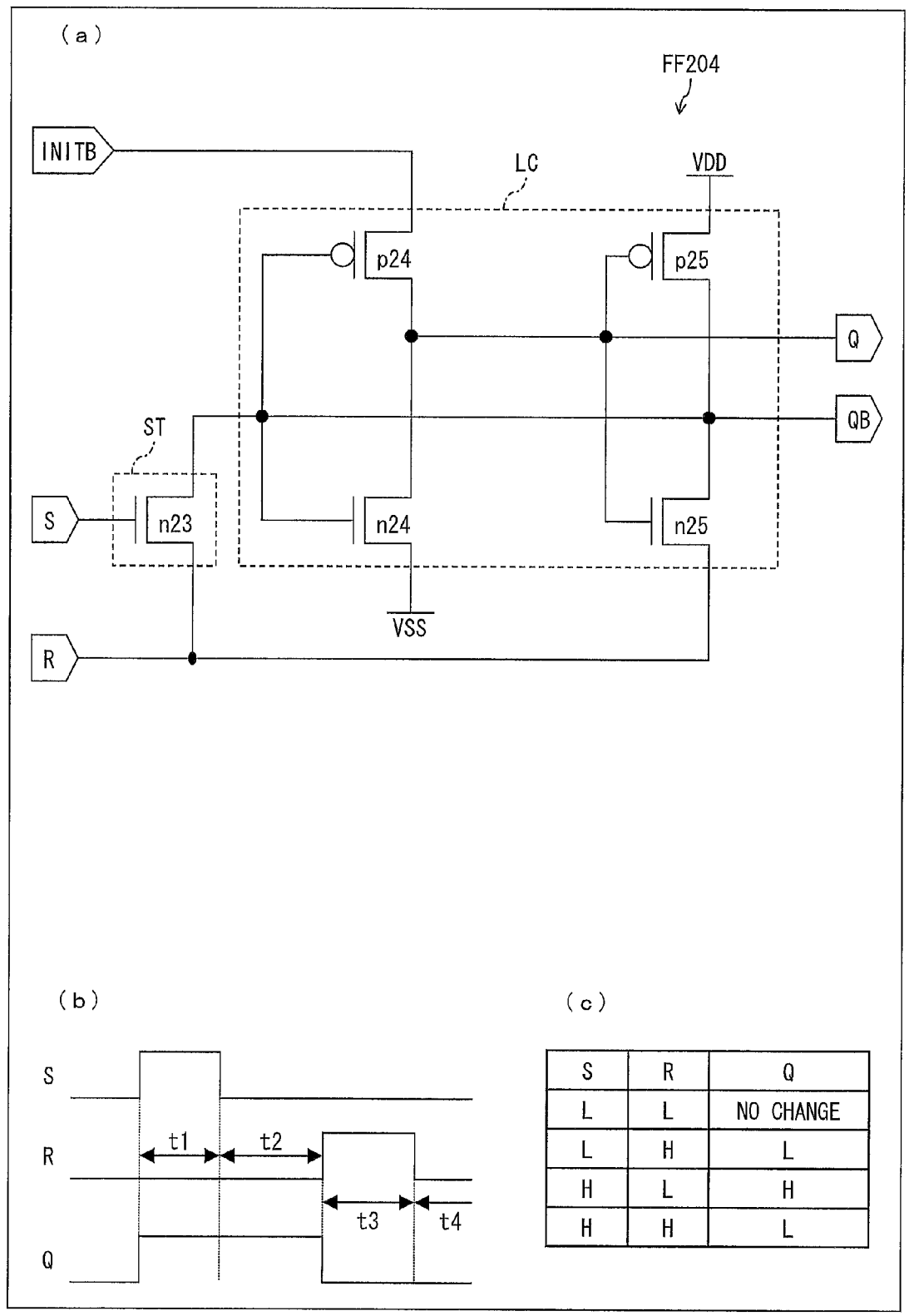
FIG. 8 is an explanatory view illustrating another flip-flop in accordance with Embodiment 2 of the present invention: (a) of FIG. 8 is a circuit diagram, (b) of FIG. 8 is a timing chart, and (c) of FIG. 8 is a truth table.

(a) of FIG. 8 is a circuit diagram illustrating an arrangement of an FF 204 which is a modified example of (a) of FIG. 7. The FF 204 illustrated in (a) of FIG. 8 includes (i) a P channel transistor p24 and an N channel transistor n24 which constitute a CMOS circuit, (ii) a P channel transistor p25 and an N channel transistor n25 which constitute another CMOS circuit, (iii) an N channel transistor n23, (iv) an S terminal, (v) an R terminal, (vi) an INITB terminal, (vii) a Q terminal, and (viii) a QB terminal. The FF 204 has an arrangement in which (i) a gate of the p24, a gate of the n24, a drain of the p25, a drain of the n25, a drain of the n23, and the QB terminal are connected to each other, (ii) a drain of the p24, a drain of the n24, a gate of the p25, a gate of the n25, and the Q terminal are connected to each other, (iii) a gate of the n23 is connected to the S terminal, (iv) a source of the n23 and a source of the n25 are connected to the R terminal, (v) a source of the p24 is connected to the INITB terminal, (vi) a source of the p25 is connected to a VDD, and (vii) a source of the n24 is connected to a VSS. Here, the p24, the n24, the p25, and the n25 constitute a latch circuit LC, and the n23 serves as a set transistor ST.

(b) of FIG. 8 is a timing chart showing an operation of the FF 204 (in a case where an INITB signal is inactive), and (c) of FIG. 8 is a truth table of the FF 204 (in the case where the INITB signal is inactive). A Q signal of the FF 204 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is low (inactive) during a time period in which the S signal is high (active) and the R signal is high (active) (see (b) and (c) of FIG. 8).

Figure 11:
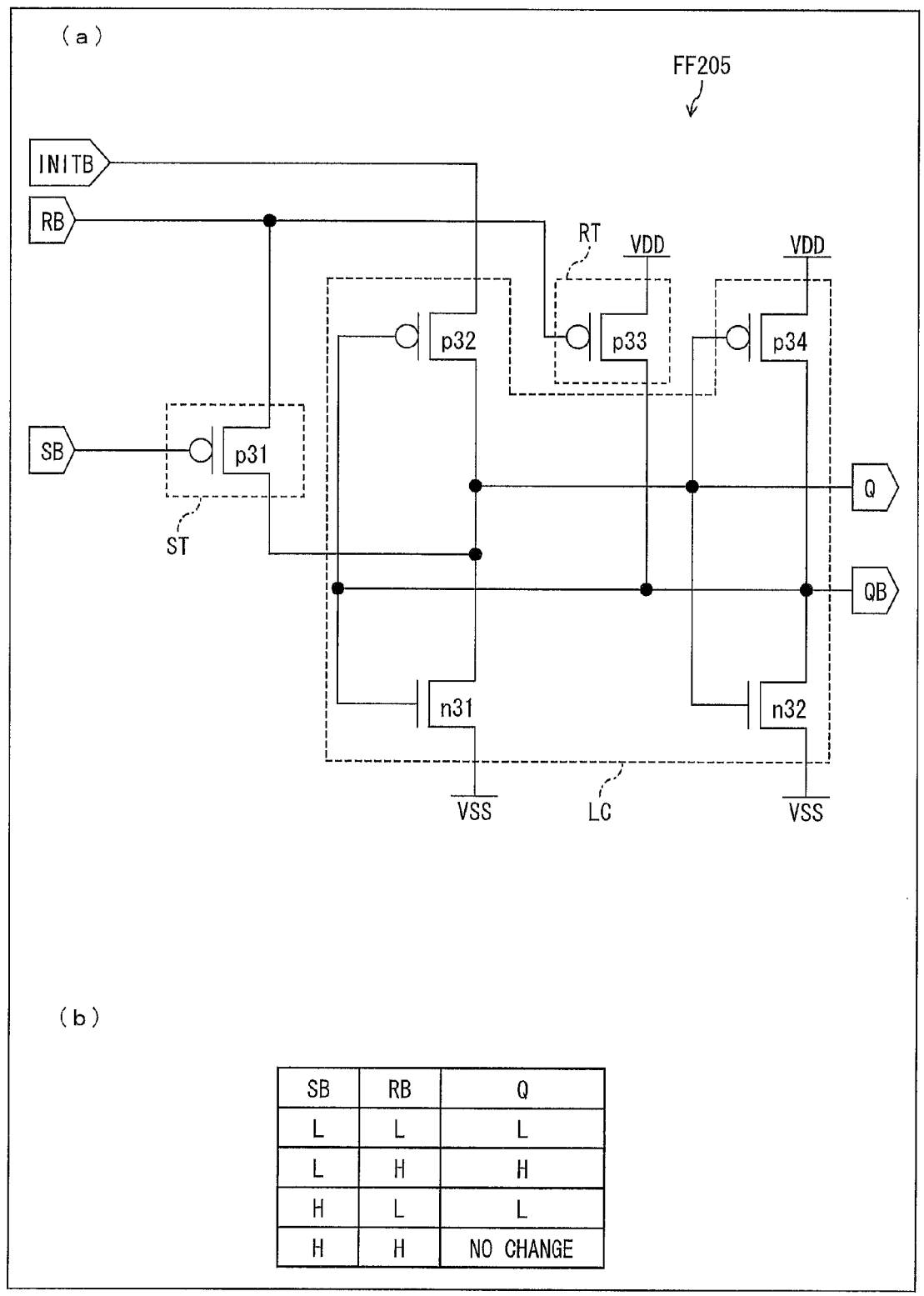
FIG. 11 is an explanatory view illustrating another flip-flop in accordance with Embodiment 2 of the present invention: (a) of FIG. 11 is a circuit diagram, and (b) of FIG. 11 is a truth table.

(a) of FIG. 11 is a circuit diagram illustrating another arrangement of the flip-flop in accordance with Embodiment 2 of the present invention. An FF 205 illustrated in (a) of FIG. 11 includes (i) a P channel transistor p32 and an N channel transistor n31 which constitute a CMOS circuit, (ii) a P channel transistor p34 and an N channel transistor n32 which constitute another CMOS circuit, (iii) P channel transistors p31 and p33, (iv) an SB terminal, (v) an RB terminal, (vi) an INITB terminal, (vii) a Q terminal, and (viii) a QB terminal. The FF 205 has an arrangement in which (i) a gate of the p32, a gate of the n31, a drain of the p34, a drain of the n32, a drain of the p33, and the QB terminal are connected to each other, (ii) a drain of the p32, a drain of the n31, a gate of the p34, a gate of the n32, a drain of the p31, and the Q terminal are connected to each other, (iii) a gate of the p31 is connected to the SB terminal, (iv) a source of the p31 and a gate of the p33 are connected to the RB terminal, (v) a source of the p32 is connected to the INITB terminal, (vi) a source of the p33 and a source of the p34 are connected to a VDD, and (vii) a source of the n31 and a source of the n32 are connected to a VSS. Here, the p32, the n31, the p34, and the n32 constitute a latch circuit LC, the p31 serves as a set transistor ST, and the p33 serves as a reset transistor RT.

(b) of FIG. 11 is a truth table of the FF 205 (in a case where an INIT signal is inactive). A Q signal of the FF 205 is such that (i) it is low (inactive) during a time period in which an SB signal is low (active) and an RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) of FIG. 11).

Figure 12:
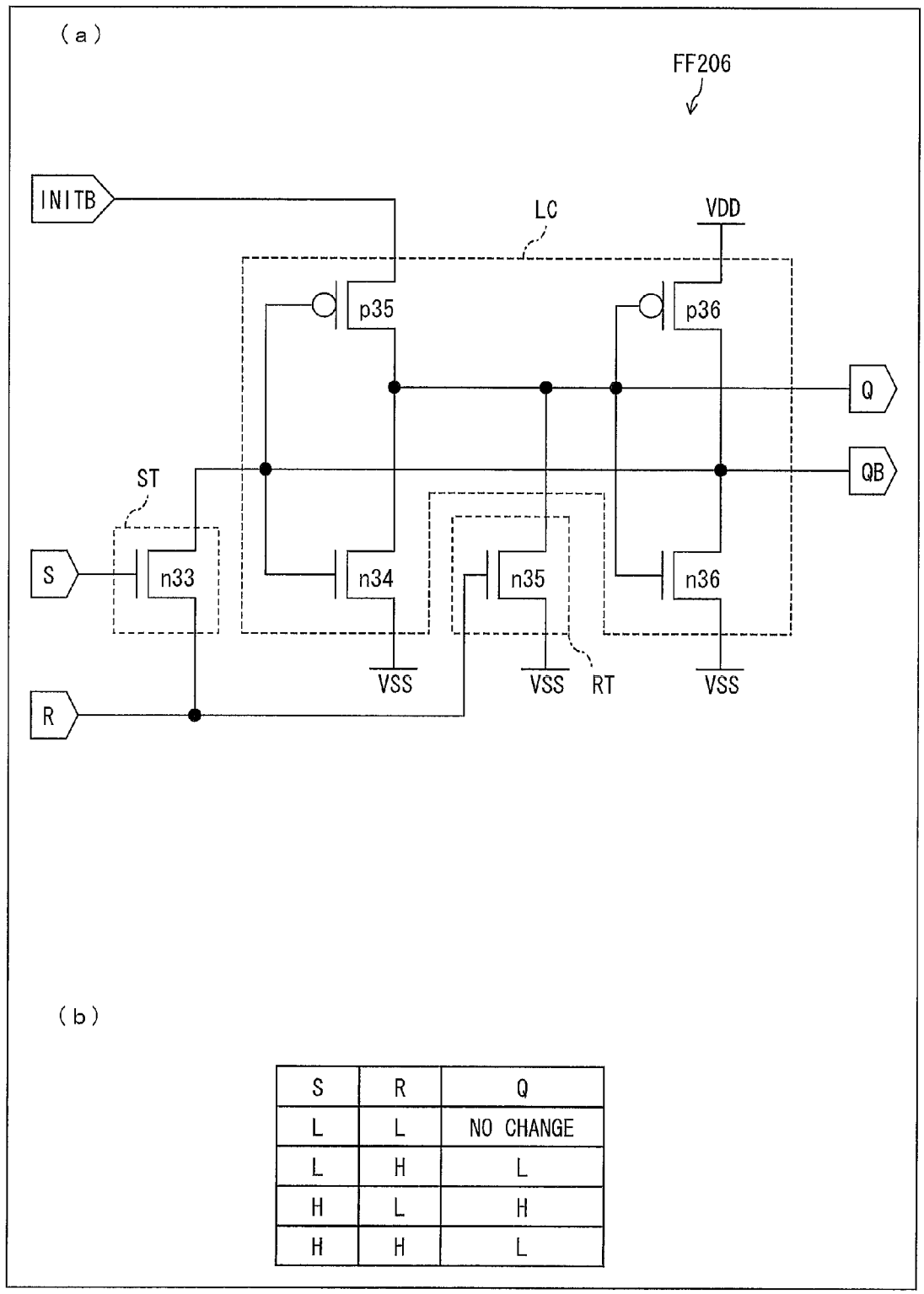
FIG. 12 is an explanatory view illustrating another flip-flop in accordance with Embodiment 2 of the present invention: (a) of FIG. 12 is a circuit diagram, and (b) of FIG. 12 is a truth table.

(a) of FIG. 12 is a circuit diagram illustrating an arrangement of an FF 206 which is a modified example of (a) of FIG. 11. The FF 206 illustrated in (a) of FIG. 12 includes (i) a P channel transistor p35 and an N channel transistor n34 which constitute a CMOS circuit, (ii) a P channel transistor p36 and an N channel transistor n36 which constitute another CMOS circuit, (iii) an N channel transistors n33 and n35, (iv) an S terminal, (v) an R terminal, (vi) an INITB terminal, (vii) a Q terminal, and (viii) a QB terminal. The FF 206 has an arrangement in which (i) a gate of the p35, a gate of the n34, a drain of the p36, a drain of the n36, a drain of the n33, and the QB terminal are connected to each other, (ii) a drain of the p35, a drain of the n34, a gate of the p36, a gate of the n36, a drain of the n35, and the Q terminal are connected to each other, (iii) a gate of the n33 is connected to the S terminal, (iv) a source of the n33 and a gate of the n35 are connected to the R terminal, (v) a source of the p35 is connected to the INITB terminal, (vi) a source of the p36 is connected to a VDD, and (vii) a source of the n35 is connected to a VSS. Here, the p35, the n34, the p36, and the n36 constitute a latch circuit LC. The n33 serves as a set transistor ST. The n35 serves as a reset transistor RT.

(b) of FIG. 12 is a truth table of the FF 206 (in a case where an INITB signal is inactive). A Q signal of the FF 206 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is low (inactive) during a time period in which the S signal is high (active) and the R signal is high (active) (see (b) and (c) of FIG. 12).

Figure 15:
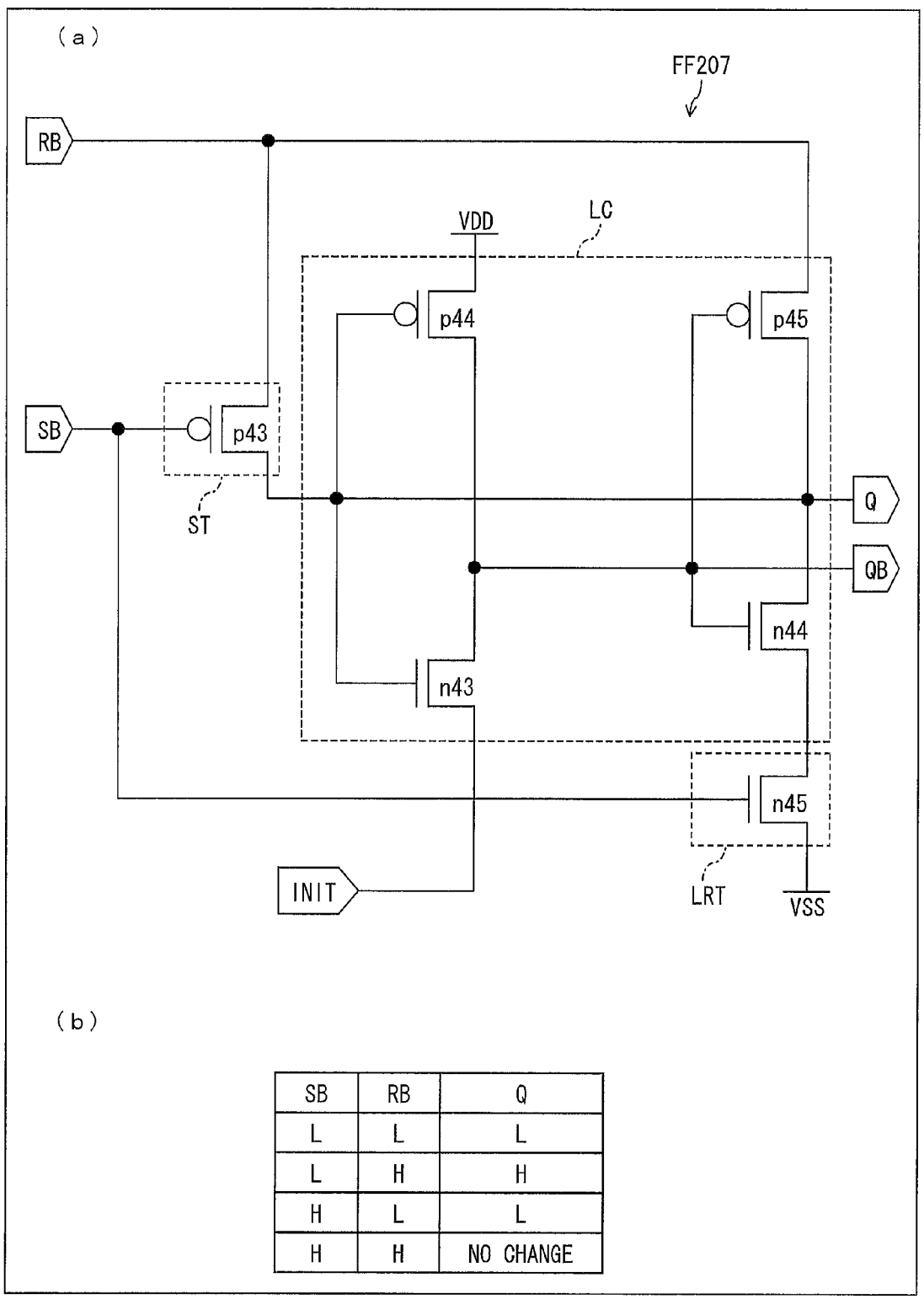
FIG. 15 is an explanatory view illustrating another flip-flop in accordance with Embodiment 2 of the present invention: (a) of FIG. 15 is a circuit diagram, and (b) of FIG. 15 is a truth table.

(a) of FIG. 15 is a circuit diagram illustrating another arrangement of the flip-flop in accordance with Embodiment 2 of the present invention. An FF 207 illustrated in (a) of FIG. 15 includes (i) a P channel transistor p44 and an N channel transistor n43 which constitute a CMOS circuit, (ii) a P channel transistor p45 and an N channel transistor n44 which constitute another CMOS circuit, (iii) a P channel transistor p43, (iv) an N channel transistor n45, (v) an SB terminal, (vi) an RB terminal, (vii) an INIT terminal, (viii) a Q terminal, and (ix) a QB terminal. The FF 207 has an arrangement in which (i) a gate of the p44, a gate of the n43, a drain of the p45, a drain of the n44, a drain of the p43, and the Q terminal are connected to each other, (ii) a drain of the p44, a drain of the n43, a gate of the p45, a gate of the n44, and the QB terminal are connected to each other, (iii) a source of the n44 and a drain of the n45 are connected to each other, (iv) a gate of the p43 and a gate of the n45 are connected to the SB terminal, (v) a source of the p43 and a source of the p45 are connected to the RB terminal, (vi) a source of the n43 is connected to the INIT terminal, (vii) a source of the p44 is connected to a VDD, and (viii) a source of the n45 is connected to a VSS. Here, the p44, the n43, the p45, and the n44 constitute a latch circuit LC. The p43 serves as a set transistor ST. The n45 serves as a latch releasing circuit transistor LRT.

(b) of FIG. 15 is a truth table (in a case where an INIT signal is inactive). A Q signal of the FF 207 is such that (i) it is low (inactive) during a time period in which an SB signal is low (active) and an RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) of FIG. 15).

Figure 16:
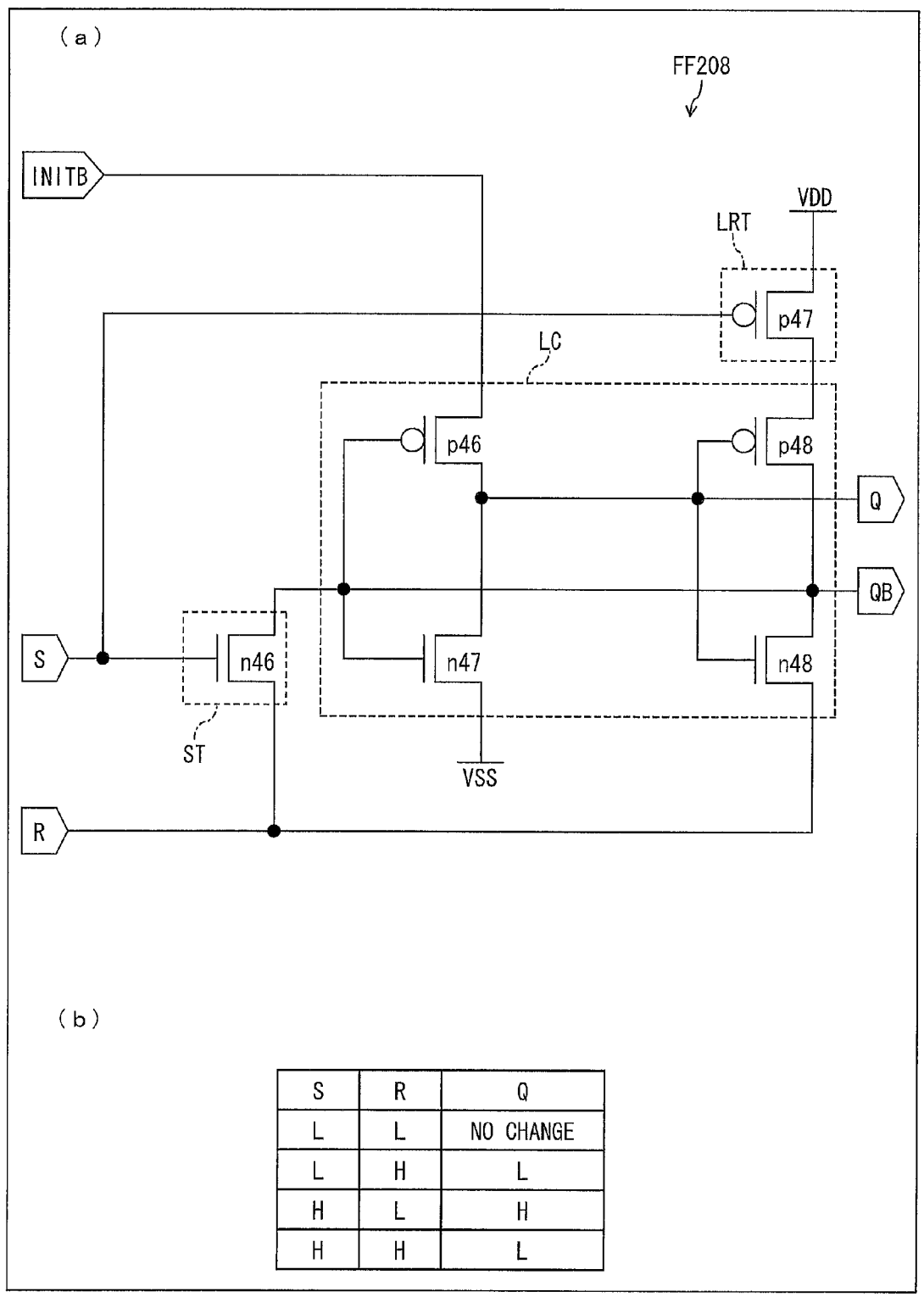
FIG. 16 is an explanatory view illustrating another flip-flop in accordance with Embodiment 2 of the present invention: (a) of FIG. 16 is a circuit diagram, and (b) of FIG. 16 is a truth table.

(a) of FIG. 16 is a circuit diagram illustrating an arrangement of an FF 208 which is a modified example of (a) of FIG. 15. The FF 208 illustrated in (a) of FIG. 16 includes (i) a P channel transistor p46 and an N channel transistor n47 which constitute a CMOS circuit, (ii) a P channel transistor p48 and an N channel transistor n48 which constitute another CMOS circuit, (iii) an N channel transistor n46, (iv) a P channel transistor p47, (v) an S terminal, (vi) an R terminal, (vii) an INITB terminal, (viii) a Q terminal, and (ix) a QB terminal. The FF 208 has an arrangement in which (i) a gate of the p46, a gate of the n47, a drain of the p48, a drain of the n48, a drain of the n46, and the QB terminal are connected to each other, (ii) a drain of the p46, a drain of the n47, a gate of the p48, a gate of the n48, and the Q terminal are connected to each other, (iii) a drain of the p47 and a source of the p48 are connected to each other, (iv) a gate of the n46 and a gate of the p47 are connected to the S terminal, (v) a source of the n46 and a source of the n48 are connected to the R terminal, (vi) a source of the p46 is connected to the INITB terminal, (vii) a source of the p47 is connected to a VDD, and (viii) a source of the n47 is connected to a VSS. Here, the p46, the n47, the p48, and the n48 constitute a latch circuit LC. The n46 serves as a set transistor ST. The p47 serves as a latch releasing transistor LRT.

(b) of FIG. 16 is a truth table of the FF 208 (in a case where an INITB signal is inactive). A Q signal of the FF 208 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is low (inactive) during a time period in which the S signal is high (active) and the R signal is high (active) (see (b) of FIG. 16).

Figure 25:
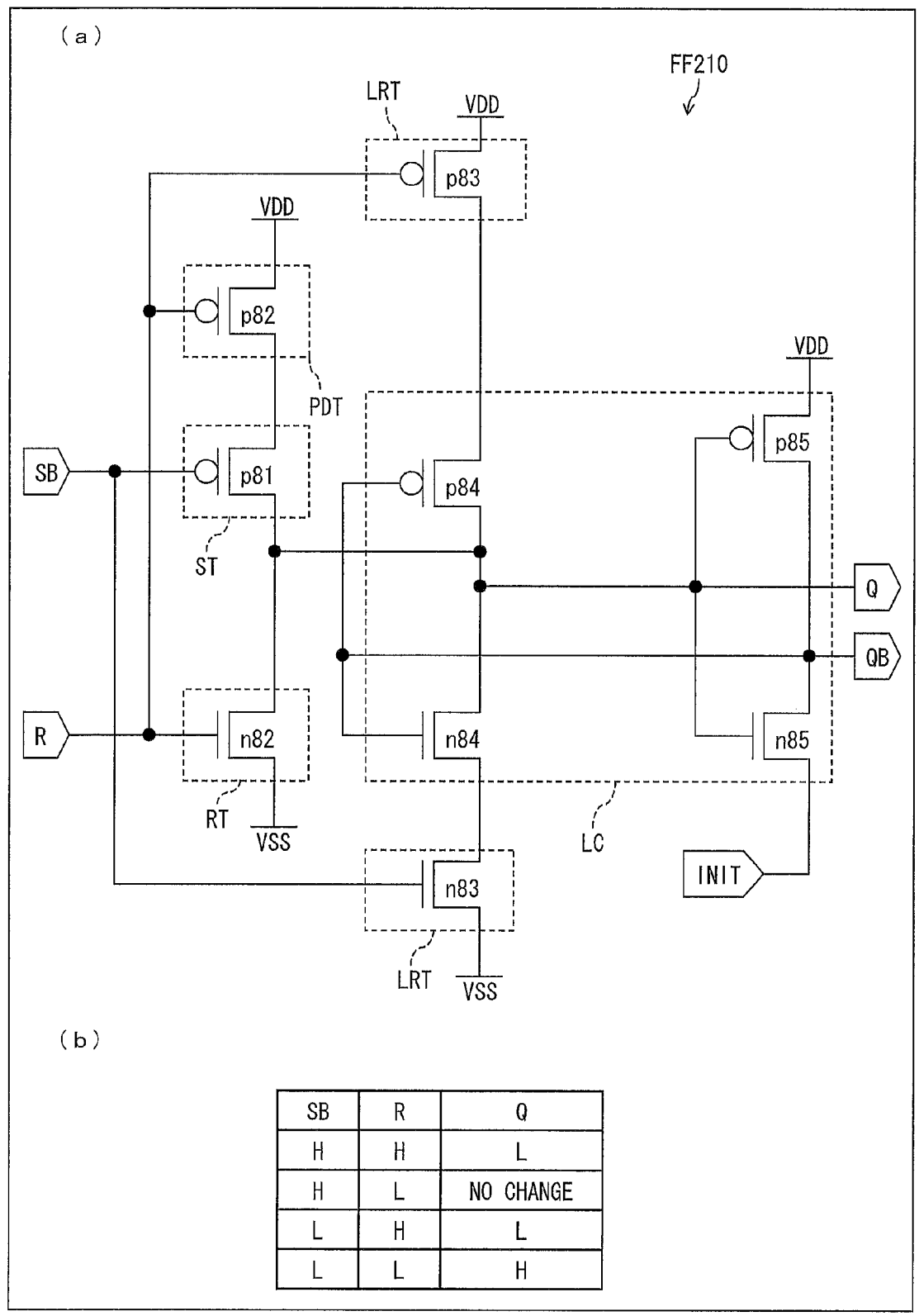
FIG. 25 is an explanatory view illustrating another flip-flop in accordance with Embodiment 1 of the present invention: (a) of FIG. 25 is a circuit diagram, and (b) of FIG. 25 is a truth table.

(a) of FIG. 25 is a circuit diagram illustrating an arrangement of an FF 210. The FF 210 illustrated in (a) of FIG. 25 includes (i) a P channel transistor p84 and an N channel transistor n84 which constitute a CMOS circuit, (ii) a P channel transistor p85 and an N channel transistor n85 which constitute another CMOS circuit, (iii) P channel transistors p81, p82, and p83, (iv) N channel transistors n82 and n83, (v) an SB terminal, (vi) an R terminal, (vii) an INIT terminal, (viii) a Q terminal, and (ix) a QB terminal. The FF 210 has an arrangement in which (i) a gate of the p84, a gate of the n84, a drain of the p85, a drain of the n85, and the QB terminal are connected to each other, (ii) a drain of the p84, a drain of the n84, a drain of the p81, a drain of the n82, a gate of the p85, a gate of the n85, and the Q terminal are connected to each other, (iii) a source of the p84 and a drain of the p83 are connected to each other, (iv) a source of the p81 and a drain of the p82 are connected to each other, (v) a gate of the p81 and a gate of the n83 are connected to the SB terminal, (vi) a gate of the n82, a gate of the p82, and a gate of the p83 are connected to the R terminal, (vii) a source of the n85 is connected to the INIT terminal, (viii) a source of the p82, a source of the p83, and a source of the p85 are connected to a VDD, and (ix) a source of the n82 and a source of the n83 are connected to a VSS. Here, the p84, the n84, the p85, and the n85 constitute a latch circuit LC. The p81 serves as a set transistor ST. The n82 serves as a reset transistor RT. The p83 serves as a latch releasing transistor LRT. The n83 serves as a latch releasing transistor LRT. The p82 serves as a priority determining transistor PDT.

(b) of FIG. 25 is a truth table of the FF 210 (in a case where an INIT signal is inactive). A Q signal of the FF 210 is such that (i) it is low (inactive) during a time period in which an SB signal is high (inactive) and an R signal is high (active), (ii) it is in a retention state during a time period in which the SB signal is high (inactive) and the R signal is low (inactive), (iii) it is low (inactive) during a time period in which the SB signal is low (active) and the R signal is high (active), and (iv) it is high (active) during a time period in which the SB signal is low (active) and the R signal is low (inactive) (see (b) of FIG. 25).

Figure 27:
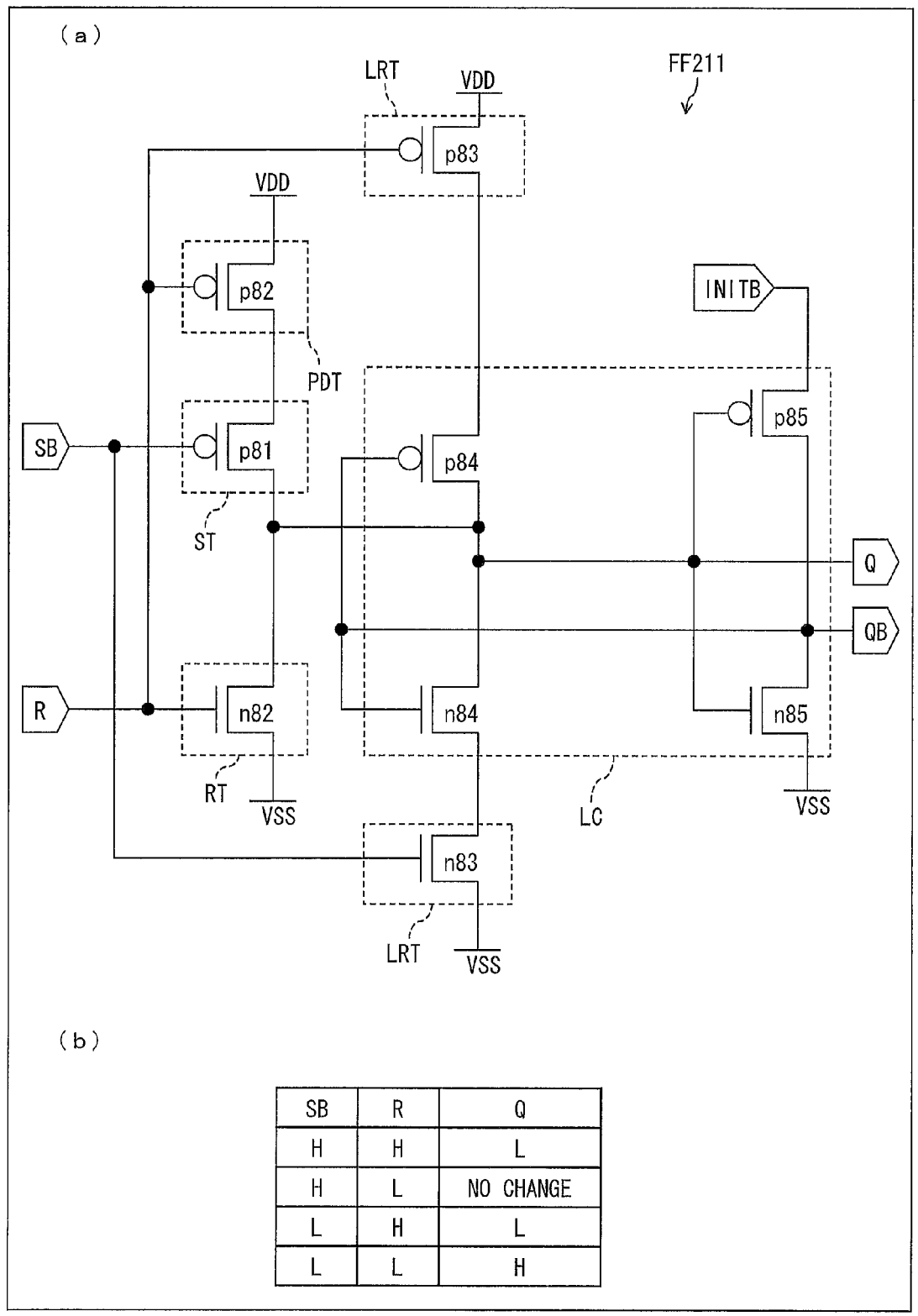
FIG. 27 is an explanatory view illustrating another flip-flop in accordance with Embodiment 1 of the present invention: (a) of FIG. 27 is a circuit diagram, and (b) of FIG. 27 is a truth table.

Note that, it is possible to modify the FF 210 illustrated in (a) of FIG. 25 such that the source of the p85 is connected to the INITB terminal and the source of the n85 is connected to the VSS, as in an FF 211 illustrated in (a) of FIG. 27. (b) of FIG. 27 is a truth table of the FF 211.

[Flip-Flop in Accordance with Embodiment 3]

Figure 5:
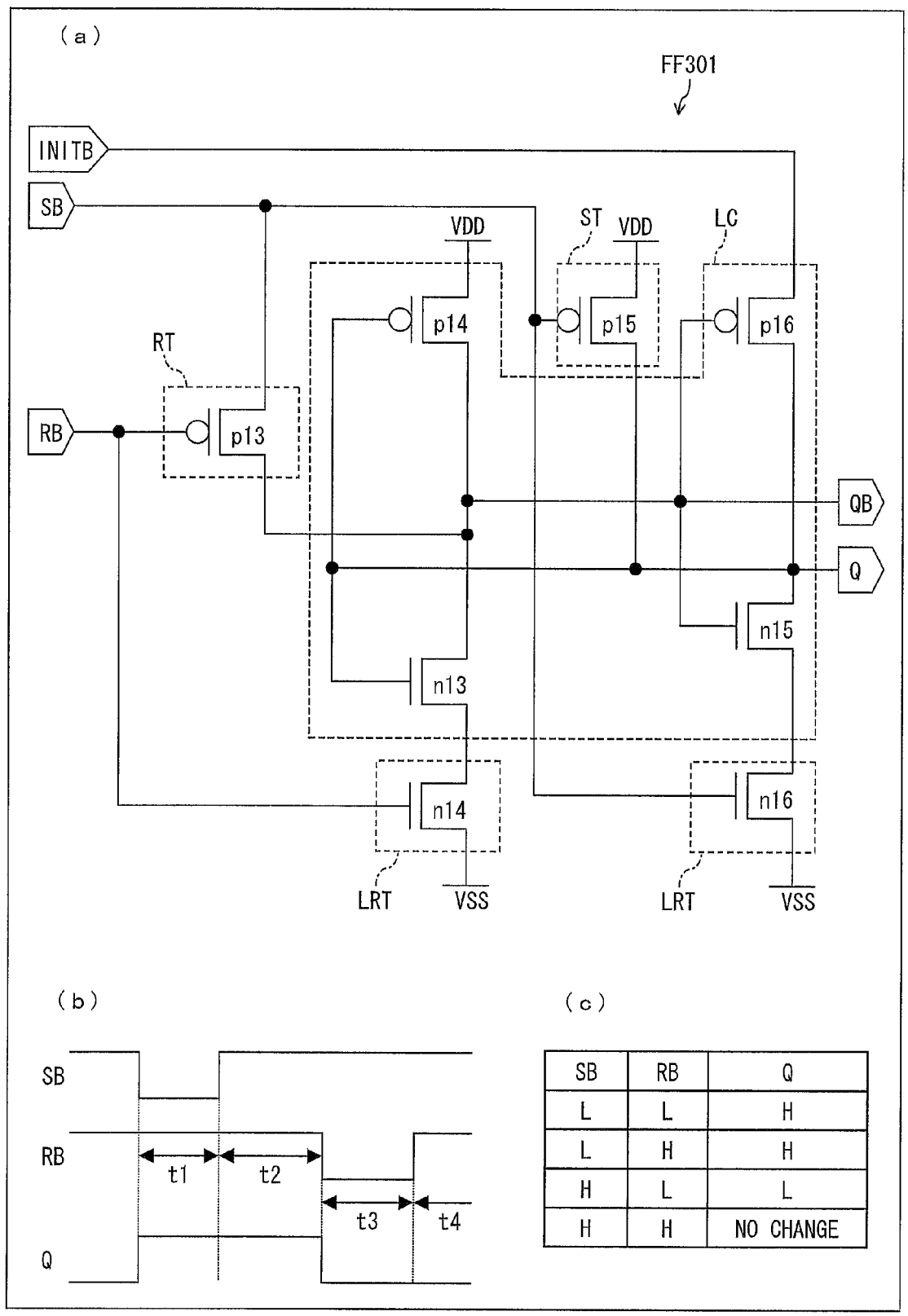
FIG. 5 is an explanatory view illustrating a flip-flop in accordance with Embodiment 3 of the present invention: (a) of FIG. 5 is a circuit diagram, (b) of FIG. 5 is a timing chart, and (c) of FIG. 5 is a truth table.

(a) of FIG. 5 is a circuit diagram illustrating an arrangement of a flip-flop in accordance with Embodiment 3 of the present invention. An FF 301 illustrated in (a) of FIG. 5 includes (i) a P channel transistor p14 and an N channel transistor n13 which constitute a CMOS circuit, (ii) a P channel transistor p16 and an N channel transistor n15 which constitute another CMOS circuit, (iii) P channel transistors p13 and p15, (iv) N channel transistors n14 and n16, (v) an SB terminal, (vi) an RB terminal, (vii) an INITB terminal, (viii) a Q terminal, and (ix) a QB terminal. The FF 301 has an arrangement in which (i) a gate of the p14, a gate of the n13, a drain of the p16, a drain of the p15, a drain of the p15, and the Q terminal are connected to each other, (ii) a drain of the p14, a drain of the n13, a gate of the p16, a gate of the n15, a drain of the p13, and the QB terminal are connected to each other, (iii) a source of the n13 and a drain of the n14 are connected to each other, (iv) a source of the n15 and a drain of the n16 are connected to each other, (v) a source of the p13, a gate of the p15, and a gate of the n16 are connected to the SB terminal, (vi) a gate of the p13 and a gate of the n14 are connected to the RB terminal, (vii) a source of the p16 is connected to the INITB terminal, (viii) a source of the p14 and a source of the p15 are connected to a VDD, and (ix) a source of the n14 and a source of the n16 are connected to a VSS. Here, the p14, the n13, the p16, and the n15 constitute a latch circuit LC. The p15 serves as a set transistor ST. The p13 serves as a reset transistor RT. The n14 serves as a latch releasing transistor LRT. The n16 serves as a latch releasing transistor LRT.

(b) of FIG. 5 is a timing chart showing an operation of the FF 301 (in a case where an INITB signal is inactive), and (c) of FIG. 5 is a truth table of the FF 301 (in the case where the INITB signal is inactive). A Q signal of the FF 301 is such that (i) it is high (active) during a time period in which an SB signal is low (active) and an RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) and (c) of FIG. 5).

For example, during a time period t1 shown in (b) of FIG. 5, the p15 is turned on, so that the Q terminal receives Vdd (high). This turns on the n13, so that the QB terminal receives Vss (low). Then, during a time period t2, the SB signal is turned to be high, so that the p15 is turned off and the n14 and the n16 are turned on. Accordingly, the state of the t1 is maintained during the time period t2. During a time period t3, the RB signal is turned to be low, so that the QB terminal receives Vdd (high) from the SB terminal. This turns on the n15, so that the Q terminal receives Vss (low). Note that, in a case where both the SB signal and the RB signal are turned to be low (active), (i) the p15 is turned on, so that the Q terminal receives Vdd (high) and (ii) the QB terminal receives Vss+ Vth (a threshold voltage of the p13) via the p13.

Further, in a case where both the SB signal and the RB signal are turned to be inactive in a time period in which the INITB signal is active, a Q signal and a QB signal of the FF 301 are turned to be inactive.

For example, in a case where, in a time period in which the INITB signal is low (active), the SB signal and the RB signal are changed from a state A in which the SB signal is low (active) and the RB signal is low (active) to a state X in which both the SB signal and the RB signal are high (inactive), the Q terminal receives Vss (low) and the QB terminal receives Vdd (high). That is, the outputs of the respective Q terminal and QB terminal are in an undetermined state in the state A. In a case where the p16 is turned on immediately before the SB signal and the RB signal are changed from the state A to the state X, the Q terminal is turned to be Vss+Vth (a threshold voltage of the p16) instantaneously. This turns on the p14, so that the QB terminal receives Vdd (high). Further, since the n15 to which the QB terminal is connected is turned on, the Q terminal receives Vss (low). Meanwhile, in a case where the p16 is turned off immediately before the SB signal and the RB signal are changed from the state A to the state X, that is, in a case where the p16 constituting the latch circuit LC is in the off state and the transistor n15 constituting the inverter is in the on state, the Q terminal receives Vss (low). This turns on the p14, the gate of which is connected to the Q terminal. Accordingly, the QB terminal receives Vdd (high). That is, the Q terminal receives Vss (low) and the QB terminal receives Vdd (high) in the state X, regardless of what undetermined state the state A is. Further, in a case where, in the time period in which the INITB signal is low (active), the SB signal and the RB signal are changed from a state B in which the SB signal is low (active) and the RB signal is high (inactive) to the state X in which both the SB signal and the RB signal are high (inactive), the Q terminal receives Vss (low) and the QB terminal receives Vdd (high). That is, the outputs of the respective Q terminal and QB terminal are in the undetermined state in the state B. In a case where the p16 is turned on immediately before the SB signal and the RB signal are changed from the state B to the state X, the Q terminal is instantaneously turned to be Vss+Vth (the threshold voltage of the p16). This turns on the p14, so that the QB terminal receives Vdd (high). Further, the n15 to which the QB terminal is connected is turned on, so that the Q terminal receives Vss (low). In a case where the p16 is turned off immediately before the SB signal and the RB signal are changed from the state B to the state X, that is, in a case where the p16 constituting the latch circuit LC is in the off state and the transistor n15 constituting the inverter is in the on state, the Q terminal receives Vss (low). This turns on the p14, the gate of which is connected to the Q terminal. Accordingly, the QB terminal receives Vdd (high). The QB terminal receives Vdd (high). That is, the Q terminal receives Vss (low) and the QB terminal receives Vdd (high) in the state X, regardless of what undetermined state the state B is.

As described above, the FF 301 has an arrangement in which (i) the p14, the n13, the p16, and the n15 (two CMOS circuits) constitute a latch circuit, (ii) the SB terminal is connected to (a) the gate of the p15 which serves as a set transistor ST and (b) the source of the p13 which serves as a reset transistor RT, and (iii) the source of the p16 is connected to the INITB terminal. With the arrangement, it is possible to carry out a setting operation, a latching operation, a resetting operation, priority determination (when the SB signal and the RB signal are turned to be active simultaneously), and initialization, without provision of a priority determining circuit and an initialization circuit, each of which has been required in a conventional flip-flop (see FIG. 70). As described above, in a case where the SB signal and the RB signal of the FF 301 are turned to be active simultaneously, the SB signal (set) has priority, and the output of the Q terminal is turned to be active.

Figure 23:
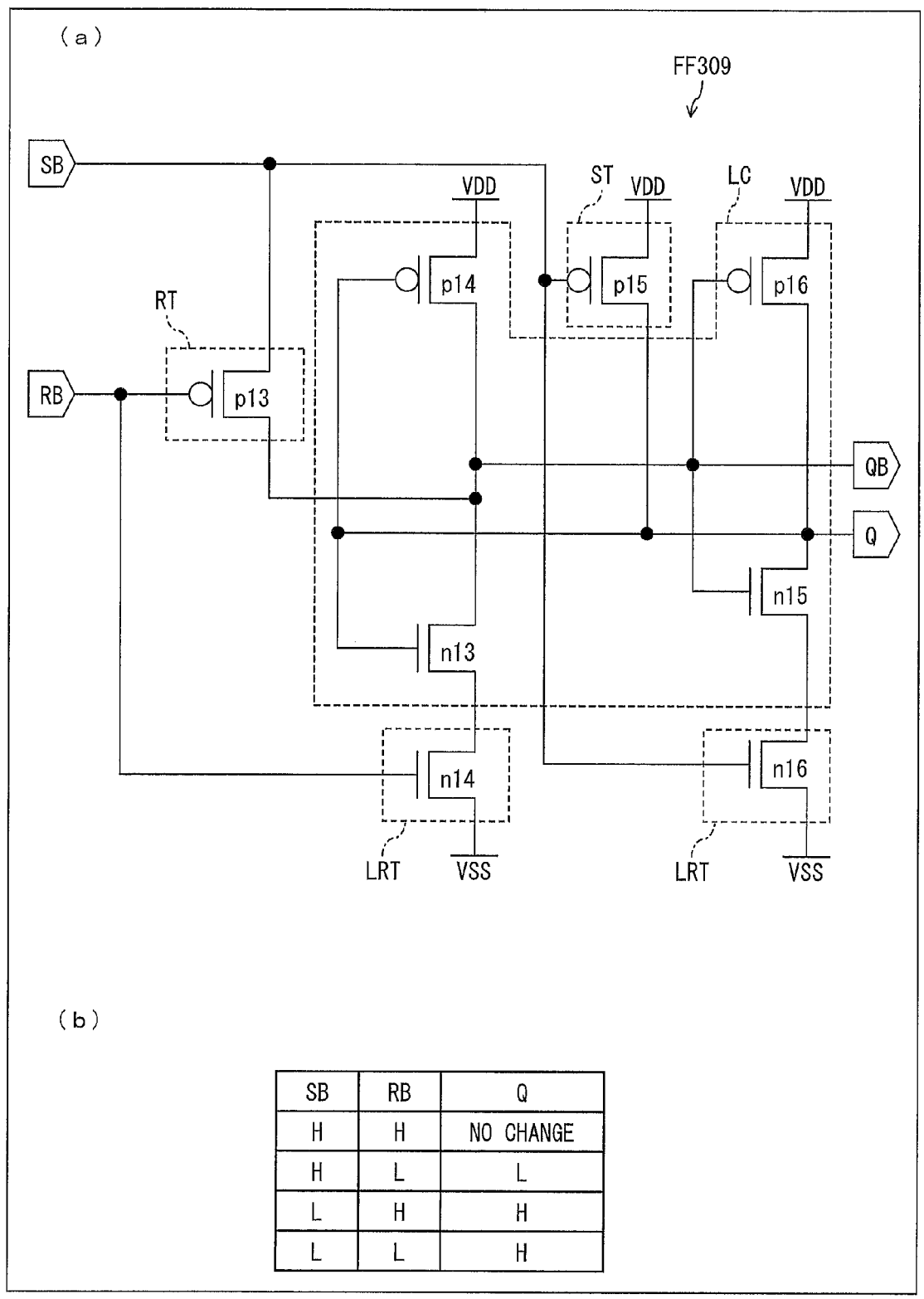
FIG. 23 is an explanatory view illustrating another flip-flop in accordance with Embodiment 3 of the present invention: (a) of FIG. 23 is a circuit diagram, and (b) of FIG. 23 is a truth table.

Note that, it is possible to modify the FF 301 illustrated in (a) of FIG. 5 such that the source of the p16 is connected the VDD, as in an FF 309 illustrated in (a) of FIG. 23. (b) of FIG. 23 is a truth table of the FF 309.

Figure 6:
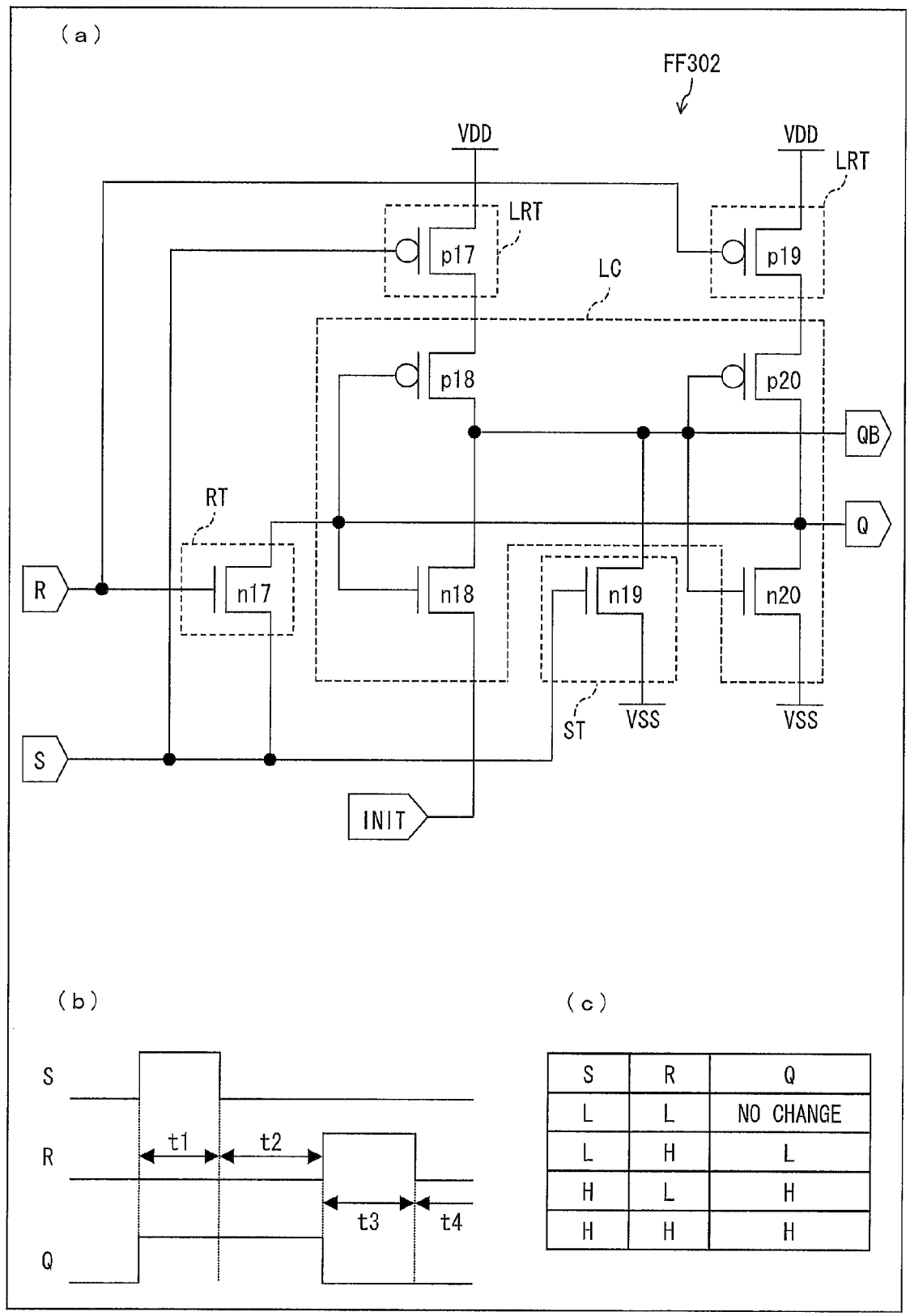
FIG. 6 is an explanatory view illustrating another flip-flop in accordance with Embodiment 3 of the present invention: (a) of FIG. 6 is a circuit diagram, (b) of FIG. 6 is a timing chart, and (c) of FIG. 6 is a truth table.

(a) of FIG. 6 is a circuit diagram illustrating an arrangement of an FF 302 which is a modified example of (a) of FIG. 5. The FF 302 illustrated in (a) of FIG. 6 includes (i) a P channel transistor p18 and an N channel transistor n18 which constitute a CMOS circuit, (ii) a P channel transistor p20 and an N channel transistor n20 which constitute another CMOS circuit, (iii) P channel transistors p17 and p19, (iv) N channel transistors n17 and n19, (v) an S terminal, (vi) an R terminal, (vii) an INIT terminal, (viii) a Q terminal, and (ix) a QB terminal. The FF 302 has an arrangement in which (i) a gate of the p18, a gate of the n18, a drain of the p20, a drain of the n20, a drain of the n17, and the Q terminal are connected to each other, (ii) a drain of the p18, a drain of the n18, a gate of the p20, a gate of the n20, a drain of the n19, and the QB terminal are connected to each other, (iii) a source of the p20 and a drain of the n19 are connected to each other, (iv) a source of the p18 and a drain of the p17 are connected to each other, (v) a gate of the p17, a gate of the n19, and a source of the n17 are connected to the S terminal, (vi) a gate of the p19 and a gate of the n17 are connected to the R terminal, (vii) a source of the n18 is connected to the INIT terminal, (viii) a source of the p17 and a source of the p19 are connected to a VDD, and (ix) a source of the n19 and a source of the n20 are connected to a VSS. Here, the p18, the n18, the p20, and the n20 constitute a latch circuit LC. The n19 serves as a set transistor ST. The n17 serves as a reset transistor RT. The p17 serves as a latch releasing transistor LRT. The p19 serves as a latch releasing transistor LRT.

(b) of FIG. 6 is a timing chart showing an operation of the FF 302 (in a case where an INIT signal is inactive), and (c) of FIG. 6 is a truth table of the FF 302 (in the case where the INIT signal is inactive). A Q signal of the FF 302 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is high (active) during a time period in which the S signal is high (active) and the R signal is high (active) (see (b) and (c) of FIG. 6).

Further, in a case where both the S signal and the R signal are turned to be inactive in a time period in which the INIT signal is active, a Q signal and a QB signal of the FF 302 are turned to be inactive.

Figure 9:
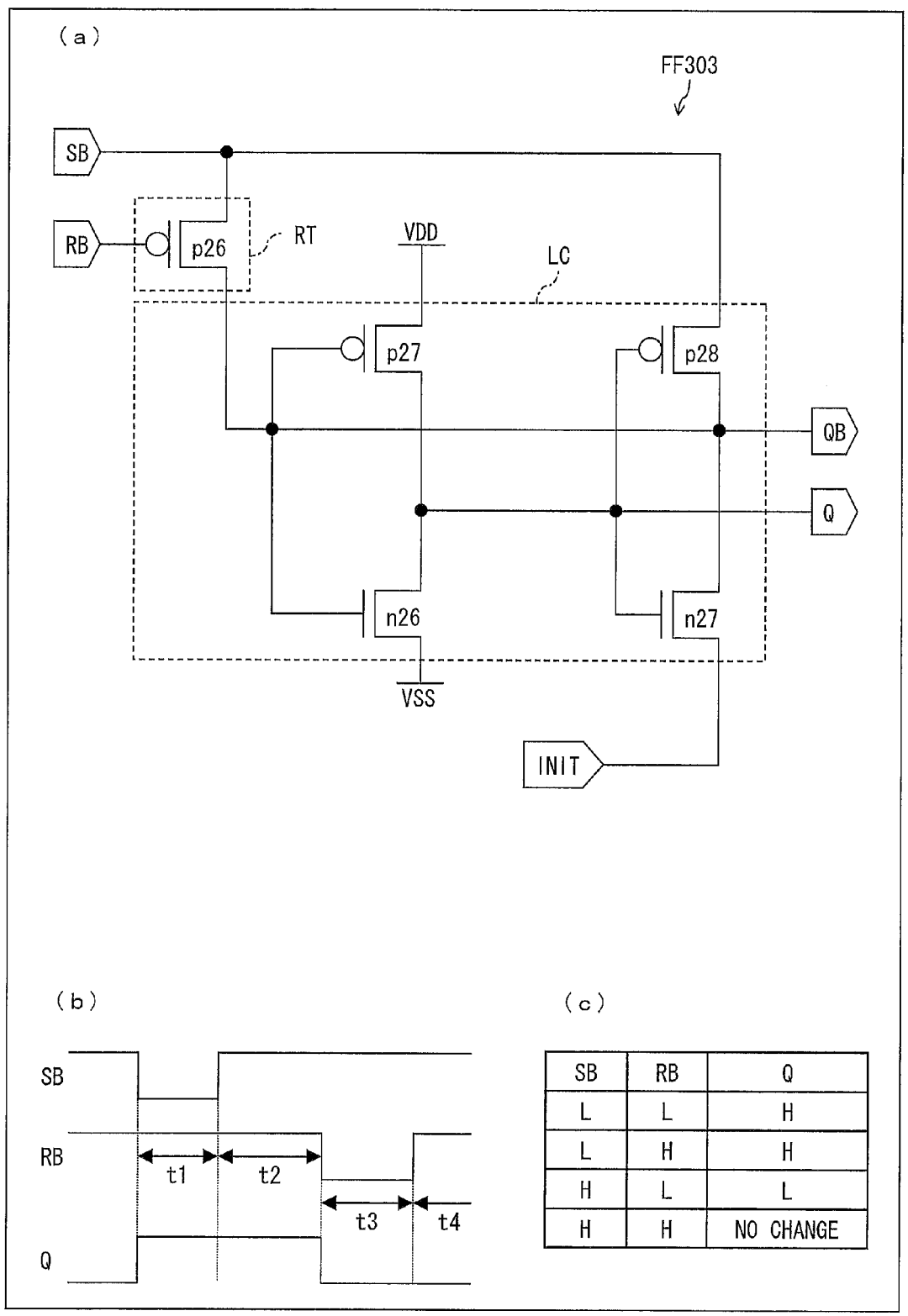
FIG. 9 is an explanatory view illustrating another flip-flop in accordance with Embodiment 3 of the present invention: (a) of FIG. 9 is a circuit diagram, (b) of FIG. 9 is a timing chart, and (c) of FIG. 9 is a truth table.

(a) of FIG. 9 is a circuit diagram illustrating another arrangement of the flip-flop in accordance with Embodiment 3 of the present invention. An FF 303 illustrated in (a) of FIG. 9 includes (i) a P channel transistor p27 and an N channel transistor n26 which constitute a CMOS circuit, (ii) a P channel transistor p28 and an N channel transistor n27 which constitute another CMOS circuit, (iii) a P channel transistor p26, (iv) an SB terminal, (v) an RB terminal, (vi) an INIT terminal, (vii) a Q terminal, and (viii) a QB terminal. The FF 303 has an arrangement in which (i) a gate of the p27, a gate of the n26, a drain of the p28, a drain of the n27, a drain of the p26, and the QB terminal are connected to each other, (ii) a drain of the p27, a drain of the n26, a gate of the p28, a gate of the n27, and the Q terminal are connected to each other, (iii) a gate of the p26 is connected to the RB terminal, (iv) a source of the p26 and a source of the p28 are connected to the SB terminal, (v) a source of the n27 is connected to the INIT terminal, (vi) a source of the n26 is connected to a VSS, and (vii) a source of the p27 is connected to a VDD. Here, the p27, the n26, the p28, and the n27 constitute a latch circuit LC, and the p26 serves as a reset transistor RT.

(b) of FIG. 9 is a timing chart showing an operation of the FF 303 (in a case where an INIT signal is inactive), and (c) of FIG. 9 is a truth table of the FF 303 (in the case where the INIT signal is inactive). A Q signal of the FF 303 is such that (i) it is high (active) during a time period in which an SB signal is low (active) and a RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) and (c) of FIG. 9).

For example, during a time period t1 shown in (b) of FIG. 9, the QB terminal temporarily receives Vss+Vth (a threshold voltage of the p28) via the p28, so that the p27 is turned on. Accordingly, the Q terminal receives Vdd (high). Further, since the Q terminal receives Vdd, the n27 is turned on. Accordingly, the QB terminal receives Vss. Then, during a time period t2, the p28 is in an off state. Accordingly, a state of the t1 is maintained during the time period t2, even if the SB signal is turned to be high. During a time period t3, the RB signal is turned to be low, so that the QB terminal receives Vdd from the SB terminal. This turns on the n26, so that the Q terminal receives Vss (low). Note that, in a case where both the SB signal and the RB signal are turned to be low (active), (i) the QB terminal receives Vss+Vth temporarily via the p26, (ii) this turns on the p27, and therefore (iii) the Q terminal receives Vdd (high). Further, since the Q terminal receives Vdd, the n27 is turned on. Accordingly, the QB terminal receives Vss (low) from the INIT terminal.

As described above, the FF 303 has an arrangement in which (i) the p27, the n26, the p28, and the n27 (two CMOS circuits) constitute a latch circuit, (ii) the SB terminal is connected to (a) the source of the p28 and (b) the source of the p26 which serves as a reset transistor RT, and (iii) the source of the n27 is connected to the INIT terminal. With the arrangement, it is possible to carry out a setting operation, a latching operation, a resetting operation, priority determination (when the SB signal and the RB signal are turned to be active simultaneously), and initialization, without provision of a set circuit, a latch releasing circuit, a priority determining circuit, and an initialization circuit, each of which has been required in a conventional flip-flop (see FIG. 70). As described above, in a case where the SB signal and the RB signal of the FF 303 are turned to be active simultaneously, the SB signal (set) has priority, and the outputs of the respective Q terminal and QB terminal are turned to be active.

Figure 10:
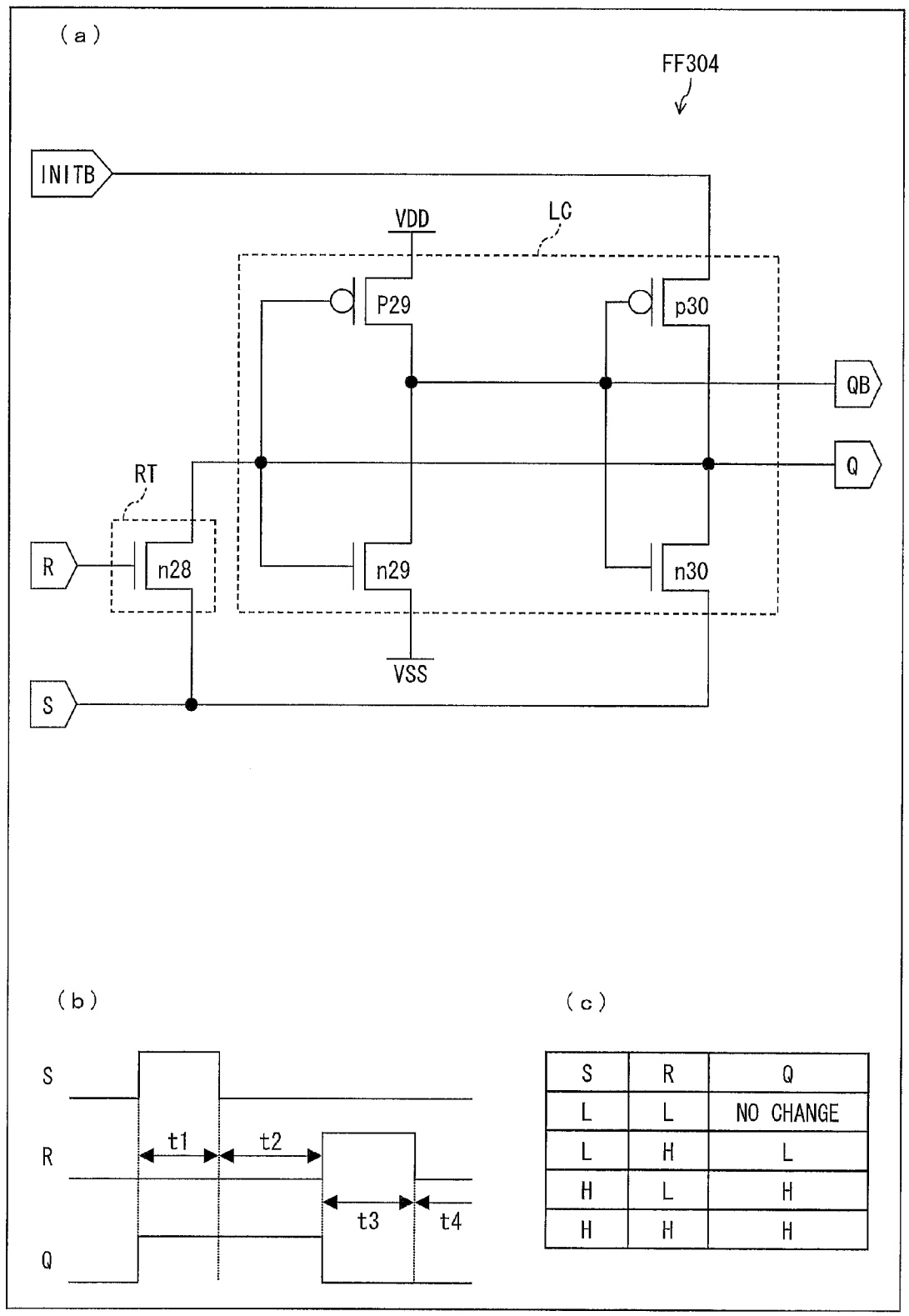
FIG. 10 is an explanatory view illustrating another flip-flop in accordance with Embodiment 3 of the present invention: (a) of FIG. 10 is a circuit diagram, (b) of FIG. 10 is a timing chart, and (c) of FIG. 10 is a truth table.

(a) of FIG. 10 is a circuit diagram illustrating an arrangement of an FF 304 which is a modified example of (a) of FIG. 9. The FF 304 illustrated in (a) of FIG. 10 includes (i) a P channel transistor p29 and an N channel transistor n29 which constitute a CMOS circuit, (ii) a P channel transistor p30 and an N channel transistor n30 which constitute another CMOS circuit, (iii) an N channel transistor n28, (iv) an S terminal, (v) an R terminal, (vi) an INITB terminal, (vii) a Q terminal, and (viii) a QB terminal. The FF 304 has an arrangement in which (i) a gate of the p29, a gate of the n29, a drain of the n28, a drain of the p30, a drain of the n30, and the Q terminal are connected to each other, (ii) a drain of the p29, a drain of the n29, a gate of the p30, a gate of the n30, and the QB terminal are connected to each other, (iii) a gate of the n28 is connected to the R terminal, (iv) a source of the n28 and a source of the n30 are connected to the S terminal, (v) a source of the p30 is connected to the INITB terminal, (vi) a source of the p29 is connected to a VDD, and (vii) a source of the n29 is connected to a VSS. Here, the p29, the n29, the p30, and the n30 constitute a latch circuit LC, and the n28 serves as a reset transistor RT.

(b) of FIG. 10 is a timing chart showing an operation of the FF 304 (in a case where an INTIB signal is inactive), and (c) of FIG. 10 is a truth table of the FF 304 (in the case where the INTIB signal is inactive). A Q signal of the FF 304 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is high (active) during a time period in which the S signal is high (active) and the R signal is high (active) (see (b) and (c) of FIG. 10).

Figure 13:
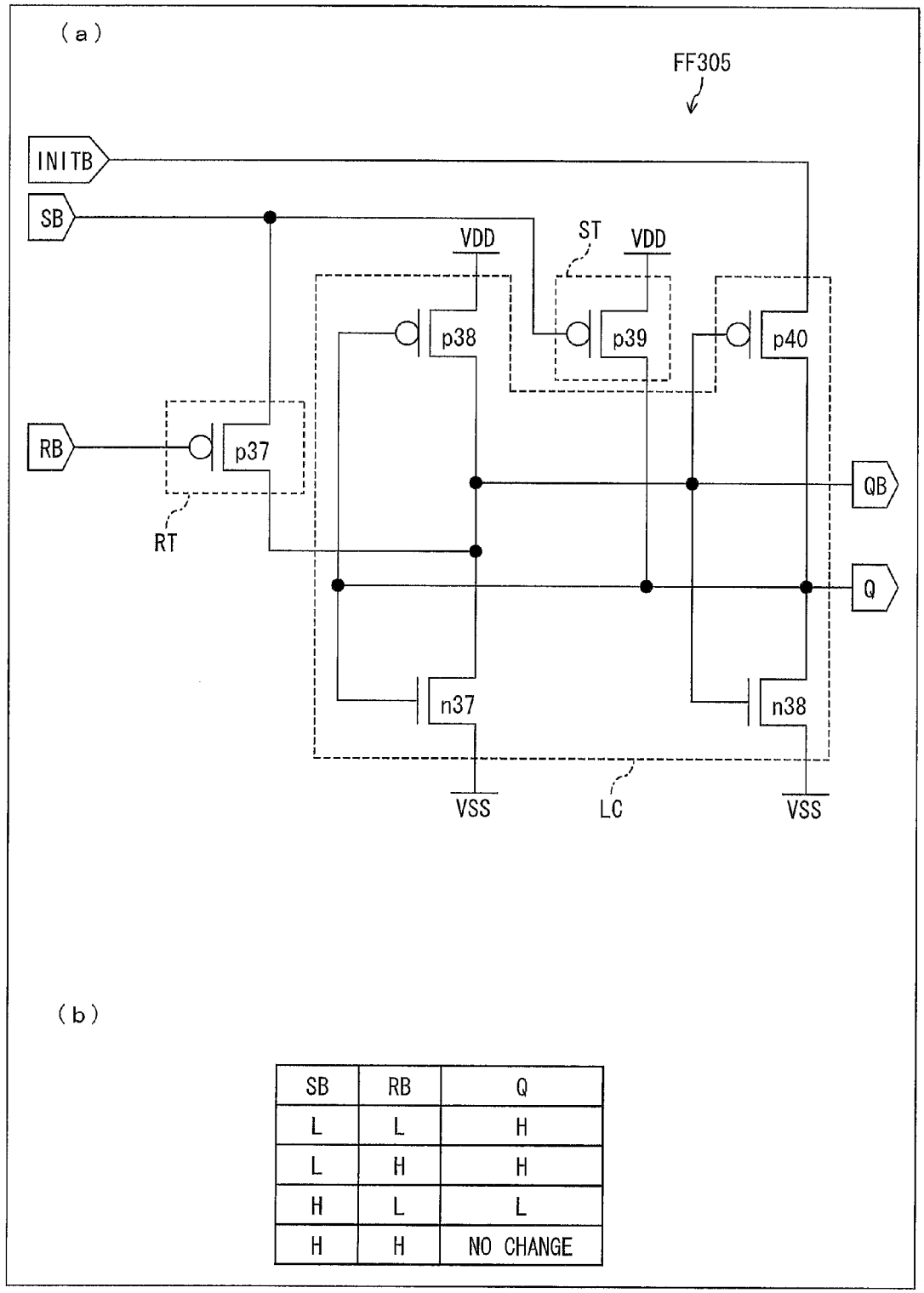
FIG. 13 is an explanatory view illustrating another flip-flop in accordance with Embodiment 3 of the present invention: (a) of FIG. 13 is a circuit diagram, and (b) of FIG. 13 is a truth table.

(a) of FIG. 13 is a circuit diagram illustrating another arrangement of the flip-flop in accordance with Embodiment 3 of the present invention. An FF 305 illustrated in (a) of FIG. 13 includes (i) a P channel transistor p38 and an N channel transistor n37 which constitute a CMOS circuit, (ii) a P channel transistor p40 and an N channel transistor n38 which constitute another CMOS circuit, (iii) P channel transistors p37 and p39, (iv) an SB terminal, (v) an RB terminal, (vi) an INIT terminal, (vii) a Q terminal, and (viii) a QB terminal. The FF 305 has an arrangement in which (i) a gate of the p38, a gate of the n37, a drain of the p40, a drain of the n38, a drain of the p39, and the Q terminal are connected to each other, (ii) a drain of the p38, a drain of the n37, a gate of the p40, a gate of the n38, a drain of the p3'7, and the QB terminal are connected to each other, (iii) a gate of the p37 is connected to the RB terminal, (iv) a source of the p37 and a gate of the p39 are connected to the SB terminal, (v) a source of the p40 is connected to the INITB terminal, (vi) a source of the n37 and a source of the n38 are connected to a VSS, and (vii) a source of the p38 and a source of the p39 are connected to a VDD. Here, the p38, the n37, the p40, and the n38 constitute a latch circuit LC. The p37 serves as a reset transistor RT. The p39 serves as a set transistor ST.

(b) of FIG. 13 is a truth table of the FF 305 (in a case where an INTB signal is inactive). A Q signal of the FF 305 is such that (i) it is high (active) during a time period in which an SB signal is low (active) and an RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) of FIG. 13).

Figure 14:
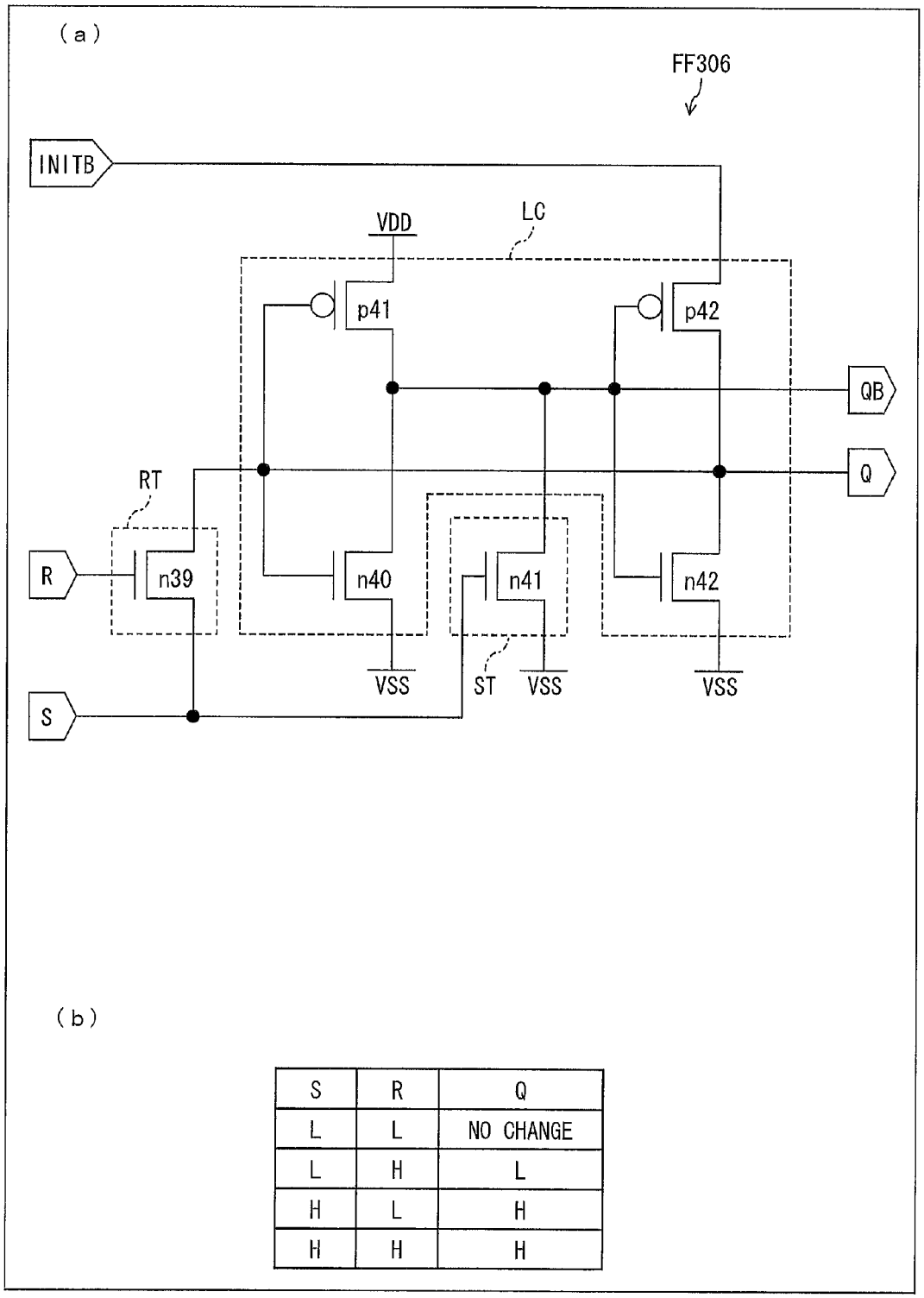
FIG. 14 is an explanatory view illustrating another flip-flop in accordance with Embodiment 3 of the present invention: (a) of FIG. 14 is a circuit diagram, and (b) of FIG. 14 is a truth table.

(a) of FIG. 14 is a circuit diagram illustrating an arrangement of an FF 306 which is a modified example of (a) of FIG. 13. The FF 306 illustrated in (a) of FIG. 14 includes (i) a P channel transistor p41 and an N channel transistor n40 which constitute a CMOS circuit, (ii) a P channel transistor p42 and an N channel transistor n42 which constitute another CMOS circuit, (iii) N channel transistors n39 and n41, (iv) an S terminal, (v) an R terminal, (vi) an INTIB terminal, (vii) a Q terminal, and (viii) a QB terminal. The FF 306 has an arrangement in which (i) a gate of the p41, a gate of the n40, a drain of the n39, a drain of the p42, a drain of the n42, and the Q terminal are connected to each other, (ii) a drain of the p41, a drain of the n40, a gate of the p42, a gate of the n42, a drain of the n41, and the QB terminal are connected to each other, (iii) a gate of the n39 is connected to the R terminal, (iv) a source of the n39 and a gate of the n41 are connected to the S terminal, (v) a source of the p42 is connected to the INITB terminal, (vi) a source of the p41 is connected to a VDD, and (vii) a source of the n40, a source of the n41, and a source of the n42 are connected to a VSS. Here, the p41, the n40, the p42, and the n42 constitute a latch circuit LC. The n39 serves as a reset transistor RT. The n41 serves as a set transistor ST.

(b) of FIG. 14 is a truth table of the FF 306 (in a case where an INTIB signal is inactive). A Q signal of the FF 306 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is high (active) during a time period in which the S signal is high (active) and the R signal is high (active) (see (b) of FIG. 14).

Figure 17:
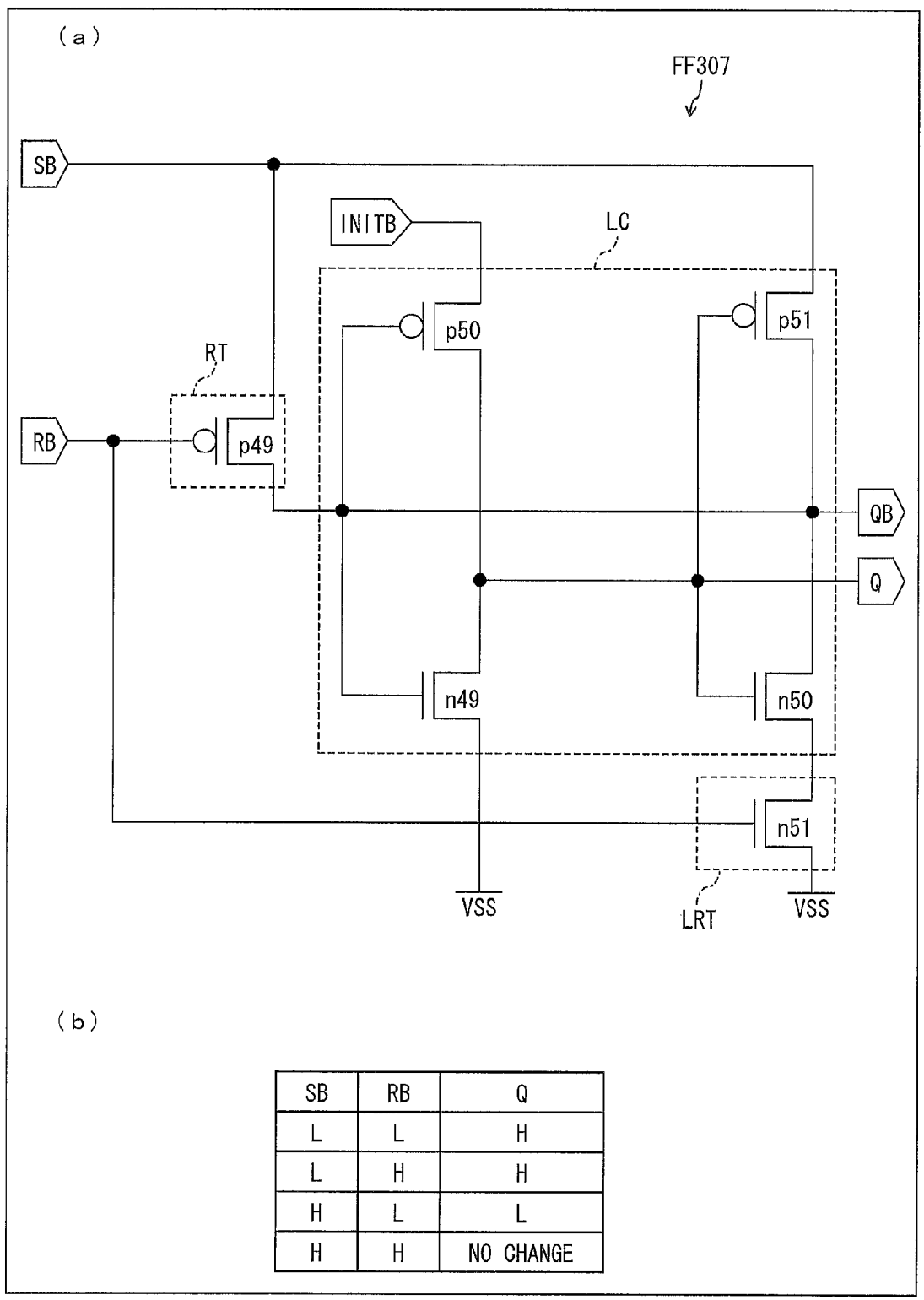
FIG. 17 is an explanatory view illustrating another flip-flop in accordance with Embodiment 3 of the present invention: (a) of FIG. 17 is a circuit diagram, and (b) of FIG. 17 is a truth table.

(a) of FIG. 17 is a circuit diagram illustrating another arrangement of the flip-flop in accordance with Embodiment 3 of the present invention. An FF 307 illustrated in (a) of FIG. 17 includes (i) a P channel transistor p50 and an N channel transistor n49 which constitute a CMOS circuit, (ii) a P channel transistor p51 and an N channel transistor n50 which constitute another CMOS circuit, (iii) a p channel transistor p49, (iv) an N channel transistor n51, (v) an SB terminal, (vi) an RB terminal, (vii) an INITB terminal, (viii) a Q terminal, and (ix) a QB terminal. The FF 307 has an arrangement in which (i) a gate of the p50, a gate of the n49, a drain of the p51, a drain of the n50, a drain of the p49, and the QB terminal are connected to each other, (ii) a drain of the p50, a drain of the n49, a gate of the p51, a gate of the n50, and the Q terminal are connected to each other, (iii) a source of the n50 and a drain of the n51 are connected to each other, (iv) a gate of the p49 and a gate of the n51 are connected to the RB terminal, (v) a source of the p49 and a source of the p51 are connected to the SB terminal, (vi) a source of the p50 is connected to the INITB terminal, and (vii) a source of the n49 and a source of the n51 are connected to a VSS. Here, the p50, the n49, the p51, and the n50 constitute a latch circuit LC. The p49 serves as a reset transistor RT. The n51 serves as a latch releasing transistor LRT.

(b) of FIG. 17 is a truth table of the FF 307 (in a case where an INTIB signal is inactive). A Q signal of the FF 307 is such that (i) it is high (active) during a time period in which an SB signal is low (active) and an RB signal is low (active), (ii) it is high (active) during a time period in which the SB signal is low (active) and the RB signal is high (inactive), (iii) it is low (inactive) during a time period in which the SB signal is high (inactive) and the RB signal is low (active), and (iv) it is in a retention state during a time period in which the SB signal is high (inactive) and the RB signal is high (inactive) (see (b) of FIG. 17).

Figure 18:
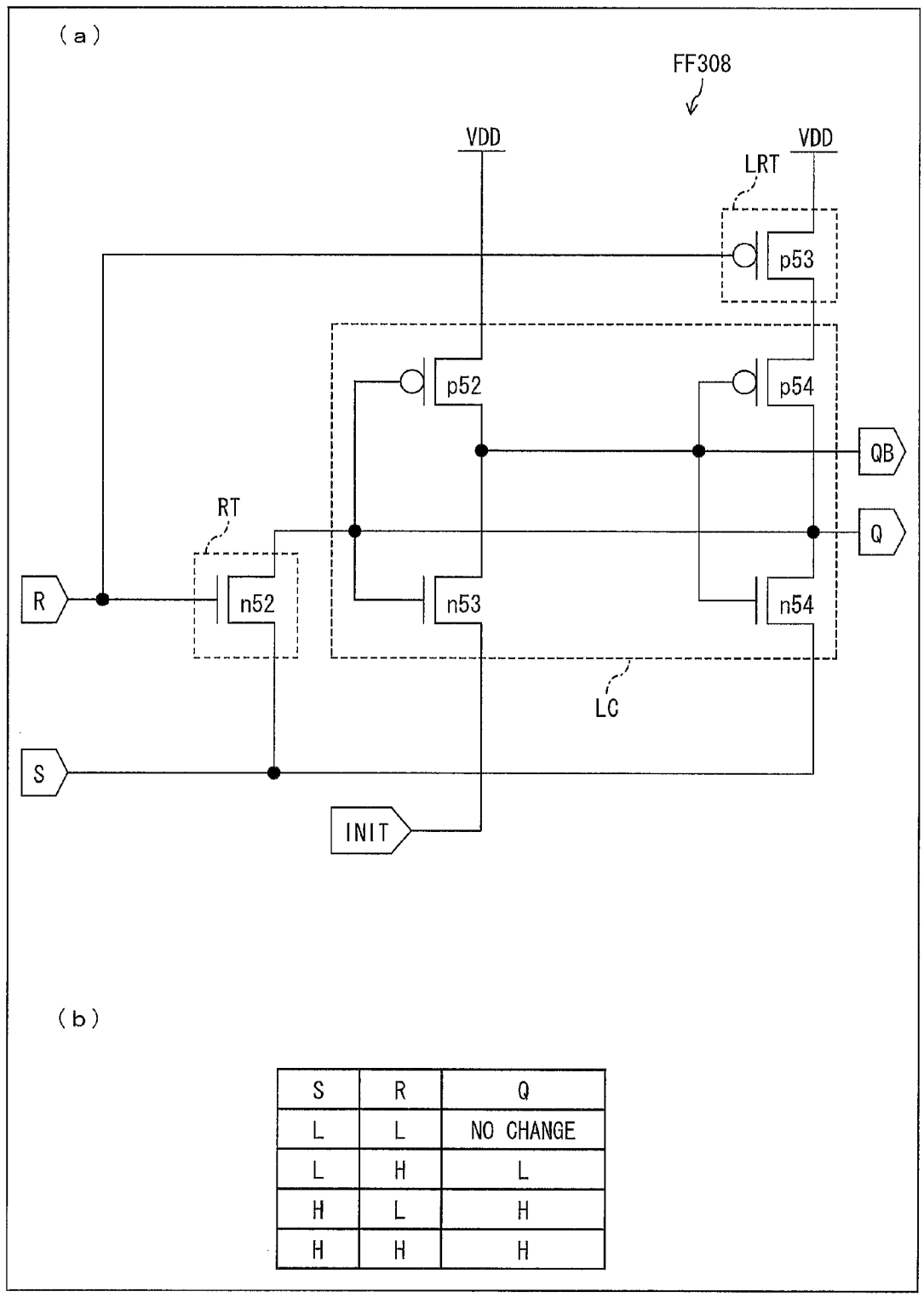
FIG. 18 is an explanatory view illustrating another flip-flop in accordance with Embodiment 3 of the present invention: (a) of FIG. 18 is a circuit diagram, and (b) of FIG. 18 is a truth table.

(a) of FIG. 18 is a circuit diagram illustrating an arrangement of an FF 308 which is a modified example of (a) of FIG. 17. The FF 308 illustrated in (a) of FIG. 18 includes (i) a P channel transistor p52 and an N channel transistor n53 which constitute a CMOS circuit, (ii) a P channel transistor p54 and an N channel transistor n54 which constitute another CMOS circuit, (iii) an N channel transistor n52, (iv) a P channel transistor p53, (v) an S terminal, (vi) an R terminal, (vii) an INIT terminal, (viii) a Q terminal, and (ix) a QB terminal. The FF 308 has an arrangement in which (i) a gate of the p52, a gate of the n53, a drain of the n52, a drain of the p54, a drain of the n54, and the Q terminal are connected to each other, (ii) a drain of the p52, a drain of the n53, a gate of the p54, a gate of the n54, and the QB terminal are connected to each other, (iii) a drain of the p53 and a source of the p54 are connected to each other, (iv) a gate of the n52 and a gate of the p53 are connected to the R terminal, (v) a source of the n54 and a source of the n52 are connected to the S terminal, (vi) a source of the n53 is connected to the INIT terminal, and (vii) a source of the p52 and a source of the p53 are connected to a VDD. Here, the p52, the n53, the p54, and the n54 constitute a latch circuit LC. The n52 serves as a reset transistor RT. The p53 serves as a latch releasing transistor.

(b) of FIG. 18 is a truth table of the FF 308 (in a case where an INIT signal is inactive). A Q signal of the FF 308 is such that (i) it is in a retention state during a time period in which an S signal is low (inactive) and an R signal is low (inactive), (ii) it is low (inactive) during a time period in which the S signal is low (inactive) and the R signal is high (active), (iii) it is high (active) during a time period in which the S signal is high (active) and the R signal is low (inactive), and (iv) it is high (active) during a time period in which the S signal is high (active) and the R signal is high (active) (see (b) of FIG. 18).

Figure 24:
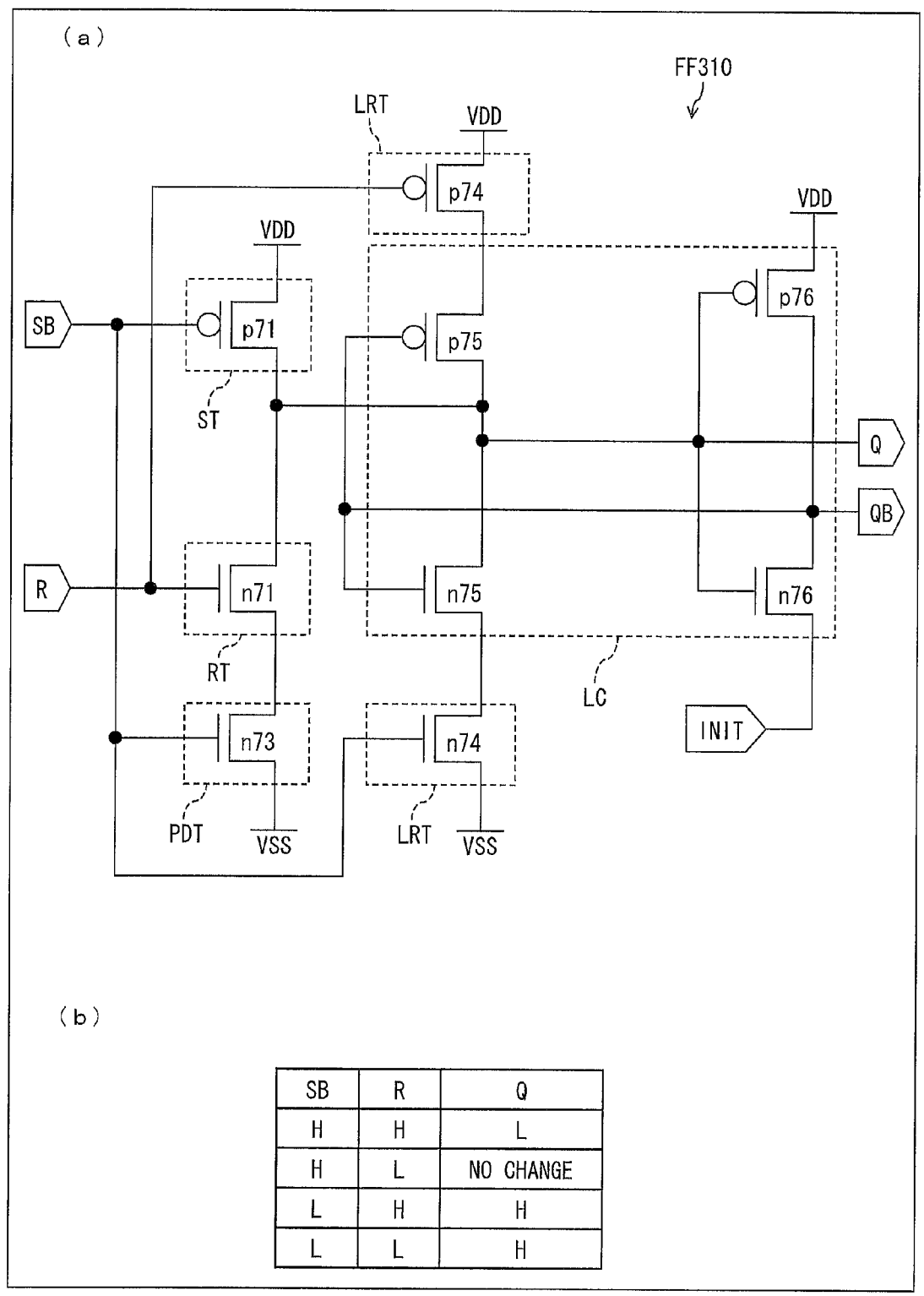
FIG. 24 is an explanatory view illustrating another flip-flop in accordance with Embodiment 1 of the present invention: (a) of FIG. 24 is a circuit diagram, and (b) of FIG. 24 is a truth table.

(a) of FIG. 24 is a circuit diagram illustrating another arrangement of the flip-flop in accordance with Embodiment 3 of the present invention. An FF 310 illustrated in (a) of FIG. 24 includes (i) a p channel transistor p75 and an N channel transistor n75 which constitute a CMOS circuit, (ii) a P channel transistor p76 and an N channel transistor n76 which constitute another CMOS circuit, (iii) P channel transistors p71 and p74, (iv) N channel transistors n71, n73, and n74, (v) an SB terminal, (vi) an R terminal, (vii) an INIT terminal, (viii) a Q terminal, and (ix) a QB terminal. The FF 310 has an arrangement in which (i) a gate of the p75, a gate of the n75, a drain of the p76, a drain of the n76, and the QB terminal are connected to teach other, (ii) a drain of the p75, a drain of the n75, a drain of the p71, a drain of the n71, a gate of the p76, a gate of the n76, and the Q terminal are connected to each other, (iii) a source of the n75 and a drain of the n74 are connected each other, (iv) a source of the n71 and a drain of the n73 are connected to each other, (v) a source of the p75 and a drain of the p74 are connected to each other, (vi) a gate of the p71, a gate of the n73, a gate of the n74 are connected to the SB terminal, (vii) a gate of the p74 and a gate of the n71 are connected to the R terminal, (viii) a source of the n76 is connected to the INIT terminal, (ix) a source of the p71, a source of the p74, a source of the p76 are connected to a VDD, and (x) a source of the n73 and a source of the n74 are connected to a VSS. Here, the p75, the n75, the p76, and the n76 constitute a latch circuit LC. The p71 serves as a set transistor ST. The n71 serves as a reset transistor RT. The n74 serves as a latch releasing transistor LRT. The p74 serves as a latch releasing transistor LRT. The n73 serves as a priority determining transistor PDT.

(b) of FIG. 24 is a truth table of the FF 310 (in a case where an INITB signal is inactive). A Q signal of the FF 310 is such that (i) it is low (inactive) during a time period in which an SB signal is high (inactive) and an R signal is high (active), (ii) it is in a retention state during a time period in which the SB signal is high (inactive) and the R signal is low (inactive), (iii) it is high (active) during a time period in which the SB signal is low (active) and the R signal is high (active), and (iv) it is high (active) during a time period in which the SB signal is low (active) and the R signal is low (inactive) (see (b) of FIG. 24).

Figure 26:
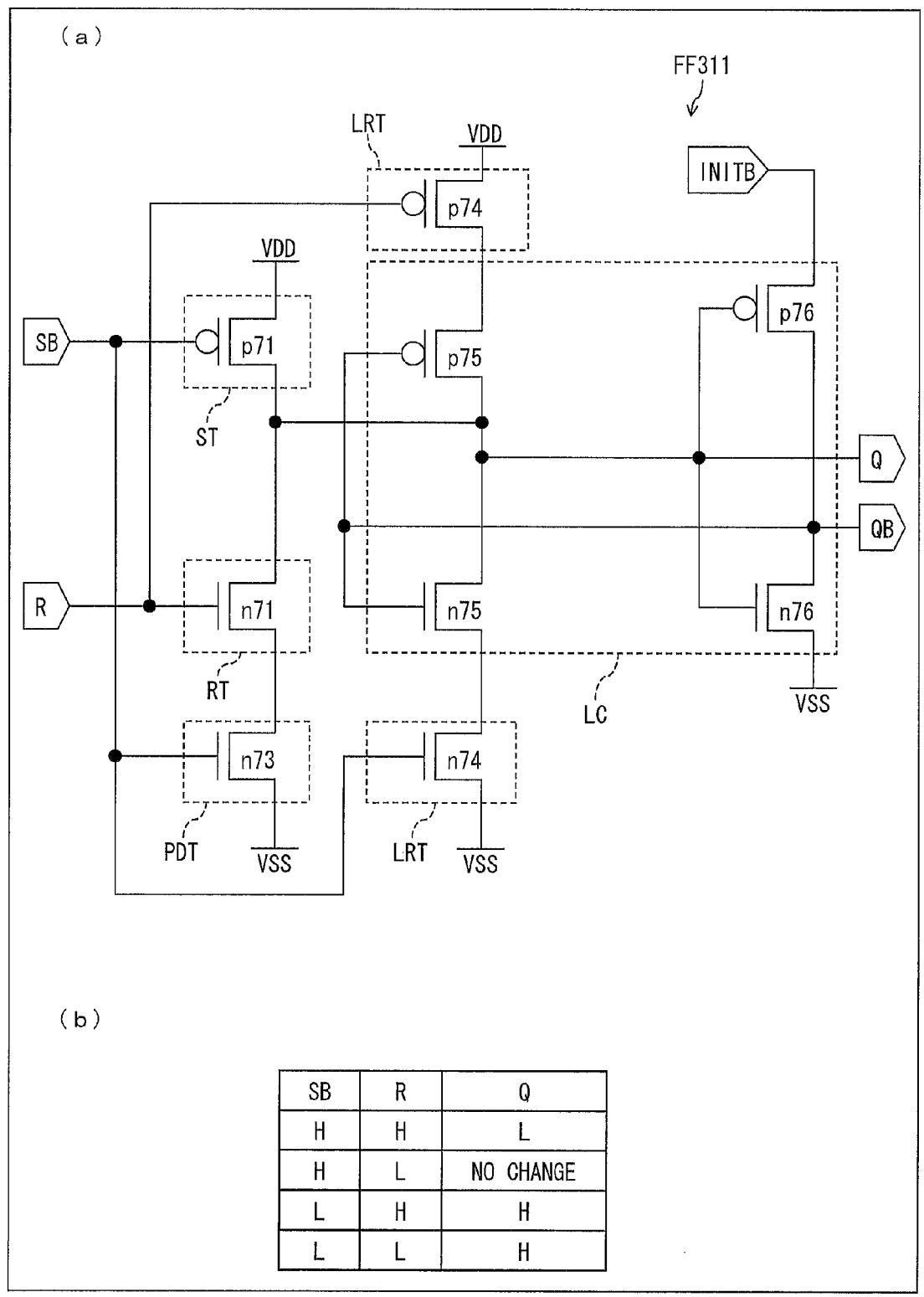
FIG. 26 is an explanatory view illustrating another flip-flop in accordance with Embodiment 1 of the present invention: (a) of FIG. 26 is a circuit diagram, and (b) of FIG. 26 is a truth table.

Note that it is possible to modify the FF 310 illustrated in (a) of FIG. 24 such that the source of the p76 is connected to the INITB terminal and the source of the n76 is connected to the VSS, as in an FF 311 illustrated in (a) of FIG. 26. (b) of FIG. 26 is a truth table of the FF 311.

Figure 72:
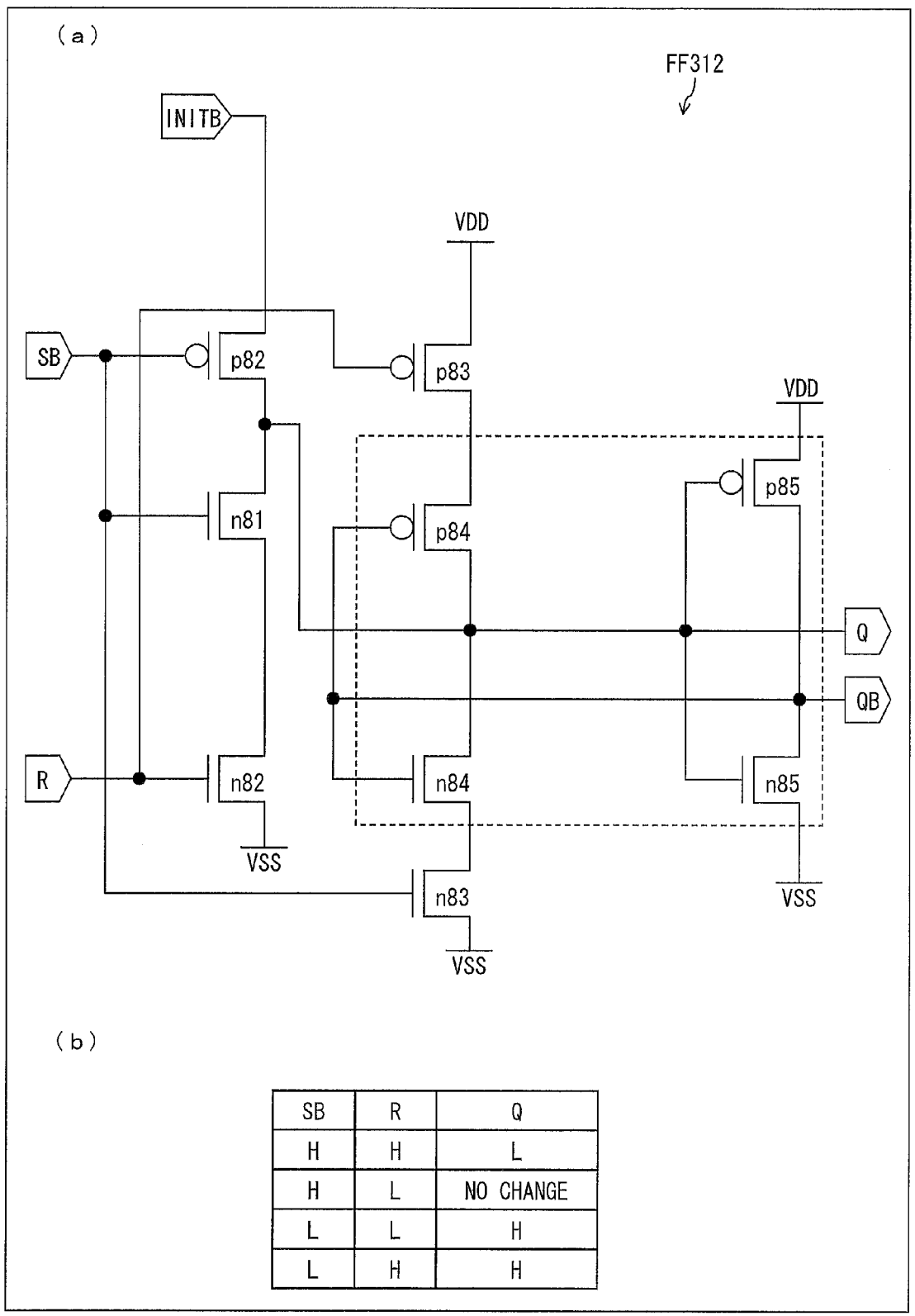
FIG. 72 is an explanatory view illustrating another flip-flop in accordance with Embodiment 3 of the present invention: (a) of FIG. 72 is a circuit diagram, and (b) of FIG. 71 is a truth table.

Further, the flip-flop of Embodiment 3 of the present invention can be modified to have an arrangement illustrated in (a) of FIG. 72. That is, an FF 312 illustrated in (a) of FIG. 72 has an arrangement in which (i) a source of a p82 (set transistor) is connected to an INITB terminal, (ii) a gate of the p82 is connected to (a) an SB terminal, (b) a gate of an n81, and (c) a gate of an n83, and (iii) a drain of the p82 is connected to a Q terminal. Further, the FF 312 has an arrangement in which (i) a drain of an n82 (reset transistor) is connected to a source of the n81, (ii) a gate of the n82 is connected to an R terminal and a gate of a p83, and (iii) a source of the n82 is connected to a VSS. Note that a drain of the p83 and a drain of the n83 are connected to a latch circuit LC. (b) of FIG. 72 is a truth table of the FF 312.

Application to Shift Register

Example 1

Figure 28:
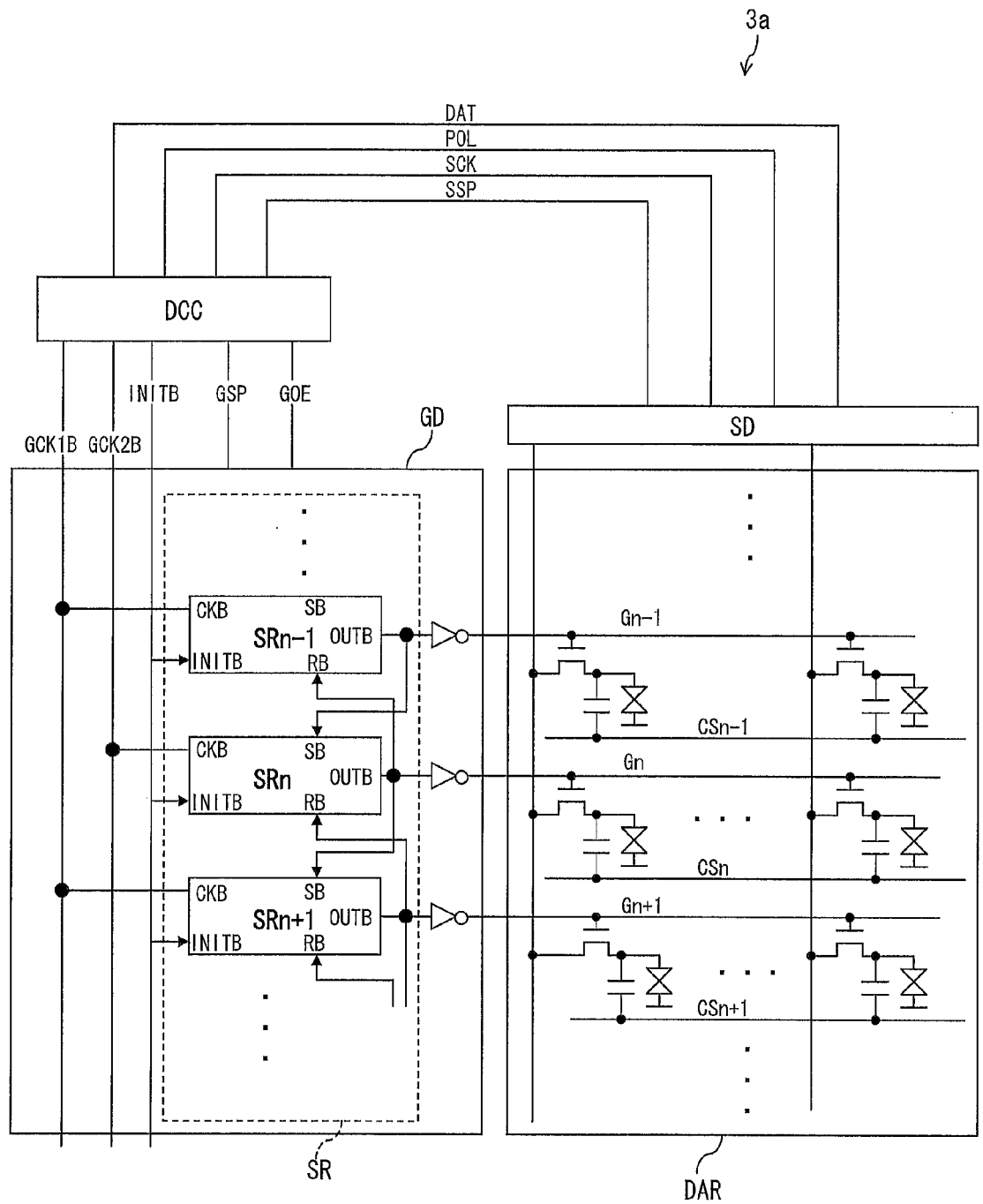
FIG. 28 is a view schematically illustrating an arrangement of a display device of the present invention.

FIG. 28 is a circuit diagram illustrating an arrangement of a liquid crystal display device 3a of the present invention. The liquid crystal display device 3a includes a display section DAR, a gate driver GD, a source driver SD, and a display control circuit DCC. The display control circuit DCC supplies, to the gate driver GD, (i) a gate start pulse GSP, (ii) a gate-on enable signal GOE, (iii) an INITB signal (initialization signal), and (iv) gate clock signals GCK1B and GCK2B. Further, the display control circuit DCC supplies, to the source driver SD, (i) a source start pulse SSP, (ii) digital data DAT, (iii) a polarity signal POL, and (iv) a source clock signal SCK. The gate driver GD includes a shift register SR which includes a plurality of stages. Hereinafter, an ith stage (i=1, ..., n−1, n, n+1, ...) of the shift register SR is merely referred to as "the ith stage SRi", as appropriate.

An output signal (OUTB signal) outputted from the ith stage SRi of the shift register is supplied to a scan signal line Gi of the display section DAR via an inverter. For example, an OUTS signal of the nth stage SRn is supplied to a scan signal line Gn via an inverter. In the display section DAR, the scan signal line Gn is connected to a gate of a transistor which is connected to a pixel electrode provided in a PIXn, and a retention capacitor (storage capacitor) is formed between the pixel electrode provided in the PIXn and a retention capacitor line CSn.

Figure 29:
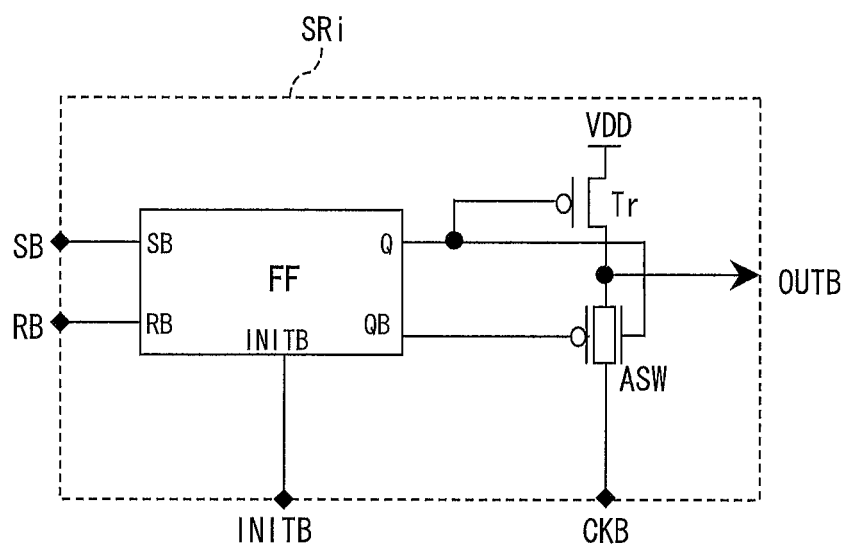
FIG. 29 is a circuit diagram illustrating each of a plurality of stages of a shift register of the display device illustrated in FIG. 28.

FIG. 29 is a circuit diagram illustrating an arrangement of the ith stage SRi of the shift register. Each of the plurality of stages of the shift register includes (i) a flip-flop FF in accordance with one of the aforementioned embodiments of the present invention, which flip-flop FF includes an SB terminal, an RB terminal, and an INITB terminal, (ii) an analogue switch ASW, (iii) a P channel transistor Tr, and (iv) a CKB terminal (see FIG. 29). The ith stage of the shift register has an arrangement in which (i) a Q terminal of the flip-flop FF is connected to a gate of the transistor Tr and one (on an N channel side) of two gates of the analogue switch ASW, (ii) a QB terminal of the flip-flop FF is connected to the other one (on a P channel side) of two gates of the analogue switch ASW, (iii) a source of the transistor Tr is connected to a VDD, (iv) a drain of the transistor Tr is connected to (a) an OUTB terminal which is an output terminal of this stage and (b) one of two conductive electrodes of the analogue switch ASW, and (v) the other one of two conductive electrodes of the analogue switch ASW is connected to the CKB terminal for receiving a clock signal.

During a time period in which a Q signal of the flip-flop FF of the ith stage SRi is low (inactive), the analogue switch ASW is in an off state and the transistor Tr is in an on state. Accordingly, the OUTB signal is high (inactive). Meanwhile, during a time period in which the Q signal is high (active), the analogue switch ASW is in the on state and the transistor Tr is in the off state. Accordingly, a GCKB signal is received and is outputted from the OUTB terminal. That is, the transistor Tr and the analogue switch ASW constitute a signal generation circuit (a gate circuit which obtains a power source potential or a clock signal in accordance with an output of the FF) for generating the OUTB signal by use of the output of the flip-flop FF.

The shift register SR has such an arrangement that (i) an OUTB terminal of a stage is connected to an SB terminal of a subsequent stage and (ii) an OUTB terminal of the subsequent stage is connected to an RB terminal of the stage. For example, an OUTB terminal of the nth stage SRn is connected to an SB terminal of the (n+1)th stage SRn+1, and an OUTB terminal of the (n+1)th stage SRn+1 is connected to an RB terminal of the nth stage SRn. Note that an SB terminal of the first stage SR1 of the shift register SR receives a GSPB signal. Further, the gate driver GD is arranged such that (i) CKB terminals of odd stages are connected to a first GCK line (a line for supplying a GCK signal), and CKB terminals of even stages are connected to a second GCK line (a line for supplying a GCK signal) which is different from the first GCK line, and (ii) INITB terminals of the odd stages and INITB terminals of the even stages are connected to a single INITB line (a line for supplying an INITB signal). For example, (i) a CKB terminal of the nth stage SRn is connected to a GCK2B signal line, (ii) a CKB terminal of the (n+1)th SRn+1 is connected to a GCK1B signal line, and (iii) an INITB terminal of the nth stage SRn and an INITB terminal of the (n+1)th stage SRn+1 are connected to a single INITB signal line.

Figure 30:
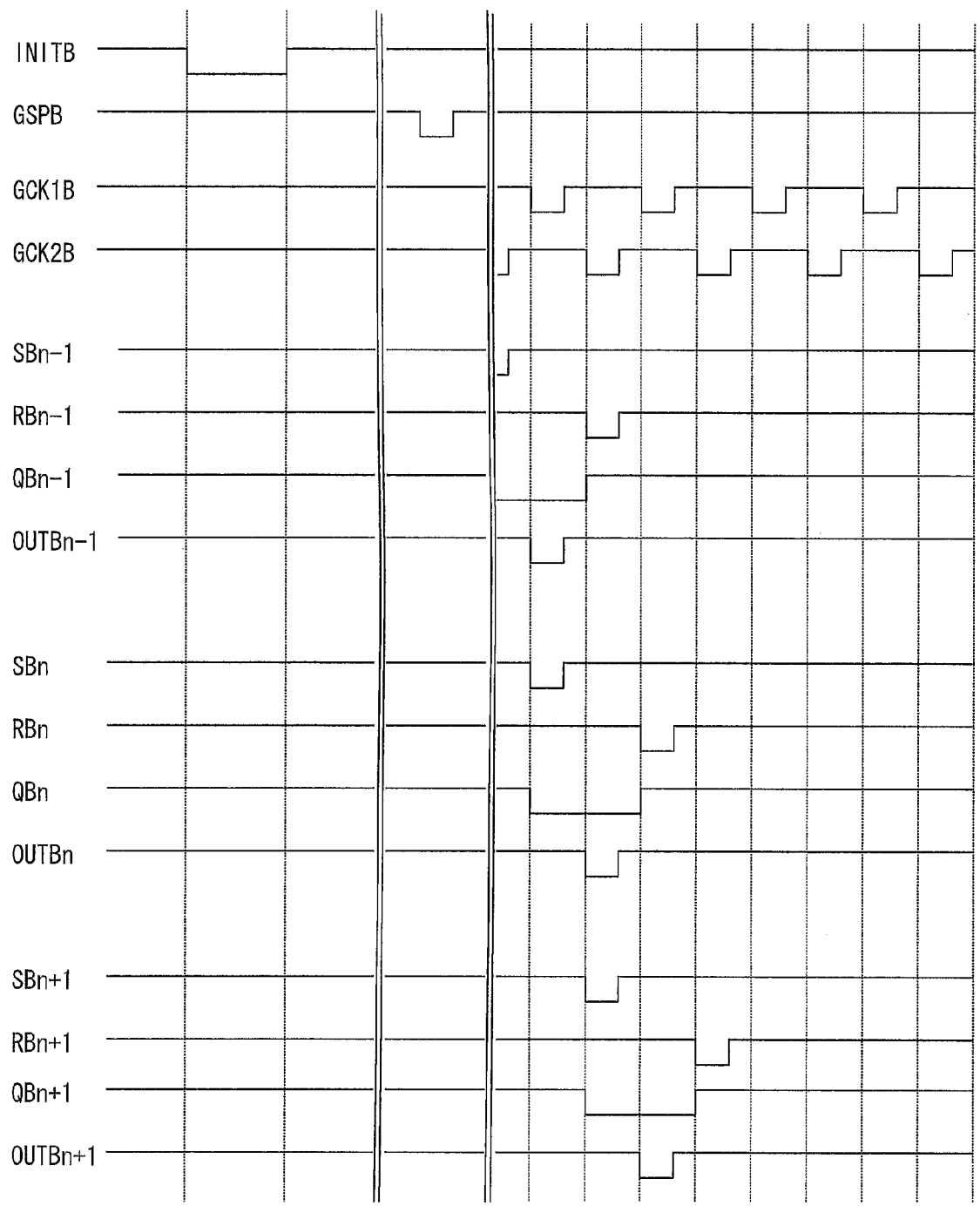
FIG. 30 is a timing chart showing how to drive the display device illustrated in FIG. 28.

FIG. 30 is a timing chart showing how to drive the liquid crystal display device 3a. In FIG. 30, "INITB" stands for an initialization signal, "GSPB" stands for a gate start pulse bar signal, "GCK1B" stands for a GCK1B signal, "GCK2B" stands for a GCK2B signal, and "SBi", "RBi", "QBi", and "OUTBi" (i=n−1, n, n+1) stands for, respectively, an SB signal (an electric potential at the SB terminal) of the ith stage SRi, an RB signal (an electric potential at the RB terminal) of the ith stage SRi, a QB signal (an electric potential at the QB terminal) of the ith stage SRi, and an OUTB signal (an electric potential at the OUTB terminal), of the ith stage SRi.

The shift register SR is such that, when an SB signal supplied to a stage is turned to be active (=low), an output of a flip-flop (FF) of the stage is set to be active, and the stage receives a GCKB signal. When the GCKB signal of the stage is turned to be active (=low), an OUTB signal of the stage is turned to be active (=low) and an SB signal of a subsequent stage is turned to be active. This causes an output of a flip-flop (FF) of the subsequent stage to be active, so that the subsequent stage receives the GCKB signal. When the GCKB signal of the subsequent stage is turned to be active (=low), the flip-flop (FF) of the stage is reset so that a Q signal is turned to be low (inactive). Accordingly, the OUTB terminal of the stage is connected to the VDD electrically, so that the OUTB signal of the stage is turned to be high (inactive).

Figure 31:
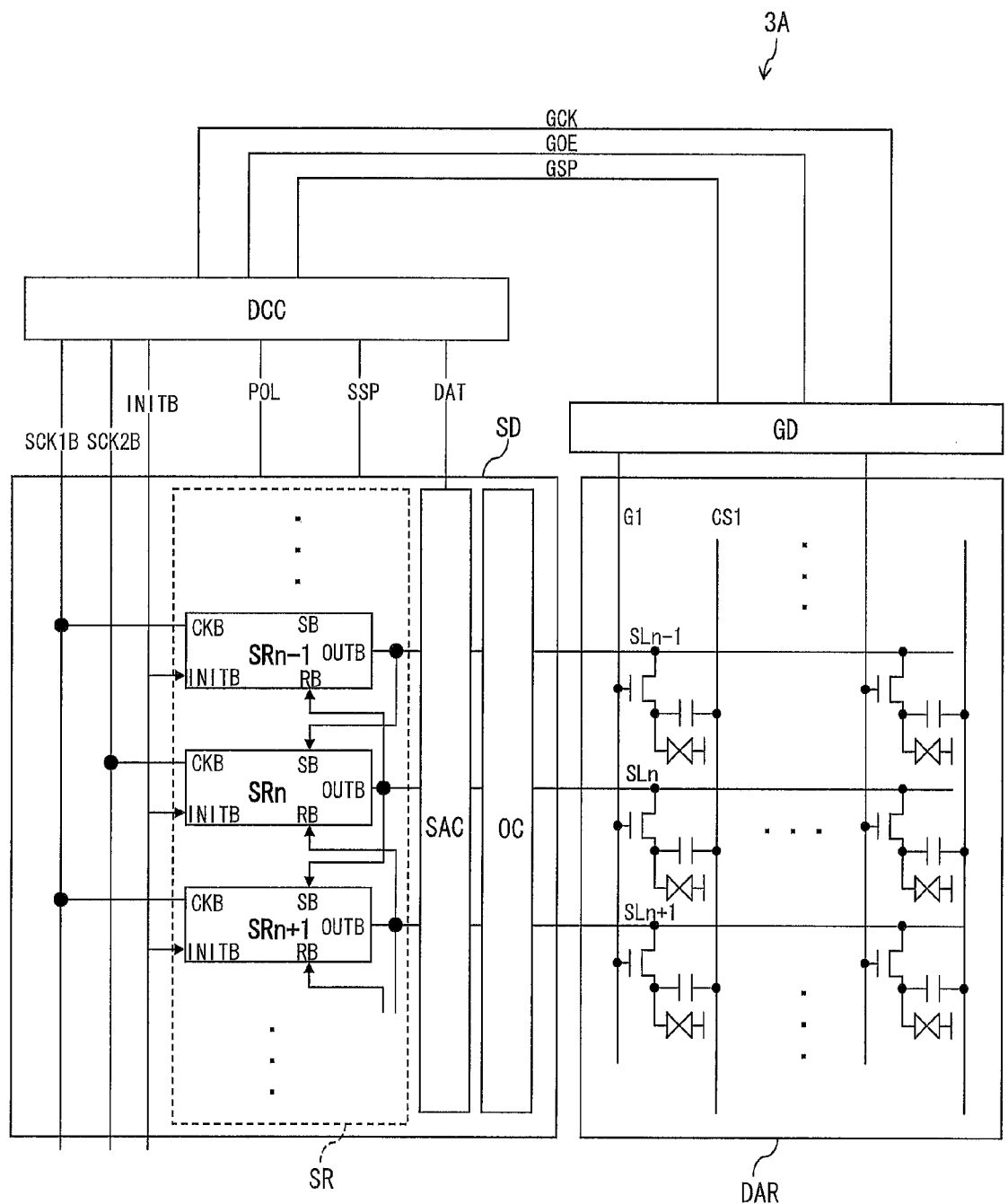
FIG. 31 is a view schematically illustrating another arrangement of the display device of the present invention.

FIG. 31 is a circuit diagram illustrating an arrangement of a liquid crystal display device 3A in which the shift register SR illustrated in FIG. 28 is used in a source driver. The source driver has an arrangement in which (i) the first stage of the shift register SR receives a source start pulse SSP and (ii) a CKB terminal of each of the plurality of stages receives a source clock bar signal SCK1B or SCK2B. Further, the ith stage SRi supplies an OUTB signal to a data signal line SLi of the display section DAR via a sampling circuit SAC and an output circuit OC. For example, the nth stage SRn supplies an OUTB signal to a data signal line SLn via the sampling circuit SAC and the output circuit OC. In the display section DAR, the data signal line SLn is connected to a source of a transistor which is connected to a pixel electrode provided in a PIXn.

Figure 32:
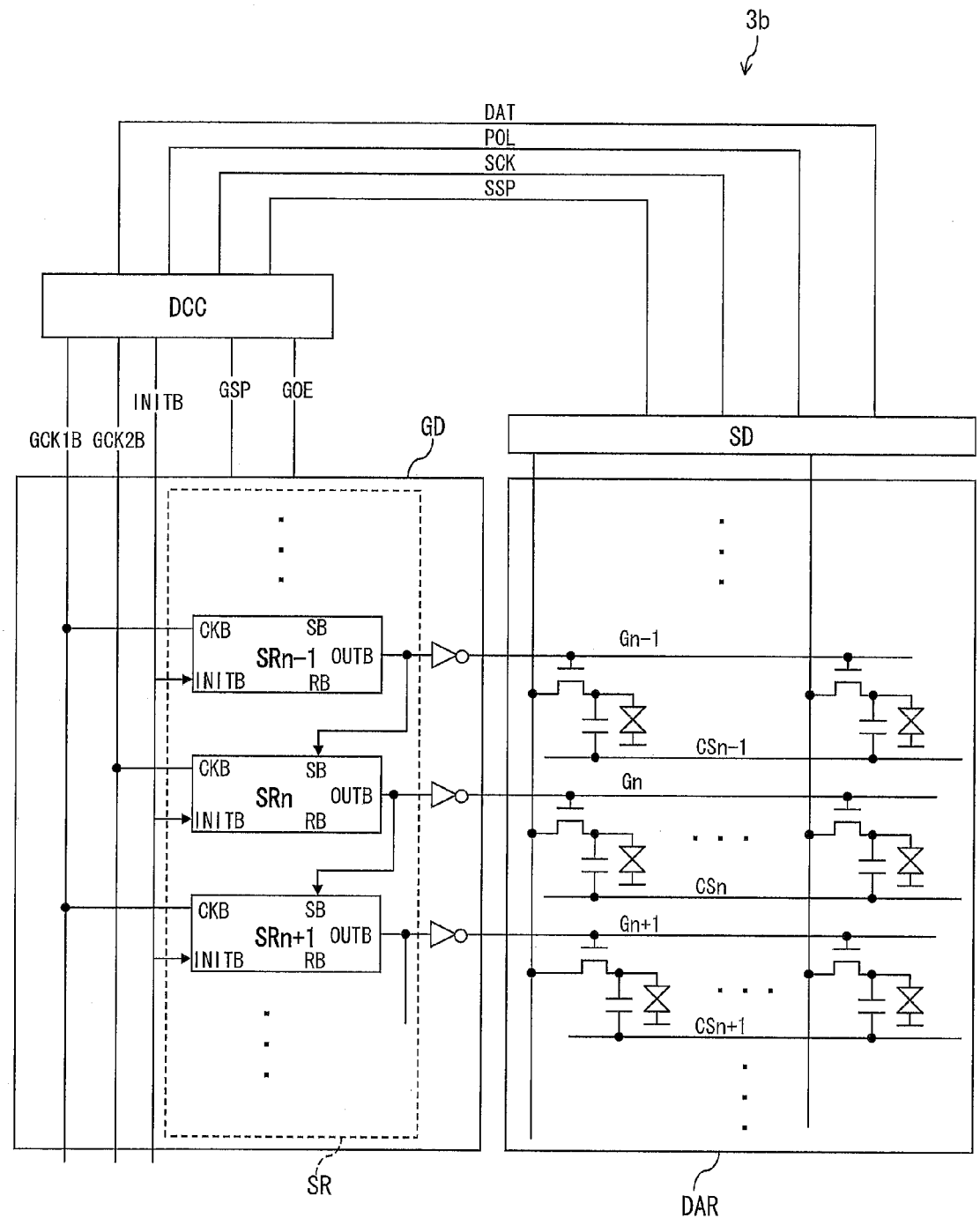
FIG. 32 is a view schematically illustrating another arrangement of the display device of the present invention.

FIG. 32 is a circuit diagram illustrating an arrangement of a liquid crystal display device 3b in which the arrangement of the shift register SR illustrated in FIG. 28 is modified.

FIG. 33 is a circuit diagram illustrating the ith stage SRi of the shift register SR illustrated in FIG. 32. Each of the plurality of stages of the shift register includes (i) a flip-flop FF in accordance with one of the aforementioned embodiments of the present embodiment, which flip-flop FF includes an SB terminal, an RB terminal, and an INITB terminal, (ii) two analogue switches ASW1 and ASW2, (iii) a NAND, (iv) an inverter, and (v) a CKB terminal (see FIG. 33). The ith stage SRi has an arrangement in which (i) a QB terminal of a flip-flop FF is connected to one of two inputs of the NAND, (ii) an output of the NAND is connected to (a) an input of the inverter, (b) one (on a P channel side) of two gates of the analogue switch ASW1, and (c) one (on an N channel side) of two gates of the analogue switch ASW2, (iii) an output of the inverter is connected to the other one (on the N channel side) of two gates of the analogue switch ASW1 and the other one (on the P channel side) of two gates of the analogue switch ASW2, (iv) one of two conductive electrodes of the analogue switch ASW1 is connected to a VDD terminal, (v) one of two conductive electrodes of the analogue switch ASW2 is connected to the CKB terminal, and (vi) the other one of two conductive electrodes of the analogue switch ASW1, the other one of two conductive electrodes of the analogue switch ASW2, an OUTB terminal which is an output terminal of this stage, the other one of two inputs of the NAND, and an RB terminal of the FF are connected to each other.

The ith stage SRi is such that, during a time period in which a QB signal (an input X of the NAND) of the flip-flop FF is high (inactive), (i) the output (M) of the NAND is low (the analogue switch ASW1 is in an on state and the analogue switch ASW2 is in an off state) and the OUTB signal is turned to be Vdd (inactive), in a case where an OUTB signal (an input Y of two inputs of the NAND) is high (inactive), and (ii) the output (M) of the NAND is turned to be high (the analogue switch ASW1 is in the off state and the analogue switch ASW2 is in the on state) and the GCKB signal is received and outputted from the OUTB terminal, in a case where an OUTB signal (an input Y of the NAND) is low (active). Further, the ith stage SRi is such that, during a time period in which the QB signal is low (active), since the input X of the NAND is low and the other input Y of the NAND is low, the output (M) of the NAND is turned to be high (the analogue switch ASW1 is in the off state and the analogue switch ASW2 is in the on state) and the GCKB signal is received and outputted from the OUTB terminal. That is, the NAND, the inverter, and the analogue switches ASW1 and ASW2 constitute a signal generation circuit for generating an OUTB signal by use of the output of the flip-flop FF. Particularly, the inverter and the analogue switches ASW1 and ASW2 constitute a gate circuit which obtains a power source potential or a clock signal in accordance with the output M of the NAND.

The shift register SR illustrated in FIG. 32 has an arrangement in which an OUTB terminal of a stage is connected to an SB terminal of a subsequent stage. For example, an OUTB terminal of the nth stage SRn is connected to an SB terminal of the (n+1)th stage SRn+1. Note that an SB terminal of the first stage SR1 of the shift register SR receives a GSPB signal. The gate driver GD illustrated in FIG. 32 has such an arrangement that (i) CKB terminals of odd stages are connected to a first GCK line (a line for supplying a GCK signal) and CKB terminals of even stages are connected to a second GCK line (a line for supplying a GCK signal) which is different from the first GCK line, and (ii) INITB terminals of the odd stages and INTB terminals of the even stages are connected to a single INITB line (a line for supplying an INITB signal). For example, (i) a CKB terminal of the nth stage SRn is connected to a GCK2B signal line, (ii) a CKB terminal of the (n+1)th stage SRn+1 is connected to a GCK1B signal line, and (iii) an INTIB terminal of the nth stage SRn and an INITB terminal of the (n+1)th stage SRn+1 are connected to a single INITB signal line.

Figure 34:
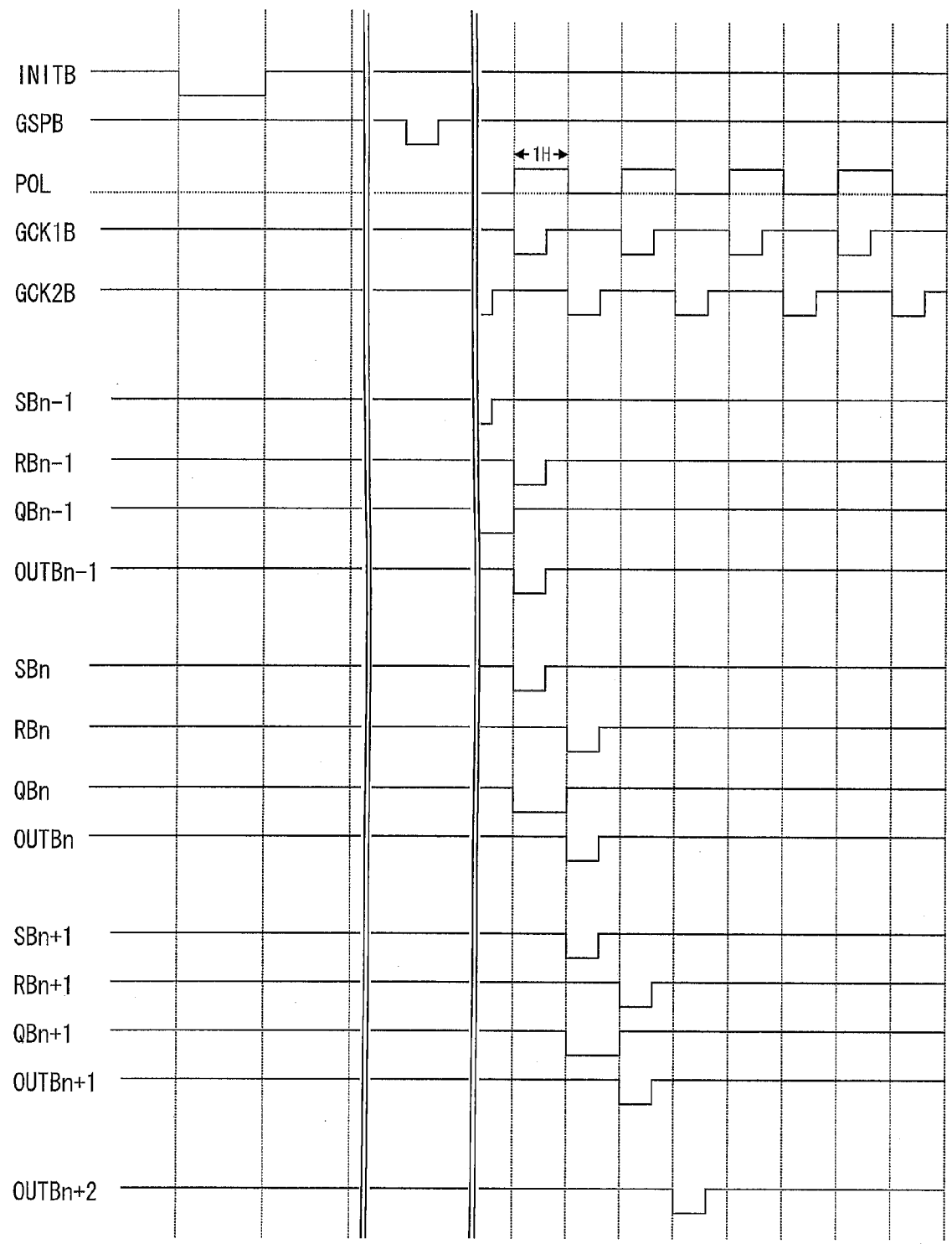
FIG. 34 is a timing chart showing how to drive the display device illustrated in FIG. 32.

FIG. 34 is a timing chart showing how to drive the liquid crystal display device 3b. The shift register SR illustrated in FIG. 32 is such that, when an SB signal supplied to a stage is turned to be active (=low), an output of a flip-flop FF of the stage is set to be active and the stage receives a GCKB signal. When the GCKB signal of the stage is turned to be active (=low), (i) an OUTB signal of the stage is turned to be active (=low), (ii) an SB signal of a subsequent stage is turned to be active (=low), and (iii) a flip-flop FF of the stage is reset to be high (inactive). Here, since an OUTB signal of the stage is low (i.e., an output of a NAND is high), the stage keeps receiving the GCKB signal. When the GCKB signal is turned to be high (inactive), the OUTB signal of the stage is turned to be high, and the output of the NAND is turned to be low. After that, the OUTB terminal is connected to the VDD electrically, so that the OUTS signal is turned to be high (inactive).

Figure 35:
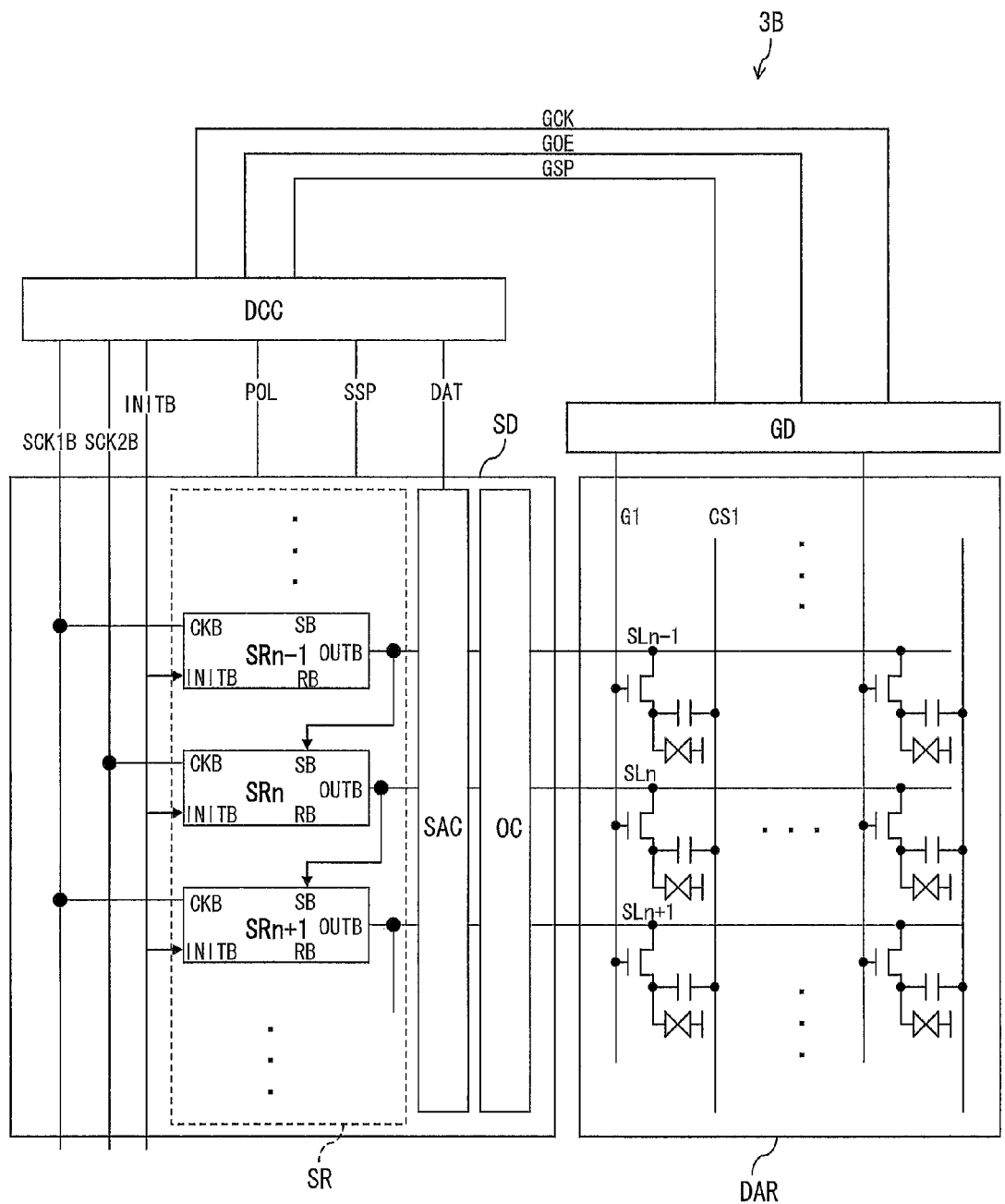
FIG. 35 is a view schematically illustrating another arrangement of the display device of the present invention.

FIG. 35 is a circuit diagram illustrating a liquid crystal display device 3B in which the shift register SR illustrated in FIG. 32 is used in the source driver. The source driver has an arrangement in which (i) a source start pulse SSP is supplied to the first stage of the shift register SR and (ii) the CKB terminal of each of the plurality of stages of the shift register SR receives a source clock bar signal SCK1B or SCK2B. Further, the ith stage SRi supplies an OUTB signal to a data signal line SLi of the display section DAR via a sampling circuit SAC and an output circuit OC. For example, the nth stage SRn supplies an OUTB signal to a data signal line SLn via the sampling circuit SAC and the output circuit OC. The display section DAR has an arrangement in which the data signal line SLn is connected to a source of a transistor which is connected to a pixel electrode provided in a PIXn.

Figure 36:
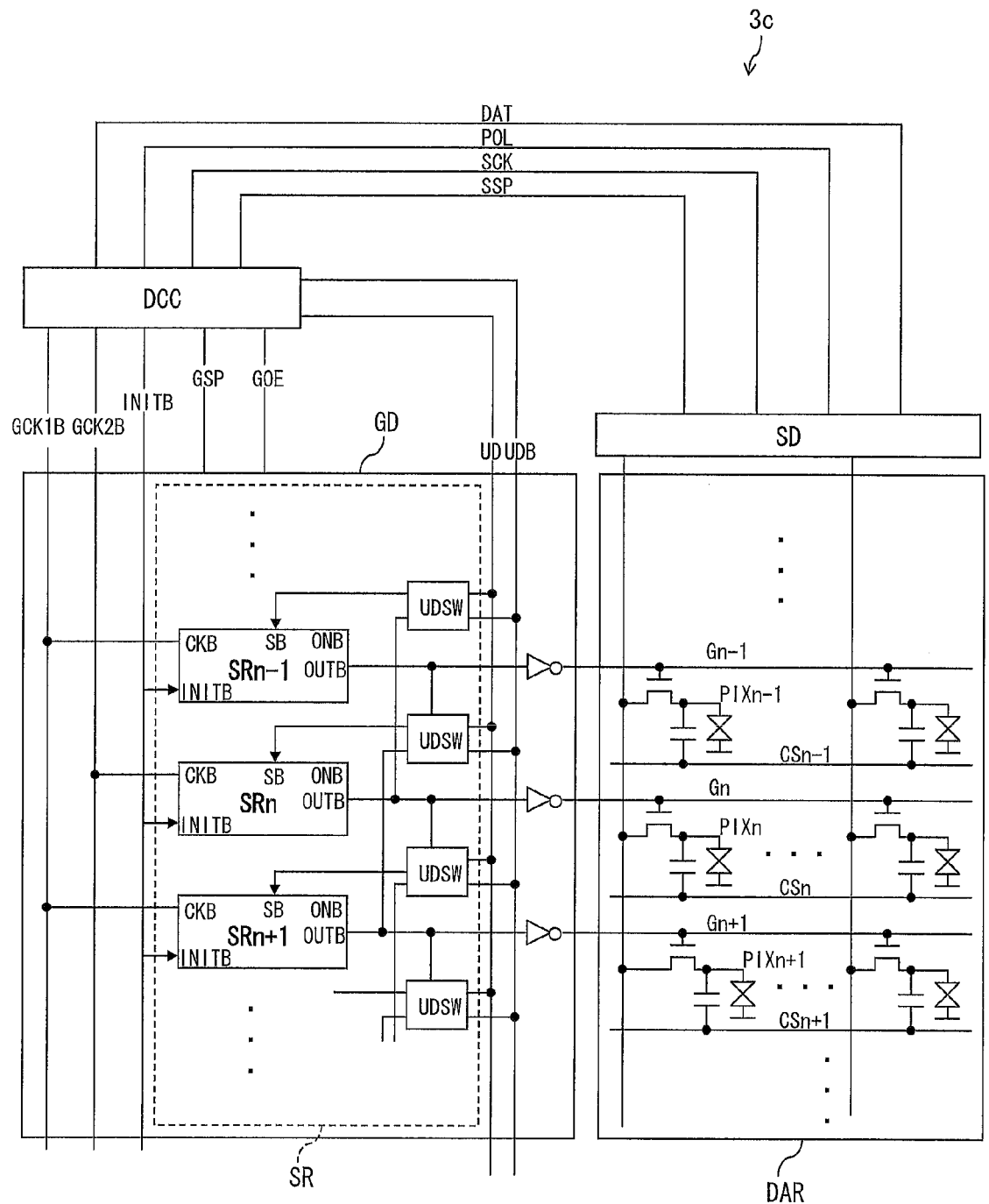
FIG. 36 is a view schematically illustrating another arrangement of the display device of the present invention.

Further, FIG. 36 is a circuit diagram illustrating an arrangement of a liquid crystal display device 3c in which the shift register SR illustrated in FIG. 32 can carry out shifting in both directions (directions opposite to each other). The liquid crystal display device 3c includes an up-down switch UDSW for each of the plurality of stages of the shift register SR. Each up-down switch UDSW receives an UD signal and an UDB signal. For example, the UDSWn−1 is connected to (i) an OUTB terminal of the (n−1)th stage SRn−1, (ii) an SB terminal of the nth stage SRn, and (iii) an OUTB terminal of the (n+1)th stage SRn+1. The UDSWn is connected to (i) an OUTB terminal of the nth stage SRn, (ii) an SB terminal of the (n+1)th stage SRn+1, and (iii) an OUTB terminal of the (n+2)th stage SRn+2. Further, for example, in a case where down-shifting is carried out from the nth stage SRn to the (n+1)th stage SRn+1, the OUTS terminal of the nth stage SRn and the SB terminal of the (n+1)th stage SRn+1 are connected to each other electrically in the UDSWn by use of the UD signal and the UDB signal. Further, in a case where up-shifting is carried out from the (n+1)th stage SRn+1 to the nth stage SRn, the OUTB terminal of the (n+1)th stage SRn+1 and the SB terminal of the nth stage SRn are connected to each other electrically in the UDSWn−1 by use of the UD signal and the UDB signal.

Each of the liquid crystal display devices 3a through 3c, 3A, and 3B employs a flip-flop in accordance with one of the aforementioned embodiments of the present invention. It is therefore possible to provide, with any one of the liquid crystal display devices 3a through 3c, 3A, and 3B, a compact G-Cs driver.

Application to Shift Register

Example 2

Figure 37:
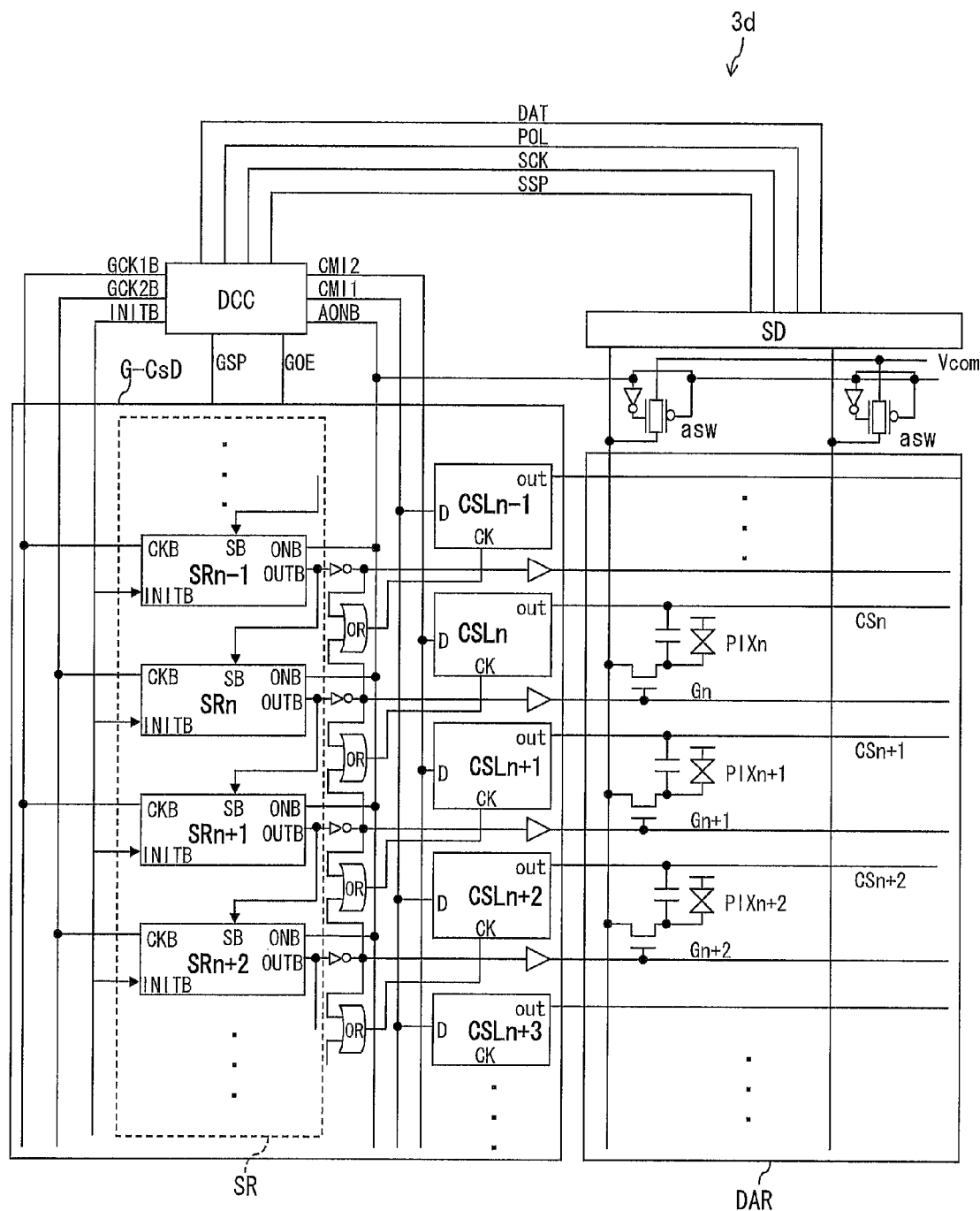
FIG. 37 is a view schematically illustrating another arrangement of the display device of the present invention.

FIG. 37 is a circuit diagram illustrating a liquid crystal display device 3d of the present invention. The liquid crystal display device 3d is a liquid crystal display device employing what is called "CC (charge coupled) driving", and includes a display section DAR, a gate-Cs driver G-CsD, a source driver SD, and a display control circuit DCC. The display control circuit DCC supplies, to the gate driver GD, a gate start pulse signal GSP, a gate-on enable signal GOE, an INITB signal (initialization signal), an AONB signal (all-on signal), CS inversion signals CMI1 and CMI2, and gate clock signals GCK1B and GCK2B. Further, the display control circuit DCC supplies, to the source driver SD, a source start pulse SSP, digital data DAT, a polarity signal POL, and a source clock signal SCK. The gate-Cs driver G-CsD includes (i) a shift register SR including a plurality of stages and (ii) a plurality of D latch circuits CSL. Further, the gate-Cs driver G-CsD includes, for each of the plurality of stages, (i) one inverter, (ii) one OR circuit, and (iii) one D latch circuit CSL. Hereinafter, the ith (i=1, . . . , n−1, n, n+1, . . . ) stage of the shift register SR is referred to as "the ith stage SRi" for the sake of simple explanation, as appropriate. Further, a D latch circuit CSLi corresponds to the ith stage SRi of the shift register.

The ith stage of the SRi of the shift register supplies an output signal (OUTS signal) to a scan signal line Gi of the display section DAR via an inverter and a buffer. Further, the D latch circuit CSLi corresponding to the ith stage SRi supplies an output signal (an out signal, a CS signal) to a retention capacitor line CSi of the display section DAR. For example, the nth stage SRn supplies an OUTB signal to a scan signal line Gn via an inverter and a buffer, and a D latch circuit CSLn corresponding to the nth stage SRn supplies an output signal (an out signal, a CS signal) to a retention capacitor line CSn of the display section DAR. The display section DAR has an arrangement in which (i) the scan signal line Gn is connected to a gate of a transistor which is connected to a pixel electrode provided in a PIXn and (ii) a retention capacitor (storage capacitor) is formed between the pixel electrode provided in the PIXn and the retention capacitor line CSn.

Further, for each of a plurality of data signal lines, one analogue switch asw and one inverter are provided. An input of the inverter is connected to an AONB signal line. An end of the data signal line is connected to one of two conductive terminals of the analogue switch asw. The other one of two conductive terminals of the analogue switch asw is connected to a Vcom (an electric potential of a common electrode) power source. One (on an N channel side) of two gates of the analogue switch asw is connected to an output of the inverter, while the other one (on a P channel side) of two gates of the analogue switch asw is connected to the AONB signal line.

Figure 38:
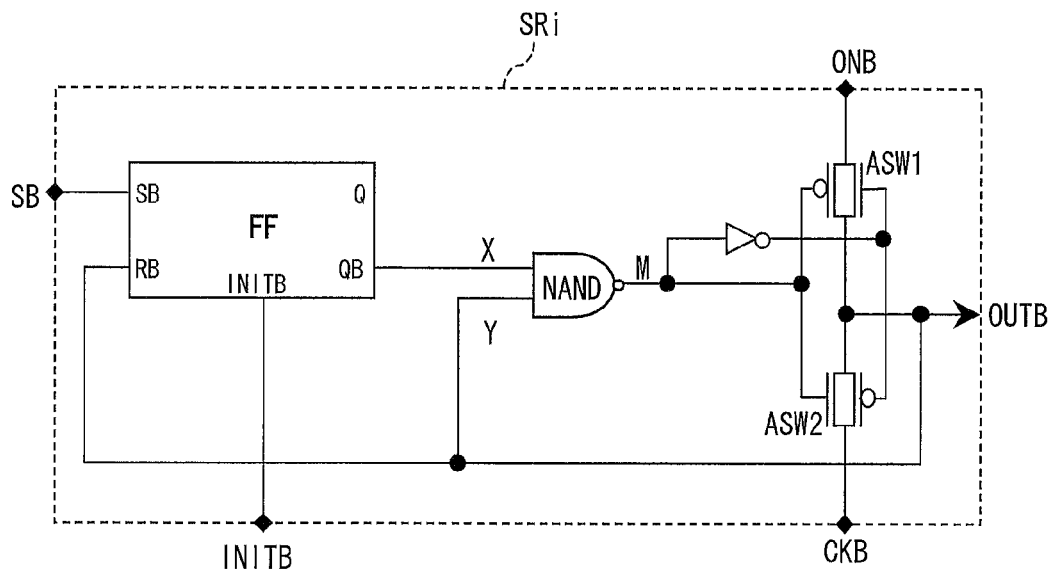
FIG. 38 is a circuit diagram illustrating each of a plurality of stages of a shift register of the display device illustrated in FIG. 37.

FIG. 38 is a circuit diagram illustrating an arrangement of the ith stage SRi of the shift register illustrated in FIG. 37. Each of the plurality of stages of the shift register includes (i) a flip-flop FF in accordance with one of the aforementioned embodiments of the present invention, which includes an SB terminal, an RB terminal, and an INITB terminal, (ii) two analogue switches ASW1 and ASW2, (iii) a NAND, (iv) an inverter, (v) a CKB terminal, and (vi) an ONB terminal (see FIG. 38). The ith stage SRi has an arrangement in which (i) a QB terminal of the flip-flop FF is connected to one of two inputs of the NAND, (ii) an output of the NAND is connected to (a) an input of the inverter, (b) one (on a P channel side) of two gates of the analogue switch ASW1, and (c) one (on an N channel side) of two gates of the analogue switch ASW2, (iii) an output of the inverter is connected to the other one (on the N channel side) of two gates of the analogue switch ASW1, and the other one (on the P channel side) of two gates of the analogue switch ASW2, (iv) one of two conductive electrodes of the analogue switch ASW1 is connected to the ONB terminal, (v) one of two conductive electrodes of the analogue switch ASW2 is connected to the CKB terminal, and (vi) the other one of two conductive electrodes of the analogue switch ASW1, the other one of two conductive electrodes of the analogue switch ASW2, the other one of two inputs of the NAND, the RB terminal of the flip-flop FF, and an OUTB terminal which is an output terminal of this stage, are connected to each other.

The ith stage SRi is such that, during a time period in which a QB signal (an input X of the NAND) of the flip-flop FF is high (inactive), (i) the output (M) of the NAND is low (the analogue switch ASW1 is in an on state and the analogue switch ASW2 is in an off state), and the OUTB terminal receives an AONB signal (=inactive=Vdd), in a case where an OUTB signal (an input Y of the NAND) is high (inactive), and (ii) the output (M) of the NAND is high (the analogue switch ASW1 is in the off state and the analogue switch ASW2 is in the on state) and a GCKB signal is received and outputted from the OUTB terminal, in a case where the OUTS signal (the input Y of the NAND) is low (active). Further, during a time period in which the QB signal of the flip-flop FF is low (active), since the input X of the NAND is low and the input Y of the NAND is low, the output (M) of the NAND is turned to be high (the analogue switch ASW1 is in the off state and the analogue switch ASW2 is in the on state) and the GCKB signal is received and outputted from the OUTB terminal. That is, the NAND, the inverter, and the analogue switches ASW1 and ASW2 constitute a signal generation circuit for generating an OUTB signal by use of the output of the flip-flop FF. Particularly, the inverter and the analogue switches ASW1 and ASW2 constitute a gate circuit for obtaining an AONB signal or a clock signal in accordance with the output M of the NAND.

Figure 39:
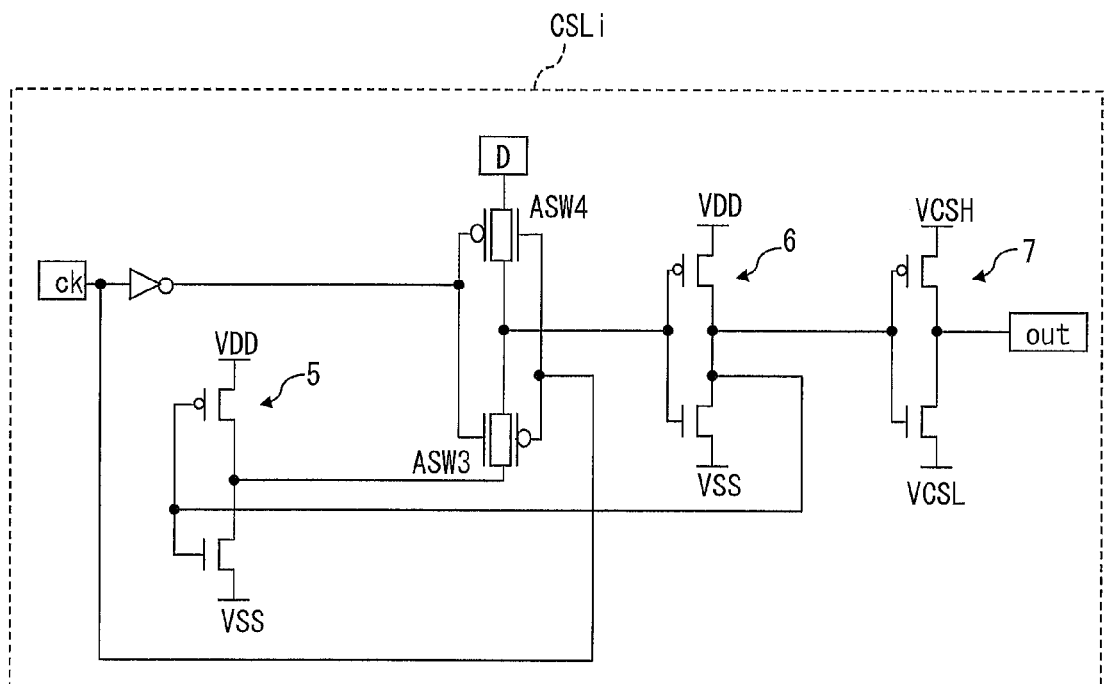
FIG. 39 is a circuit diagram illustrating a D latch circuit of a G-Cs driver of the display device illustrated in FIG. 37.

FIG. 39 is a circuit diagram illustrating an arrangement of a D latch circuit CSLi corresponding to the ith stage SRi of the shift register SR illustrated in FIG. 37. The D latch circuit CSLi includes three CMOS circuits 5 through 7, analogue switches ASW3 and ASW4, an inverter, a CK terminal, a D terminal, and an out terminal (see FIG. 39). Each of the CMOS circuits 5 and 6 has an arrangement in which (i) a gate of a P channel transistor and a gate of an N channel transistor are connected to each other, (ii) a drain of the P channel transistor and a drain of the N channel transistor are connected to each other, (iii) a source of the P channel transistor is connected to a VDD, and (iv) a source of the N channel transistor is connected to a VSS. The CMOS circuit 7 has an arrangement in which (i) a gate of a P channel transistor and a gate of an N channel transistor are connected to each other, (ii) a drain of the P channel transistor and a drain of the N channel transistor are connected to each other, (iii) a source of the P channel transistor is connected to a power source VCSH, and (iv) a source of the N channel transistor is connected to a power source VCSL. The D latch circuit CSLi has an arrangement in which (i) the CK terminal, an input of the inverter, one (on the N channel side) of two gates the analogue switch ASW3, and one (on the P channel side) of two gates of the analogue switch ASW4 are connected to each other, (ii) an output of the inverter, the other one (in the P channel side) of two gates of the analogue switch ASW3, and the other one (on the N channel side) of two gates of the analogue switch ASW4 are connected to each other, (iii) a drain side of the CMOS circuit 5, one of two conductive terminals of the analogue switch ASW4, one of two conductive terminals of the analogue switch ASW3, and a gate side of the CMOS circuit 6 are connected to each other, (iv) the other one of two conductive terminals of the analogue switch ASW3 and the D terminal are connected to each other, (v) the other one of two conductive terminals of the analogue switch ASW4 and the gate side of the CMOS circuit 6 are connected to each other, (vi) a gate side of the CMOS circuit 5 and a drain side of the CMOS circuit 6 are connected to each other, (vii) the drain side of the CMOS circuit 6 and a gate side of the CMOS circuit 7 are connected to each other, and (viii) a drain side of the CMOS circuit 7 and the out terminal are connected to each other.

The D latch circuit CSLi obtains a D signal (a signal supplied to the D terminal) during a time period in which a CK signal (a signal supplied to the CK terminal) is active (high), and latches the D signal. That is, in a case where the D signal is turned to be high from low in a time period in which the CK signal is active, the out signal (a signal outputted from the out terminal) is increased from an electric potential of the power source VCSL to an electric potential of the power source VCSH. The out signal is then maintained at the electric potential of the power source VCSH. In a case where the D signal is turned to be low from high in the time period in which the CK signal is active, the out signal (the signal outputted from the out terminal) is decreased from the electric potential of the power source VCSH to the electric potential of the power source VCSL. The out signal is then maintained at the electric potential of the power source VCSL.

The G-CsD of the liquid crystal display device 3d has such an arrangement that an OUTB terminal of a stage is connected to an SB terminal of a subsequent stage. Further, the OUTB terminal of the stage is connected to, via an inverter, one of two inputs of an OR circuit which corresponds to the stage. Further, an OUTB terminal of the subsequent stage is connected to, via an inverter, the other one of two input terminals of the OR circuit which corresponds to the stage. An output of the OR circuit which corresponds to the stage is connected to a CK terminal of a D latch circuit which corresponds to the stage. For example, (i) an OUTB terminal of the nth stage SRn is connected to an SB terminal of the (n+1)th stage SRn+1, (ii) the OUTB terminal of the nth stage SRn is connected to, via an inverter, one of two input terminals of an OR circuit which corresponds to the nth stage SRn, (iii) an OUTB terminal of the (n+1)th stage SRn+1 is connected to, via an inverter, the other one of two input terminals of the OR circuit which corresponds to the nth stage SRn, and (iv) an output of the OR circuit which corresponds to the nth stage SRn is connected to a CK terminal of a D latch circuit CSLn which corresponds to the nth stage SRn. Note that an SB terminal of the first stage of the shift register SR receives a GSPB signal.

Further, the G-CsD of the liquid crystal display device 3d has such an arrangement that (i) CKB terminals of odd stages are connected to a first GCK line (a line for supplying a GCK signal) and CKB terminals of even stages are connected to a second GCK line (a line for supplying a GCK signal) which is different from the first GCK line, (ii) INITB terminals of the odd stages and INITB terminals of the even stages are connected to a single INITB line (a line for supplying an INITB signal), (iii) ONB terminals of the odd stages and ONB terminals of the even stages are connected to a single AONB line (a line for supplying an AON signal). For example, (i) a CKB terminal of the nth stage SRn is connected to a GCK2B signal line, (ii) a CKB terminal of the (n+1)th stage is connected to a GCK1B signal line, (iii) an INITB terminal of the nth stage SRn and an INITB terminal of the (n+1)th stage SRn+1 are connected to a single INITB signal line, and (iv) an ONB terminal of the nth stage SRn and an ONB terminal of the (n+1)th stage SRn+1 are connected to a single AONB signal line. Further, D terminals of D latch circuits are connected to first and second CMI lines (lines for supplying CMI signals) such that D latch circuits are connected to different CMI lines every two neighboring D latch circuits corresponding to neighboring two stages. For example, (i) a D terminal of a D latch circuit CSLn corresponding to the nth stage SRn is connected to a CMI2 signal line, (ii) a D terminal of a D latch circuit CSLn+1 corresponding to the (n+1)th stage SRn+1 is connected to the CMI2 signal line, (iii) a D terminal of a D latch circuit CSLn+2 corresponding to the (n+2)th stage SRn+2 is connected to a CMI1 signal line, and (iv) a D terminal of a D latch circuit CSLn+3 corresponding to the (n+3)th stage SRn+3 is connected to the CMI1 signal line.

Figure 40:
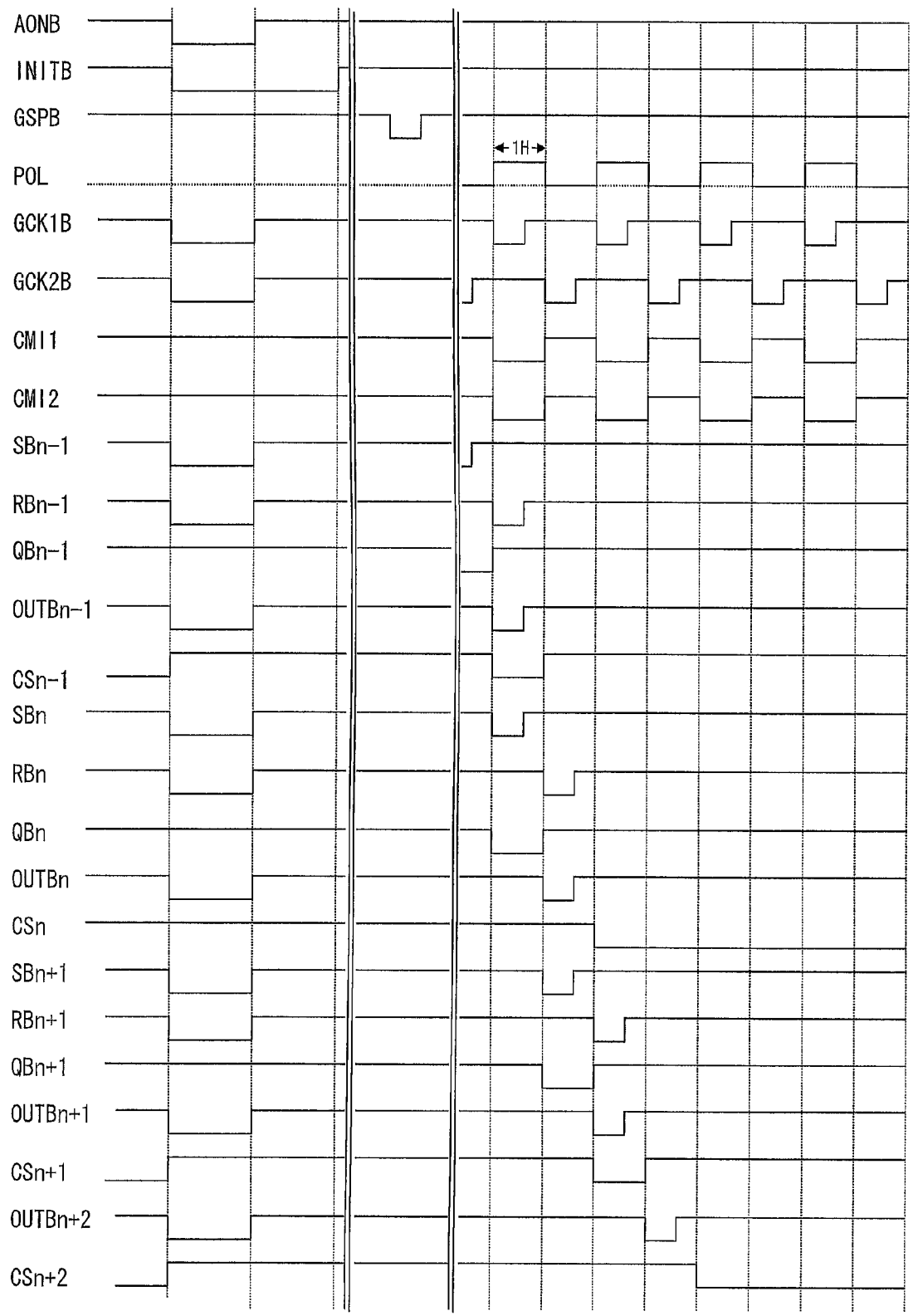
FIG. 40 is a timing chart showing how to drive the display device illustrated in FIG. 37.

FIG. 40 is a timing chart showing how to drive the liquid crystal display device 3d. Note that, in FIG. 40, "AONB" stands for an AONB signal, "INITB" stands for an initialization signal, "GSPB" stands for a gate start pulse bar signal, "GCK1B" stands for a GCK1B signal, "GCK2B" stands for a GCK2B signal, "CMI1" stands for a CMI1 signal, "CMI2" stands for a CMI2 signal, "SBi", "RBi", "QBi", and "OUTBi" (i=n−1, n, n+1) stand for, respectively, an SB signal (an electric potential at the SB terminal) of the ith stage SRi, an RB signal (an electric potential at the RB terminal) of the ith stage SRi, a QB signal (an electric potential at a QB terminal) of the ith stage SRi, and an OUTB signal (an electric potential at the OUTB terminal) of the ith stage SRi, and "CSi" (i=n−1, n, n+1) stands for an electric potential at a retention capacitor line CSi corresponding to the ith stage SRi (=an electric potential at the out terminal of the D latch circuit CSLi). Note that, in FIG. 40, a cycle of a polarity signal POL is identical with one horizontal scanning period 1H (that is, a polarity of a data signal supplied to an identical data signal line is inverted every 1H), and the CMI1 and the CMI2 have the same phase.

In the liquid crystal display device 3d, the following display preparatory operation is carried out before a first frame (vertical scanning period) for displaying an image. Specifically, an AONB signal and an INITB signal are turned to be active (low) and maintained to be active for a predetermined time period. Then, the AONB signal is turned to be inactive, after that, the INITB signal is turned to be inactive. During a time period in which the AONB signal is active, each GCKB signal is maintained to be active (low) and each CMI signal is maintained to be high (or low). As a result, in each of the plurality of stages of the shift register SR, the AONB signal is outputted from the OUTB terminal via the ASW1, and immediately after that, the ASW1 is turned off and the ASW2 is turned on. Therefore OUTB signals of all of the plurality of stages are turned to be active (low) so that all of a plurality of scan signal lines are selected. Note that, here, an analogue switch asw corresponding to each of a plurality of data signal lines is turned on, so that all of the plurality of data signal lines receive Vcom. Further, since an SB signal, an RB signal, and an INITB signal, supplied to each of the plurality of stages, are turned to be active (low), a QB signal of the FF provided in each of the plurality of stages is turned to be inactive (high). Furthermore, an output of the OR circuit corresponding to each of the plurality of stages is turned to be active (high), so that each of a plurality of D latch circuits latches the CMI1 signal (high) or the CMI2 signal (high). Accordingly, an out signal (a CS signal) supplied to each of a plurality of retention capacitor lines becomes equal to an electric potential of the power source VCSL. After the above display preparatory operation is carried out (after the AONB signal and the INITB signal are turned to be inactive in this order), (i) Vcom is written on all of a plurality of PIXs of the display section DAR, (ii) the QB output of the FF, provided in each of the plurality of stages of the shift register, is turned to be inactive (high), and (iii) the out signal of each of the plurality of D latch circuits (an electric potential at each of the plurality of retention capacitor lines) becomes equal to an electric potential of the power source VCSL.

In the liquid crystal display device 3d, the following operation is carried out when the first frame is displayed (a first vertical scanning period). That is, in a case where an SB signal supplied to a stage of the shift register SR is turned to be active (=low), an output of the FF is set to be active, and the stage obtains a GCKB signal. When the GCKB signal is turned to be active (=low), an OUTB signal of the stage is turned to be active, and an SB signal of a subsequent stage is turned to be active. Further, the FF of the stage is reset to be high (inactive). Here, the OUTS signal of the stage is low (that is, an output of the NAND is high), so that the stage keeps obtaining the GCKB signal. When the GCKB signal is turned to be high (inactive), the OUTB signal of the stage is turned to be high, and the output of the NAND is turned to be low. After that, the AONB signal is outputted from the OUTB terminal, so that the OUTB signal is turned to be high (inactive).

Further, when the OUTB signal of the stage is turned to be active (an output of an OR circuit corresponding to the stage is turned to be active), a D latch circuit corresponding to the stage latches the CMI1 signal or the CMI2 signal. Further, in a case where an OUTB signal of the subsequent stage is turned to be active (the output of the OR circuit corresponding to the stage is turned to be active), the D latch circuit corresponding to the stage latches the CMI1 signal or the CMI2 signal again. With the arrangement, after the OUTB signal of the stage is turned to be inactive (after a scan signal line corresponding to the stage is turned off), an out signal of the D latch circuit corresponding to the stage (an electric potential at a retention capacitor line corresponding to the stage) is increased from an electric potential of the power source VCSL to an electric potential of the power source VCSH (in a case where a data signal having a positive polarity is written on a pixel corresponding to the stage), or decreased from the electric potential of the power source VCSH to the electric potential of the power source VCSL (in a case where a data signal having a negative polarity is written on a pixel corresponding to the stage).

For example, in a case where an OUTB signal of the nth stage SRn is turned to be active (an output of an OR circuit corresponding to the nth stage SRn is turned to be active), a D latch circuit CSLn corresponding to the nth stage SRn latches the CMI2 signal. Then, when an OUTB signal of the (n+1)th stage SRn+1 is turned to be active (the output of the OR circuit corresponding to the nth stage SRn is turned to be active), the D latch circuit CSLn latches the CMI2 signal again. With the arrangement, after the OUTB signal of the nth stage SRn is turned to be inactive (a scan signal line Gn corresponding to the nth stage SRn is turned on/off), an out signal of the D latch circuit CSLn corresponding to the nth stage SRn (an electric potential at a retention capacitor line CSn corresponding to the nth stage SRn) is decreased from the electric potential of the power source VCSH to the electric potential of the power source VCSL. Here, a data signal having a negative polarity is written on a pixel PIXn corresponding to the nth stage SRn, as indicated by the POL. Accordingly, it is possible to decrease, by decreasing the electric potential at the retention capacitor line CSn, an effective electric potential to less than an electric potential at the data signal (luminance of the pixel PIXn can be increased).

Further, in a case where the OUTB signal of the (n+1)th stage SRn+1 is turned to be active, a D latch circuit CSLn+1 corresponding to the (n+1)th stage SRn+1 latches the CMI2 signal. Furthermore, in a case where an OUTB signal of a (n+2)th stage SRn+2 is turned to be active, the D latch circuit CSLn+1 latches the CMI2 signal again. With the arrangement, after the OUTB signal of the (n+1)th stage SRn+1 is turned to be inactive (after a scan signal line Gn+1 is turned on/off), an out signal (an electric potential at a retention capacitor line CSn+1) of the D latch circuit CSLn+1 corresponding to the (n+1)th stage SRn+1 is increased from the electric potential of the power source VCSL to the electric potential of the power source VCSH. Here, a data signal having a positive polarity is written on a pixel PIXn+1 corresponding to the (n+1)th stage SRn+1, as indicated by the POL. Accordingly, it is possible to increase, by increasing the electric potential at the retention capacitor line CSn+1, the effective electric potential to more than an electric potential of the data signal (luminance of the pixel PIXn+1 can be increased).

Further, in a case where the OUTB signal of the (n+2)th stage SRn+2 is turned to be active, a D latch circuit CSLn+2 corresponding to the (n+2)th stage SRn+2 latches the CMI1 signal. Furthermore, in a case where an OUTB signal of the (n+3)th stage SRn+3 is turned to be active, the D latch circuit CSLn+2 latches the CMI1 signal again. With the arrangement, after the OUTB signal of the (n+2)th stage SRn+2 is turned to be inactive (after a scan signal line Gn+2 is turned on/off), an out signal of the D latch circuit CSLn+2 corresponding to the (n+2)th stage SRn+2 is decreased from the electric potential of the power source VCSH to the electric potential of the power source VCSL. Here, a data signal having a negative polarity is written on a pixel PIXn+2 corresponding to the (n+2)th stage SRn+2, as indicated by the POL. Accordingly, it is possible to increase, by decreasing the electric potential at the retention capacitor line CSn+2, the effective electric potential to more than the electric potential of the data signal (luminance of the pixel PIXn+2 can be increased).

From the second frame, the displaying is carried out in the same manner as the first frame. Note, however, that a phase of the POL is shifted every frame by a half cycle so that the polarity of the data signal supplied to an identical pixel is inverted every one frame. In accordance with the inversion, the increase and the decrease of the out signal of the D latch circuit CSLi (the electric potential at the retention capacitor line CSi) is switched with each other every one frame.

The liquid crystal display device 3d employs a flip-flop in accordance with one of the aforementioned embodiments of the present invention. It is therefore possible to provide a compact G-Cs driver. Further, an identical electric potential (e.g., Vcom) can be written on all the pixels simultaneously before the first frame is displayed. This prevents generation of a defect in a screen before the first frame is displayed. Furthermore, since initialization of the shift register (initialization of the flip-flop provided in each of the plurality of stages) is carried out at the same time as the writing of the identical electric potential on all the pixels, it is possible to complete the display preparatory operation more quickly, as compared with a conventional liquid crystal display device in which the writing of an identical electric potential on all the pixels and the initialization of the flip-flop are carried out separately and independently. Moreover, since returning of the INITB signal (turning the INITB signal to be inactive) is delayed as compared with that of the AONB signal (turning the AONB signal to be inactive), it is possible to carry out the initialization successfully even if returning of the SB signal of each of the plurality of stages along with the returning of the AONB signal is deviated from returning of the RB signal along with the returning of the AONB signal (particularly in a case where the returning of the SB signal is delayed as compared with the returning of the RB signal). Moreover, since CC driving can be appropriately carried out with respect to each pixel row from the first frame, it is possible to prevent generation of a defect in the screen (non-uniformity which is recognized by a viewer as horizontal stripes) during the first frame, which has been found conventionally in the CC driving.

Figure 41:
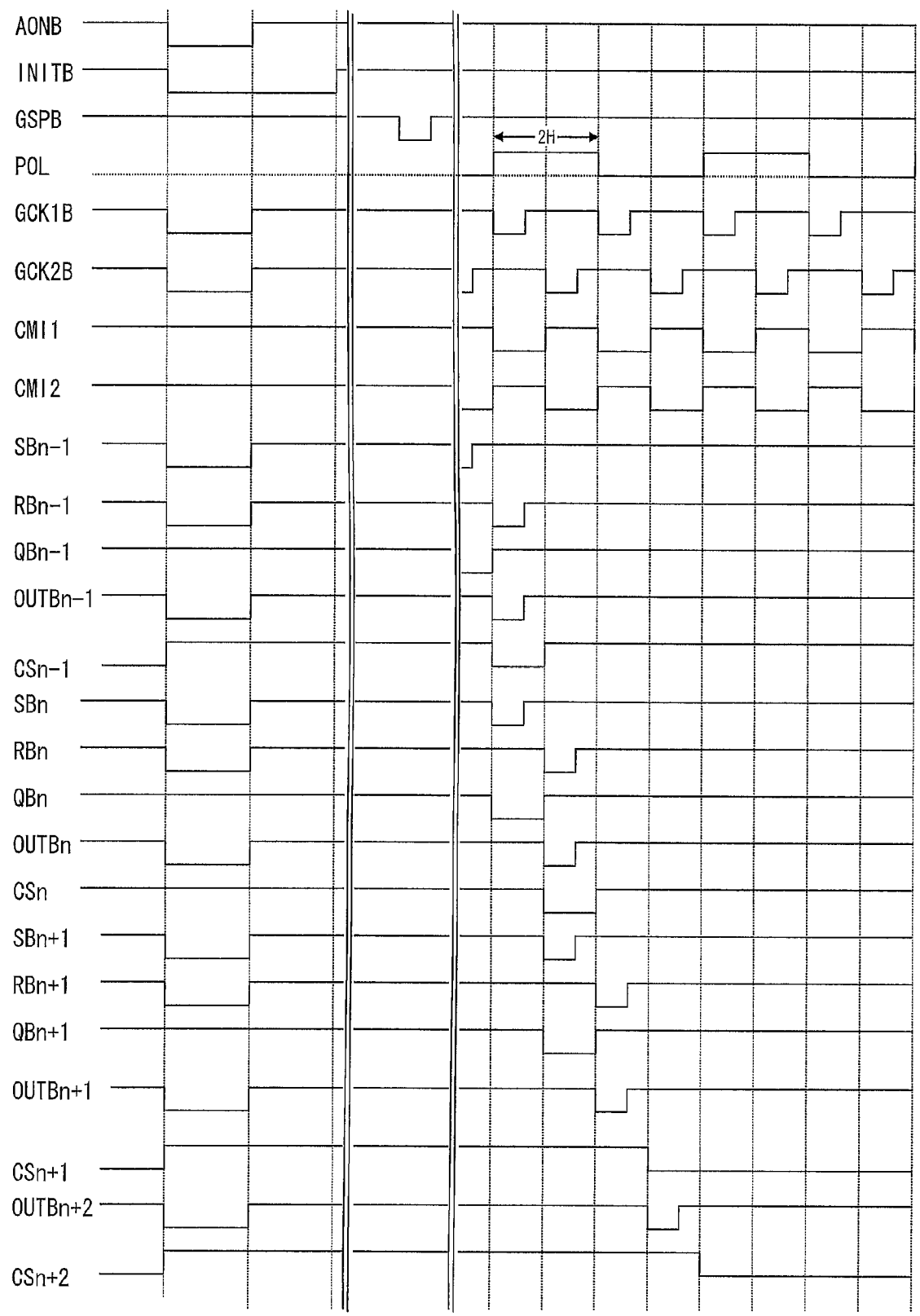
FIG. 41 is a timing chart showing how to drive the display device illustrated in FIG. 37.

Further, it should be noted that, with the liquid crystal display device 3d, by only shifting the phase of the CMI2 by a half cycle (from the phase shown in FIG. 40), (i) the cycle of the polarity signal POL can be switched to 2H (inversion of the polarity of the data signal supplied to the identical data signal line is carried out every 2H) and (ii) the CC driving can be appropriately carried out with respect to each pixel row from the first frame (see FIG. 41). That is, with the liquid crystal display device 3d, by only controlling the phases of the respective CS inversion signals CMI1 and CMI2, it is possible to (i) switch the cycle of the polarity signal POL from 1H to 2H and (ii) prevent generation of a defect in the screen at that time.

The shift register SR of the G-Cs driver of the liquid crystal display device 3d uses a flip-flop in accordance with one of the aforementioned embodiments of the present invention (e.g., the arrangement illustrated in FIG. 3). It is therefore possible to provide a compact G-Cs driver. Note, however, that, in a case where not the advantage of a compact body but other advantages are required, a conventional flip-flop (e.g., a flip-flop illustrated in FIG. 70) can be used in the shift register of the G-Cs driver, as a matter of course.

Application to Shift Register

Example 3

Figure 42:
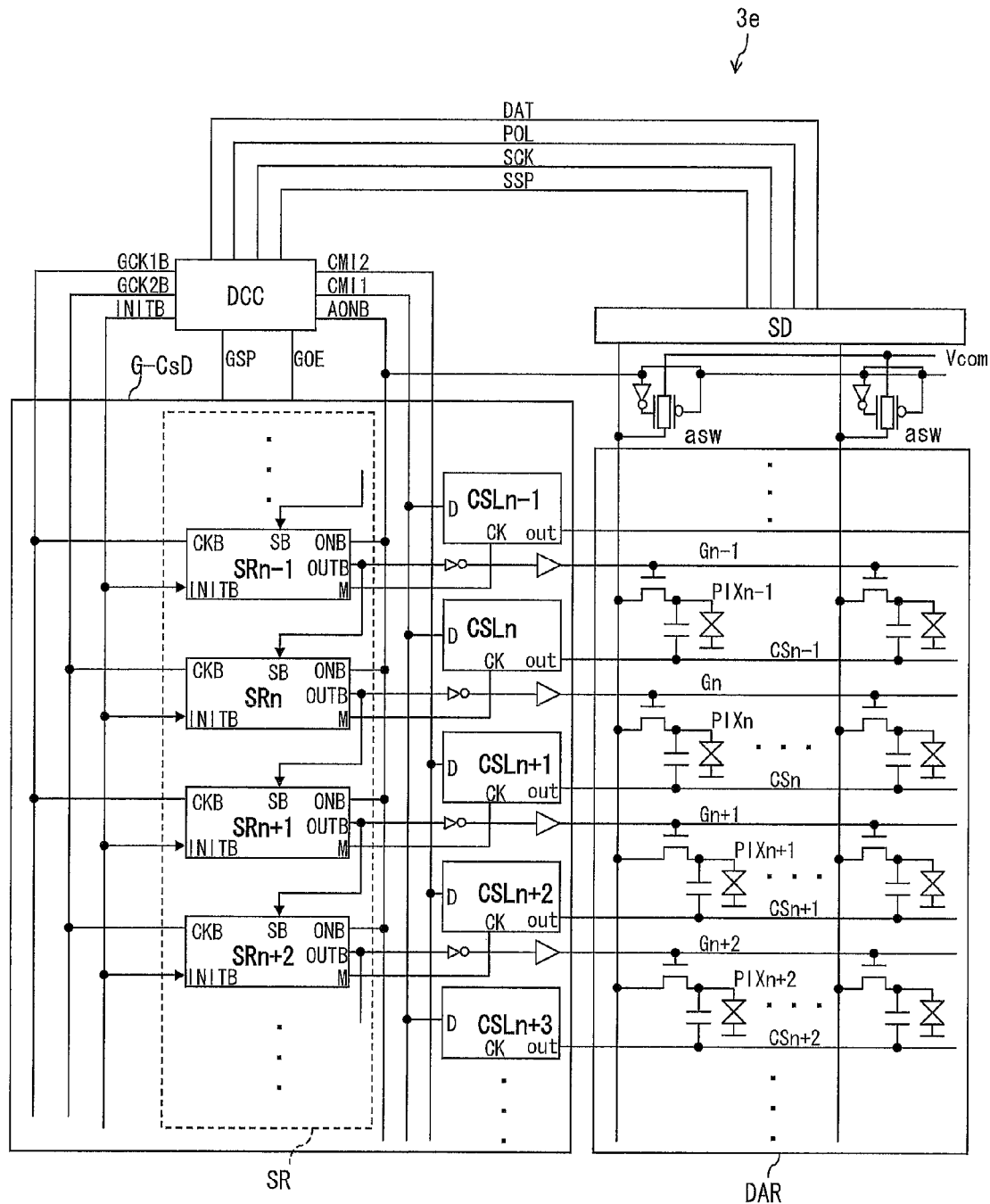
FIG. 42 is a view schematically illustrating another arrangement of the display device of the present invention.

FIG. 42 is a circuit diagram illustrating an arrangement of a liquid crystal display device 3e of the present invention. The liquid crystal display device 3e is a liquid crystal display device employing what is called CC (charge coupled) driving, and includes a display section DAR, a gate-Cs driver G-CsD, a source driver SD, and a display control circuit DCC. The display control circuit DCC supplies, to a gate driver GD, a gate start pulse GSP, a gate-on enable signal GOE, an INITB signal (initialization signal), an AONB signal (all-on signal), CS inversion signals CMI1 and CMI2, and gate clock signals GCK1B and GCK2B. Further, the display control circuit DCC supplies, to the source driver SD, a source start pulse SSP, digital data DAT, a polarity signal POL, and a source clock signal SCK. The gate-Cs driver G-CsD includes (i) a shift register SR including a plurality of stages and (ii) a plurality of D latch circuits CSL. For each of the plurality of stages of the shift register, one inverter, one D latch circuit CSL, and one buffer are provided. Hereinafter, the ith stage (i=1, ..., n−1, n, n+1, ...) of the shift register is referred to as "the ith stage SRi" for the sake of simple explanation, as appropriate. Further, a D latch circuit CSLi corresponds to the ith stage SRi of the shift register.

The ith stage SRi of the shift register supplies an output signal (OUTB signal) to a scan signal line Gi of the display section DAR via an inverter and a buffer. Further, the D latch circuit CSLi corresponding to the ith stage SRi supplies an output signal (an out signal, a CS signal) to a retention capacitor line CSi−1 of the display section DAR. For example, the nth stage SRn supplies an OUTB signal to a scan signal line Gn via an inverter and a buffer. The D latch circuit CSLn corresponding to the nth stage SRn supplies an output signal (the out signal, the CS signal) to a retention capacitor line CSn−1 of the display section DAR. In the display section DAR, the scan signal line Gn is connected to a gate of a transistor which is connected to a pixel electrode provided in a PIXn. A retention capacitor (storage capacitor) is formed between the pixel electrode in the PIXn and the retention capacitor line CSn. Further, a scan signal line Gn−1 is connected to a gate of a transistor which is connected to a pixel electrode provided in a PIXn−1. A retention capacitor (storage capacitor) is formed between the pixel electrode provided in the PIXn−1 and the retention capacitor line CSn−1.

Further, for each of a plurality of data signal lines, one analogue switch asw and one inverter are provided. An input of the inverter is connected to an AONB signal line. An end of the data signal line is connected to one of two conducive terminals of the analogue switch asw, and the other one of two conductive terminals of the analogue switch asw is connected to a Vcom (an electric potential of a common electrode) power source. One (on an N channel side) of two gates of the analogue switch asw is connected to an output of the inverter, and the other one (on a P channel side) of two gates of the analogue switch asw is connected to the AONB signal line.

FIG. 43 is a circuit diagram illustrating an arrangement of the ith stage SRi of the shift register SR illustrated in FIG. 42. Each of the plurality of stages of the shift register includes (i) a flip-flop FF in accordance with one of the aforementioned embodiments of the present invention, which includes an SB terminal, an RB terminal, and an INITB terminal, (ii) two analogue switches ASW1 and ASW2, (iii) a NAND, (iv) an inverter, (v) a CKB terminal, (vi) an ONB terminal, (vii) and (viii) an M terminal (see FIG. 43). The ith stage SRi has an arrangement in which (i) a QB terminal of the flip-flop FF is connected to one of two inputs of the NAND, (ii) an output of the NAND is connected to (a) the M terminal, (b) an input of the inverter, (c) one (on the P channel side) of two gates of the analogue switch ASW1, and (d) one (on the N channel side) of two gates of the analogue switch ASW2, (iii) an output of the inverter is connected to the other one (on the N channel side) of two gates of the analogue switch ASW1 and the other one (on the P channel side) of two gates of the analogue switch ASW2, (iv) one of two conductive electrodes of the analogue switch ASW1 is connected to the ONB terminal, (v) one of two conductive electrodes of the analogue switch ASW2 is connected to the CKB terminal, and (vi) the other one of two conductive electrodes of the analogue switch ASW1, the other one of two conductive electrodes of the analogue switch ASW2, the other one of two inputs of the NAND, the RB terminal of the FF, and an OUTB terminal which is an output terminal of the ith stage SRi, are connected to each other.

The ith stage SRi is such that, during a time period in which a QB signal (an input X of two inputs of the NAND) is high (inactive), (i) in a case where an OUTB signal (an input Y of inputs of the NAND) is high (inactive), the output (an M signal) of the NAND is turned to be low (the analogue switch ASW1 is in the on state and the analogue switch ASW2 is in the off state) and an AONB signal (=inactive=Vdd) is supplied to the OUTB terminal, and (ii) in a case where the OUTS signal (the input Y of the NAND) is low (active), the output (the M signal) of the NAND is high (the analogue switch ASW1 is in the off state and the analogue switch ASW2 is in the on state) and a GCKB signal is obtained and outputted from the OUTB terminal. Further, during a time period in which the QB signal of the flip-flop FF is low (active), since the input X of the NAND is low and the input Y of the NAND is low, the output (the M signal) of the NAND is high (the analogue switch ASW1 is in the off state and the analogue switch ASW2 is in the on state) and the GCKB signal is obtained and outputted from the OUTB terminal. That is, the NAND, the inverter, and the analogue switches ASW1 and ASW2 constitute a signal generation circuit for generating the OUTB signal by use of the output of the flip-flop FF. Particularly, the inverter and the analogue switches ASW1 and ASW2 constitute a gate circuit which receives an AONB signal or a clock signal in accordance with the output (the M signal) of the NAND.

The D latch circuit CSLi has the same arrangement as that of FIG. 39. That is, the D latch circuit CSLi obtains a D signal (a signal supplied to the D terminal) during a time period in which a CK signal (a signal supplied to the CK terminal) is active (high), and latches the D signal. In other words, in a case where the D signal is turned to be high from low in the time period in which the CK signal is active, an out signal (a signal outputted from the out terminal) is increased from an electric potential of the power source VCSL to an electric potential of the power source VCSH, and then is maintained at the electric potential of the power source VCSH. In a case where the D signal is turned to be low from high in the time period in which the CK signal is active, the out signal (the signal outputted from the out terminal) is decreased from the electric potential of the power source VCSH to the electric potential of the power source VCSL, and then is maintained at the electric potential of the power source VCSL.

The shift register SR of the G-CsD of the liquid crystal display device 3e has an arrangement in which an OUTB terminal of a stage is connected to an SB terminal of a subsequent stage. Further, an M terminal of the stage is connected to a CK terminal of a D latch circuit which corresponds to the stage. For example, an OUTS terminal of the nth sage SRn is connected to an SB terminal of the (n+1)th stage SRn+1, and an M terminal of the nth stage SRn is connected to a CK terminal of a D latch circuit SLn which corresponds to the nth stage SRn. Note that an SB terminal of the first stage of the shift register SR receives a GSPB signal.

Further, the G-CsD has such an arrangement that (i) CKB terminals of odd stages are connected to a first GCK line (a line for supplying a GCK signal) and CKB terminals of even stages are connected to a second GCK line (a line for supplying a GCK signal) which is different from the first GCK line, (ii) INITB terminals of the odd stages and INITB terminals of the even stages are connected to a single INTIB line (a line for supplying an INITB signal), and (iii) ONB terminals of the odd stages and ONB terminals of the even stages are connected to a single AONB line (a line for supplying an AON signal). For example, (i) a CKB terminal of the nth stage SRn is connected to a GCK2B signal line, (ii) a CKB terminal of the (n+1)th stage SRn+1 is connected to a GCK1B signal line, (iii) an INITB terminal of the nth stage SRn and an INITB terminal of the (n+1)th stage SRn+1 are connected to a single INITB signal line, and (iv) an ONB terminal of the nth stage SRn and an ONB terminal of the (n+1)th stage SRn+1 are connected to a single AONB signal line. Further, D terminals of D latch circuits are connected to first and second CMI lines (lines for supplying CMI signals) such that D latch circuits are connected to different CMI lines every two neighboring D latch circuits corresponding to neighboring two stages. For example, (i) a D terminal of a D latch circuit CSLn−1 corresponding to a (n−1)th stage SRn−1 is connected to a CMI1 signal line, (ii) a D terminal of the D latch circuit CSLn corresponding to the nth stage SRn is connected to the CMI1 signal line, (iii) a D terminal of a D latch circuit CSLn+1 corresponding to the (n+1)th stage SRn+1 is connected to a CMI2 signal line, and (iv) a D terminal of a D latch circuit CSLn+2 corresponding to a (n+2)th stage SRn+2 is connected to the CMI2 signal line.

Figure 44:
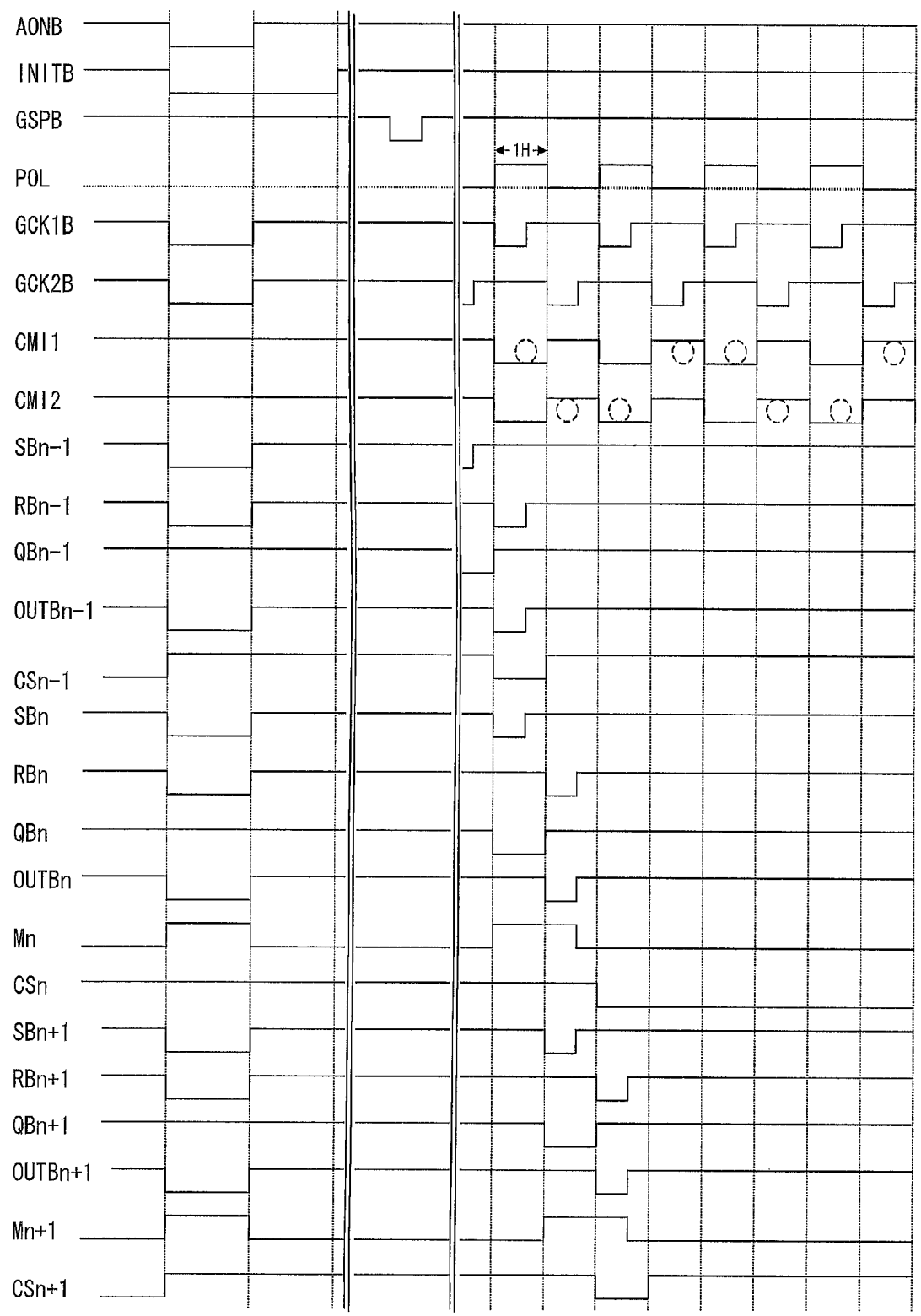
FIG. 44 is a timing chart showing how to drive the display device illustrated in FIG. 42.

FIG. 44 is a timing chart showing how to drive the liquid crystal display device 3e. Note that, in FIG. 44, "AONB" stands for an AON signal, "INTIB" stands for an initialization signal, "GSPB" stands for a gate start pulse bar signal, "GCK1B" stands for a GCK1B signal, "GCK2B" stands for a GCK2B signal, "CMI1" stands for a CMI1 signal, "CMI2" stands for a CMI2 signal, "SBi", "RBi", "QBi", and "OUTBi" (i=n−1, n, n+1) stand for, respectively, an SB signal (an electric potential at the SB terminal) of the ith stage SRi, an RB signal (an electric potential at the RB terminal) of the ith stage SRi, a QB signal (en electric potential at the QB terminal) of the ith stage SRi, and an OUTB signal (an electric potential at the OUTB terminal) of the ith stage SRi, and "CSi (i=n−1, n, n+1) stands for an electric potential at a retention capacitor line CSi corresponding to the ith stage SRi (=an electric potential at an out terminal of the D latch circuit CSLi). In FIG. 44, a cycle of a polarity signal POL is identical with one horizontal scanning period 1H (that is, a polarity of a data signal supplied to an identical data signal line is inverted every 1H), and the CMI1 and the CMI2 have the same phase.

In the liquid crystal display device 3e, the following display preparatory operation is carried out before the first frame (vertical scanning period) for displaying an image. Specifically, an AONB signal and an INITB signal are turned to be active (low) and maintained to be active for a predetermined time period. Then, the AONB signal is turned to be inactive, after that, the INITB signal is turned to be inactive. During a time period in which the AONB signal is active, each GCKB signal is maintained to be active (low) and each CMI signal is maintained to be high (or low). As a result, in each of the plurality of stages of the shift register SR, the AONB signal is outputted from the OUTB terminal via the ASW1, and immediately after that, the ASW1 is turned off and the ASW2 is turned on. Accordingly, OUTB signals of all of the plurality of stages are turned to be active (low), so that all of a plurality of scan signal lines are selected. Note here that an analogue switch asw corresponding to each of a plurality of data signal lines is turned on so that all of the plurality of data signal lines receive Vcom. Further, an SB signal, an RB signal, and an INITB signal, which are supplied to each of the plurality of stages, are turned to be active (low), so that a QB signal of the flip-flop provided in each of the plurality of stages is turned to be inactive (high). Furthermore, an M signal (a signal outputted from the M terminal) of each of the plurality of stages is turned to be active (high). Accordingly, each of the plurality of D latch circuits latches the CMI1 signal (low) or the CMI2 signal (low) and an out signal (a CS signal) supplied to each of a plurality of retention capacitor lines becomes equal to the electric potential of the power source VCSL. After the display preparatory operation described above is carried out (after the AONB signal and the INITB signal are turned to be inactive in this order), (i) Vcom is written on all of a plurality of PIXs of the display section DAR, (ii) the QB output of the flip-flop provided in each of the plurality of stages is turned to be inactive (high), and (iii) the out signal (the electric potential at the retention capacitor line) of each of the plurality of D latch circuits becomes equal to the electric potential of the power source VCSL.

In the liquid crystal display device 3e, the following operation is carried out during a time period in which the first frame is displayed (first vertical scanning period). That is, in a case where an SB signal supplied to a stage of the shift register SR is turned to be active (=low), an output of an FF of the stage is set to be active, and a GCKB signal is obtained by the stage. In a case where the GCKB signal of the stage is turned to be active (=low), (i) an OUTB signal of the stage is turned to be active (=low), (ii) an SB signal of a subsequent stage is turned to be active, and (iii) the FF of the stage is reset to be high (inactive). Here, the OUTS signal of the stage is low (that is, an output of a NAND is high), so that the stage keeps obtaining the GCKB signal. When the GCKB signal is turned to be high (inactive), the OUTB signal of the stage is turned to be high and the output of the NAND is turned to be low. After that, an AONB signal is outputted from the OUTB terminal so that the OUTB signal is turned to be high (inactive).

Further, when an M signal of the subsequent stage is turned to be active, a D latch circuit corresponding to the subsequent stage latches the CMI1 signal and the CMI2 signal. With the arrangement, after the OUTB signal of the stage is turned to be inactive (after a scan signal line corresponding to the stage is turned off), an out signal (an electric potential at a retention capacitor line corresponding to the stage) of a D latch circuit corresponding to the stage is increased from the electric potential of the power source VCSL to the electric potential of the power source VCSH (in a case where a data signal having a positive polarity is written on a pixel corresponding to the stage), or decreased from the electric potential of the power source VCSH to the electric potential of the power source VCSL (in a case where a data signal having a negative polarity is written on the pixel corresponding to the stage).

For example, when an M signal of the nth stage SRn is turned to be active, a D latch circuit CSLn corresponding to the nth stage SRn latches the CMI1 signal. With the arrangement, after an OUTB signal of the (n−1)th stage SRn−1 is turned to be inactive (after a scan signal line Gn−1 is turned on/off), an out signal (an electric potential at a retention capacitor line CSn−1) of the D latch circuit CSLn is increased from the electric potential of the power source VCSL to the electric potential of the power source VCSH. Here, a data signal having a positive polarity is written on a pixel PIXn−1 corresponding to the (n−1)th stage SRn−1, as indicated by the POL. Accordingly, it is possible to increase, by increasing the electric potential at the retention capacitor line CSn−1, an effective electric potential to more than an electric potential of the data signal (luminance of the pixel PIXn−1 can be increased).

Further, in a case where an M signal of the (n+1)th stage SRn+1 is turned to be active, a D latch circuit CSLn+1 corresponding to the (n+1)th stage SRn+1 latches the CMI2 signal. With the arrangement, after an OUTB signal of the nth stage SRn is turned to be inactive (after a scan signal line Gn is turned on/off), an out signal of the D latch circuit CSLn+1 (an electric potential at a retention capacitor CSn) is decreased from the electric potential of the power source VCSH to the electric potential of the power source VCSL. Here, a data signal having a negative polarity is written on a pixel PIXn corresponding to the nth stage SRn as indicated by the POL. Accordingly, it is possible to decrease, by decreasing the electric potential at the retention capacitor line CSn, the effective electric potential to less than an electric potential of the data signal (luminance of the pixel PIXn can be increased).

Furthermore, in a case where an M signal of the (n+2)th stage SRn+2 is turned to be active, a D latch circuit CSLn+2 corresponding to the (n+2)th stage SRn+2 latches the CMI2 signal. With the arrangement, after an OUTB signal of the (n+1)th stage SRn+1 is turned to be inactive (a scan signal line Gn+1 is turned on/off), an out signal of the D latch circuit CSLn+2 (an electric potential at a retention capacitor line CSn+1) is increased from the electric potential of the power source VCSH to the electric potential of the power source VCSL. Here, a data signal having a positive polarity is written on a pixel PIXn+1 corresponding to the (n+1)th stage SRn+1 as indicated by the POL. Accordingly, it is possible to increase, by increasing the electric potential at the retention capacitor line CSn+1, the effective electric potential to more than an electric potential of the data signal (luminance of the pixel PIXn+1 can be increased).

From the second frame, the displaying is carried out in the same manner as the first frame. Note, however, that a phase of the POL is shifted by a half cycle every 1 frame, so that the polarity of the data signal supplied to an identical pixel electrode PIXi is inverted every 1 frame. With the inversion, the increase and decrease of the out signal of the D latch circuit CSLi (the electric potential at the retention capacitor line CSi) are switched with each other every 1 frame.

The liquid crystal display device 3e employs a flip-flop in accordance with one of the aforementioned embodiments of the present invention. Accordingly, it is possible to provide a compact G-Cs driver. Further, with the arrangement in which the internal signal (the M signal) of the shift register is supplied to the CK terminal of the D latch circuit, it becomes unnecessary to provide a NOR circuit or an OR circuit in the G-Cs driver. This makes it possible to provide a further compact G-Cs driver. Moreover, since an identical electric potential (e.g., Vcom) can be written on all the pixels simultaneously before the first frame is displayed, it is possible to prevent generation of a defect in a screen before the first frame is displayed. Further, since the initialization of the shift register (initialization of the flip-flop of each of the plurality of stages) is carried out at the same time as the writing of the identical electric potential on all the pixels, it becomes possible to complete the display preparatory operation more quickly as compared with a conventional liquid crystal display device in which the writing of the identical electric potential on all the pixels and the initialization of the flip-flop are carried out separately and independently. Furthermore, returning of an INITB signal (causing the INITB signal to be inactive) is delayed as compared with returning of an AONB signal (causing the AONB signal to be inactive). Accordingly, even if returning of the SB signal of each of the plurality of stages and returning of the RB signal of each of the plurality of stages are different (delay) from each other due to the delay of the returning of the AONB signal, it is possible to carry out the initialization of the flip-flop successfully. Moreover, since the CC driving can be appropriately carried out with respect to each pixel row from the first frame, it is possible to prevent generation of a defect in the screen during the first frame (non-uniformity which is recognized by a viewer as horizontal stripes).

Figure 45:
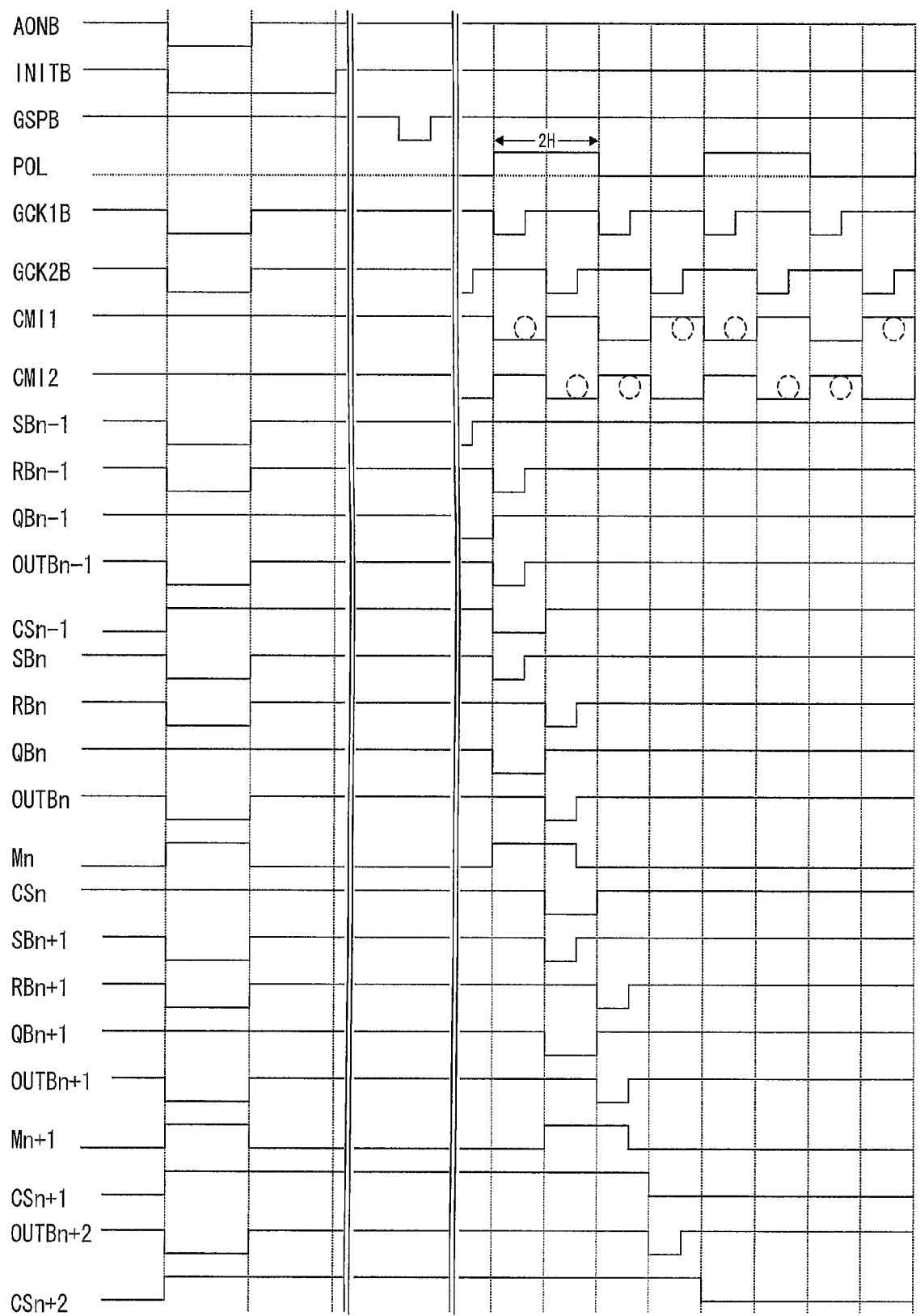
FIG. 45 is a timing chart showing how to drive the display device illustrated in FIG. 42.

Further, it should be noted that, in the liquid crystal display device 3e, by only shifting the phase of the CMI2 signal by a half cycle (from the phase shown in FIG. 44), it is possible to (i) switch the cycle of the polarity signal POL to 2H (the polarity of the data signal supplied to the identical data signal line is inverted every 2H), and (ii) carry out the CC driving appropriately with respect to each pixel row from the first frame (see FIG. 45). In other words, in the liquid crystal display device 3d, by only controlling the phases of the respective CS inversion signals CMI1 and CMI2, it is possible to (i) switch the cycle of the polarity signal POL from 1H to 2H and (ii) prevent generation of a defect in the screen at that time.

The shift register SR of the G-Cs driver of the liquid crystal display device 3e employs a flip-flop described in the aforementioned embodiment (e.g., the arrangement illustrated in FIG. 3). Accordingly, it is possible to provide a compact shift register. Note, however, that, since omission of the NOR circuit or the OR circuit in the G-Cs driver is carried out to provide a compact shift register, it is possible to use, as a matter of course, a conventional flip-flop (e.g., the flip-flop illustrated in FIG. 70) in the shift register of the G-Cs driver.

Figure 46:
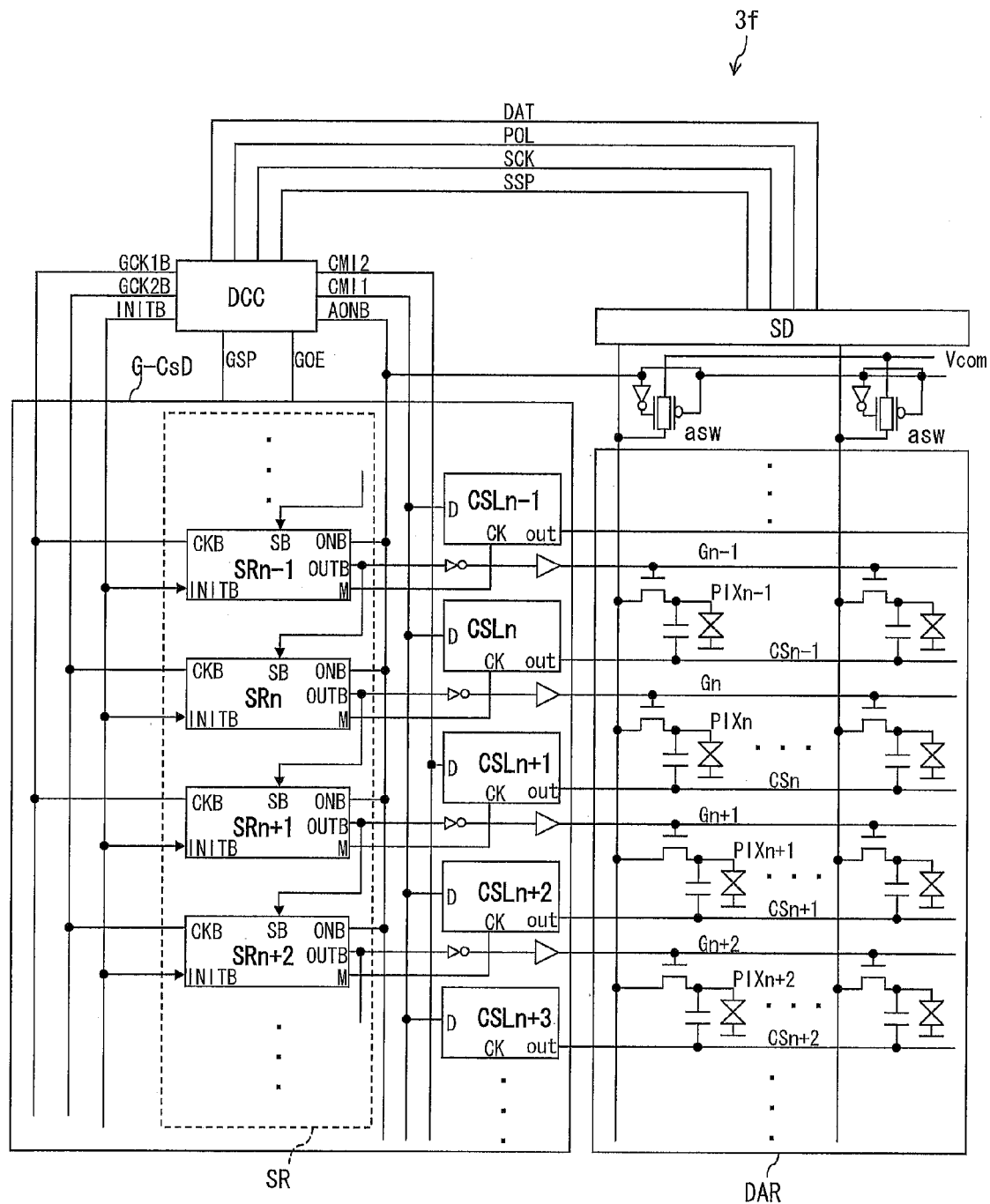
FIG. 46 is a view schematically illustrating another arrangement of the display device of the present invention.
Figure 47:
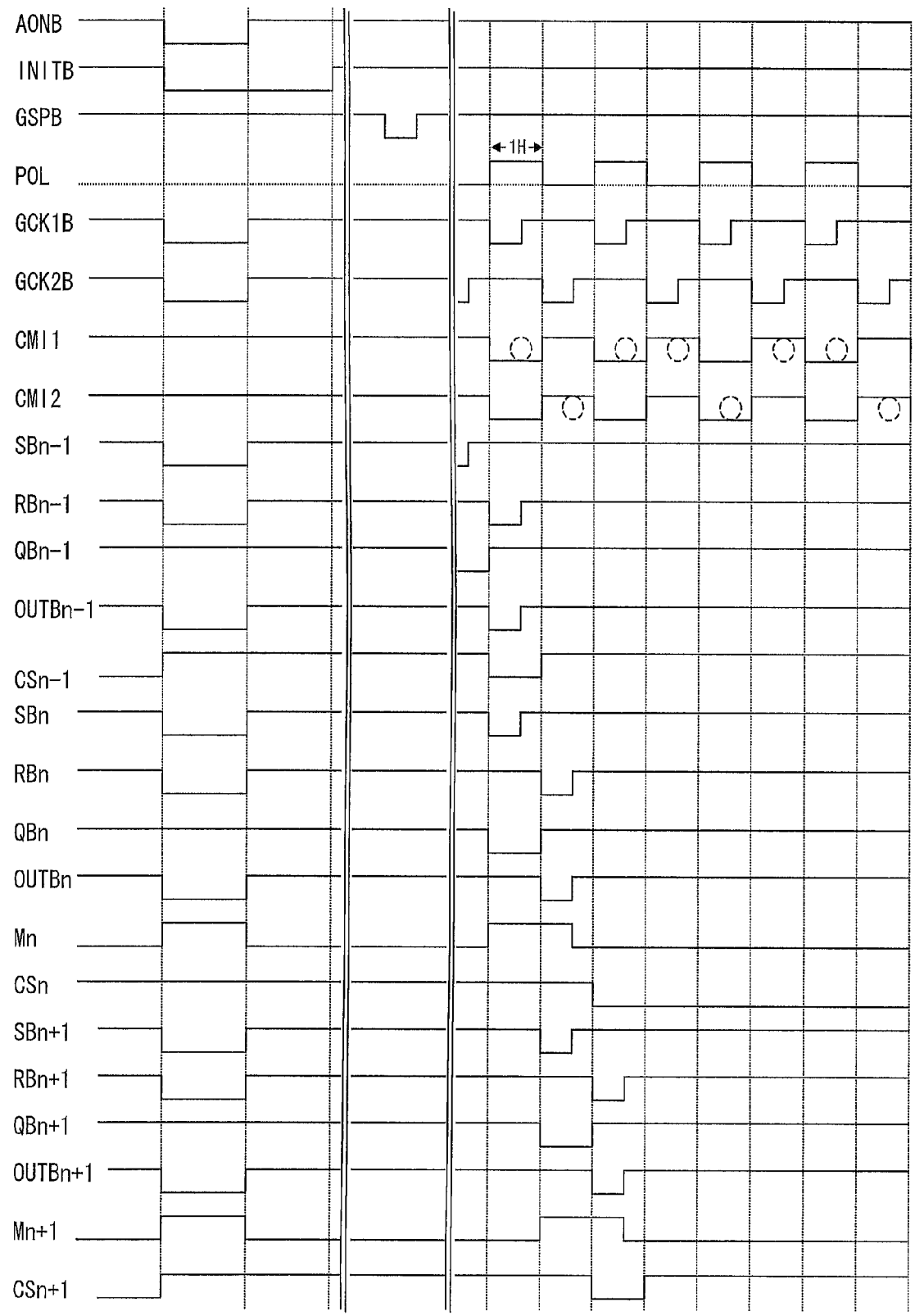
FIG. 47 is a timing chart showing how to drive the display device illustrated in FIG. 46.
Figure 48:
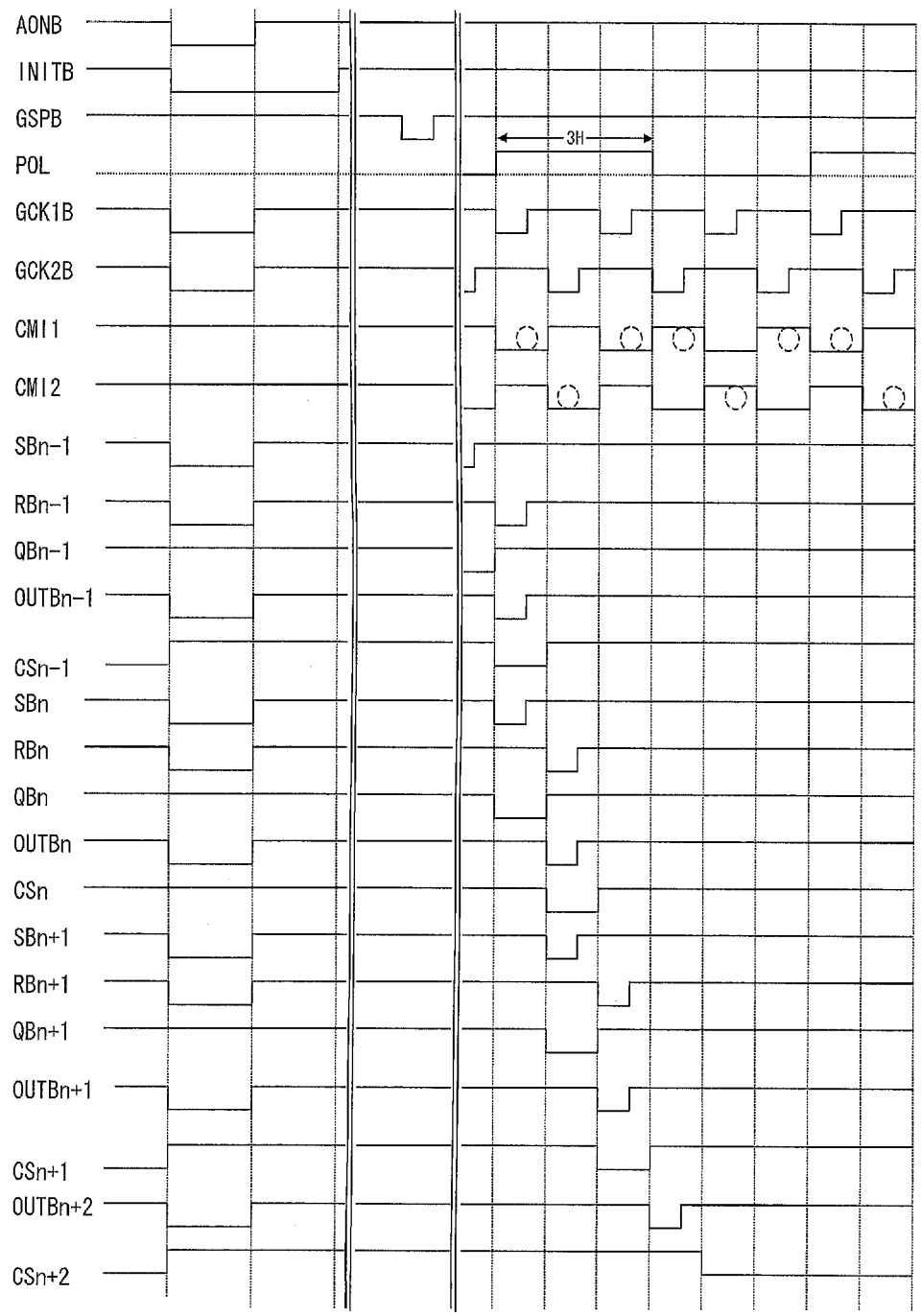
FIG. 48 is a timing chart showing how to drive the display device illustrated in FIG. 46.

It is possible to modify the liquid crystal display device 3e such that a connection relationship between (i) each of the plurality of D latch circuits and (ii) the CMI1 line or the CMI2 line is changed to be that of a liquid crystal display device 3f illustrated in FIG. 46. That is, the D latch circuit CSLi (i=a multiple of 3 or a numeral obtained by adding 2 to the multiple of 3, i.e., 3, 5, 6, 8, . . . ) is connected to the CMI1, and the latch circuit CSLi (i=a numeral obtained by adding 1 to a multiple of 3, i.e., 4, 7, 10, . . . ) is connected to the CMI2. With the arrangement, by only shifting the phases of the respective CMI1 and CMI2 signals by a half cycle (see FIG. 48) from the state in which the phases coincide with each other (see FIG. 47) as shown in FIGS. 47 and 48, it is possible to (i) switch the cycle of the polarity signal POL from 1H to 3H and (ii) carry out appropriately the CC driving with respect to each pixel row from the first frame. That is, in the liquid crystal display device 3f, by only controlling the phases of the respective CS inversion signals CMI1 and CMI2, it is possible to (i) switch the cycle of the polarity signal POL from 1H to 3H and (ii) prevent generation of a defect in the screen at that time.

Figure 49:
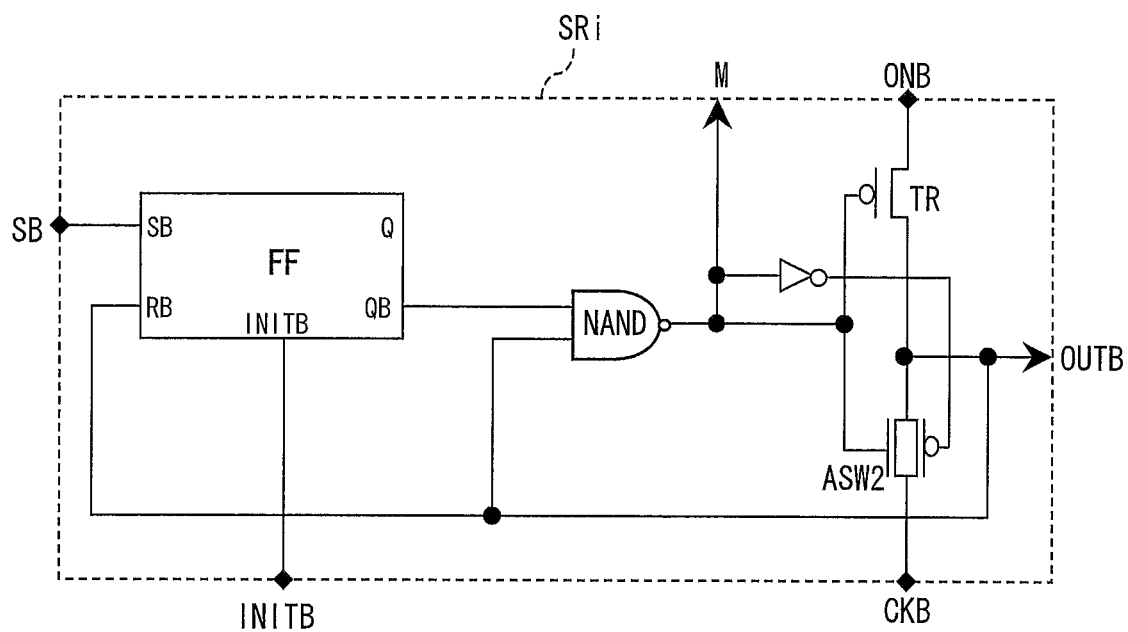
FIG. 49 is a circuit diagram illustrating a modified example of FIG. 43.

It is also possible to modify each of the plurality of stages of the shift register of the liquid crystal display device 3e (see FIG. 43) to have an arrangement illustrated in FIG. 49. That is, in FIG. 49, a single channel (P channel) transistor TR is used as the ASW1 of FIG. 43. With the arrangement, it is possible to provide a further compact shift register.

Application to Shift Register

Example 4

Figure 51:
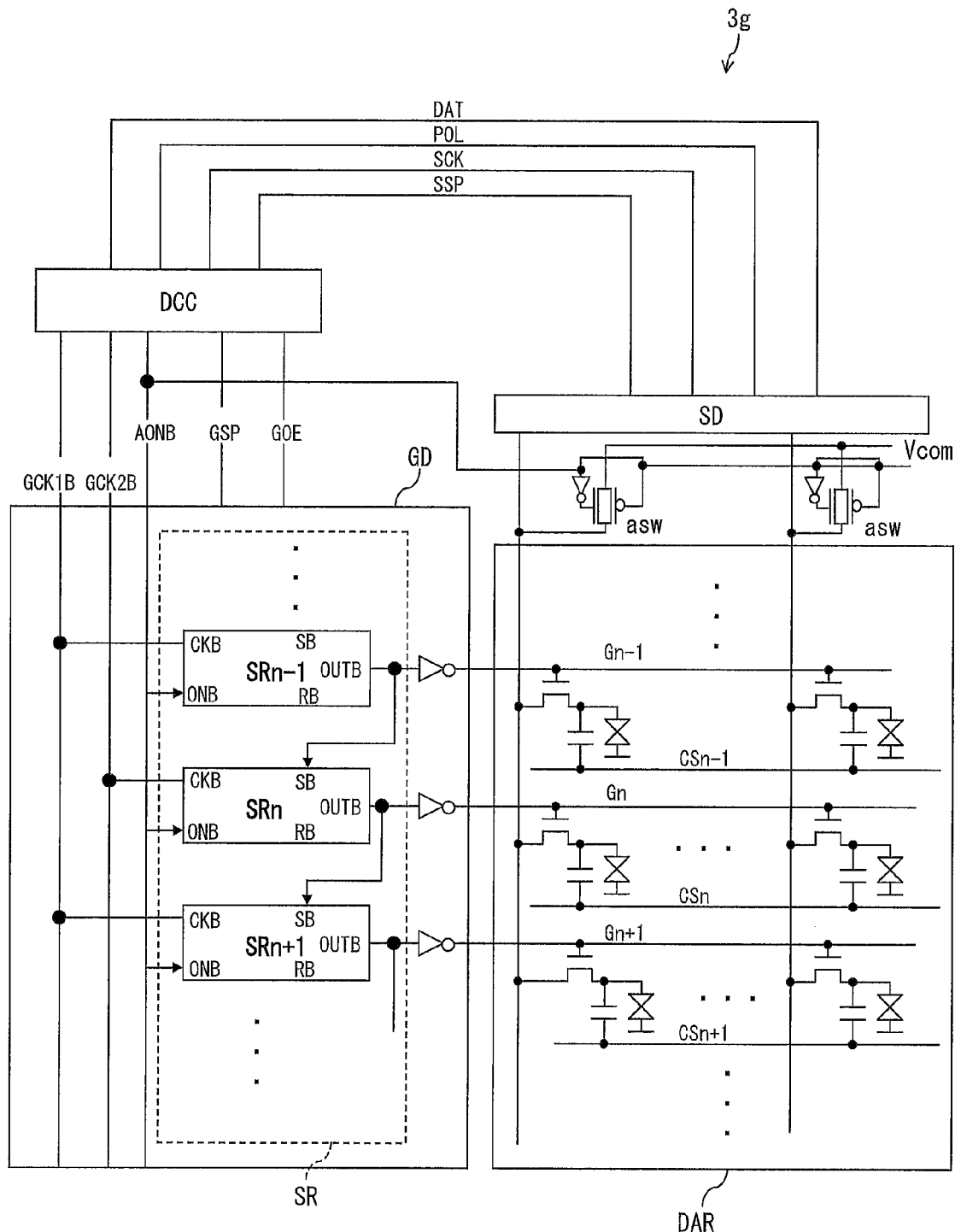
FIG. 51 is a view schematically illustrating another arrangement of the display device of the present invention.

FIG. 51 is a circuit diagram illustrating an arrangement of a liquid crystal display device 3g of the present invention. The liquid crystal display device 3g includes a display section DAR, a gate driver GD, a source driver SD, and a display control circuit DCC. The display control circuit DCC supplies, to the gate driver GD, an AONB signal (all-on signal), a gate start pulse GSP, a gate-on enable signal GOE, and gate clock signals GCK1B and GCK2B. Further, the display control circuit DCC supplies, to the source driver SD, a source start pulse SSP, digital data DAT, a polarity signal POL, and a source clock signal SCK. The gate driver GD includes a shift register SR which includes a plurality of stages. Hereinafter, the ith stage of the shift register SR is referred to as "the ith stage SRi (i=1, . . . , n−1, n, n+1, . . . )", as appropriate.

The ith stage SRi of the shift register supplies an output signal (OUTB signal) to a scan signal line Gi of the display section DAR via an inverter. For example, the nth stage SRn supplies an OUTB signal to a scan signal line Gn via an inverter. In the display section DAR, the scan signal line Gn is connected to a gate of a transistor which is connected to a pixel electrode provided in a PIXn. A retention capacitor (storage capacitor) is formed between the pixel electrode provided in the PIXn and a retention capacitor line CSn.

Further, for each of a plurality of data signal lines, one analogue switch asw and one inverter are provided. An input of the inverter is connected to an AONB signal line. An end of the data signal line is connected to one of two conductive terminals of the analogue switch asw, and the other one of two conductive terminals of the analogue switch asw is connected to a Vcom (an electric potential of a common electrode) power source. One (on an N channel side) of two gates of the analogue switch asw is connected to an output of the inverter, and the other one (on a P channel side) of two gates of the analogue switch asw is connected to the AONB signal line.

FIG. 52 is a circuit diagram illustrating an arrangement of the ith stage SRi of the shift register SR. Each of the plurality of stages of the shift register includes (i) a flip-flop FF of Embodiment 2 of the present invention, which includes an SB terminal and an RB terminal, (ii) two analogue switches ASW1 and ASW2, (iii) a NAND, (iv) an inverter, (v) a CKB terminal, and (vi) an ONB terminal (see FIG. 52). The ith stage SRi has an arrangement in which (i) a QB terminal of the flip-flop FF is connected to one of two inputs of the NAND, (ii) an output of the NAND is connected to (a) an input of the inverter, (b) one (on the P channel side) of two gates of the analogue switch ASW1, and (c) one (on the N channel side) of two gates of the analogue switch ASW2, (iii) an output of the inverter is connected to the other one (on the N channel side) of two gates of the analogue switch ASW1 and the other one (on the P channel side) of two gates of the analogue switch ASW2, (iv) one of two conductive electrodes of the analogue switch ASW1 is connected to the ONB terminal, (v) one of two conductive electrodes of the analogue switch ASW2 is connected to the CKB terminal, and (vi) the other one of two conductive electrodes of the analogue switch ASW1, the other one of two conductive electrodes of the analogue switch ASW2, the other one of two inputs of the NAND, the RB terminal of the FF, and an OUTB terminal which is an output terminal of the ith stage SRi, are connected to each other.

The shift register SR has an arrangement in which an OUTB terminal of a stage is connected to an SB terminal of a subsequent stage. For example, an OUTB terminal of the nth stage SRn is connected to an SB terminal of the (n+1)th stage SRn+1. Note that an SB terminal of the first stage SRi of the shift register SR receives a GSPB signal. Further, the gate driver GD has such an arrangement that CKB terminals of odd stages are connected to a first GCK line (a line for supplying a GCK signal) and CKB terminals of even stages are connected to a second GCK line (a line for supplying a GCK signal) which is different from the first GCK line. For example, a CKB terminal of the nth stage SRn is connected to a GCK2B signal line, while a CKB terminal of the (n+1)th stage SRn+1 is connected to a GCK1B signal line.

Figure 53:
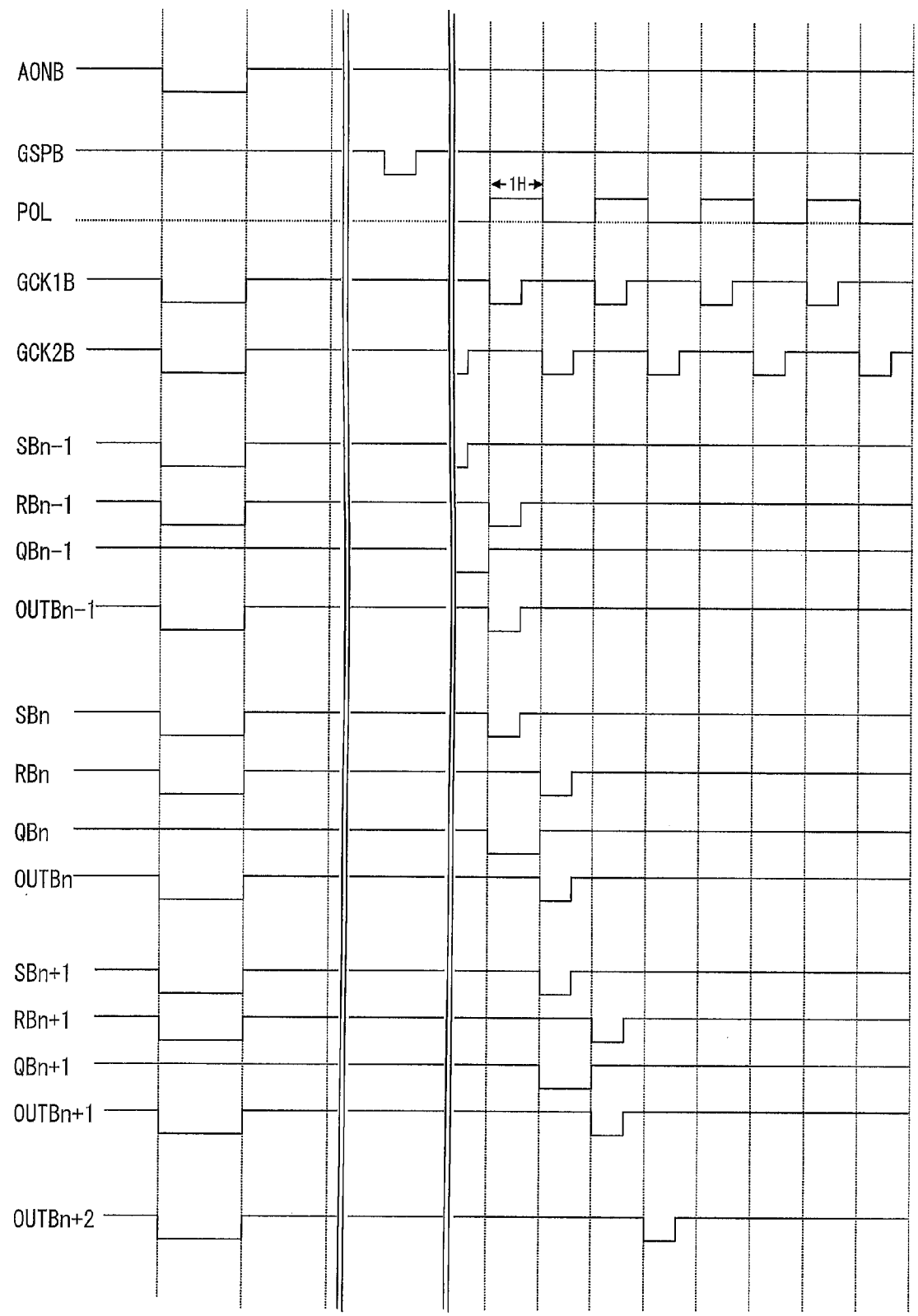
FIG. 53 is a timing chart showing how to drive the display device illustrated in FIG. 51.

FIG. 53 is a timing chart showing how to drive the liquid crystal display device 3g. Note that, in FIG. 53, "AONB" stands for an AONB signal (all-on signal), "GSPB" stands for a gate start pulse bar signal, "GCK1B" stands for a GCK1B signal, "GCK2B" stands for a GCK2B signal, and "SBi", "RBi", "QBi", and "OUTBi" (i=n−1, n, n+1) stands for, respectively, an SB signal (an electric potential at the SB terminal) of the ith stage SRi, an RB signal (an electric potential at the RB terminal) of the ith stage SRi, a QB signal (an electric potential at the QB terminal) of the ith stage SRi, and an OUTB signal (an electric potential at the OUTB terminal) of the ith stage SRi.

In the liquid crystal display device 3g, the following display preparatory operation is carried out before the first frame (vertical scanning period) for displaying an image. Specifically, an AONB signal is maintained to be active (low) for a predetermined time period. Each GCKB signal is maintained to be active (low) during a time period in which the AONB signal is active. This causes each of the plurality of stages of the shift register SR to output the AONB signal from the OUTB terminal via the ASW1. Immediately after that, the ASW1 is turned off, and the ASW2 is turned on. Accordingly, OUTB signals of all of the plurality of stages are turned to be active (low), so that all of a plurality of scan signal lines are selected. Note that, here, an analogue switch asw corresponding to each of a plurality of data signal lines is turned on, so that Vcom is supplied to all of the plurality of data signal line. Further, an SB signal and an RB signal, supplied to each of the plurality of stages, are turned to be active (low), so that a QB signal of the FF provided in each of the plurality of stages is turned to be inactive (high). This is because, according to the flip-flop of Embodiment 2 of the present invention, in a case where the SB signal and the RB signal are turned to be active at the same time, the RB signal (reset) has priority and the QB signal is turned to be inactive. After the above display preparatory operation is completed (after the AONB signal is turned to be inactive), Vcom is written on all of a plurality of PIXs of the display section DAR, and a QB output of the FF provided in each of the plurality of stages of the shift register is maintained to be inactive (high).

Further, in the liquid crystal display device 3g, the following operation is carried out during each vertical scanning period (during a time period in which each frame is displayed). That is, in a case where an SB signal supplied to a stage of the shift register SR is turned to be active (=low), an FF of the stage is set to be active, and the stage obtains a GCKB signal. When the GCKB signal of the stage is turned to be active (=low), (i) an OUTB signal of the stage is turned to be active (=low), (ii) an SB signal of a subsequent stage is turned to be high (inactive), and (iii) the FF of the stage is reset to be high (inactive). Here, since the OUTB signal of the stage is low (that is, an output of a NAND is high), the stage keeps obtaining the GCKB signal. When the GCKB signal is turned to be high (inactive), the OUTB signal of the stage is turned to be high, and the output of the NAND is turned to be low. After that, the AONB signal is outputted from an OUTB terminal so that the OUTB signal is turned to be high (inactive).

The liquid crystal display device 3g employs the flip-flop described in the aforementioned Embodiment 2. It is therefore possible to provide a compact gate driver. Further, it is also possible to initialize the shift register without supplying an INITB signal. This makes it possible to provide a further compact shift register. Furthermore, since an identical electric potential (e.g., Vcom) can be written on all of the plurality of pixels simultaneously before the first frame is displayed, it is possible to prevent generation of a defect in a screen before the first frame is displayed. Moreover, the initialization of the shift register (initialization of the flip-flop provided in each of the plurality of stages) is carried out at the same time as the writing of the identical electric potential on all the plurality of pixels. This makes it possible to carry out the display preparatory operation more quickly, as compared with a conventional liquid crystal display device in which the writing of the identical electric potential on all the plurality of pixels and the initialization of the flip-flop are carried out separately and independently.

Note that, in a case where the flip-flop of the aforementioned Embodiment 2 is used in each of the plurality of stages of the shift register, as illustrated in FIG. 52, there is a risk that a feedback of the OUTB signal to the RB terminal of the flip-flop might be carried out before a feedback of the OUTB signal to the NAND. In view of this, it is preferable to arrange the NAND of FIG. 52 as illustrated in FIG. 54. That is, a source of a P channel transistor p40 is connected to a VDD. A gate of the P channel transistor p40 is caused to function as an input X of the NAND. A drain of the P channel transistor p40 is caused to function as an output M of the NAND. Further, a source of a P channel transistor p41 is connected to a VDD. A gate of the P channel transistor p41 is caused to function as an input Y of the NAND. A drain of the P channel transistor p41 is connected to a drain of an N channel transistor n40. Furthermore, a gate of the N channel transistor n40 is connected to the input Y. A source of the N channel transistor n40 is connected to a drain of an N channel transistor n41. Moreover, a gate of the N channel transistor n41 is connected to the input X. A drain of the N channel transistor n41 is connected to a VSS. The P channel transistors p40 and p41 are set to be higher in driving power than the N channel transistors n40 and n41. With the arrangement, an OUTB signal is maintained to be active (=low) until a QB signal is turned to be inactive (high) sufficiently. Accordingly, it is possible to prevent the feedback to the RB terminal from being carried out before the feedback to the NAND.

It is possible to use, as the gate driver GD of the liquid crystal display device 3g, a gate-Cs driver (G-CsD) for carrying out CC driving (see FIG. 55). A liquid crystal display device 3h illustrated in FIG. 55 has an arrangement in which (i) each of a plurality of stages of a shift register SR included in a G-CsD of the liquid crystal display device 3d (see FIG. 37) is modified to have an arrangement illustrated in FIG. 52 and (ii) an input of the INITB signal is omitted. According to the shift register of the liquid crystal display device 3h, when OUTB signals of all of the plurality of stages are turned to be active and an SB signal and an RB signal of the flip-flop are turned to be active at the same time, the RB signal (reset) has priority (that is, a QB signal is turned to be inactive). Accordingly, it is possible to initialize the shift register without supplying an INITB signal.

Figure 56:
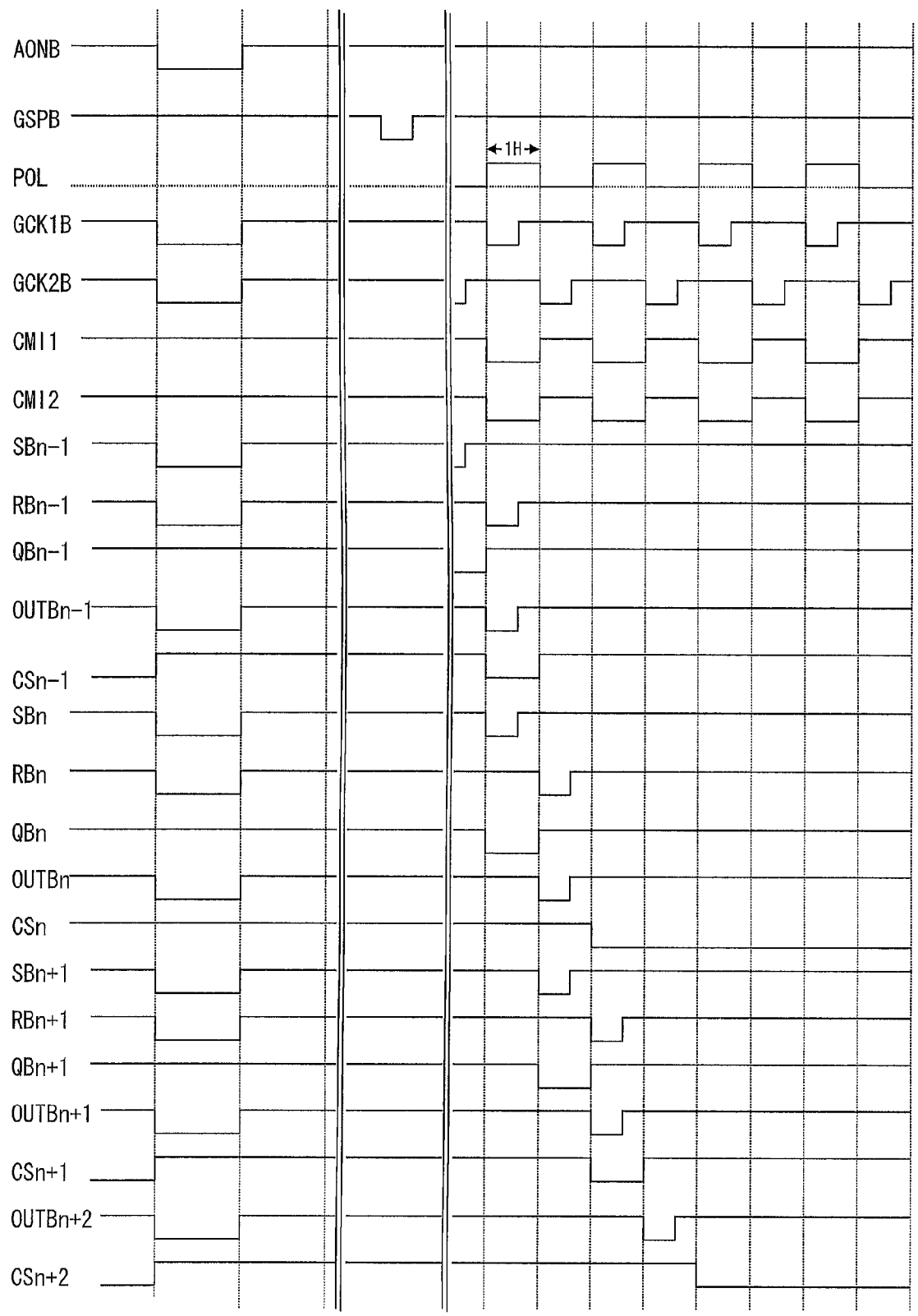
FIG. 56 is a timing chart showing how to drive the display device illustrated in FIG. 55.
Figure 57:
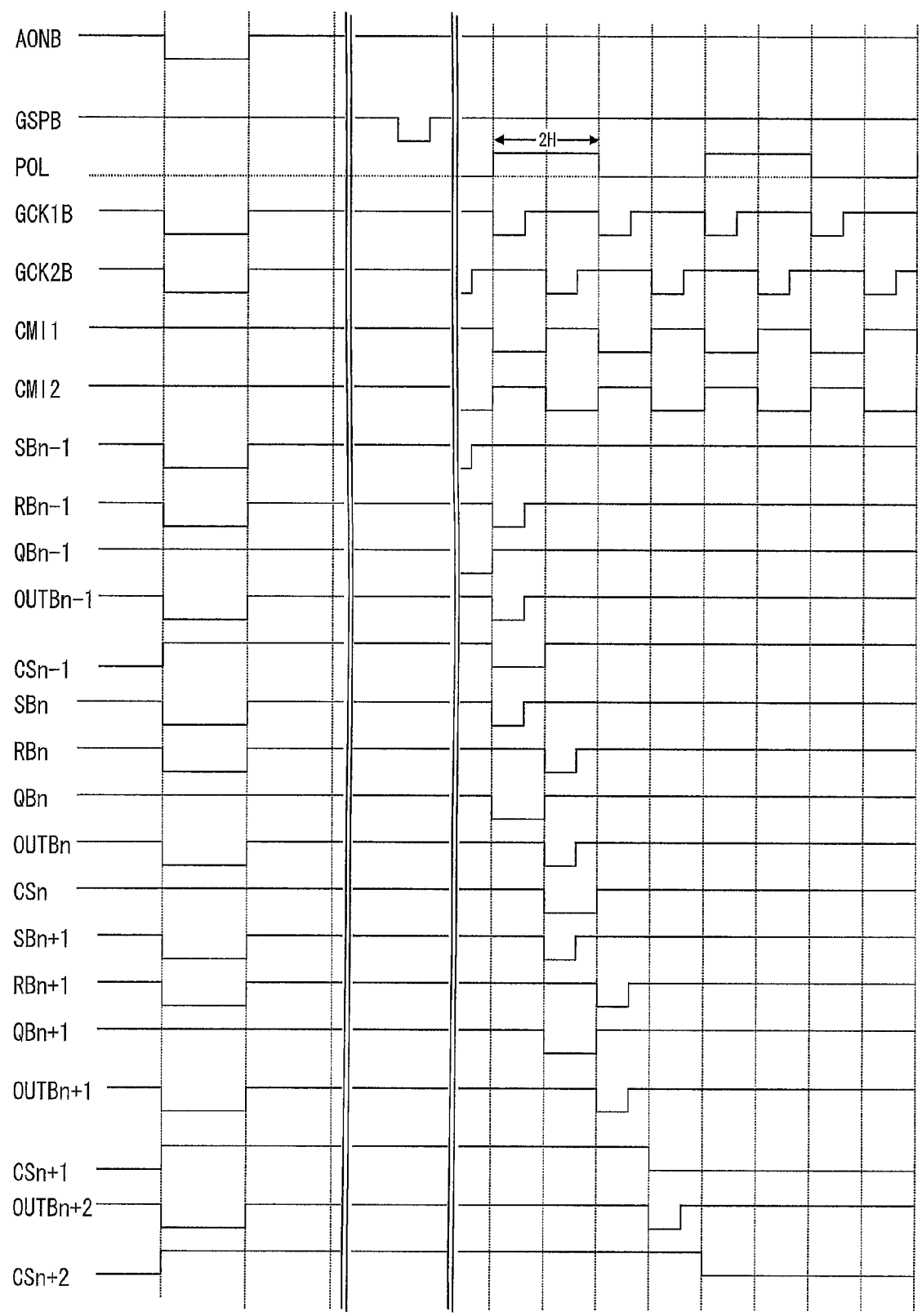
FIG. 57 is a timing chart showing how to drive the display device illustrated in FIG. 55.

Each of FIGS. 56 and 57 is a timing chart showing how to drive the liquid crystal display device 3h. As illustrated in FIGS. 56 and 57, by only shifting the phases of the CMI1 signal and the CMI2 signal to be different from each other by a half cycle (FIG. 57) from an identical cycle (FIG. 56), it becomes possible to (i) switch a cycle of a polarity signal POL from 1H to 2H and (ii) carry out the CC driving with respect to each pixel row appropriately from the first frame.

The liquid crystal display device 3h employs the flip-flop described in the aforementioned Embodiment 2. It is therefore possible to provide a compact G-Cs driver. Further, an identical electric potential (e.g., Vcom) can be written on all of the plurality of pixels simultaneously before the first frame is displayed. This makes it possible to prevent generation of a defect in the screen before the first frame is displayed. Furthermore, the initialization of the shift register (initialization of the flip-flop provided in each of the plurality of stages) is carried out at the same time as the writing of the identical electric potential on all the plurality of pixels. It is therefore possible to carry out the display preparatory operation more quickly, as compared with a conventional liquid crystal display device in which the writing of the identical electric potential on all the plurality of pixels and the initialization of the flip-flop are carried out separately and independently. Moreover, since the CC driving can be carried out appropriately with respect to each pixel row from the first frame, it is possible to prevent generation of a defect in the screen (non-uniformity which is recognized by a viewer as horizontal stripes), which defect has been conventionally found in the CC driving. Further, since the shift register can be initialized without an INITB signal, it is possible to simplify a circuit arrangement of the G-CsD (a reduction in size). Furthermore, by only controlling the phases of the respective CS inversion signals CMI1 and CMI2, it is possible to (i) switch the cycle of the polarity signal POL from 1H to 2H and (ii) prevent generation of a defect in the screen at that time.

Figure 58:
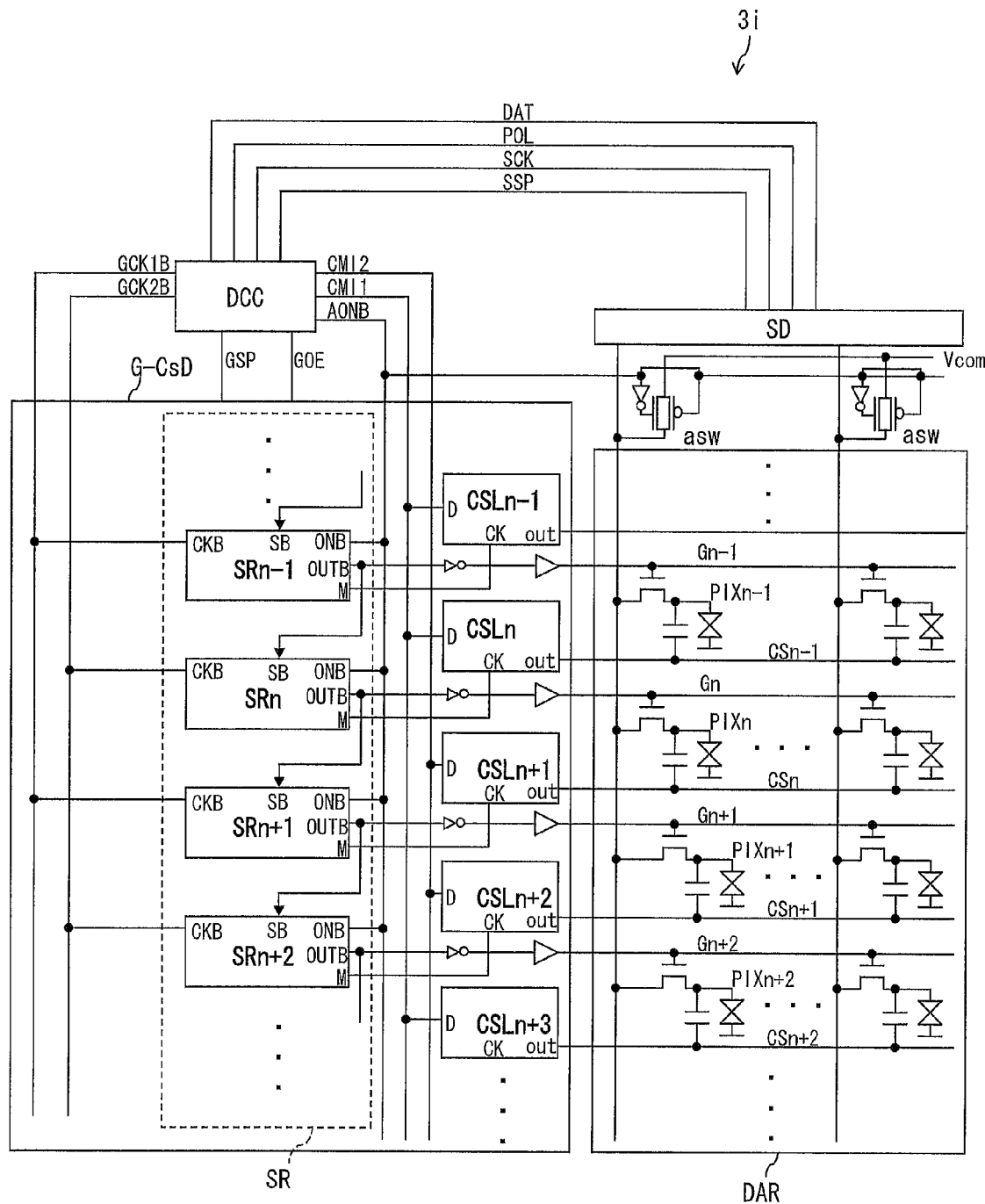
FIG. 58 is a view schematically illustrating another arrangement of the display device of the present invention.

It is possible to modify the G-CsD of the liquid crystal display device 3h (see FIG. 55) to have an arrangement illustrated in FIG. 58. A liquid crystal display device 3i illustrated in FIG. 58 has an arrangement in which (i) the flip-flop included in each of the plurality of stages of the shift register SR of the liquid crystal display device 3e (see FIG. 42) is modified to have an arrangement illustrated in FIG. 52 and (ii) an input of an INITB signal is omitted. In the shift register of the liquid crystal display device 3i, in a case where (i) OUTB signals of all of the plurality of stages are turned to be active and (ii) an SB signal and an RB signal of the flip-flop are turned to be active at the same time, the RB signal (reset) has priority (that is, a QB signal is turned to be inactive). Accordingly, it is possible to initialize the shift register without an input of an INITB signal.

Figure 59:
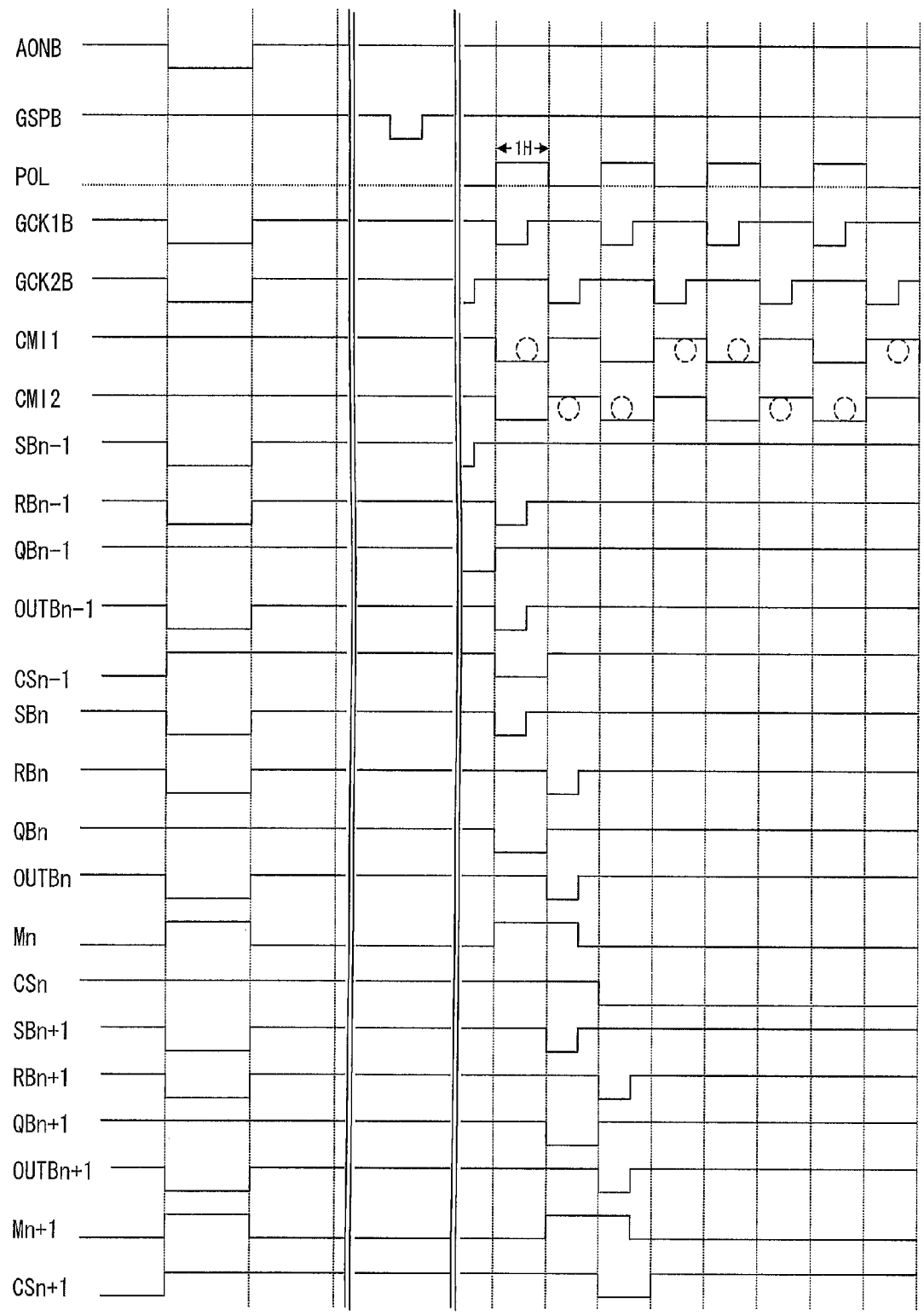
FIG. 59 is a timing chart showing how to drive the display device illustrated in FIG. 58.
Figure 60:
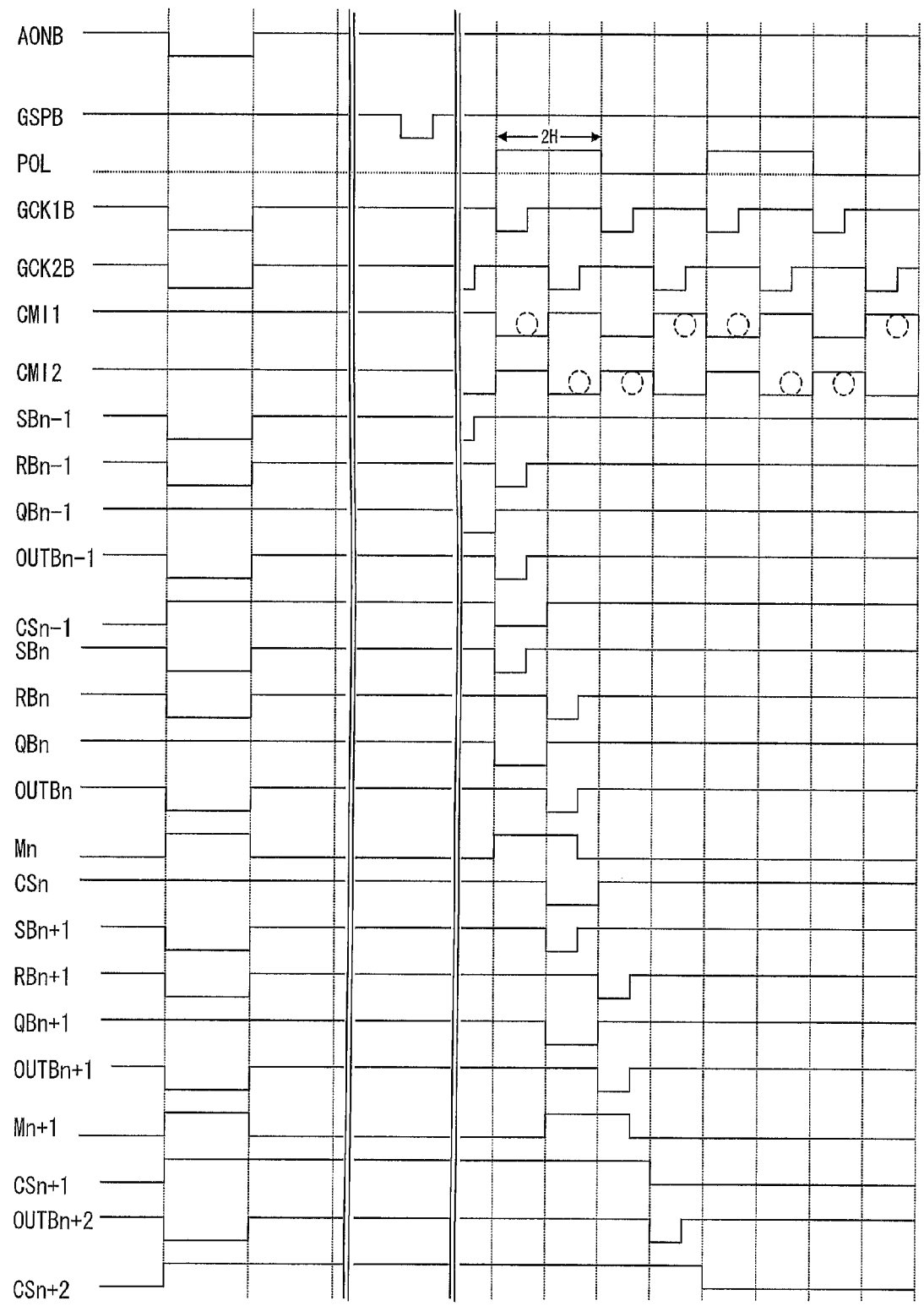
FIG. 60 is a timing chart showing how to drive the display device illustrated in FIG. 58.

Each of FIGS. 59 and 60 is a timing chart showing how to drive the liquid crystal display device 3i. As shown in FIGS. 59 and 60, by only shifting the phases of the CMI1 signal and the CMI2 signal with respect to each other by a half cycle (FIG. 60) from the state where they coincide with each other (FIG. 59), it is possible to (i) switch the cycle of the polarity signal POL from 1H to 2H and (ii) carry out the CC driving appropriately with respect to each pixel row from the first frame.

With the liquid crystal display device 3i, it is possible to have the same effects as those of the liquid crystal display device 3h. Further, according to the liquid crystal display device 3i, a NOR circuit and an OR circuit can be omitted in the G-Cs driver. Accordingly, it is possible to provide a further compact G-Cs driver.

It is possible to modify the shift register SR of the liquid crystal display device 3g (see FIG. 51) to have an arrangement of a liquid crystal display device 3j illustrated in FIG. 61. FIG. 62 is a circuit diagram illustrating an arrangement of the ith stage SRi of the shift register included in the liquid crystal display device 3j. Each of a plurality of stages of the shift register includes (i) a flip-flop FF of the aforementioned Embodiment 2, which includes an SB terminal and an RB terminal, (ii) analogue switches ASW5 and ASW6, (iii) an ONB terminal, and (iv) a CKB terminal (see FIG. 62). The ith stage SRi has an arrangement in which (i) a Q terminal of the flip-flop FF is connected to one (on a P channel side) of two gates of the analogue switch ASW5 and one (on an N channel side) of two gates of the analogue switch ASW6, (ii) a QB terminal of the flip-flop FF is connected to the other one (on the N channel side) of two gates of the analogue switch ASW5 and the other one (on the P channel side) of two gates of the analogue switch ASW6, (iii) one of two conductive electrodes of the analogue switch ASW5, one of two conductive electrodes of the analogue switch ASW6, and an OUTB terminal which is an output terminal of the ith stage SRi, are connected to each other, (iv) the other one of two conductive electrodes of the analogue switch ASW5 and the ONB terminal are connected to each other, and (v) the other one of two conductive electrodes of the analogue switch ASW6 and the CKB terminal for receiving a clock signal are connected to each other.

Further, the shift register SR has an arrangement in which (i) an OUTB terminal of a stage is connected to an SB terminal of a subsequent stage and (ii) an OUTB terminal of the subsequent stage is connected to an RB terminal of the stage. Furthermore, the gate driver GD has an arrangement in which CKB terminals of odd stages are connected to a first GCK line (a line for supplying a GCK signal) and CKB terminals of even stages are connected to a second GCK line (a line for supplying a GCK signal) which is different from the first GCK line.

Figure 63:
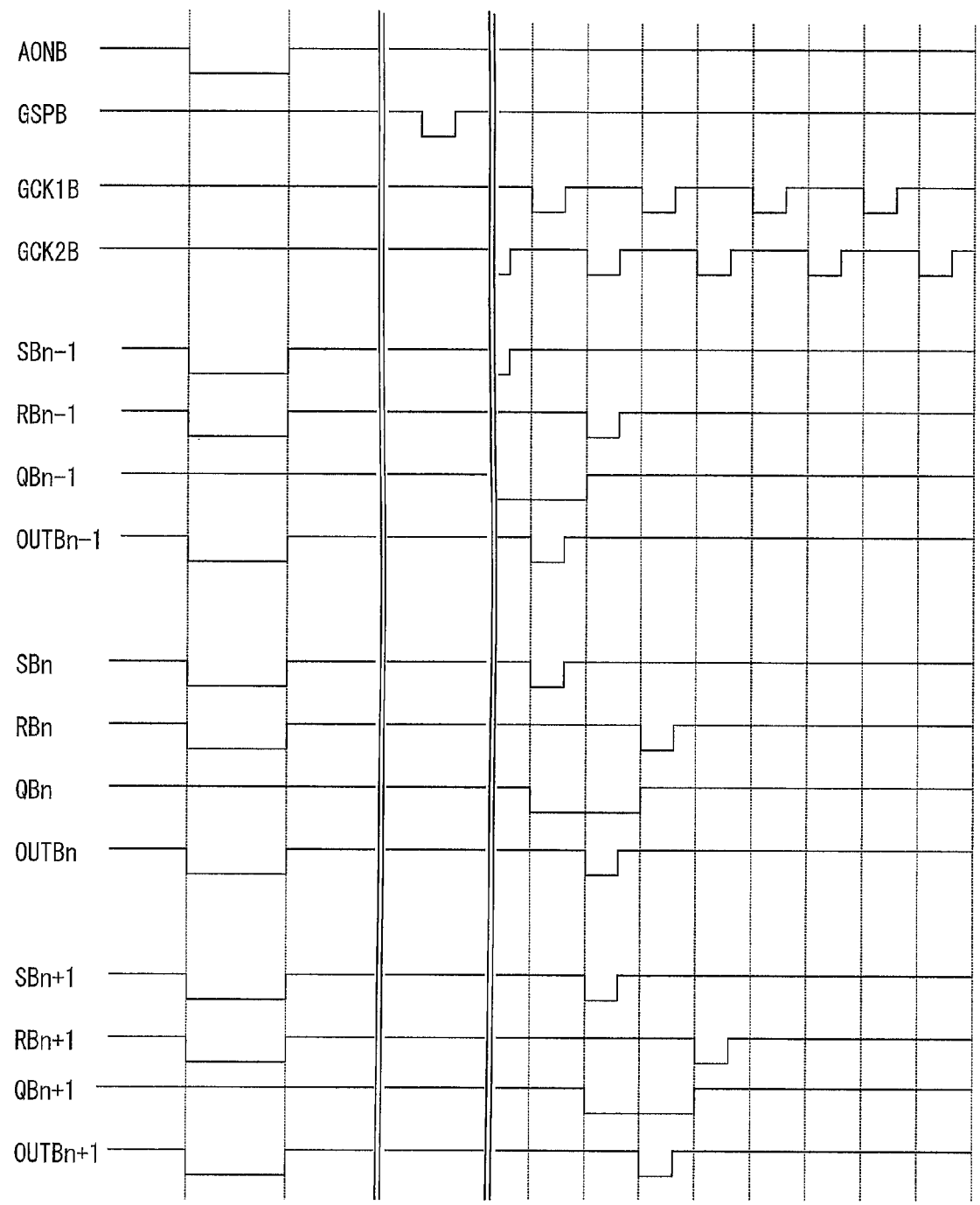
FIG. 63 is a timing chart showing how to drive the display device illustrated in FIG. 61.

FIG. 63 is a timing chart showing how to drive the liquid crystal display device 3j. With the liquid crystal display device 3j, it is possible to have the same effects as those of the liquid crystal display device 3g (see FIG. 51).

Application to Shift Register

Example 5

Figure 64:
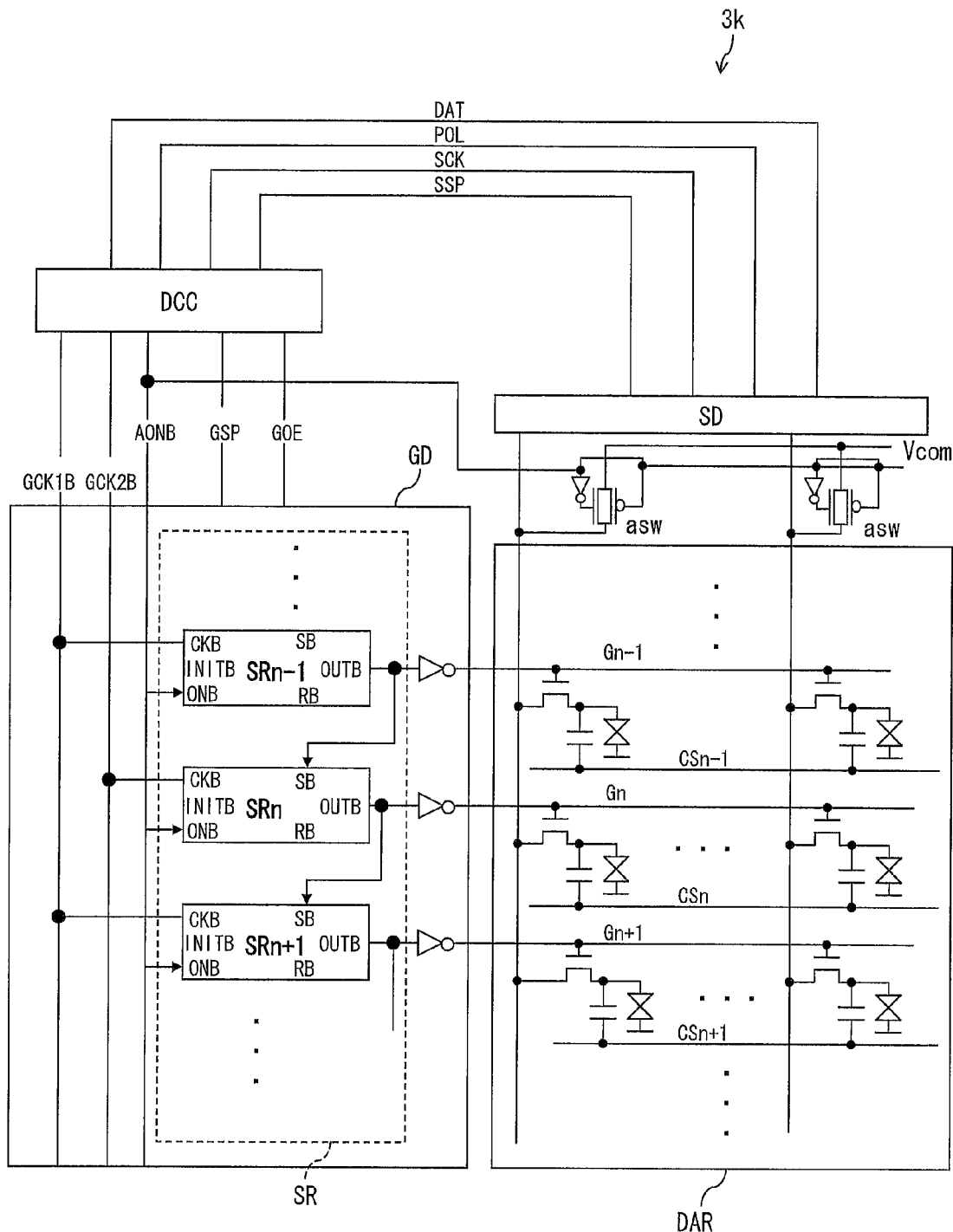
FIG. 64 is a view schematically illustrating another arrangement of the display device of the present invention.

FIG. 64 is a circuit diagram illustrating an arrangement of a liquid crystal display device 3k of the present invention. The liquid crystal display device 3k includes a display section DAR, a gate driver GD, a source driver SD, and a display control circuit DCC. The display control circuit DCC supplies, to the gate driver GD, a gate start pulse GSP, a gate-on enable signal GOE, an AONB signal (all-on signal), and gate clock signals GCK1B and GCK2B. Further, the display control circuit DCC supplies, to the source driver SD, a source start pulse SSP, digital data DAT, a polarity signal POL, and a source clock signal SCK. The gate driver GD includes a shift register SR which includes a plurality of stages. Hereinafter, the ith stage (i=1, ..., n−1, n, n+1, ...) of the shift register is referred to as "the ith stage SRi", as appropriate.

An output signal (OUTB signal) of the ith stage SRi of the shift register is supplied to a scan signal line Gi of the display section DAR via an inverter. For example, an OUTS signal of the nth stage SRn is supplied to a scan signal line Gn via an inverter. The display section DAR has an arrangement in which (i) the scan signal line Gn is connected to a gate of a transistor which is connected to a pixel electrode provided in a PIXn and (ii) a retention capacitor (storage capacitor) is formed between the pixel electrode provided in the PIXn and a retention capacitor line CSn.

Further, for each of a plurality of data signal lines, one analogue switch asw and one inverter are provided. An input of the inverter is connected to an AONB signal line. An end of the data signal line is connected to one of two conductive terminals of the analogue switch asw, and the other one of two conductive terminals of the analogue switch asw is connected to a Vcom (an electric potential of a common electrode) power source. One (on an N channel side) of two gates of the analogue switch asw is connected to an output of the inverter, and the other one (on a P channel side) of two gates of the analogue switch asw is connected to the AONB signal line.

FIG. 65 is a circuit diagram illustrating an arrangement of the ith stage SRi of the shift register SR. Each of the plurality of stages of the shift register includes (i) a flip-flop FF in accordance with one of the aforementioned embodiments of the present invention, which includes an SB terminal, an RB terminal, and an INITB terminal, (ii) two analogue switches ASW1 and ASW2, (iii) a NAND, (iv) an inverter, (v) an ONB terminal, and (vi) a CKB terminal (see FIG. 65). The ith stage SRi has an arrangement in which (i) a QB terminal of the flip-flop FF is connected to one of two inputs of the NAND, (ii) an output of the NAND is connected to (a) an input of the inverter, (b) one (on the P channel side) of two gates of the analogue switch ASW1, and (c) one (on the N channel side) of two gates of the analogue switch ASW2, (iii) an output of the inverter is connected to the other one (on the N channel side) of two gates of the analogue switch ASW1 and the other one (on the P channel side) of two gates of the analogue switch ASW2, (iv) one of two conductive electrodes of the analogue switch ASW1 is connected to the ONB terminal and the INITB terminal, (v) one of two conductive electrodes of the analogue switch ASW2 is connected to the CKB terminal, (vi) the other one of two conductive electrodes of the analogue switch ASW1, the other one of two conductive electrodes of the analogue switch ASW2, the other one of inputs of the NAND, the RB terminal of the FF, and an OUTB terminal which is an output terminal of the ith stage, are connected to each other.

The shift register SR has an arrangement in which an OUTB terminal of a stage is connected to an SB terminal of a subsequent stage. Further, the gate driver GD has an arrangement in which CKB terminals of odd stages are connected to a first GCK line (a line for supplying a GCK signal) and CKB terminals of even stages are connected to a second GCK line (a line for supplying a GCK signal) which is different from the first GCK line.

FIG. 53 is a timing chart showing how to drive the liquid crystal display device 3k. In the liquid crystal display device 3k, the following display preparatory operation is carried out before the first frame (vertical scanning period) for displaying an image. Specifically, an AONB signal is maintained to be active (low) for a predetermined time period. Each GCKB signal is maintained to be active (low) during a time period in which the AONB signal is active. As a result, each of the plurality of stages of the shift register SR outputs the AONB signal from the OUTB terminal via the ASW1. Immediately after that, the ASW1 is turned off, and the ASW2 is turned on. In this case, OUTB signals of all of the plurality of stages are turned to be active (low), so that all of a plurality of scan signal lines are selected. Note here that the analogue switch asw corresponding to each of a plurality of data signal lines is turned on, so that Vcom is supplied to all of the plurality of data signal lines. Further, the INITB terminal of the flip-flop provided in each of the plurality of stages receives the AONB signal which serves as an initialization signal. Accordingly, a QB signal of the flip-flop provided in each of the plurality of stages is turned to be inactive (high). After the above display preparatory operation is carried out (after the AONB signal is turned to be inactive), Vcom is written on all of a plurality of PIXs of the display section DAR, and a QB output of the FF provided in each of the plurality of stages of the shift register is maintained to be inactive (high).

Further, in the liquid crystal display device 3k, the following operation is carried out during each vertical scanning period (during a time period in which each frame is displayed). That is, in a case where an SB signal supplied to a stage of the shift register SR is turned to be active (=low), an output of an FF of the stage is set to be active, and the stage obtains a GCKB signal. When the GCKB signal of the stage is turned to be active (=low), (i) an OUTS signal of the stage is turned to be active (=low), (ii) an SB signal of a subsequent stage is turned to be active, and (iii) the FF of the stage is reset to be high (inactive). Here, the OUTS signal of the stage is low (an output of a NAND is high), so that the stage keeps receiving the GCKB signal. When the GCKB signal is turned to be high (inactive), the OUTB signal of the stage is turned to be high and the output of the NAND is turned to be low. After that, the AONB signal is outputted from the OUTB terminal so that the OUTB signal is turned to be high (inactive).

The liquid crystal display device 3k employs a flip-flop in accordance with one of the aforementioned embodiments of the present invention. It is therefore possible to provide a compact gate driver. Further, by using the AONB signal as an initialization signal of the shift register, it becomes unnecessary to input an INITB signal additionally. This makes it possible to provide a further compact gate driver. Furthermore, an identical electric potential (e.g., Vcom) can be written on all the pixels simultaneously before the first frame is displayed. It is therefore possible to prevent generation of a defect in a screen before the first frame is displayed. Moreover, the initialization of the shift register (initialization of the flip-flop provided in each of the plurality of stages) is carried out at the same time as the writing of the identical electric potential on all the pixels. It is therefore possible to carry out the display preparatory operation more quickly, as compared with a conventional liquid crystal display device in which the writing of the identical electric potential on all the pixels and the initialization of the flip-flop are carried out separately and independently.

It is possible to use, as the gate driver GD of the liquid crystal display device 3k, a gate-Cs driver (G-CsD) for carrying out CC driving (see FIG. 66). A liquid crystal display device 3r illustrated in FIG. 66 has an arrangement in which (i) each of the plurality of stages of the shift register included in the G-CsD of the liquid crystal display device 3d (see FIG. 37) is modified to have an arrangement illustrated in FIG. 65 and (ii) an input of an INITB signal is omitted. A shift register of the liquid crystal display device 3r employs an AONB signal as an initialization signal of the shift register. Accordingly, a QB signal of the flip-flop provided in each of the plurality of stages is turned to be inactive when OUTB signals of all of the plurality of stages are turned to be active.

Each of FIGS. 56 and 57 is a timing chart showing how to drive the liquid crystal display device 3r. By only shifting the phases of the respective CMI1 signal and CMI2 signal with respect to each other by a half cycle (FIG. 57) from the state where they coincide with each other (FIG. 56), it becomes possible to (i) switch a cycle of a polarity signal POL from 1H to 2H and (ii) carry out the CC driving appropriately with respect to each pixel row from the first frame.

The liquid crystal display device 3r employs a flip-flop in accordance with one of the aforementioned embodiments of the present invention. It is therefore possible to provide a compact G-Cs driver. Further, an identical electric potential (e.g., Vcom) can be written on all the pixels simultaneously before the first frame is displayed. Accordingly, it is possible to prevent generation of a defect in a screen before the first frame is displayed. Furthermore, initialization of the shift register (initialization of the flip-flop provided in each of the plurality of stages) is carried out at the same time as the writing of the identical electric potential on all the pixels. It is therefore possible to carry out the display preparatory operation more quickly, as compared with a conventional liquid crystal display device in which the wiring of the identical electric potential on all the pixels and the initialization of the flip-flop are carried out separately and independently. Further, the CC driving can be carried out appropriately with respect to each pixel row from the first frame. It is therefore possible to prevent generation of a defect (non-uniformity which is recognized by a viewer as horizontal stripes) in a screen during the first frame, which defect has been found in the CC driving conventionally. Moreover, an AONB signal is used as an initialization signal of the shift register. It is therefore possible to simplify a circuit arrangement of the G-CsD (reduction in size of the G-CsD). Further, by only controlling the phases of the respective CS inversion signals CMI1 and CMI2, it is possible to (i) switch the cycle of the polarity signal POL from 1H to 2H and (ii) prevent generation of a defect in the screen at that time.

Figure 67:
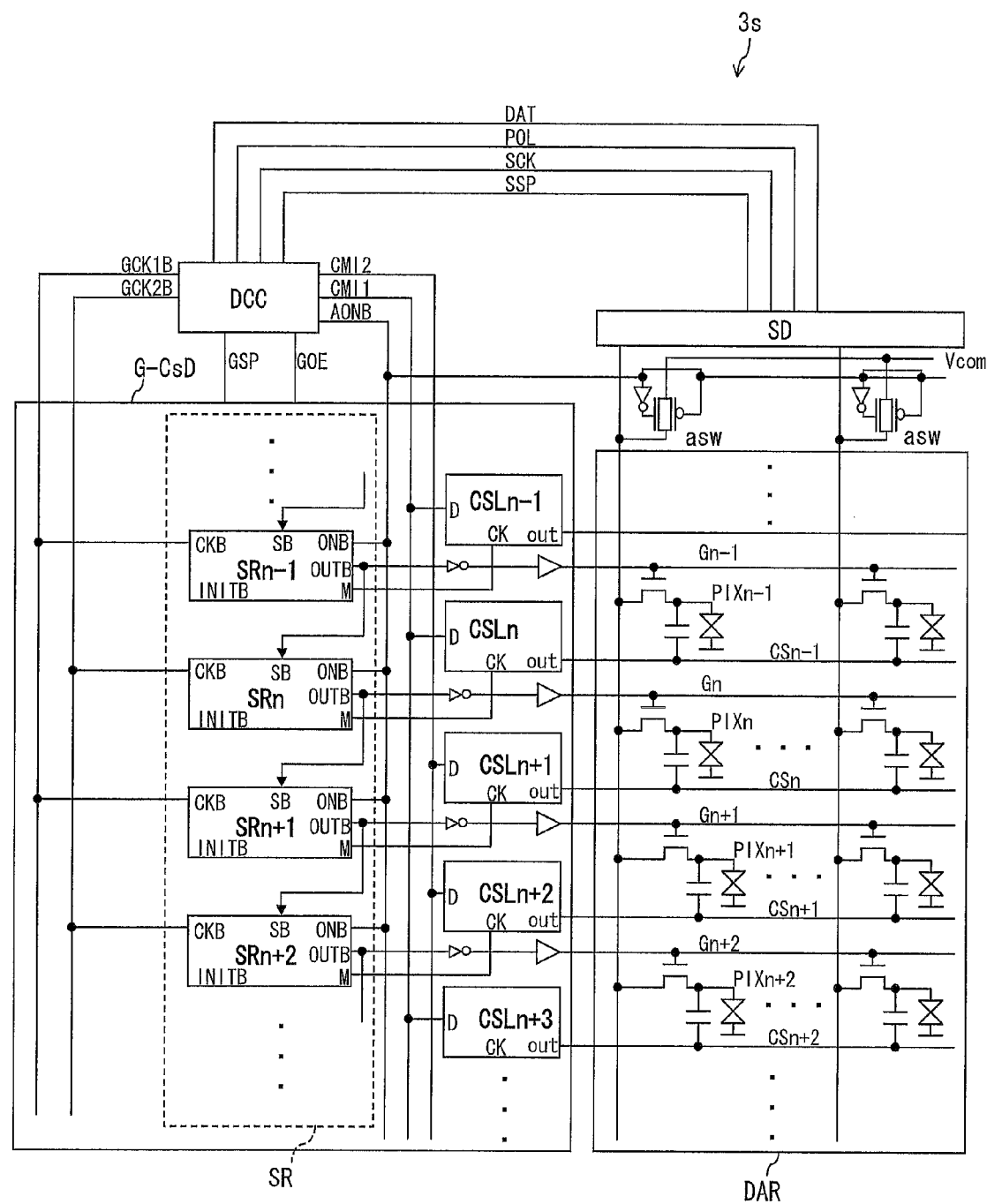
FIG. 67 is a view schematically illustrating another arrangement of the display device of the present invention.

It is possible to modify the G-CsD of the liquid crystal display device 3r to have an arrangement illustrated in FIG. 67. A liquid crystal display device 3s illustrated in FIG. 67 has an arrangement in which (i) the flip-flop provided in each of the plurality of stages of the shift register SR of the liquid crystal display device 3e (see FIG. 42) is modified to have an arrangement illustrated in FIG. 65 and (ii) an input of an INITB signal is omitted. A shift register of the liquid crystal display device 3e employs an AONB signal as an initialization signal of the shift register. Accordingly, a QB signal of a flip-flop provided in the plurality of stages is turned to be active when OUTB signals of all of the plurality of stages are turned to be active.

Each of FIGS. 59 and 60 is a timing chart showing how to drive the liquid crystal display device 3s. By only shifting the phases of the respective CMI1 signal and the CMI2 signal with respect to each other by a half cycle (FIG. 60) from the state where they coincide with each other (FIG. 59), it is possible to (i) switch a cycle of a polarity signal POL from 1H to 2H and (ii) carry out the CC driving appropriately with respect to each pixel row from the first frame.

With the liquid crystal display device 3s, it is possible to have the same effects as those of the liquid crystal display device 3r. Further, with the liquid crystal display device 3s, it is unnecessary to provide an NOR circuit and an OR circuit in the G-Cs driver. This makes it possible to provide a further compact G-Cs driver.

Figure 69:
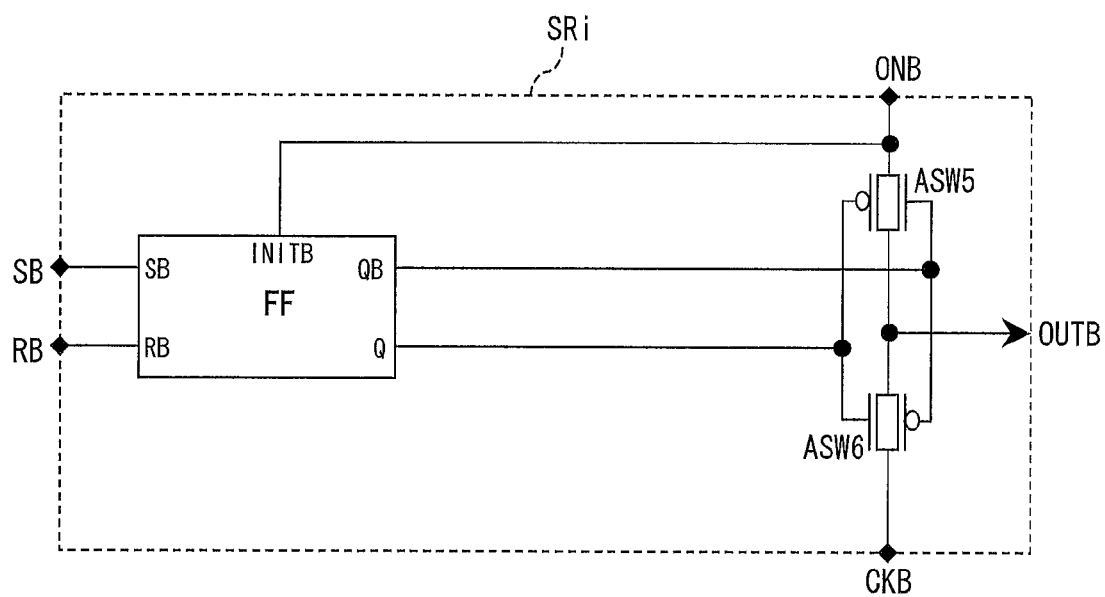
FIG. 69 is a circuit diagram illustrating each of a plurality of stages of a shift register of the display device illustrated in FIG. 68.

It is possible to modify the shift register SR of the liquid crystal display device 3k (see FIG. 64) to have an arrangement of a liquid crystal display device 3t illustrated in FIG. 68. FIG. 69 is a circuit diagram illustrating an arrangement of the ith stage SRi of a shift register included in the liquid crystal display device 3t. Each of a plurality of stages of the shift register includes (i) a flip-flop FF in accordance with one of the aforementioned embodiments of the present invention, which includes an SB terminal, an RB terminal, and an INITB terminal, (ii) analogue switches ASW5 and ASW6, (iii) an ONB terminal, and (iv) a CKB terminal (see FIG. 69). The ith stage SRi has an arrangement in which (i) a Q terminal of the flip-flop FF is connected to one (on a P channel side) of two gates of the analogue switch ASW5 and one (on an N channel side) of two gates of the analogue switch ASW6, (ii) a QB terminal of the flip-flop FF is connected to the other one (on the N channel side) of two gates of the analogue switch ASW5 and the other one (on the P channel side) of two gates of the analogue switch ASW6, (iii) an OUTB terminal which is an output terminal of the ith stage SRi, one of two conductive electrodes of the analogue switch ASW5, and one of two conductive electrodes of the analogue switch ASW6 are connected to each other, (iv) the other one of two conductive electrodes of the analogue switch ASW5, the ONB terminal, and the INITB terminal are connected to each other, and (v) the other one of two conductive electrodes of the analogue switch ASW6 and the CKB terminal for receiving a clock signal are connected to each other.

Further, the shift register SR has an arrangement in which (i) an OUTB terminal of a stage is connected to an SB terminal of a subsequent stage and (ii) an OUTB terminal of the subsequent stage is connected to an RB terminal of the stage. Further, the gate driver GD has an arrangement in which CKB terminals of odd stages are connected to a first GCK line (a line for supplying a GCK signal) and CKB terminals of even stages are connected to a second GCK line (a line for supplying GCK signal) which is different from the first GCK line.

FIG. 63 is a timing chart showing how to drive the liquid crystal display device 3t. Further, with the liquid crystal display device 3t, it is possible to have the same effects as those of the liquid crystal display device 3k (see FIG. 64).

Note that the gate driver, the source driver, or the gate-Cs driver can be formed monolithically (on the same substrate) with a pixel circuit of the display section.

Figure 70:
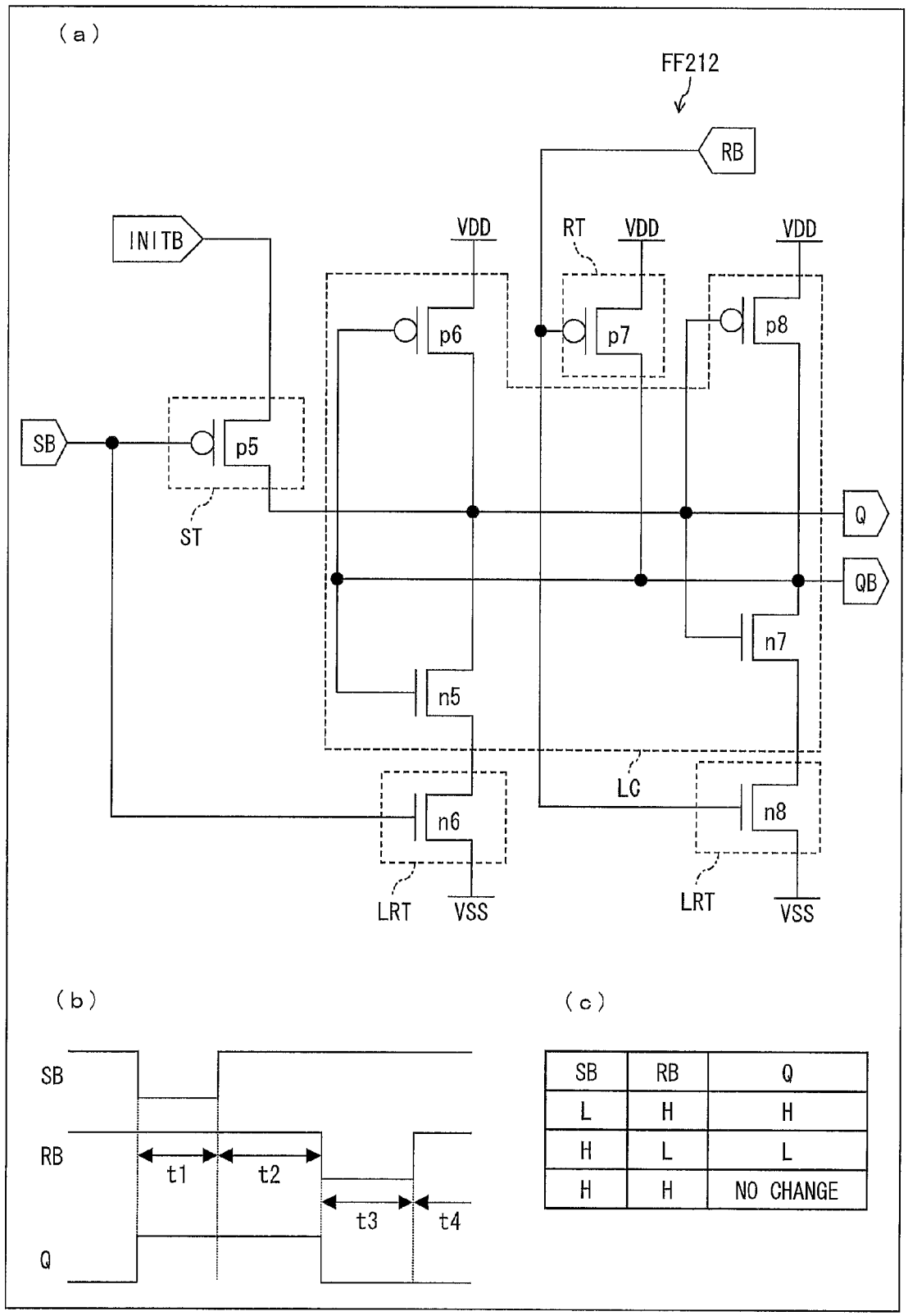
FIG. 70 is an explanatory view illustrating another flip-flop used in the display device of the present invention: (a) of FIG. 70 is a circuit diagram, (b) of FIG. 70 is a timing chart, and (c) of FIG. 70 is a truth table.
Figure 71:
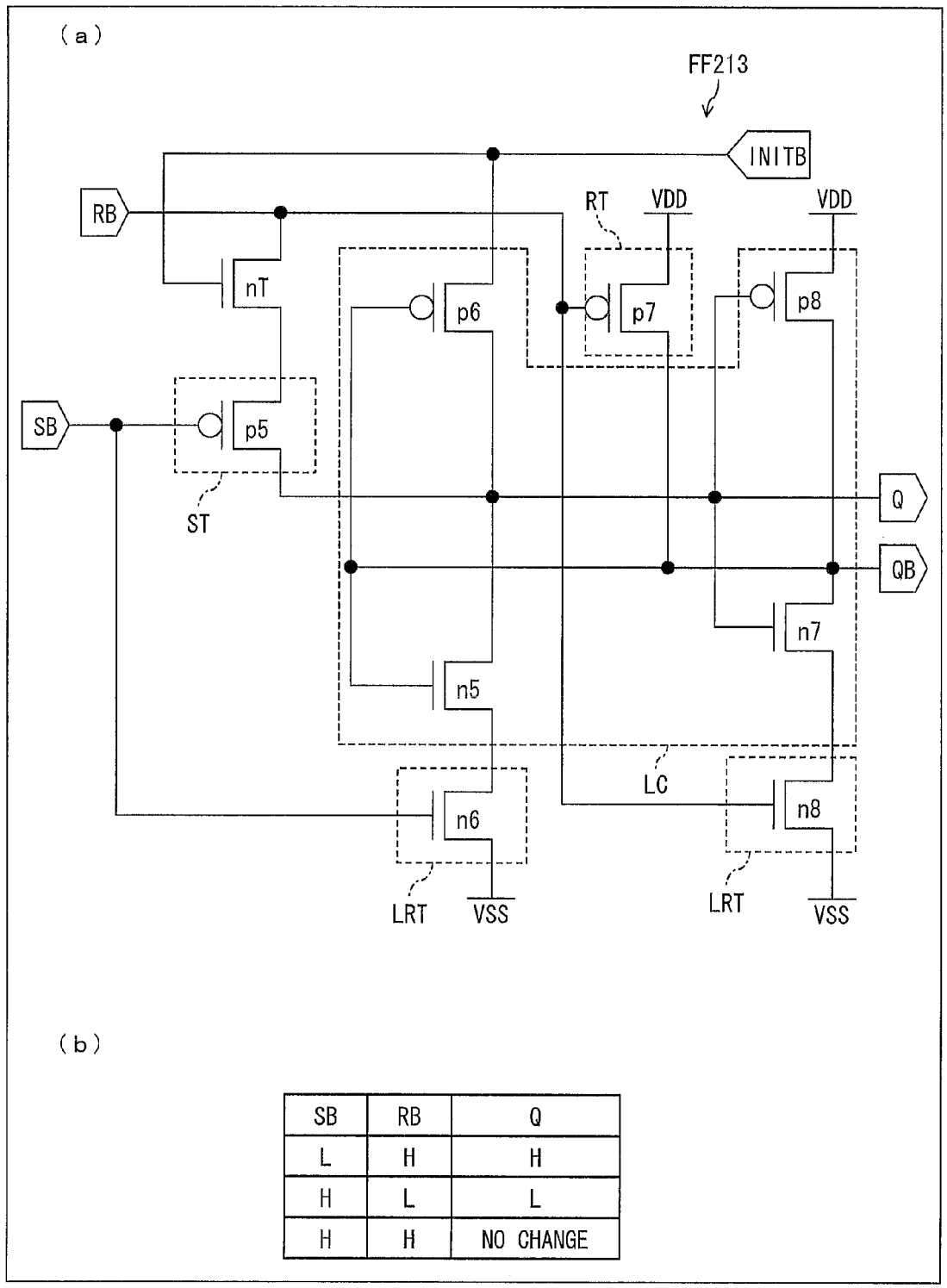
FIG. 71 is an explanatory view illustrating another flip-flop used in the display device of the present invention: (a) of FIG. 71 is a circuit diagram, and (b) of FIG. 71 is a truth table.

Note that it is possible to modify the shift register of the liquid crystal display device 3d and the shift register of the liquid crystal display device 3e (see FIGS. 37 and 42) to have an arrangement illustrated in (a) of FIG. 70. An FF 212 illustrated in (a) of FIG. 70 has an arrangement in which, in an FF 201 illustrated in FIG. 3, (i) a source of a p5 (set transistor) is connected to an INITB terminal, (ii) an RB terminal is connected to only a gate of a p7 and a gate of p8, and (iii) a drain of a p6 is connected to a VDD. (b) of FIG. 70 shows an operation timing chart of the FF 212, and (c) of FIG. 70 is a truth table of the FF 212. The flip-flop FF 212 is such that, in a case where an SB signal is turned to be active (low) and an RB signal is turned to be active (low) during a time period in which the INITB terminal is active (low), a Q signal is turned to be low and a QB signal is turned to be high (inactive). Further, it is possible to modify the shift register of the liquid crystal display devices 3d and the shift register of the liquid crystal display device 3e to have an arrangement illustrated in (a) of FIG. 71. That is, an FF 213 illustrated in (a) of FIG. 71 has an arrangement in which (i) a channel transistor nT is added to an FF 201 illustrated in FIG. 3, (ii) a gate of the nT is connected to the INITB terminal, (iii) a drain of the nT is connected to a source of a p5 (set transistor), and (iv) a source of the nT is connected to an RB terminal. (b) of FIG. 71 is a truth table of the FF 213.

Figure 50:
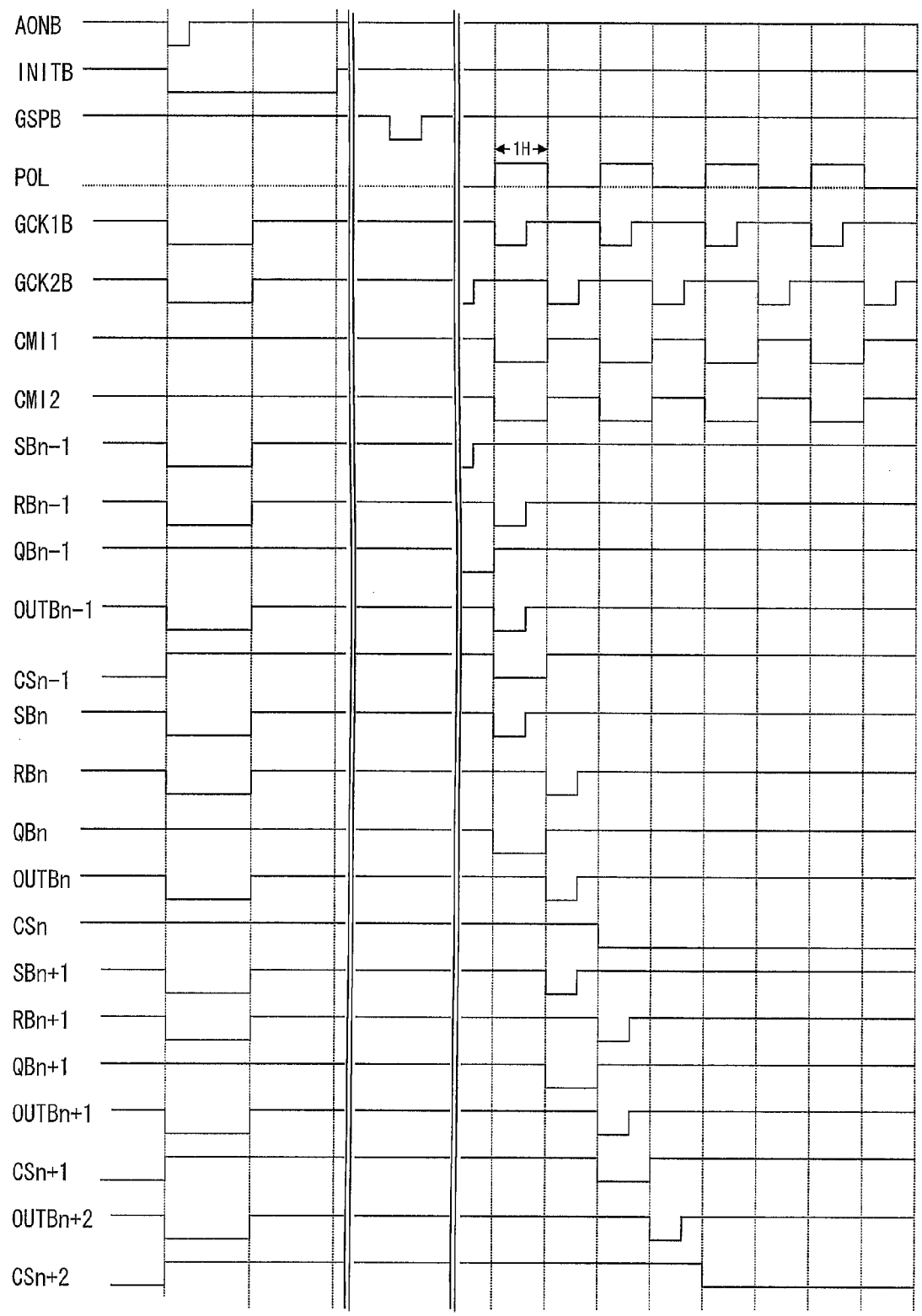
FIG. 50 is a timing chart showing a modified example of either FIG. 40 or FIG. 44.
Figure 73:
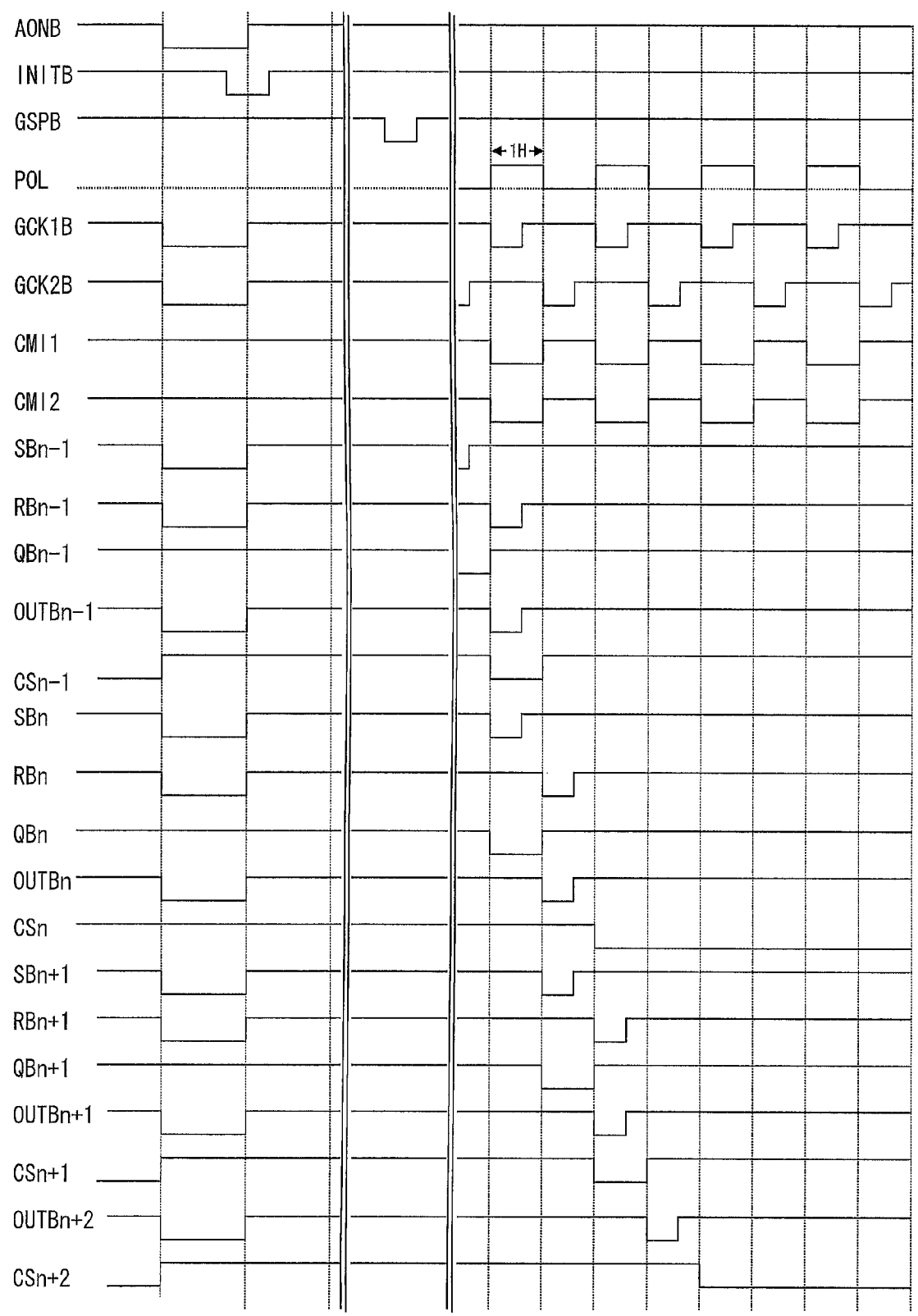
FIG. 73 is a timing chart showing another modified example of either FIG. 40 or FIG. 44.

Further, in the driving of each of the liquid crystal display devices 3d and 3e, it is possible to cause an AONB signal to be inactive (high) during the course of simultaneous selection (see FIG. 50). Further, it is possible to cause an INITB signal to be active after the AONB signal is turned to be active (low) but before the AONB signal is turned to be inactive (high) (see FIG. 73). Furthermore, it is also possible to cause the INITB signal to be active (low) after the AONB signal which has been active (low) is turned to be inactive (high) (see FIG. 74).

A flip-flop of the present invention includes: a first transistor which is a P channel transistor; a second transistor which is an N channel transistor; a third transistor which is a P channel transistor; a fourth transistor which is an N channel transistor; a plurality of input terminals; a first output terminal; a second output terminal; and an input transistor, the first transistor and the second transistor constituting a first CMOS circuit such that their gate terminals are connected to each other and their drain terminals are connected to each other, the third transistor and the fourth transistor constituting a second CMOS circuit such that their gate terminals are connected to each other and their drain terminals are connected to each other, the first output terminal being connected to a gate side of the first CMOS circuit and a drain side of the second CMOS circuit, the second output terminal being connected to a gate side of the second CMOS circuit and a drain side of the first CMOS circuit, the input transistor being such that its gate terminal is connected to one of the plurality of input terminals and its source terminal is connected to another one of the plurality of input terminals. Note that a drain terminal of the input transistor is connected to the first output terminal directly or indirectly via a relay transistor.

In the present specification, one (on an output side) of two conductive electrodes of a transistor (a P channel transistor or an N channel transistor) is referred to as "drain terminal". With the arrangement, it is possible to output one of the signals supplied to the different input terminals in such a manner that, if the signals are turned to be active simultaneously, one of the signals has priority, without provision of a priority determining circuit which ahs been conventionally necessary. This makes it possible to provide a compact flip-flop.

The flip-flop of the present invention can be arranges such that the input transistor is a P channel transistor, and the source terminal of the input transistor is connected to one of the plurality of input terminals, which one of the plurality of input terminals receives a signal that (i) has a first electric potential during a time period in which the signal is inactive and (ii) has a second electric potential which is lower than the first electric potential, during a time period in which the signal is active.

The flip-flop of the present invention can be arranged such that the input transistor is an N channel transistor, and the source terminal of the input transistor is connected to one of the plurality of input terminals, which one of the plurality of input terminals receives a signal that (i) has a first electric potential during a time period in which the signal is active and (ii) has a second electric potential which is lower than the first electric potential, during a time period in which the signal is inactive.

The flip-flop of the present invention can be arranged such that the plurality of input terminals include an input terminal for receiving a set signal and an input terminal for receiving a reset signal, and the input transistor is such a set transistor that (i) its gate terminal is connected to the input terminal for receiving the set signal and (ii) its source terminal is connected to the input terminal for receiving the reset signal.

The flip-flop of the present invention can be arranged such that the plurality of input terminals include an input terminal for receiving an initialization signal, and the input terminal for receiving the initialization signal is connected to one of a source terminal of the first transistor, a source terminals of the second transistor, a source terminal of the third transistor, and a source terminal of the fourth transistor.

The flip-flop of the present invention can further include a reset transistor, the reset transistor being such that (i) its gate terminal is connected to the input terminal for receiving the reset signal, (ii) its source terminal is connected to a first power source line, and (iii) its drain terminal is connected to the second output terminal.

The flip-flop of the present invention can further include at least one of a first release transistor and a second release transistor, the first release transistor being such that (i) its gate terminal is connected to the input terminal for receiving the reset signal, (ii) its source terminal is connected to a second power source line, and (iii) its drain terminal is connected to a source terminal of the second transistor, the second release transistor being such that (i) its gate terminal is connected to the input terminal for receiving the set signal, (ii) its source terminal is connected to the second power source line, and (iii) its drain terminal is connected to a source terminal of the fourth transistor.

The flip-flop of the present invention can further include a reset transistor, the reset transistor being such that (i) its gate terminal is connected to the input terminal for receiving the reset signal, (ii) its source terminal is connected to a second power source line, and (iii) its drain terminal is connected to the second output terminal.

The flip-flop of the present invention can further include at least one of a first release transistor and a second release transistor, the first release transistor being such that (i) its gate terminal is connected to the input terminal for receiving the reset signal, (ii) its source terminal is connected to a first power source line, and (iii) its drain terminal is connected to a source terminal of the first transistor, the second release transistor being such that (i) its gate terminal is connected to the input terminal for receiving the set signal, (ii) its source terminal is connected to the first power source line, and (iii) its drain terminal is connected to a source terminal of the third transistor.

The flip-flop of the present invention can be arranged such that the plurality of input terminals include an input terminal for receiving a set signal and an input terminal for receiving a reset signal, and the input transistor is such a reset transistor that its gate terminal is connected to the input terminal for receiving the reset signal and its source terminal is connected to the input terminal for receiving the set signal.

The flip-flop of the present invention can be arranged such that the plurality of input terminals further include an input terminal for receiving an initialization signal, and the input terminal for receiving the initialization signal is connected to one of a source terminal of the first transistor, a source terminal of the second transistor, a source terminal of the third transistor, and a source terminal of the fourth transistor.

The flip-flop of the present invention can further include a set transistor, the set transistor being such that (i) its gate terminal is connected to the input terminal for receiving the set signal, (ii) its source terminal is connected to a first power source line, and (iii) its drain terminal is connected to the second output terminal.

The flip-flop of the present invention can further include at least one of a first release transistor and a second release transistor, the first release transistor being such that (i) its gate terminal is connected to the input terminal for receiving the set signal, (ii) its source terminal is connected to a second power source line, and (iii) its drain terminal is connected to a source terminal of the second transistor, the second release transistor being such that (i) its gate terminal is connected to the input terminal for receiving the reset signal, (ii) its source terminal is connected to the second power source line, and (iii) its drain terminal is connected to a source terminal of the fourth transistor.

The flip-flop of the present invention can further include a set transistor, the set transistor being such that (i) its gate terminal is connected to the input terminal for receiving the set signal, (ii) its source terminal is connected to a second power source line, and (iii) its drain terminal is connected to the second output terminal.

The flip-flop of the present invention can further include at least one of a first release transistor and a second release transistor, the first release transistor being such that (i) its gate terminal is connected to the input terminal for receiving the set signal, (ii) its source terminal is connected to a first power source line, and (iii) its drain terminal is connected to a source terminal of the first transistor, the second release transistor being such that (i) its gate terminal is connected to the input terminal for receiving the reset signal, (ii) its source terminal is connected to the first power source line, and (iii) its drain terminal is connected to a source terminal of the third transistor.

A flip-flop of the present invention can include: a first transistor which is a P channel transistor; a second transistor which is an N channel transistor; a third transistor which is a P channel transistor; a fourth transistor which is an N channel transistor; a plurality of input terminals; a first output terminal; and a second output terminal, the first transistor and the second transistor constituting a first CMOS circuit such that their gate terminals are connected to each other and their drain terminals are connected to each other, the third transistor and the fourth transistor constituting a second CMOS circuit such that their gate terminals are connected to each other and their drain terminals are connected to each other, the first output terminal being connected to a gate side of the first CMOS circuit and a drain side of the second CMOS circuit, the second output terminal being connected to a gate side of the second CMOS circuit and a drain side of the first CMOS circuit, one of the first transistor, the second transistor, the third transistor, and the fourth transistor being such an input transistor that its source terminal is connected to one of the plurality of input terminals.

The flip-flop of the present invention can be arranged such that the input transistor is a P channel transistor, and the source terminal of the input transistor is connected to one of the plurality of input terminals, which one of the plurality of input terminals receives a signal that (i) has a first electric potential during a time period in which the signal is inactive and (ii) has a second electric potential which is lower than the first electric potential, during a time period in which the signal is active.

The flip-flop of the present invention can be arranged such that the input transistor is an N channel transistor, and the source terminal of the input transistor is connected to one of the plurality of input terminals, which one of the plurality of input terminals receives a signal that (i) has a first electric potential during a time period in which the signal is active and (ii) has a second electric potential which is lower than the first electric potential, during a time period in which the signal is inactive.

The flip-flop of the present invention can be arranged such that at least two of the first transistor, the second transistor, the third transistor, and the fourth transistor are input transistors each being connected to one of the plurality of input terminals via its source terminal.

The flip-flop of the present invention can be arranged such that the input transistors include a first input transistor and a second input transistor, the first input transistor being such that its source terminal is connected to an input terminal for receiving a set signal, the second input transistor being such that its source terminal is connected to an input terminal for receiving a reset signal.

The flip-flop of the present invention can be arranged such that one of the first transistor, the second transistor, the third transistor, and the fourth transistor is such an input transistor that its source terminal is connected to an input terminal for receiving an initialization signal.

A shift register of the present invention includes a flip-flop described above.

A display drive circuit of the present invention includes a flip-flop described above.

A display device of the present invention includes a flip-flop described above.

A display panel of the present invention includes: the display drive circuit described above; and a pixel circuit, the display drive circuit and the pixel circuit being formed monolithically.

A shift register of the present invention, for use in a display drive circuit which carries out simultaneous selection of a plurality of signal lines at predetermined timing, includes: the flip-flops which is provided in a stage of the shift register; and a signal generation circuit which is provided in the stage, the signal generation circuit (i) receiving a simultaneous selection signal and (ii) generating an output signal of the stage by use of an output of the flip-flop.

The shift register of the present invention can be arranged such that the output signal of the stage is turned to be active by activation of the simultaneous selection signal so that the output signal is maintained to be active during a time period in which the simultaneous selection is carried out, and the flip-flop is of a set-reset type, and an output of the flip-flop is inactive during a time period in which both a set signal and a reset signal are active.

The shift register of the present invention can be arranged such that the output signal of the stage is turned to be active by activation of the simultaneous selection signal so that the output signal is maintained to be active during a time period in which the simultaneous selection is carried out, the flip-flop includes an initialization terminal, an output of the flip-flop is inactive during a time period in which the initialization terminal is active, irrespective of conditions of the plurality of input terminals, and the initialization terminal receives the simultaneous selection signal.

The shift register of the present invention can be arranged such that the signal generation circuit includes a gate circuit which (i) obtains the simultaneous selection signal or a clock signal selectively in accordance with a switch signal supplied to the gate circuit, and (ii) outputs the simultaneous selection signal or the clock signal thus obtained as its output signal.

A display drive circuit of the present invention includes the shift register described above, the output signal of the stage being turned to be active by activation of the simultaneous selection signal so that the output signal is maintained to be active during a time period in which the simultaneous selection is carried out, the flip-flop being of a set-reset type, an output of the flip-flop being inactive during a time period in which an initialization signal is active, irrespective of (i) whether a set signal is active or inactive and (ii) whether a reset signal is active or inactive, the initialization signal (I) being turned to be active before the simultaneous selection is completed and (II) being turned to be inactive after the simultaneous selection is completed.

A display drive circuit of the present invention for use in a display device in which (i) each of a plurality of pixel electrodes is connected to, via a corresponding one of a plurality of switching elements, a corresponding one of a plurality of data signal lines and a corresponding one of scan signal lines and (ii) the pixel electrode forms, in combination with a corresponding one of a plurality of retention capacitor lines, a capacitor, and (iii) the corresponding one of the plurality of retention capacitor lines receives a modulation signal in accordance with a polarity of an electric potential of a signal written on the pixel electrode, includes the shift register described above.

The display drive circuit of the present invention can further include a retaining circuit which is provided in a stage of the shift register, the retaining circuit receiving a retaining target signal, the retaining circuit obtaining and retaining the retaining target signal during a time period in which a control signal generated by the stage of the shift register is active, the stage (i) supplying its output signal to a corresponding one of the plurality of scan signal lines, which is connected to a corresponding one(s) of a plurality of pixels and (ii) supplying, as the modulation signal, an output of the retaining circuit to one of a plurality of retention capacitor lines which forms a capacitor(s) in combination with one(s) of the plurality of pixel electrodes of respective one(s) of the plurality of pixels, which respective one(s) of the plurality of pixels correspond to a preceding stage of the shift register.

The display drive circuit of the present invention can further include a retaining circuit which is provided in a stage of the shift register, the retaining circuit receiving a retaining target signal, the retaining circuit obtaining and retaining the retaining target signal during a time period in which a control signal generated by the stage of the shift register is active, an output of the retaining circuit being supplied to a corresponding one of the plurality of retention capacitor lines as the modulation signal, a control signal generated by the stage being turned to be active before a first vertical scanning period for an image to be displayed.

The display drive circuit of the present invention can be arranged such that a polarity of an electric potential of a signal supplied to each of the plurality of data signal lines is inverted every set of a plurality of horizontal scanning periods.

The display drive circuit of the present invention can further include a plurality of retaining circuits which are provided for a plurality of stages of the shift register, respectively, each of the plurality of retaining circuits receiving a retaining target signal, neighboring ones of the plurality of stages being arranged such that an output signal of a stage and an output signal of a subsequent stage are supplied to a logic circuit, while one of the plurality of retaining circuit, corresponding to the stage, obtains and retains the retaining target signal during a time period in which an output of the logic circuit is active, the stage (i) supplying the output signal of the stage to a corresponding one of the plurality of scan signal lines, which is connected to a corresponding one(s) of the plurality of pixels and (ii) supplying, as the modulation signal, an output of the corresponding one of the plurality of retaining circuits to one of the plurality of retention capacitor lines, which forms a capacitor(s) in combination with one(s) of the plurality of pixel electrodes of respective one(s) of the plurality of pixels, which respective one(s) of the plurality of pixels correspond to the stage, a phase of the retaining target signal supplied to a first group of a plurality of retaining circuits, out of the plurality of retaining circuits, being different from that of a retaining target signal supplied to a second group of a plurality of retaining circuits, out of the plurality of retaining circuits.

The display drive circuit of the present invention can further include a plurality of retaining circuits which are provided for a plurality of stages of the shift register, respectively, each of the plurality of retaining circuits receiving a retaining target signal, each of the plurality of retaining circuits obtaining and retaining the retaining target signal during a time period in which a control signal generated by a corresponding one of the plurality of stages is active, each of the plurality of stages (i) supplying its output signal to a corresponding one of the plurality of scan signal lines, which is connected to a corresponding one (a) of a plurality of pixels, and (ii) supplying, as the modulation signal, an output of a corresponding one of the plurality of retaining circuits to one of the plurality of retention capacitor lines which forms a capacitor(s) in combination with one(s) of the plurality of pixel electrodes of respective one(s) of the plurality of pixels, which respective one(s) of the plurality of pixels correspond to a preceding stage of the shift register, a phase of the retaining target signal supplied to a first group of a plurality of retaining circuits, out of the plurality of retaining circuits, being different from that of a retaining target signal supplied to a second group of a plurality of retaining circuits, out of the plurality of retaining circuits.

The display drive circuit of the present invention can be arranged such that switching is carried out between (i) a first mode in which the polarity of the electric potential of the signal supplied to each of the plurality of data signal lines is inverted every set of n horizontal scanning period(s) (n is an integer not less than 1) and (ii) a second mode in which the polarity of the electric potential of the signal supplied to each of the plurality of data signal lines is inverted every set of m horizontal scanning period(s) (m is an integer which is not less than 1 and is different from n).

The display drive circuit of the present invention can be arranged such that the phase of the retaining target signal, supplied to each of the plurality of retaining circuits belonging to the first group, and the phase of the retaining target signal, supplied to each of the plurality of retaining circuits belonging to the second group, are set in accordance with said first mode and second mode.

The present invention is not limited to the description of the embodiments above. An embodiment altered, as appropriate, on the basis of a well-known technique or common general technical knowledge, and an embodiment based on a proper combination of technical means disclosed in different embodiments are encompassed in the technical scope of the present invention. Further, effects and the like described in the embodiments above are merely presented for illustrative purposes.

INDUSTRIAL APPLICABILITY

A flip-flop of the present invention and a shift register including the flip-flop can be suitable used in a liquid crystal display device, for example.

REFERENCE SIGNS LIST

FF: Flip-flop
ST: Set transistor (input transistor)
RT: Reset transistor (input transistor)
LRT: Latch release transistor
LC: Latch circuit
SR: Shift register
SRn: The nth stage of shift register
DCC: Display control circuit
GD: Gate driver
SD: Source driver
G-CsD: Gate-Cs driver
DAR: Display section
Gn: Scan signal line
CSn: Retention capacitor line
PIXn: Pixel
CSLn: D latch circuit
POL: (Data) Polarity signal
CMI1, CMI2: CS inversion signal
ASW1 through ASW6: asw analogue switch
3a through 3k, 3r, 3s, 3t: Liquid crystal display device

The invention claimed is:
1. A flip-flop comprising:
a first transistor which is a P channel transistor;
a second transistor which is an N channel transistor;
a third transistor which is a P channel transistor;
a fourth transistor which is an N channel transistor;
a plurality of input terminals;
a first output terminal;
a second output terminal; and
an input transistor, wherein
the first transistor and the second transistor constitute a first CMOS circuit such that gate terminals of the first and second transistors are connected to each other and drain terminals of the first and second transistors are connected to each other, the third transistor and the fourth transistor constitute a second CMOS circuit such that gate terminals of the third and fourth transistors are connected to each other and drain terminals of the third and fourth transistors are connected to each other, the first output terminal is connected to a gate side of the first CMOS circuit and a drain side of the second CMOS circuit, the second output terminal is connected to a gate side of the second CMOS circuit and a drain side of the first CMOS circuit, the plurality of input terminals receive respective signals each of which has a temporal change, and a gate terminal of the input transistor is connected to one of the plurality of input terminals and a source terminal of the input transistor is connected to another one of the plurality of input terminals.

2. The flip-flop as set forth in claim 1, wherein a drain terminal of the input transistor is connected to the first output terminal.

3. The flip-flop as set forth in claim 1, wherein,
the input transistor is a P channel transistor; and
the other one of the plurality of input terminals to which the source terminal of the input transistor is connected, receives a signal that (i) has a first electric potential during a time period in which the signal is inactive and (ii) has a second electric potential which is lower than the first electric potential, during a time period in which the signal is active.

4. The flip-flop as set forth in claim 1, wherein,
the input transistor is an N channel transistor; and
the other one of the plurality of input terminals to which the source terminal of the input transistor is connected, receives a signal that (i) has a first electric potential during a time period in which the signal is active and (ii) has a second electric potential which is lower than the first electric potential, during a time period in which the signal is inactive.

5. A flip-flop comprising:
a first transistor which is a P channel transistor;
a second transistor which is an N channel transistor;
a third transistor which is a P channel transistor;
a fourth transistor which is an N channel transistor;
a plurality of input terminals;
a first output terminal;
a second output terminal; and
an input transistor, wherein
the first transistor and the second transistor constitute a first CMOS circuit such that gate terminals of the first and second transistors are connected to each other and drain terminals of the first and second transistors are connected to each other, the third transistor and the fourth transistor constitute a second CMOS circuit such that gate terminals of the third and fourth transistors are connected to each other and drain terminals of the third and fourth transistors are connected to each other, the first output terminal is connected to a gate side of the first CMOS circuit and a drain side of the second CMOS circuit, the second output terminal is connected to a gate side of the second CMOS circuit and a drain side of the first CMOS circuit, the plurality of input terminals include an input terminal for receiving a set signal and an input terminal for receiving a reset signal, the input transistor is a set transistor, and a gate terminal of the set transistor is connected to the input terminal for receiving the set signal, a source terminal of the set transistor is connected to the input terminal for receiving the reset signal and a drain terminal of the set transistor is connected to the first output terminal.

6. The flip-flop as set forth in claim 2, wherein,
the plurality of input terminals include an input terminal for receiving an initialization signal; and
the input terminal for receiving the initialization signal is connected to one of a source terminal of the first transistor, a source terminal of the second transistor, a source terminal of the third transistor, and a source terminal of the fourth transistor.

7. The flip-flop as set forth in claim 5, further comprising:
a reset transistor, wherein
(i) a gate terminal of the reset transistor is connected to the input terminal for receiving the reset signal, (ii) a source terminal of the reset transistor is connected to a first power source line, and (iii) a drain terminal of the reset transistor is connected to the second output terminal.

8. The flip-flop as set forth in claim 5, further comprising:
at least one of a first release transistor and a second release transistor, wherein
(i) a gate terminal of the first release transistor is connected to the input terminal for receiving the reset signal, (ii) a source terminal of the first release transistor is connected to a second power source line, and (iii) a drain terminal of the first release transistor is connected to a source terminal of the second transistor, and
(i) a gate terminal of the second release transistor is connected to the input terminal for receiving the set signal, (ii) a source terminal of the second release transistor is connected to the second power source line, and (iii) a drain terminal of the second release transistor is connected to a source terminal of the fourth transistor.

9. The flip-flop as set forth in claim 5, further comprising:
a reset transistor, wherein
(i) a gate terminal of the reset transistor is connected to the input terminal for receiving the reset signal, (ii) a source terminal of the reset transistor is connected to a second power source line, and (iii) a drain terminal of the reset transistor is connected to the second output terminal.

10. The flip-flop as set forth in claim 9, further comprising:
at least one of a first release transistor and a second release transistor, wherein
(i) a gate terminal of the first release transistor is connected to the input terminal for receiving the reset signal, (ii) a source terminal of the first release transistor is connected to a first power source line, and (iii) a drain terminal of the first release transistor is connected to a source terminal of the first transistor, and
(i) a gate terminal of the second release transistor is connected to the input terminal for receiving the set signal, (ii) a source terminal of the second release transistor is connected to the first power source line, and (iii) a drain terminal of the second release transistor is connected to a source terminal of the third transistor.

11. A flip-flop comprising:
a first transistor which is a P channel transistor;
a second transistor which is an N channel transistor;
a third transistor which is a P channel transistor;
a fourth transistor which is an N channel transistor;
a plurality of input terminals;

a first output terminal;
a second output terminal; and
an input transistor, wherein
the first transistor and the second transistor constitute a first CMOS circuit such that gate terminals of the first and second transistors are connected to each other and drain terminals of the first and second transistors are connected to each other,
the third transistor and the fourth transistor constitute a second CMOS circuit such that gate terminals of the third and fourth transistors are connected to each other and drain terminals of the third and fourth transistors are connected to each other,
the first output terminal is connected to a gate side of the first CMOS circuit and a drain side of the second CMOS circuit,
the second output terminal is connected to a gate side of the second CMOS circuit and a drain side of the first CMOS circuit,
the plurality of input terminals include an input terminal for receiving a set signal and an input terminal for receiving a reset signal,
the input transistor is a reset transistor, and
a gate terminal of the input transistor is connected to the input terminal for receiving the reset signal, a source terminal of the input transistor is connected to the input terminal for receiving the set signal and a drain terminal of the input transistor is connected to the first output terminal.

12. The flip-flop as set forth in claim 11, wherein,
the plurality of input terminals further include an input terminal for receiving an initialization signal; and
the input terminal for receiving the initialization signal is connected to one of a source terminal of the first transistor, a source terminal of the second transistor, a source terminal of the third transistor, and a source terminal of the fourth transistor.

13. The flip-flop as set forth in claim 11, further comprising:
a set transistor, wherein
(i) a gate terminal of the set transistor is connected to the input terminal for receiving the set signal, (ii) a source terminal of the set transistor is connected to a first power source line, and (iii) a drain terminal of the set transistor is connected to the second output terminal.

14. The flip-flop as set forth in claim 13, further comprising:
at least one of a first release transistor and a second release transistor, wherein
(i) a gate terminal of the first release transistor is connected to the input terminal for receiving the set signal, (ii) a source terminal of the first release transistor is connected to a second power source line, and (iii) a drain terminal of the first release transistor is connected to a source terminal of the second transistor, and
(i) a gate terminal of the second release transistor is connected to the input terminal for receiving the reset signal, (ii) a source terminal of the second release transistor is connected to the second power source line, and (iii) a drain terminal of the second release transistor is connected to a source terminal of the fourth transistor.

15. The flip-flop as set forth in claim 11, further comprising:
a set transistor, wherein
(i) a gate terminal of the set transistor is connected to the input terminal for receiving the set signal, (ii) a source terminal of the set transistor is connected to a second power source line, and (iii) a drain terminal of the set transistor is connected to the second output terminal.

16. The flip-flop as set forth in claim 15, further comprising:
at least one of a first release transistor and a second release transistor, wherein
(i) a gate terminal of the first release transistor is connected to the input terminal for receiving the set signal, (ii) a source terminal of the first release transistor is connected to a first power source line, and (iii) a drain terminal of the first release transistor is connected to a source terminal of the first transistor, and
(i) a gate terminal of the second release transistor is connected to the input terminal for receiving the reset signal, (ii) a source terminal of the second release transistor is connected to the first power source line, and (iii) a drain terminal of the second release transistor is connected to a source terminal of the third transistor.

17. A flip-flop comprising:
a first transistor which is a P channel transistor;
a second transistor which is an N channel transistor;
a third transistor which is a P channel transistor;
a fourth transistor which is an N channel transistor;
a plurality of input terminals;
a first output terminal; and
a second output terminal, wherein
the first transistor and the second transistor constitute a first CMOS circuit such that gate terminals of the first and second transistors are connected to each other and drain terminals of the first and second transistors are connected to each other,
the third transistor and the fourth transistor constitute a second CMOS circuit such that gate terminals of the third and fourth transistors are connected to each other and drain terminals of the third and fourth transistors are connected to each other,
the first output terminal is connected to a gate side of the first CMOS circuit and a drain side of the second CMOS circuit,
the second output terminal is connected to a gate side of the second CMOS circuit and a drain side of the first CMOS circuit,
one of the first transistor, the second transistor, the third transistor, and the fourth transistor is an input transistor;
a source terminal of the input transistor being connected to one of the plurality of input terminals, and,
the one of the plurality of input terminals receives a signal which has a temporal change.

18. The flip-flop as set forth in claim 17, wherein
the input transistor is a P channel transistor; and
the one of the plurality of input terminals to which the source terminal of the input transistor is connected, receives a signal that (i) has a first electric potential during a time period in which the signal is inactive and (ii) has a second electric potential which is lower than the first electric potential, during a time period in which the signal is active.

19. The flip-flop as set forth in claim 17, wherein,
the input transistor is an N channel transistor; and
the one of the plurality of input terminals to which the source terminal of the input transistor is connected, receives a signal that (i) has a first electric potential during a time period in which the signal is active and (ii) has a second electric potential which is lower than the first electric potential, during a time period in which the signal is inactive.

20. The flip-flop as set forth in claim 17, wherein at least two of the first transistor, the second transistor, the third transistor, and the fourth transistor are input transistors, each of the at least two transistors being connected to one of the plurality of input terminals via a corresponding source terminal.

21. A flip-flop comprising:
a first transistor which is a P channel transistor;
a second transistor which is an N channel transistor;
a third transistor which is a P channel transistor;
a fourth transistor which is an N channel transistor;
a plurality of input terminals;
a first output terminal; and
a second output terminal, wherein
the first transistor and the second transistor constitute a first CMOS circuit such that gate terminals of the first and second transistors are connected to each other and drain terminals of the first and second transistors are connected to each other,
the third transistor and the fourth transistor constitute a second CMOS circuit such that gate terminals of the third and fourth transistors are connected to each other and drain terminals of the third and fourth transistors are connected to each other,
the first output terminal is connected to a gate side of the first CMOS circuit and a drain side of the second CMOS circuit,
the second output terminal is connected to a gate side of the second CMOS circuit and a drain side of the first CMOS circuit,
at least two of the first transistor, the second transistor, the third transistor, and the fourth transistor are input transistors,
a source terminal of a first one of the input transistors is connected to one of the plurality of input terminal for receiving a set signal, and
source terminal of a second one of the input transistors is connected to another one of the plurality of input terminal for receiving a reset signal.

22. The flip-flop as set forth in claim 21, wherein one of the first transistor, the second transistor, the third transistor, and the fourth transistor, other than the first one and the second of the input transistors, is the input transistor with a corresponding source terminal being connected to one of the plurality of input terminals for receiving an initialization signal.

23. A shift register comprising:
a flip-flop recited in claim 1.

24. A display drive circuit comprising:
a flip-flop recited in claim 1.

25. A display device comprising:
a flip-flop recited in claim 1.

26. A display panel comprising:
a display drive circuit including a flip-flop, the flip-flop including,
a first transistor which is a P channel transistor;
a second transistor which is an N channel transistor;
a third transistor which is a P channel transistor;
a fourth transistor which is an N channel transistor;
a plurality of input terminals;
a first output terminal;
a second output terminal; and
an input transistor, wherein
the first transistor and the second transistor constitute a first CMOS circuit such that gate terminals of the first and second transistors are connected to each other and drain terminals of the first and second transistors are connected to each other,
the third transistor and the fourth transistor constitute a second CMOS circuit such that gate terminals of the third and fourth transistors are connected to each other and drain terminals of the third and fourth transistors are connected to each other,
the first output terminal is connected to a gate side of the first CMOS circuit and a drain side of the second CMOS circuit,
the second output terminal is connected to a gate side of the second CMOS circuit and a drain side of the first CMOS circuit, and
a gate terminal of the input transistor is connected to one of the plurality of input terminals and a source terminal of the input transistor is connected to another one of the plurality of input terminals; and
a pixel circuit, the display drive circuit and the pixel circuit being formed monolithically.

27. A shift register for use in a display drive circuit which carries out simultaneous selection of a plurality of signal lines at a timing, the shift register comprising:
a flip-flop provided in a stage of the shift register, the flip-flop including,
a first transistor which is a P channel transistor;
a second transistor which is an N channel transistor;
a third transistor which is a P channel transistor;
a fourth transistor which is an N channel transistor;
a plurality of input terminals;
a first output terminal;
a second output terminal; and
an input transistor, wherein
the first transistor and the second transistor constitute a first CMOS circuit such that gate terminals of the first and second transistors are connected to each other and drain terminals of the first and second transistors are connected to each other,
the third transistor and the fourth transistor constitute a second CMOS circuit such that gate terminals of the third and fourth transistors are connected to each other and drain terminals of the third and fourth transistors are connected to each other,
the first output terminal is connected to a gate side of the first CMOS circuit and a drain side of the second CMOS circuit, the second output terminal is connected to a gate side of the second CMOS circuit and a drain side of the first CMOS circuit, and
a gate terminal of the input transistor is connected to one of the plurality of input terminals and a source terminal of the input transistor is connected to another one of the plurality of input terminals; and
a signal generation circuit which is provided in the stage, the signal generation circuit (i) receiving a simultaneous selection signal and (ii) generating an output signal of the stage by use of an output of the flip-flop.

28. The shift register as set forth in claim 27, wherein,
the output signal of the stage is activated by activation of the simultaneous selection signal so that the output signal is maintained to be active during a time period in which the simultaneous selection is carried out; and
the flip-flop is of a set-reset type, and an output of the flip-flop is inactive during a time period in which both a set signal and a reset signal are active.

29. The shift register as set forth in claim 27, wherein,
the output signal of the stage is activated by activation of the simultaneous selection signal so that the output signal is maintained to be active during a time period in which the simultaneous selection is carried out;
the flip-flop includes an initialization terminal;

an output of the flip-flop is inactive during a time period in which the initialization terminal is active, irrespective of conditions of the plurality of input terminals; and the initialization terminal receives the simultaneous selection signal.

30. The shift register as set forth in claim 27, wherein the signal generation circuit includes a gate circuit which (i) obtains the simultaneous selection signal or a clock signal selectively in accordance with a switch signal supplied to the gate circuit, and (ii) outputs the simultaneous selection signal or the clock signal thus obtained as an output signal.

31. Display drive circuit comprising:
a shift register recited in claim 27, wherein
the output signal of the stage is activated by activation of the simultaneous selection signal so that the output signal is maintained to be active during a time period in which the simultaneous selection is carried out,
the flip-flop is of a set-reset type,
an output of the flip-flop is inactive during a time period in which an initialization signal is active, irrespective of (i) whether a set signal is active or inactive and (ii) whether a reset signal is active or inactive, and
the initialization signal (I) is activated before the simultaneous selection is completed and (II) is deactivated after the simultaneous selection is completed.

32. A display drive circuit for use in a display device in which (i) each of a plurality of pixel electrodes is connected to, via a corresponding one of a plurality of switching elements, a corresponding one of a plurality of data signal lines and a corresponding one of scan signal lines and (ii) the pixel electrode forms, in combination with a corresponding one of a plurality of retention capacitor lines, a capacitor, and (iii) the corresponding one of the plurality of retention capacitor lines receives a modulation signal in accordance with a polarity of an electric potential of a signal written on the pixel electrode, the display drive circuit comprising:
a shift register the shift register includes a flip-flop, the flip-flop includes,
a first transistor which is a P channel transistor;
a second transistor which is an N channel transistor;
a third transistor which is a P channel transistor;
a fourth transistor which is an N channel transistor;
a plurality of input terminals;
a first output terminal;
a second output terminal; and
an input transistor, wherein
the first transistor and the second transistor constitute a first CMOS circuit such that gate terminals of the first and second transistors are connected to each other and drain terminals of the first and second transistors are connected to each other,
the third transistor and the fourth transistor constitute a second CMOS circuit such that gate terminals of the third and fourth transistors are connected to each other and drain terminals of the third and fourth transistors are connected to each other,
the first output terminal is connected to a gate side of the first CMOS circuit and a drain side of the second CMOS circuit,
the second output terminal is connected to a gate side of the second CMOS circuit and a drain side of the first CMOS circuit, and
the input transistor is such that a gate terminal of the input transistor is connected to one of the plurality of input terminals and a source terminal of the input transistor is connected to another one of the plurality of input terminals.

33. The display drive circuit as set forth in claim 32, further comprising:
a retaining circuit which is provided in a stage of the shift register, wherein
the retaining circuit receives a retaining target signal,
the retaining circuit obtains and retains the retaining target signal during a time period in which a control signal generated by the stage of the shift register is active, and
the stage (i) supplies a corresponding output signal to a corresponding one of the plurality of scan signal lines, which is connected to a corresponding one(s) of a plurality of pixels and (ii) supplies, as the modulation signal, an output of the retaining circuit to one of a plurality of retention capacitor lines which forms a capacitor(s) in combination with one(s) of the plurality of pixel electrodes of respective one(s) of the plurality of pixels, which respective one(s) of the plurality of pixels correspond to a preceding stage of the shift register.

34. The display drive circuit as set forth in claim 32, further comprising:
a retaining circuit which is provided in a stage of the shift register, wherein
the retaining circuit receives a retaining target signal,
the retaining circuit obtains and retains the retaining target signal during a time period in which a control signal generated by the stage of the shift register is active,
an output of the retaining circuit is supplied to a corresponding one of the plurality of retention capacitor lines as the modulation signal, and
a control signal generated by the stage is activated before a first vertical scanning period for an image to be displayed.

35. The display drive circuit as set forth in claim 32, wherein a polarity of an electric potential of a signal supplied to each of the plurality of data signal lines is inverted every set of a plurality of horizontal scanning periods.

36. The display drive circuit as set forth in claim 35, further comprising:
a plurality of retaining circuits which are provided for a plurality of stages of the shift register, respectively, wherein
each of the plurality of retaining circuits receives a retaining target signal,
neighboring ones of the plurality of stages is arranged such that an output signal of a stage and an output signal of a subsequent stage are supplied to a logic circuit, while one of the plurality of retaining circuit, corresponding to the stage, obtains and retains the retaining target signal during a time period in which an output of the logic circuit is active,
the stage (i) supplies the output signal of the stage to a corresponding one of the plurality of scan signal lines, which is connected to a corresponding one(s) of the plurality of pixels and (ii) supplies, as the modulation signal, an output of the corresponding one of the plurality of retaining circuits to one of the plurality of retention capacitor lines, which forms a capacitor(s) in combination with one(s) of the plurality of pixel electrodes of respective one(s) of the plurality of pixels, which respective one(s) of the plurality of pixels correspond to the stage, and
a phase of the retaining target signal supplied to a first group of a plurality of retaining circuits, out of the plurality of retaining circuits, is different from that of a retaining target signal supplied to a second group of a plurality of retaining circuits, out of the plurality of retaining circuits.

37. The display drive circuit as set forth in claim 35, further comprising:
- a plurality of retaining circuits which are provided for a plurality of stages of the shift register, respectively, wherein
- each of the plurality of retaining circuits receives a retaining target signal,
- each of the plurality of retaining circuits obtains and retains the retaining target signal during a time period in which a control signal generated by a corresponding one of the plurality of stages is active,
- each of the plurality of stages (i) supplies a correspond output signal to a corresponding one of the plurality of scan signal lines, which is connected to a corresponding one (a) of a plurality of pixels, and (ii) supplies as the modulation signal, an output of a corresponding one of the plurality of retaining circuits to one of the plurality of retention capacitor lines which forms a capacitor(s) in combination with one(s) of the plurality of pixel electrodes of respective one(s) of the plurality of pixels, which respective one(s) of the plurality of pixels correspond to a preceding stage of the shift register, and
- a phase of the retaining target signal supplied to a first group of a plurality of retaining circuits, out of the plurality of retaining circuits, is different from that of a retaining target signal supplied to a second group of a plurality of retaining circuits, out of the plurality of retaining circuits.

38. The display drive circuit as set forth in claim 36, wherein switching is carried out between (i) a first mode in which the polarity of the electric potential of the signal supplied to each of the plurality of data signal lines is inverted every set of n horizontal scanning period(s) (n is an integer not less than 1) and (ii) a second mode in which the polarity of the electric potential of the signal supplied to each of the plurality of data signal lines is inverted every set of m horizontal scanning period(s) (m is an integer which is not less than 1 and is different from n).

39. The display drive circuit as set forth in claim 38, wherein the phase of the retaining target signal, supplied to each of the plurality of retaining circuits belonging to the first group, and the phase of the retaining target signal, supplied to each of a plurality of retaining circuits belonging to the second group, are set in accordance with said first mode and second mode.

* * * * *